United States Patent [19]

McKaskle et al.

[11] Patent Number: 5,481,741
[45] Date of Patent: Jan. 2, 1996

[54] METHOD AND APPARATUS FOR PROVIDING ATTRIBUTE NODES IN A GRAPHICAL DATA FLOW ENVIRONMENT

[75] Inventors: Greg McKaskle; Jeffrey L. Kodosky, both of Austin, Tex.

[73] Assignee: National Instruments Corporation, Austin, Tex.

[21] Appl. No.: 126,163

[22] Filed: Sep. 22, 1993

Related U.S. Application Data

[63] Continuation-in-part of Ser. No. 979,416, Nov. 19, 1992, Pat. No. 5,291,587, which is a continuation of Ser. No. 376,257, Jul. 6, 1989, abandoned, which is a continuation of Ser. No. 851,569, Apr. 14, 1986, Pat. No. 4,901,221.

[51] Int. Cl.$^6$ ........................................................ G06F 9/60
[52] U.S. Cl. .......................... 395/800; 364/DIG. 7; 364/274.1; 364/275.1; 364/281.3; 364/286; 364/286.3; 395/155; 395/109
[58] Field of Search ............................ 395/200, 800, 395/155–162, 140, 62, 109, 600, 650, 775, 200; 364/146, 188

[56] References Cited

U.S. PATENT DOCUMENTS

| | | | |
|---|---|---|---|
| 4,849,880 | 7/1989 | Bhaskar et al. | 395/161 |
| 5,168,441 | 12/1992 | Onarheim et al. | 364/146 |

*Primary Examiner*—Mehmet Geckil
*Attorney, Agent, or Firm*—Jeffrey C. Hood

[57] ABSTRACT

A system and method for providing attribute nodes in a data flow diagram which allow a user to programmatically access various parameters of a control or indicator. In this manner, a user can programmatically make changes that affect the output or appearance of controls and indicators. A user can also access these parameters interactively during execution of a block diagram. A user can creates an attribute node containing one or more attributes corresponding to controls that affect a parameter of the control, such as the color used for the respective display, the visibility of the control, the scales or cursor position for respective graphs or charts, etc. The purpose of an attribute node is to affect the visual output of a control provided on the front panel depending on events which occur during execution of a VI or on user input during execution of a VI. An attribute node thus allows the execution subsystem to monitor user interaction by reading attribute data that previously was not available to the program. An attribute node allows two types of operations, these being reading an attribute node or writing to an attribute node. These operations of reading and writing an attribute node can be performed either by a block diagram during execution, wherein the user has programmed the block diagram to perform this function, or interactively by the user during execution. The process of writing to an attribute node refers to the execution subsystem updating an attribute of a control in the front panel display to reflect an attribute that has been set programmatically in a block diagram. The user can also "write" to an attribute node by providing input to a control in the front panel during execution of a block diagram. Reading an attribute node refers to the execution subsystem reading the value of an attribute for a certain control during block diagram execution that may have been changed by the user, or may have been changed during execution of a VI by the execution subsystem. Reading an attribute also refers to the user viewing changes to the attribute during execution.

33 Claims, 98 Drawing Sheets

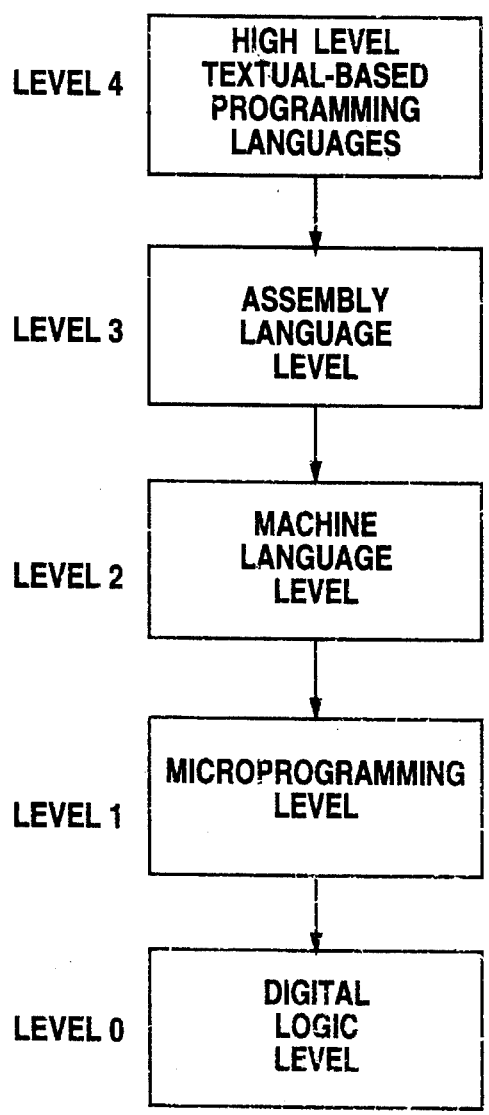
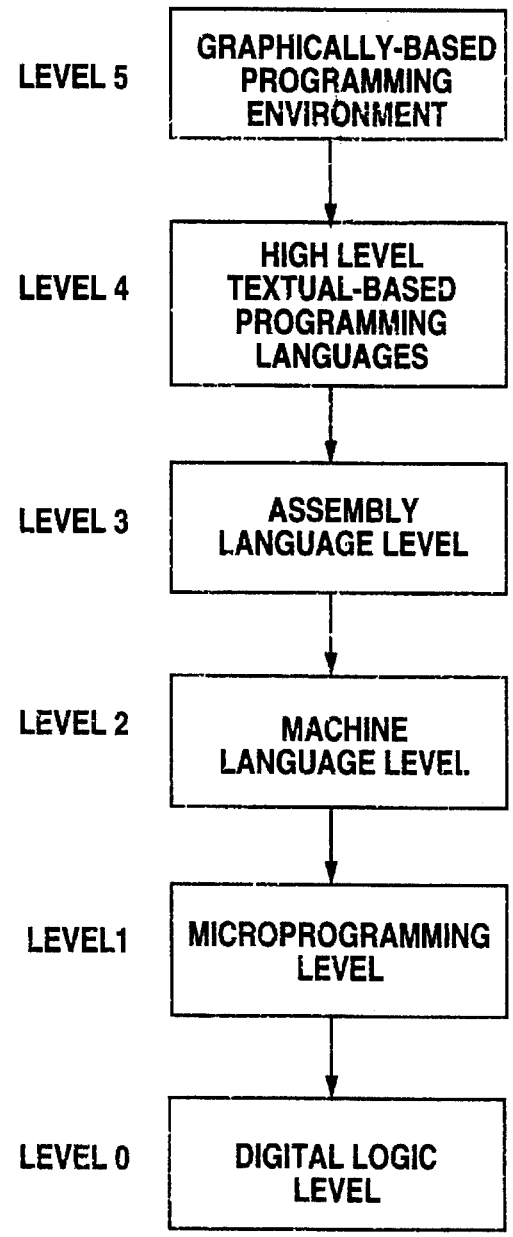
Fig. 1
Fig. 1A

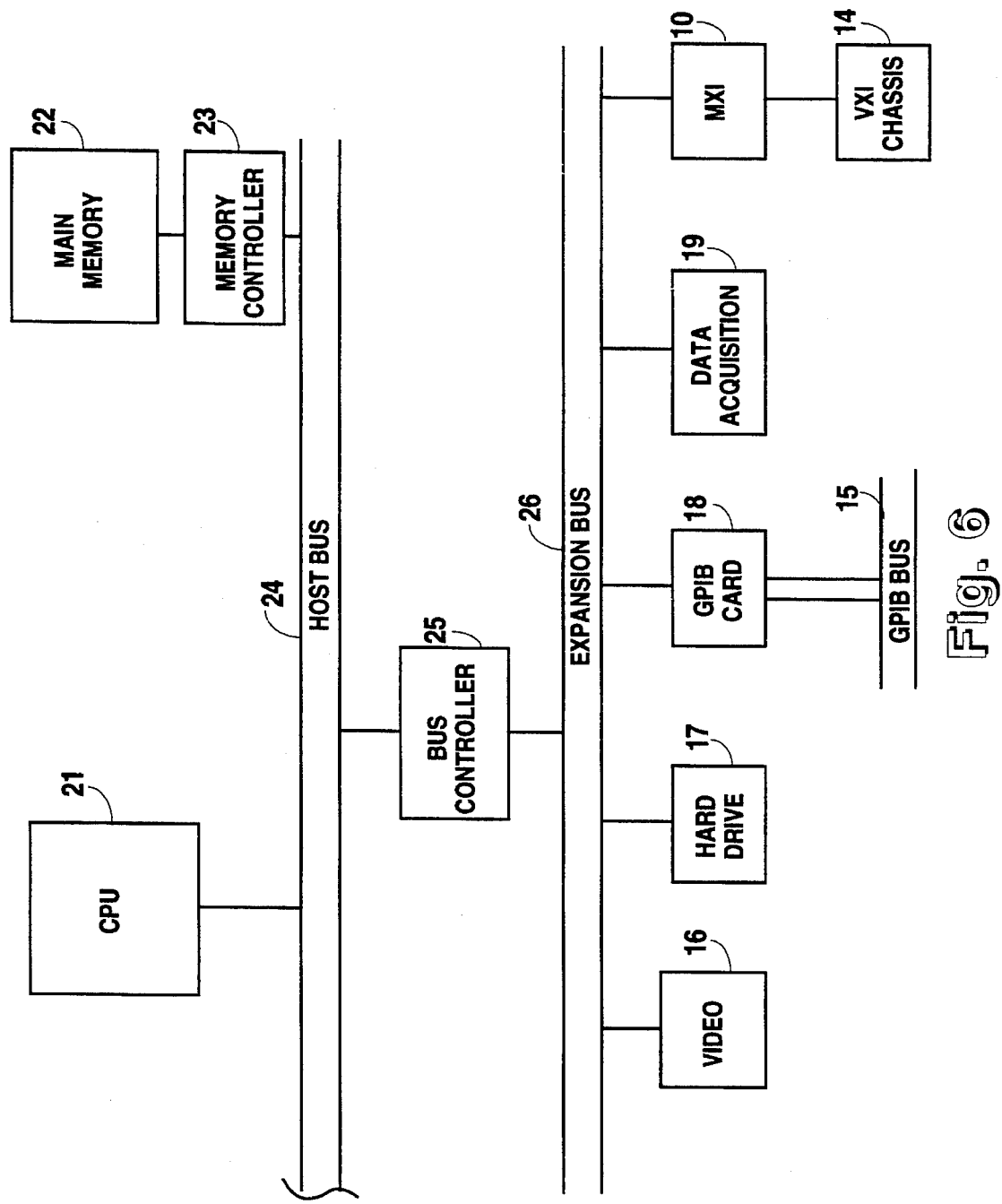

LEGEND:

SYSTEM OBJECT ☐

SYSTEM CLASS ▒

ONE-TO-MANY ⟶
(SOURCE CONTAINS ZERO OR MORE DESTINATION OBJECTS)

ONE-TO-ONE ⇢
(SOURCE REFERENCES ZERO OR ONE DESTINATION OBJECTS)

type descriptors struct { int, string, char, float }

| 22 | 50 | 4 | 4 | 3 | 4 | 30 | 4 | 1 | 4 | 10 |
|----|----|---|---|---|---|----|---|---|---|----|
| size | cluster code | # of elements | size of first element | code for first element |  |  |  |  |  |  |

Fig. 18

VI virtual instrument data structure
DIAG diagram data structure
SRN self reference node data structure
T terminal data structure
I USE instrument usage node data structure

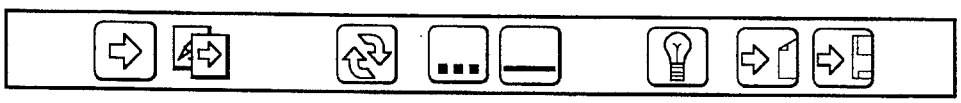
Fig. 48
   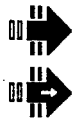      
Fig. 49A　　Fig. 49B　　Fig. 49C　　Fig. 49D
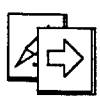         
Fig. 50A　　Fig. 50B　　Fig. 51A　　Fig. 51B
   
Fig. 52A　　Fig. 52B
      
Fig. 53A　　Fig. 53B　　Fig. 53C
         
Fig. 54A　　Fig. 54B　　Fig. 55A　　Fig. 55B
      
Fig. 56A　　Fig. 56B　　Fig. 56C

Fig. 57
 
Fig. 58A          Fig. 58B
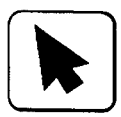 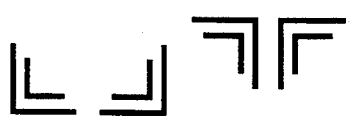
Fig. 59A          Fig. 59B
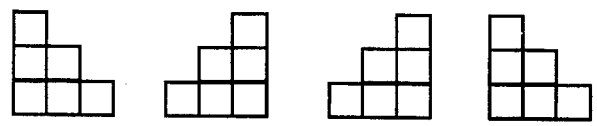
Fig. 59C
  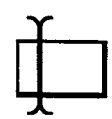
Fig. 60A          Fig. 60B          Fig. 60C
Fig. 61
 
Fig. 62A          Fig. 62B

| FILE | EDIT | OPERATE | CONTROLS | WINDOWS | TEXT |
Fig. 63
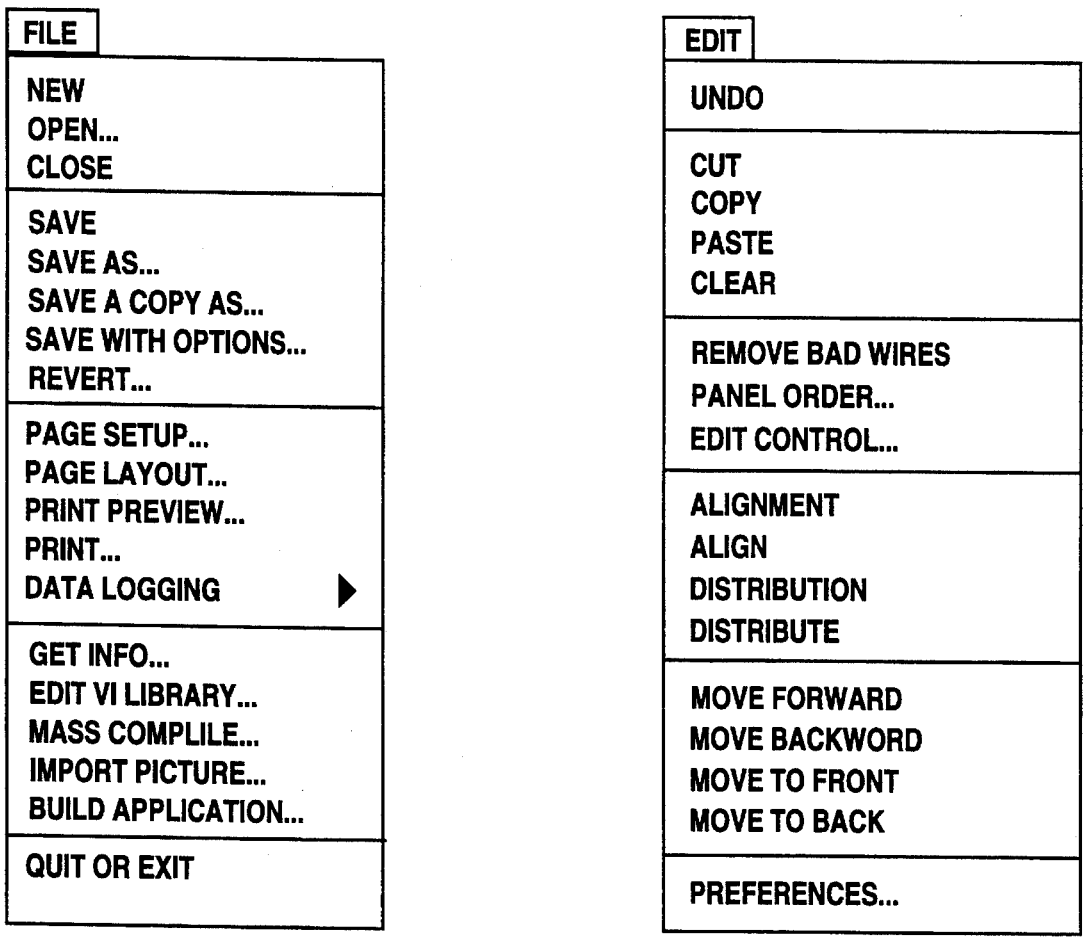
Fig. 64
Fig. 65
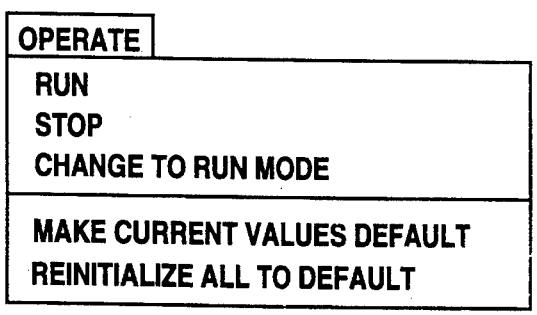
Fig. 66
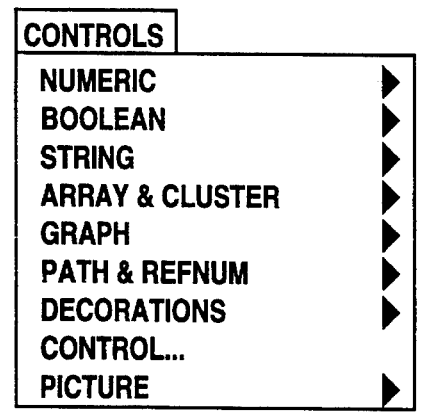
Fig. 67

|  | SCALAR | 1 D ARRAY | 2 D ARRAY | COLOR |
|---|---|---|---|---|
| NUMBER | ——— | ——— | ═══ | ORANGE (floating point), BLUE (integer) |
| BOOLEAN | ------ | ------ | ====== | GREEN |
| STRING | ～～～ | ～～～ | ≋≋≋ | PURPLE |
Fig. 76
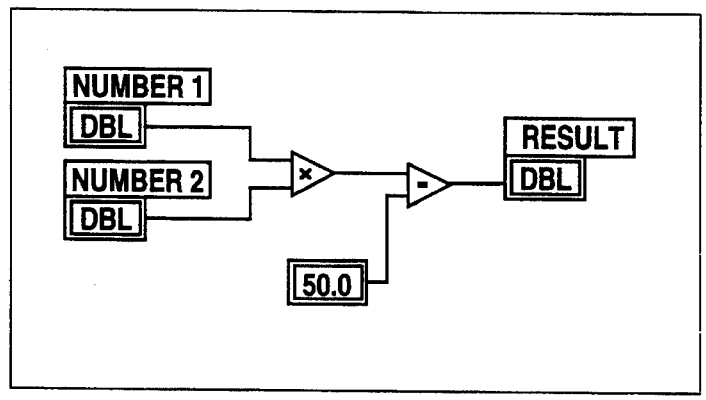
Fig. 77
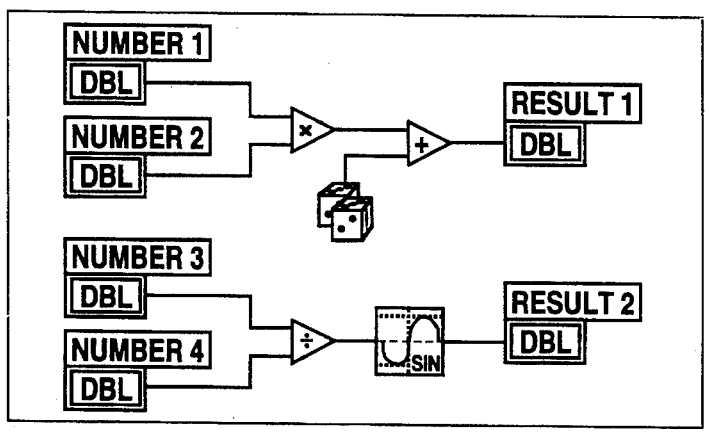
Fig. 78

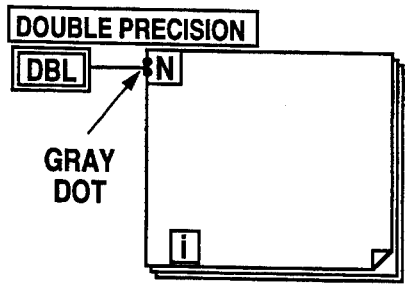
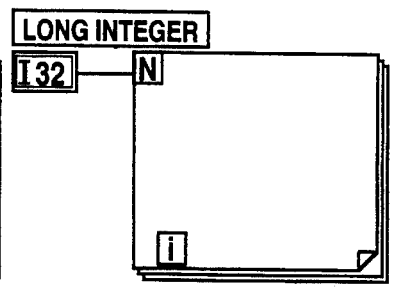
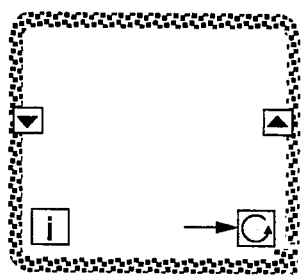
Fig. 96A    Fig. 96B    Fig. 97
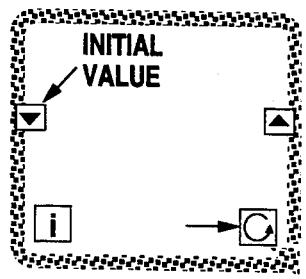
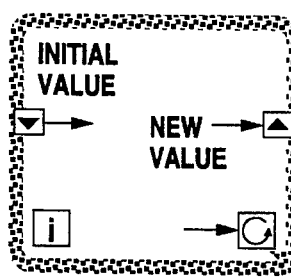
Fig. 98A    Fig. 98B
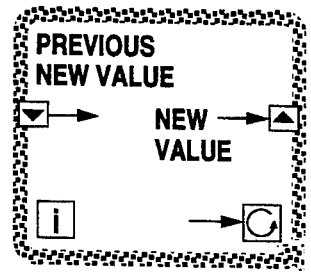
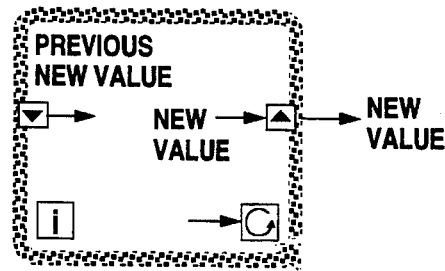
Fig. 98C    Fig. 98D
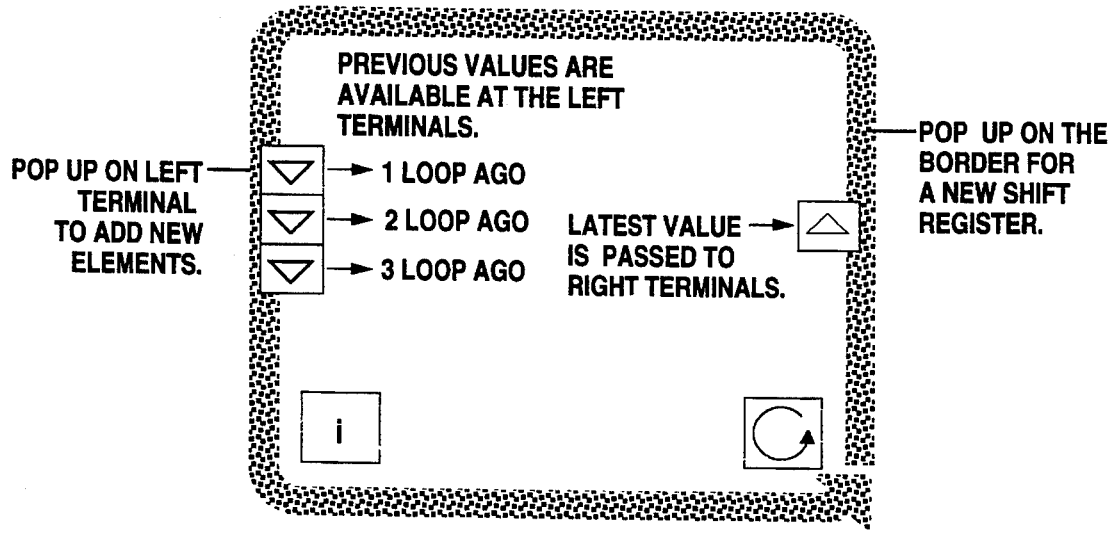
Fig. 99

NUMERICAL CASE STRUCTURE

BOOLEAN CASE STRUCTURE

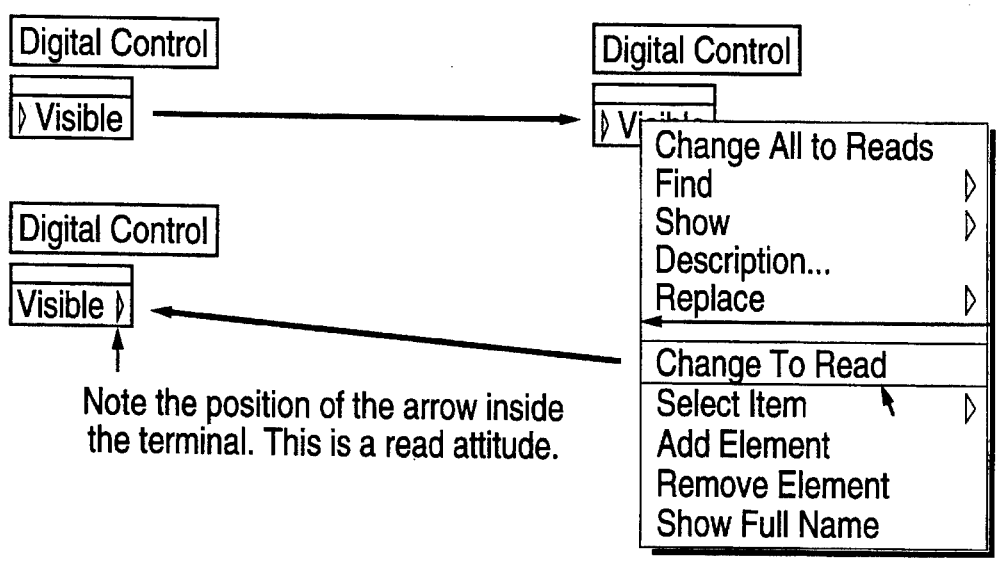
Fig. 119
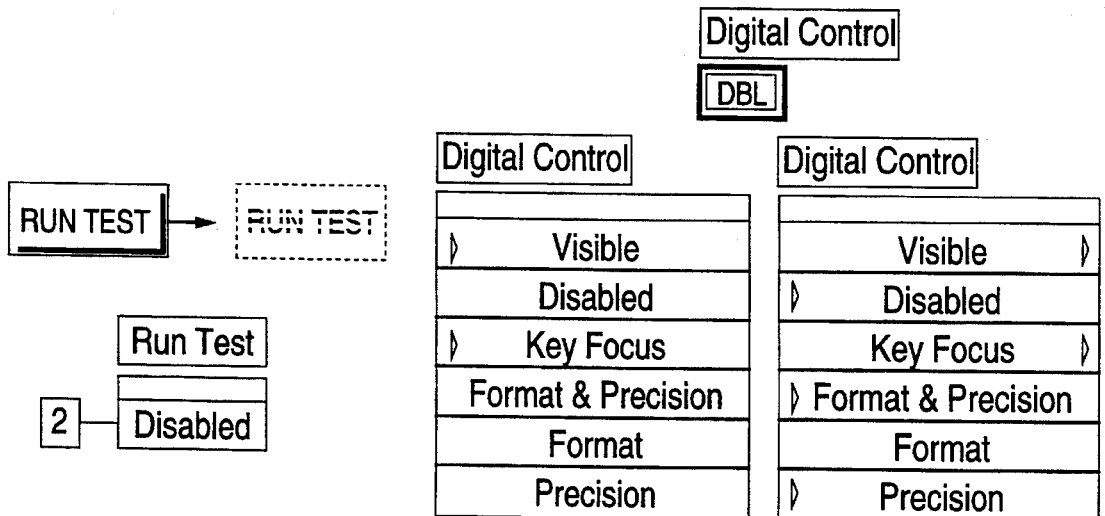
Fig. 120
Fig. 121
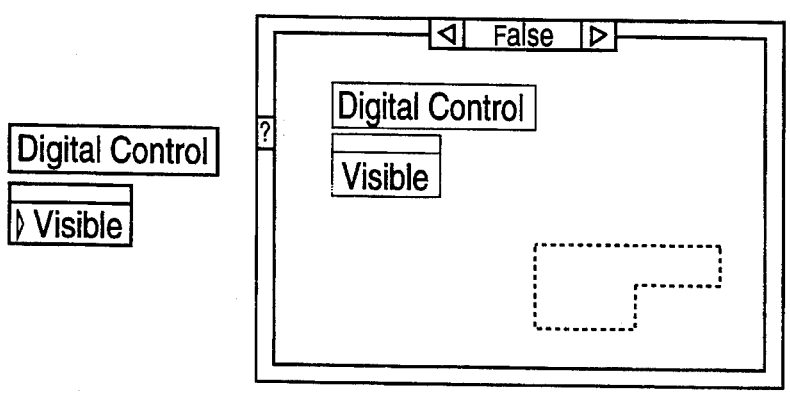
Fig. 122

Visible Attribute

Wiring Example

Disabled Attribute

Format & Precision Attribute

Wiring Example

Strings [4] Attribute
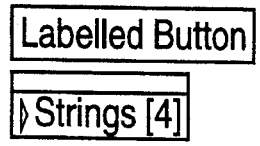
Wiring Example
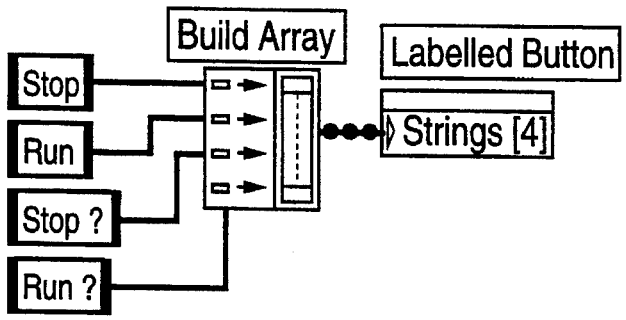
Fig. 129
Colors [4] Attribute
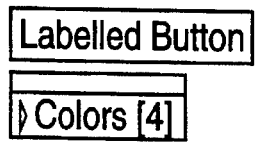
Wiring Example
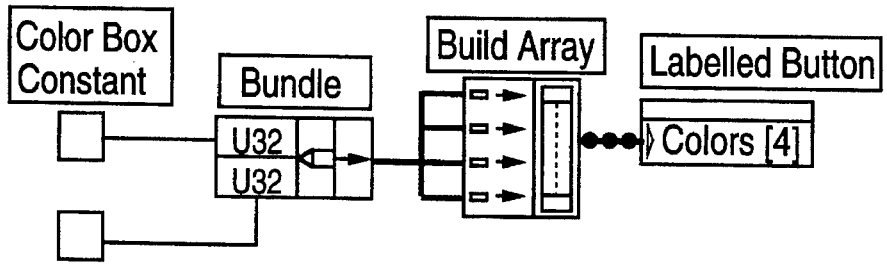
Black = Foreground
White = Background
Fig. 130

  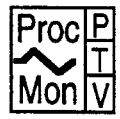 
Fig. 134A        Fig. 134B        Fig. 134C        Fig. 134D
 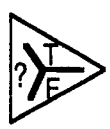  
Fig. 134E        Fig. 134F        Fig. 134G        Fig. 134H
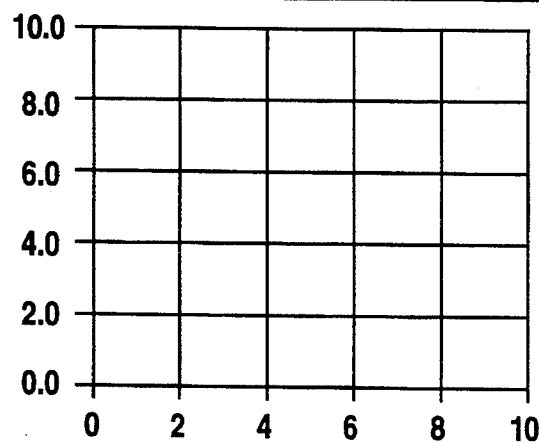
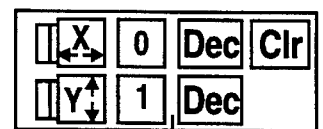 — Legend
— Palette
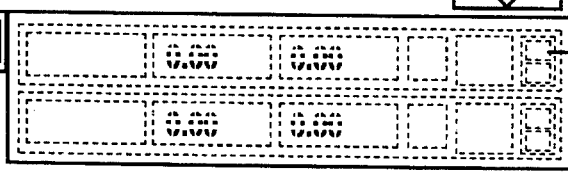 — Cursor Display
Fig. 135

X (or Y) Range Attribute
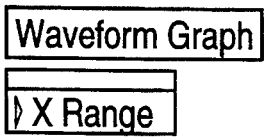
Wiring Example
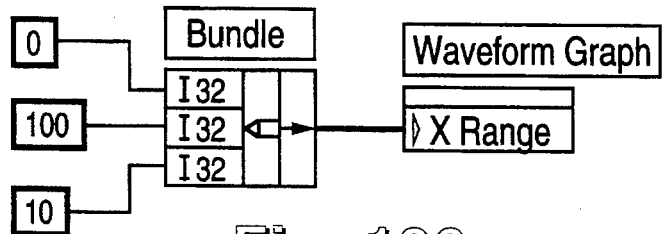
Fig. 136
Active Cursor and Cursor Position Attributes
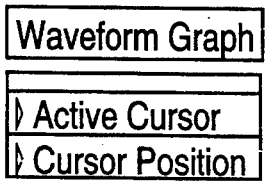
Wiring Example
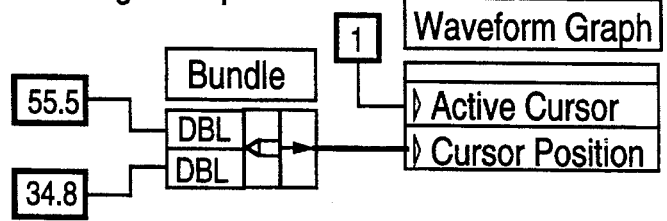
Fig. 137
Active Plot and Plot Color Attributes
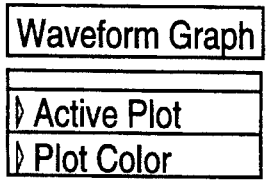
Wiring Example
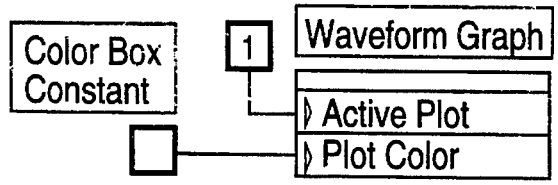
Fig. 138

Front Panel

Block Diagram

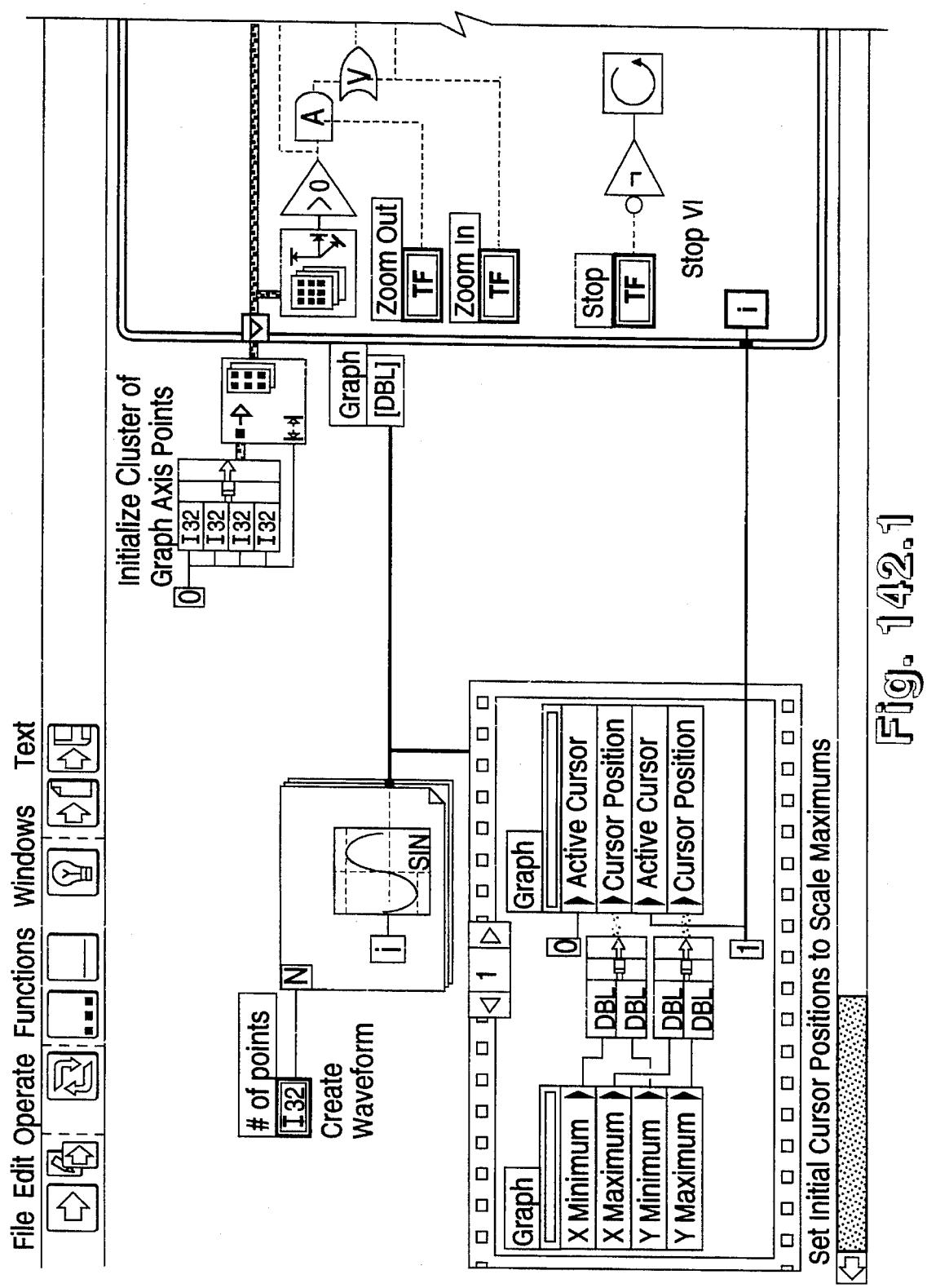
Fig. 142.1

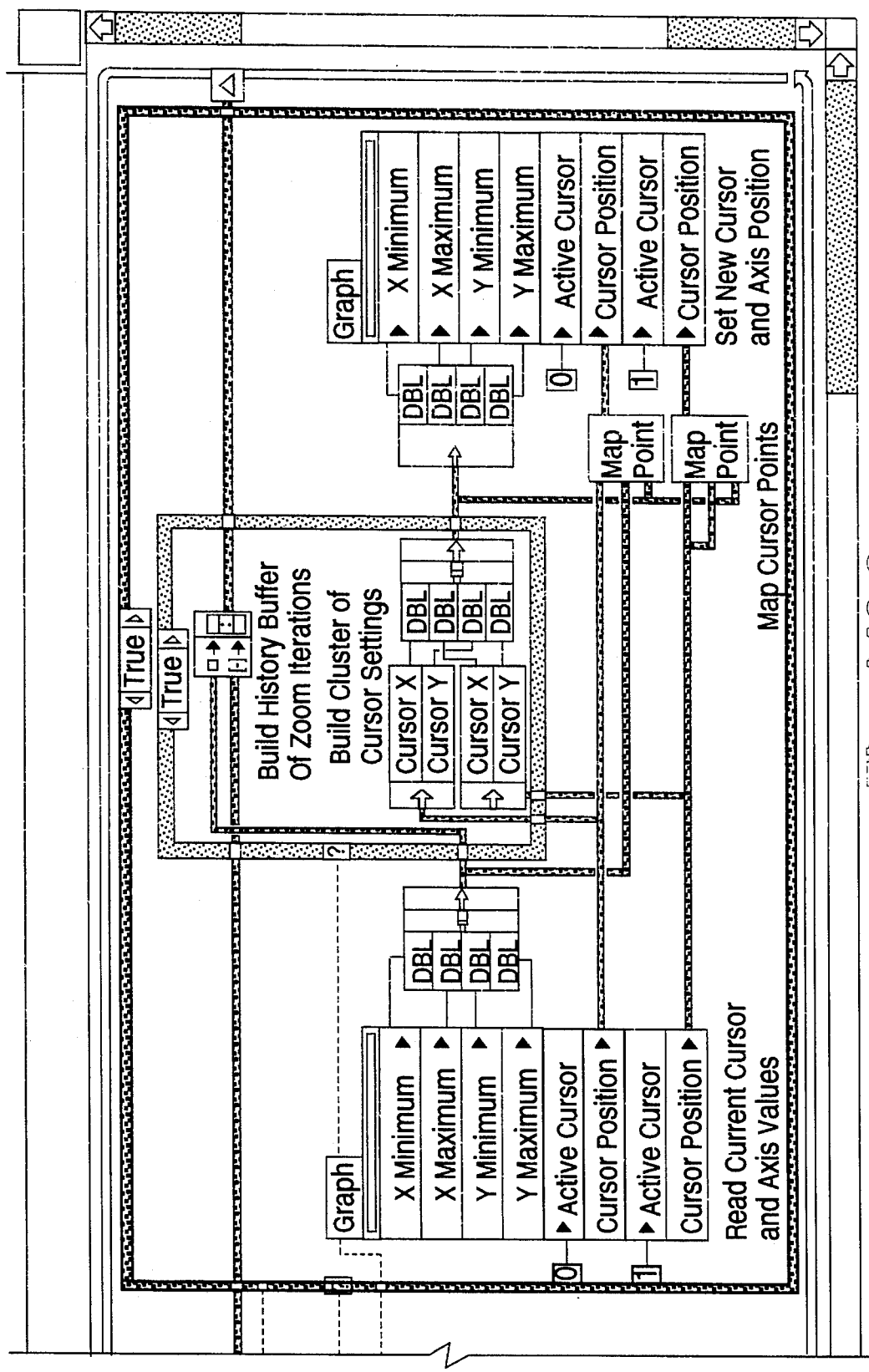
Fig. 142.2

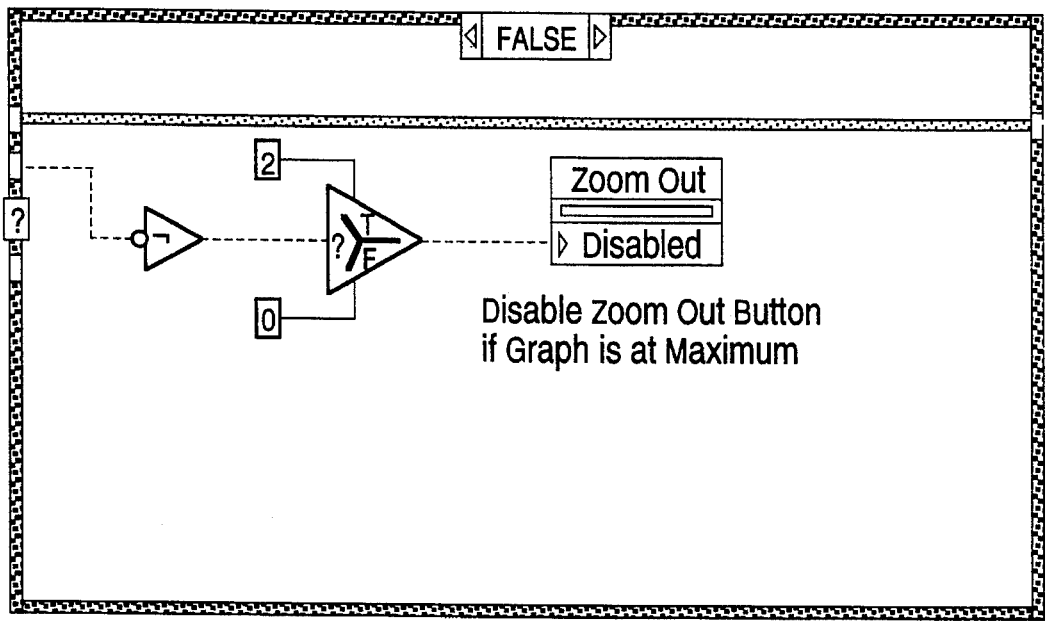
Fig 142A
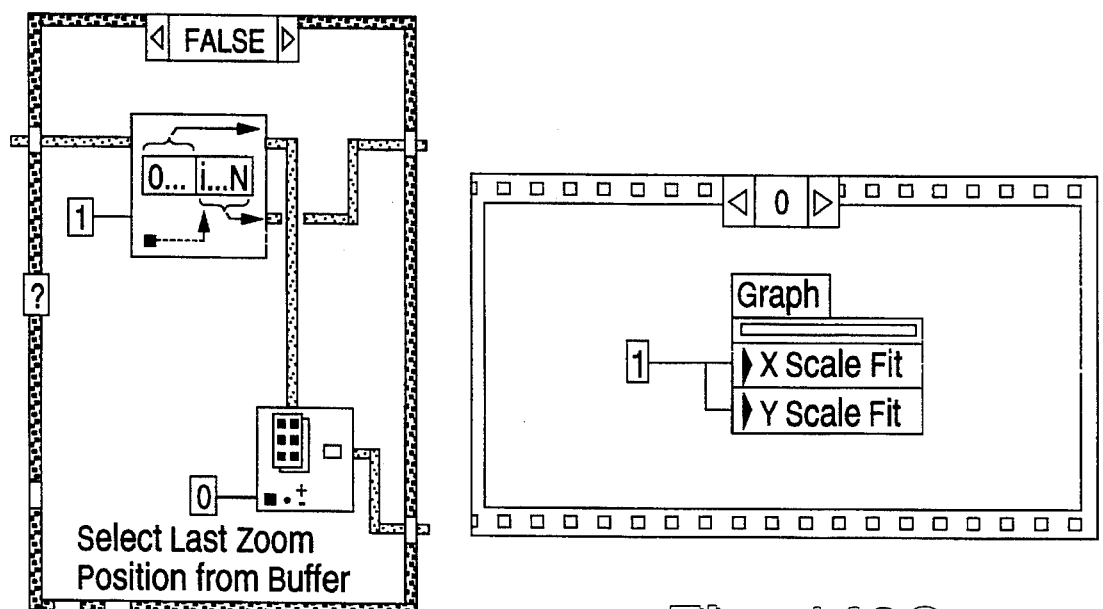
Fig. 142B
Fig. 142C

Front Panel
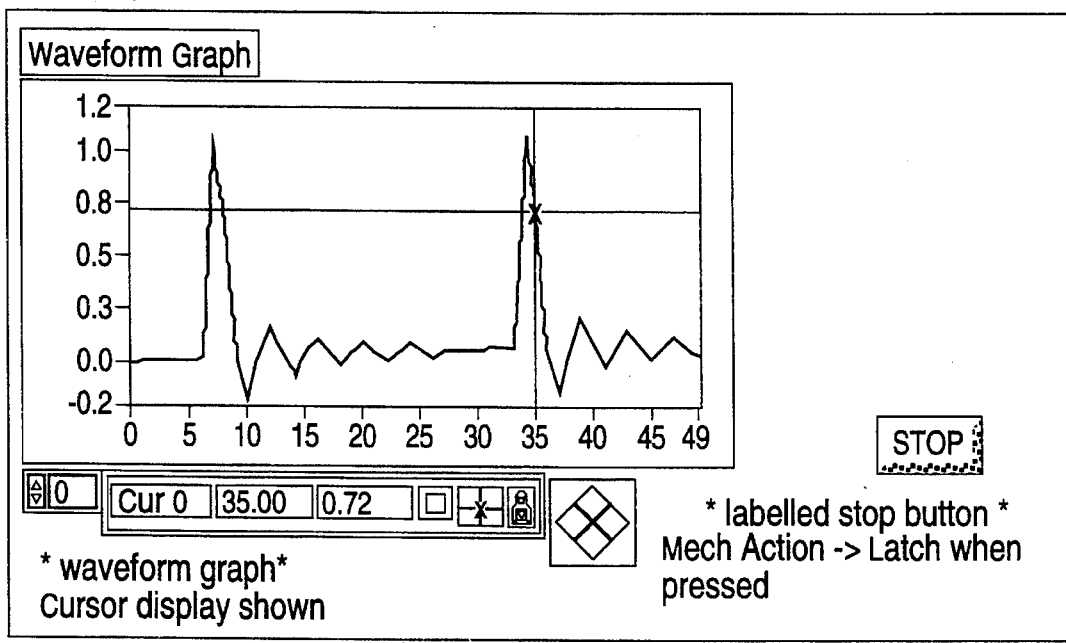
Fig. 143
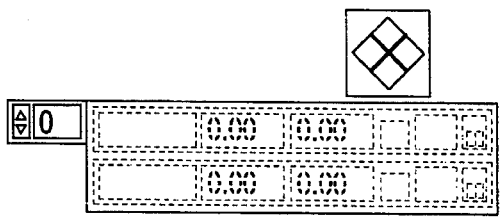
Fig. 144
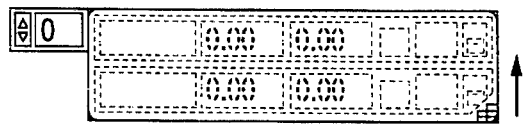
Fig. 145
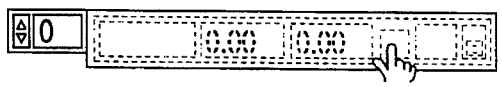
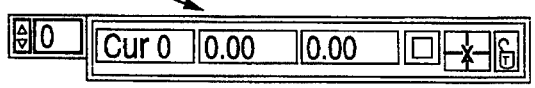
Fig. 146

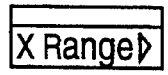 Select Item ▷ X Scale Info ▷ X Range ▷ All Elements

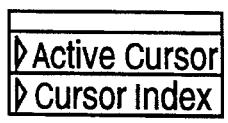 Use the Positioning tool to expand the attribute and add another input.
Select Item ▷ Active Cursor (Change To Write)
Select Item ▷ Cursor Attributes ▷ Cursor Index (Change To Write)

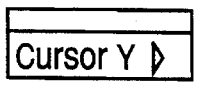 Select Item ▷ Cursor Attributes ▷ Cursor Position ▷ Cursor Y

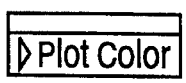 Select Item ▷ Plot Attributes ▷ Plot Color (Change To Write)

Fig. 148

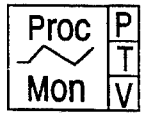

Process Monitor VC

Fig. 149A

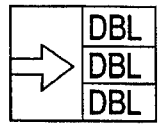

Unbundle Function

Fig. 149B

Add Function

Fig. 149C

Divide function

Fig. 149D

Round to nearest Function

Fig. 149E

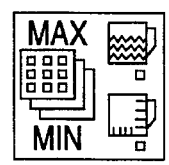

Array Max and Min Function

Fig. 149F

Equal ? Function

Fig. 149G

Color Box Constant

Fig. 149H

METHOD AND APPARATUS FOR PROVIDING ATTRIBUTE NODES IN A GRAPHICAL DATA FLOW ENVIRONMENT

This is a continuation-in-part of copending application Ser. No. 07/979,416, now U.S. Pat. No. 5,291,587, filed Nov. 19, 1992 for "Graphical System for Executing a Process and for Programming a Computer to Execute a Process, Including Graphical Variable Inputs and Variable Outputs" and assigned to National Instruments, which is a continuation of Ser. No. 07/376,257 filed Jul. 6, 1989, now abandoned, which was a continuation of Ser. No. 06/851,569 filed Apr. 14, 1986, which is now U.S. Pat. No. 4,901,221.

Reservation of Copyright

A portion of the disclosure of this patent document contains material to which a claim of copyright protection is made. The copyright owner has no objection to the facsimile reproduction by anyone of the patent document or the patent disclosure as it appears in the Patent and Trademark Office patent file or records, but reserves all other rights whatsoever.

BACKGROUND OF THE INVENTION

1. Field of the Invention

The present invention relates to graphical systems for creating and executing data flow programs, and more specifically to a method and apparatus for providing attribute nodes in a graphical data flow environment.

2. Description of the Related Art

A computer system can be envisioned as having a number of levels of complexity. Referring now to FIG. 1, the lowest level of a computer system may be referred to as the digital logic level. The digital logic level comprises the computer's true hardware, primarily consisting of gates which are integrated together to form various integrated circuits. Other hardware devices include printed circuit boards, the power supply, memory, and the various input/output devices, among others. Gates are digital elements having one or more digital inputs, signals representing 0 or 1 states, and which compute an output based on these inputs according to a simple function. Common examples of gates are AND gates, OR gates, etc. It is also noted that there is yet another level below level 0 which can be referred to as the device level. This level deals with the individual transistors and semiconductor physics necessary to construct the gates comprising the digital logic level.

The next level, referred to as level 1, is referred to as the microprogramming level. The microprogramming level is essentially a hybrid between computer hardware and software. The microprogramming level is typically implemented by software instructions stored in ROM (read only memory), these instructions being referred to as microcode. The microprogramming level can be thought of as including various interpreters comprised of sequences of microcode which carry out instructions available at the machine language level, which is at level 2. For example, when an instruction such as an arithmetic or shift function appears at the machine language level, this instruction is carried out one step at a time by an interpreter at the microprogramming level. Because the architecture of the microprogramming level is defined by hardware, it is a very difficult level in which to program. Timing considerations are frequently very important in programming at this level and thus usually only very skilled, experienced microprogrammers operate at this level.

As mentioned above, the level above the microprogramming level is referred to as the machine language level. The machine language level comprises the 1's and 0's that a program uses to execute instructions and manipulate data. The next level above the machine language level is referred to as the assembly language level. This level includes the instruction set of the computer system, i.e. the various op codes, instruction formats, etc. that cause the computer to execute instructions. In assembly language each instruction produces exactly one machine language instruction. Thus, there is a one to one correspondence between assembly language instructions and machine language instructions. The primary difference is that assembly language uses very symbolic human-readable names and addresses instead of binary ones to allow easier programming. For example, where a machine language instruction might include the sequence "101101," the assembly language equivalent might be "ADD." Therefore, assembly language is typically the lowest level language used by programmers, and assembly language programming requires a skilled and experienced programmer.

The next level includes high level text-based programming languages which are typically used by programmers in writing applications programs. Many different high level programming languages exist, including BASIC, C, FORTRAN, Pascal, COBOL, ADA, APL, etc. Programs written in these high level languages are translated to the machine language level by translators known as compilers. The high level programming languages in this level, as well as the assembly language level, are referred to in this disclosure as text-based programming environments.

Increasingly computers are required to be used and programmed by those who are not highly trained in computer programming techniques. When traditional text-based programming environments are used, the user's programming skills and ability to interact with the computer system often become a limiting factor in the achievement of optimal utilization of the computer system.

There are numerous subtle complexities which a user must master before he can efficiently program a computer system in a text-based environment. For example, text-based programming environments have traditionally used a number of programs to accomplish a given task. Each program in turn often comprises one or more subroutines. Software systems typically coordinate activity between multiple programs, and each program typically coordinates activity between multiple subroutines. However, in a text-based environment, techniques for coordinating multiple programs generally differ from techniques for coordinating multiple subroutines. Furthermore, since programs ordinarily can stand alone while subroutines usually cannot in a text-based environment, techniques for linking programs to a software system generally differ from techniques for linking subroutines to a program. Complexities such as these often make it difficult for a user who is not a specialist in computer programming to efficiently program a computer system in a text-based environment.

The task of programming a computer system to model a process often is further complicated by the fact that a sequence of mathematical formulas, mathematical steps or other procedures customarily used to conceptually model a process often does not closely correspond to the traditional text-based programming techniques used to program a computer system to model such a process. For example, a computer programmer typically develops a conceptual model for a physical system which can be partitioned into functional blocks, each of which corresponds to actual systems or subsystems. Computer systems, however, ordinarily do not actually compute in accordance with such conceptualized functional blocks. Instead, they often utilize calls to various subroutines and the retrieval of data from different memory storage locations to implement a procedure which could be conceptualized by a user in terms of a functional block. In other words, the requirement that a user program in a text-based programming environment places a level of abstraction between the user's conceptualization of the solution and the implementation of a method that accomplishes this solution in a computer program. Thus, a user often must substantially master different skills in order to both conceptually model a system and then to program a computer to model that system. Since a user often is not fully proficient in techniques for programming a computer system in a text-based environment to implement his model, the efficiency with which the computer system can be utilized to perform such modeling often is reduced.

One particular field in which computer systems are employed to model physical systems is the field of instrumentation. An instrument is a device which collects information from an environment and displays this information to a user. Examples of various types of instruments include oscilloscopes, digital multimeters, pressure sensors, etc. Types of information which might be collected by respective instruments include: voltage, resistance, distance, velocity, pressure, frequency of oscillation, humidity or temperature, among others. An instrumentation system ordinarily controls its constituent instruments from which it acquires data which it analyzes, stores and presents to a user of the system. Computer control of instrumentation has become increasingly desirable in view of the increasing complexity and variety of instruments available for use.

In the past, many instrumentation systems comprised individual instruments physically interconnected. Each instrument typically included a physical front panel with its own peculiar combination of indicators, knobs, or switches. A user generally had to understand and manipulate individual controls for each instrument and record readings from an array of indicators. Acquisition and analysis of data in such instrumentation systems was tedious and error prone. An incremental improvement in the manner in which a user interfaced with various instruments was made with the introduction of centralized control panels. In these improved systems, individual instruments were wired to a control panel, and the individual knobs, indicators or switches of each front panel were either preset or were selected to be presented on a common front panel.

A significant advance occurred with the introduction of computers to provide more flexible means for interfacing instruments with a user. In such computerized instrumentation systems the user interacted with a software program executing on the computer system through the video monitor rather than through a manually operated front panel. These earlier improved instrumentation systems provided significant performance efficiencies over earlier systems for linking and controlling test instruments.

However, these improved instrumentation systems had significant drawbacks. For example, due to the wide variety of possible testing situations and environments, and also the wide array of instruments available, it was often necessary for a user to develop a program to control the new instrumentation system desired. As discussed above, computer programs used to control such improved instrumentation systems had to be written in conventional text-based programming languages such as, for example, assembly language, C, FORTRAN, BASIC, or Pascal. Traditional users of instrumentation systems, however, often were not highly trained in programming techniques and, in addition, traditional text-based programming languages were not sufficiently intuitive to allow users to use these languages without training. Therefore, implementation of such systems frequently required the involvement of a programmer to write software for control and analysis of instrumentation data. Thus, development and maintenance of the software elements in these instrumentation systems often proved to be difficult.

U.S. Pat. No. 4,901,221 to Kodosky et al discloses a graphical system and method for modeling a process, i.e. a graphical programming environment which enables a user to easily and intuitively model a process. The graphical programming environment disclosed in Kodosky et al can be considered the highest and most intuitive way in which to interact with a computer. Referring now to FIG. 1A, a graphically based programming environment can be represented at level 5 above text-based high level programming languages such as C, Pascal, etc. The method disclosed in Kodosky et al allows a user to construct a diagram using a block diagram editor such that the diagram created graphically displays a procedure or method for accomplishing a certain result, such as manipulating one or more input variables to produce one or more output variables. As the user constructs the data flow diagram using the block diagram editor, machine language instructions are automatically constructed which characterize an execution procedure which corresponds to the displayed procedure. Therefore, a user can create a text-based computer program solely by using a graphically based programming environment. This graphically based programming environment may be used for creating virtual instrumentation systems and modeling processes as well as for any type of general programming.

Therefore, Kodosky et al teaches a graphical programming environment wherein a user manipulates icons in a block diagram using a block diagram editor to create a data flow "program" or virtual instrument (VI). In creating a virtual instrument, a user first creates a front panel including various controls or indicators that represent the respective input and output that will be used by the VI. When the controls and indicators are created in the front panel, corresponding icons or terminals are automatically created in the block diagram by the block diagram editor. The user then chooses various functions that accomplish his desired result, connecting the corresponding function icons between the terminals of the respective controls and indicators. In other words, the user creates a data flow program, referred to as a block diagram, representing the graphical data flow which accomplishes his desired function. This is done by wiring up the various function icons between the control icons and indicator icons. The manipulation and organization of icons in turn produces machine language that accomplishes the desired method or process as shown in the block diagram. A user then optionally chooses a connector pane representing the input and output terminals corresponding to the respective controls and indicators already created.

Once the controls and indicators have been placed on the front panel and a connector pane has been selected, a user will then associate respective terminals on the connector pane to the respective controls and indicators on the front panel. For example, if a connector pane having three terminals has been selected, and two controls and one indicator are created on the front panel, the user can designate respective terminals on the connector pane to correspond to the respective controls and indicators on the front panel.

A user inputs data to a virtual instrument using front panel controls. This input data propagates through the data flow block diagram or graphical program and appears as changes on the output indicators. The data that flows from the controls to the indicators in this manner is referred to as control data. In an instrumentation application, the front panel can be analogized to the front panel of an instrument. The user adjusts the controls on the front panel to affect the input and views the output on the respective indicators.

While a user could adjust the input to the virtual instrument using controls on the front panel and view the corresponding change in output on indicators on the front panel, the user could not affect any other changes to the front panel during execution. For example, the user often desired to change the appearance of a control, i.e. write to a control, on the front panel during execution of a program to provide a more meaningful and more intuitive visual display. For example, it would be highly desirable that the user be able to move cursors on a graph to select points as input to further parts of the block diagram. It would also be desirable for a data flow program or block diagram to have the ability to programmatically change the appearance of a control or write to a control during execution. For example, the user may want the block diagram to automatically change the display colors on an indicator depending on whether a certain output is above or below a certain level. One example of this is where the user wants the output of an indicator to show up in green if a given process being modelled is running in a normal manner and show up in red if the process is operating at undesirable levels. The user may also want to be able to program the block diagram to automatically hide certain controls or indicators when they are not in use.

In the method and apparatus described in Kodosky et al., it was not possible for the user to programmatically control the appearance of the front panel during execution other than control data that appeared as conventional output data. Therefore, a method and apparatus is desired to enable a user to set and read various attributes which affect the appearance of controls on a front panel programmatically and can also enable the user to provide interactive input that can be read by a block diagram as it is executing.

SUMMARY OF THE INVENTION

The present invention comprises a system and method which allows a user to programmatically access various parameters of a control or indicator. In this manner, a user can programmatically make changes that affect the output or appearance of controls and indicators. A user can also access these parameters interactively during execution of a block diagram. In the preferred embodiment of the invention, a user can create an object referred to as an attribute node corresponding to a control containing one or more attributes that affect parameters of the control, such as the color used for the respective display, the visibility of the control, the scales or cursor position for respective graphs or charts, etc. The parameters of a control or indicator on the front panel which can be programmatically accessed according to the present invention are referred to as attributes.

An attribute node is associated with a control on the front panel and operates to provide a more meaningful visual output to the user. The purpose of an attribute node is to affect the visual output of a control provided on the front panel depending on events which occur during execution of a VI or on user input during execution of a VI. An attribute node thus allows the execution subsystem to monitor user interaction by reading attribute data that previously was not available to the program. A control may be referred to as a data source, whereas an indicator may be referred to as a data sink. An attribute node operates on panel display elements regardless of whether the data flow happens to be from a data source or a data sink.

An attribute node allows two types of operations, these being reading from an attribute node or writing to an attribute node. These operations of reading and writing an attribute can be performed either by a block diagram during execution, wherein the user has programmed the block diagram to perform this function, or interactively by the user during execution. The process of writing to an attribute node refers to the execution subsystem updating an attribute of a control in the front panel display to reflect an attribute that has been set programmatically in a block diagram. The user can also "write" to an attribute by providing input to or manipulating a control in the front panel during execution of a block diagram. Reading an attribute node refers to the execution subsystem reading the value of an attribute for a certain control during block diagram execution that may have been changed by the user, or may have been changed during execution of a VI by the execution subsystem. The user can also view changes to the attribute during execution. Some attributes can be changed by a user and practically all can be changed by the execution subsystem. Therefore, during execution of a VI, the process of writing to an attribute node corresponds to changing the front panel display and thus affecting what the user actually sees. The step of reading an attribute node does not actively change the front panel, but allows the program to see how the user or block diagram is changing the front panel. Knowing this, the program can make further decisions, thus greatly increasing the flexibility of a VI.

BRIEF DESCRIPTION OF THE DRAWINGS

The purpose and advantages of the present invention will be apparent to those skilled in the art from the following detailed description in conjunction with the appended drawings in which:

FIG. 1 illustrates various levels of complexity in a computer system according to the prior art;

FIG. 1A illustrates the various levels of complexity of a computer system including a graphical programming environment as the highest level;

FIG. 6 is a block diagram of the computer system of FIGS. 5 and 5A;

FIG. 18 illustrates a type descriptor used to describe data structures;

FIG. 48 illustrates the run mode palette that appears at the top of the window when a VI is in run mode;

FIGS. 49A–D illustrate the run button and its associated icons;

FIGS. 50A–B illustrate the mode button in run mode and edit mode;

FIGS. 51A–B illustrate the icons associated with the continuous run button;

FIGS. 52A–B illustrate breakpoint button icons;

FIGS. 53A–C illustrate icons associated with the step mode button;

FIGS. 54A–B illustrate execution highlighting button icons;

FIGS. 55A–B illustrate print mode button icons;

FIGS. 56A–C illustrate data logging button icons;

FIG. 57 illustrates the edit mode palette;

FIGS. 58A–B illustrate operating tool icons;

FIGS. 59A–C illustrate positioning tool icons;

FIGS. 60A–C illustrate labeling tool icons;

FIG. 61 illustrates the wiring tool;

FIGS. 62A–B illustrate the coloring tool;

FIG. 63 illustrates the menu bar in its active state;

FIG. 64 illustrates the file menu;

FIG. 65 illustrates the edit menu;

FIG. 66 illustrates the operate menu;

FIG. 67 illustrates the controls menu;

FIG. 76 illustrates examples of wire types;

FIGS. 77 and 78 are examples of VIs;

FIG. 96 illustrates the grey dot created during numeric conversions;

FIG. 97 illustrates a shift register;

FIG. 98 llustrates the operation of a shift register;

FIG. 99 illustrates a shift register with additional terminals to access values from previous iterations;

FIG. 119 illustrates the change to read option for an attribute node;

FIG. 120 illustrates use of the disabled attribute to disable and gray out a control;

FIG. 121 illustrates multiple terminal attribute nodes;

FIG. 122 illustrates highlighting attribute nodes using the find option;

FIG. 126 illustrates a visible attribute for a digital control as well as a wiring example of the attribute;

FIG. 127 illustrates the disabled attribute for a digital control as well as two wiring examples;

FIG. 128 illustrates the format and precision attribute for a digital control as well as a wiring example;

FIG. 129 illustrates the strings [4] attribute for a labelled button and a wiring example;

FIG. 130 illustrate the colors [4] attribute for a labelled button and a wiring example;

FIG. 131 is a flowchart diagram illustrating execution of an attribute node;

FIG. 132 illustrates the front panel of a VI that simulates a process monitor system;

FIG. 133 illustrates the block diagram of a VI that simulates a process monitor system;

Figure 133:
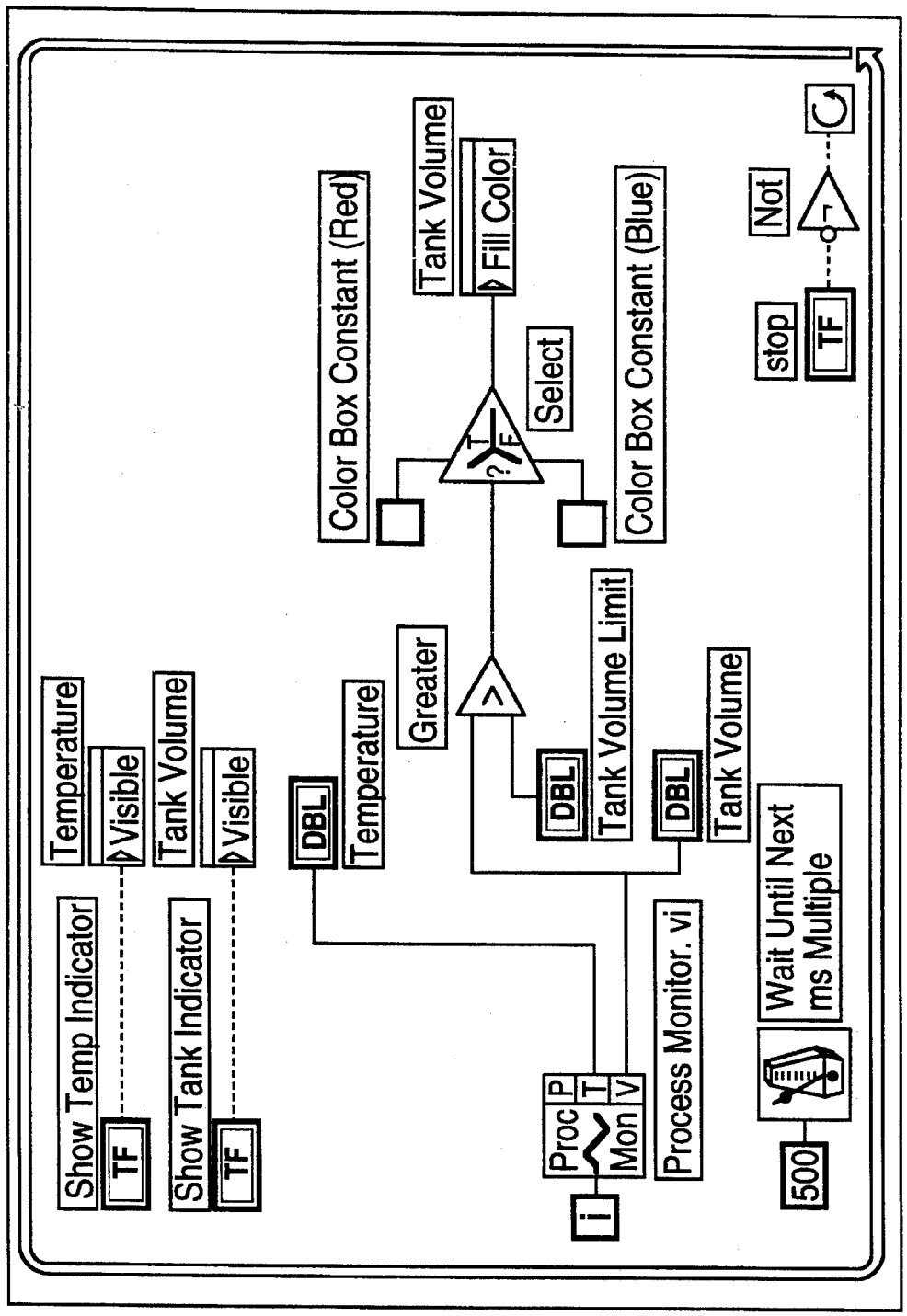
Figure 139:
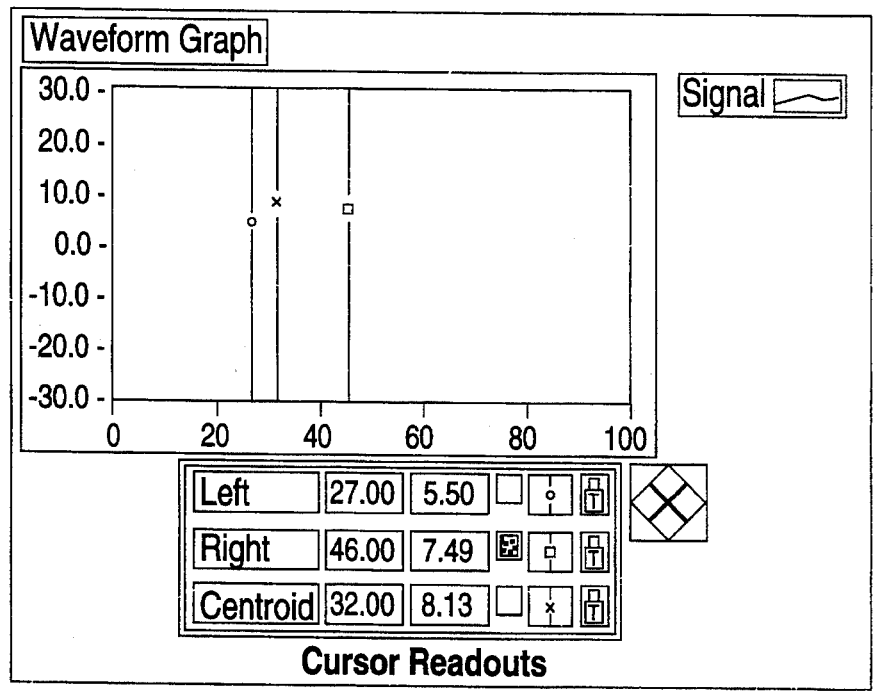
Figure 140:
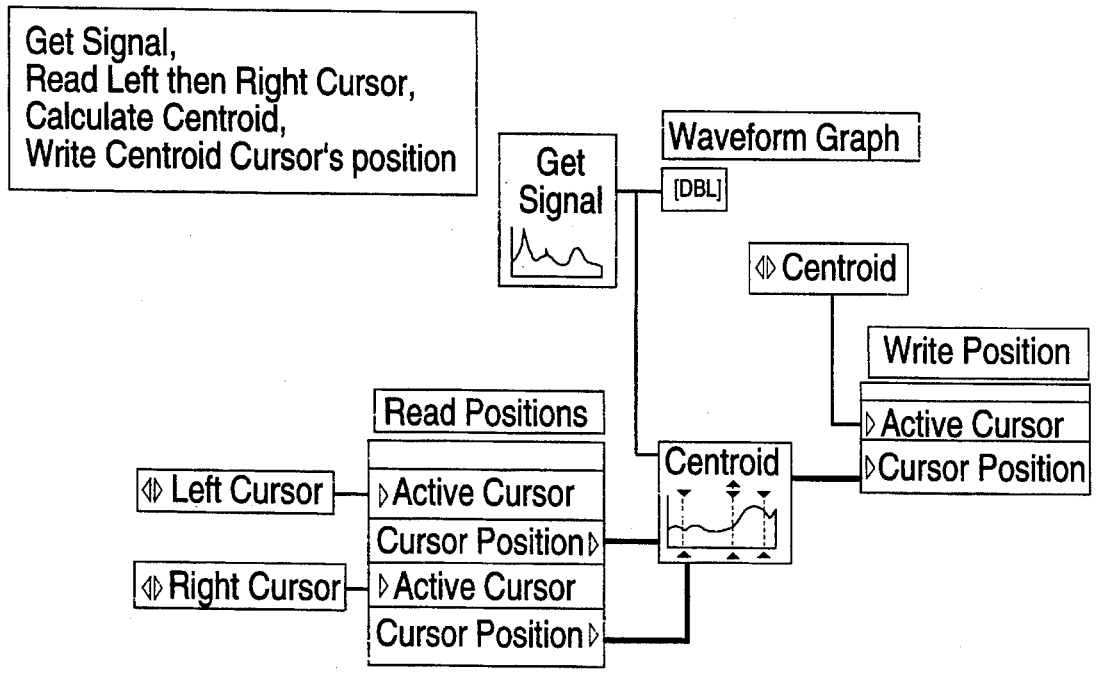
Figure 141:
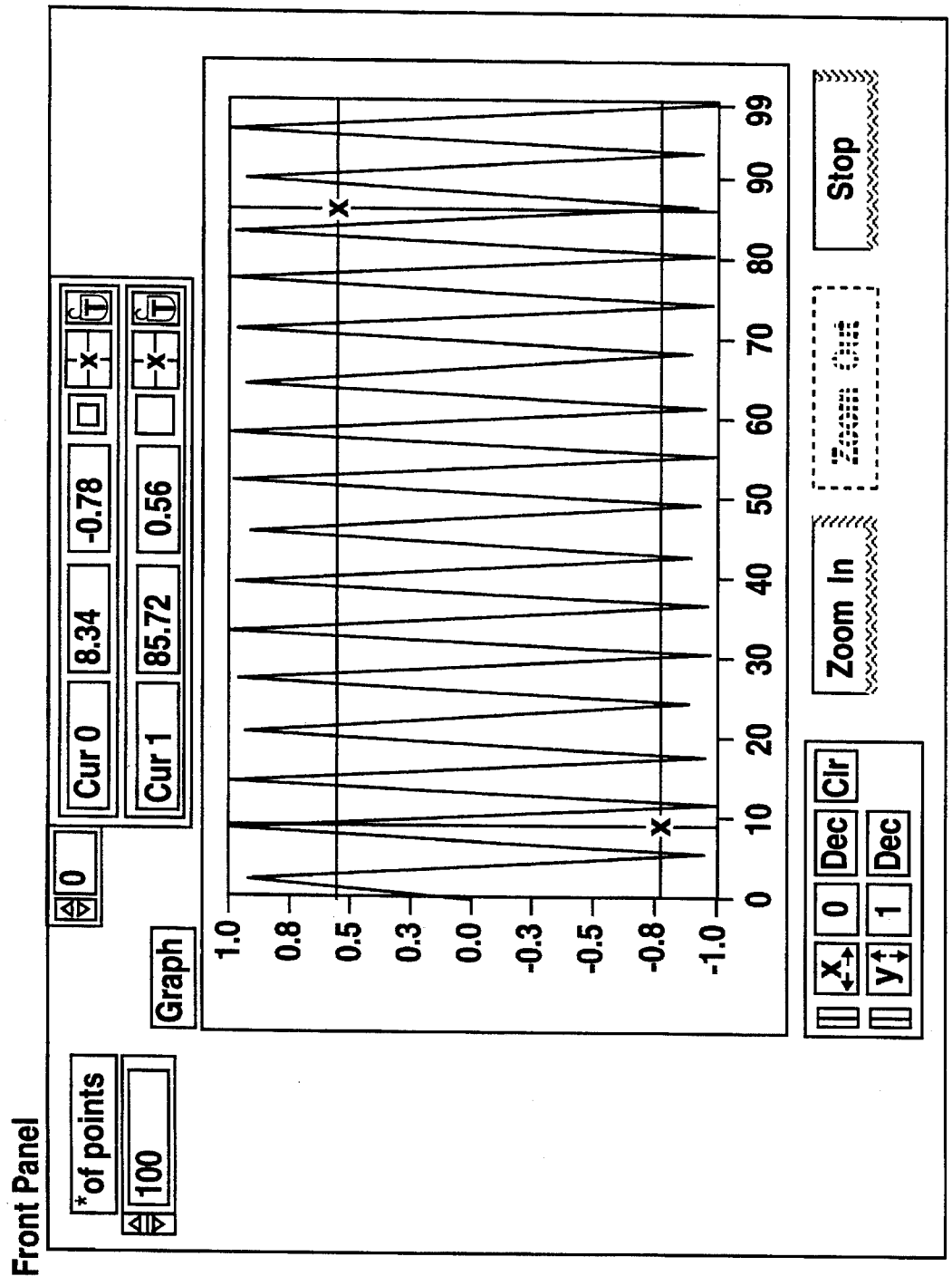
Figure 147:
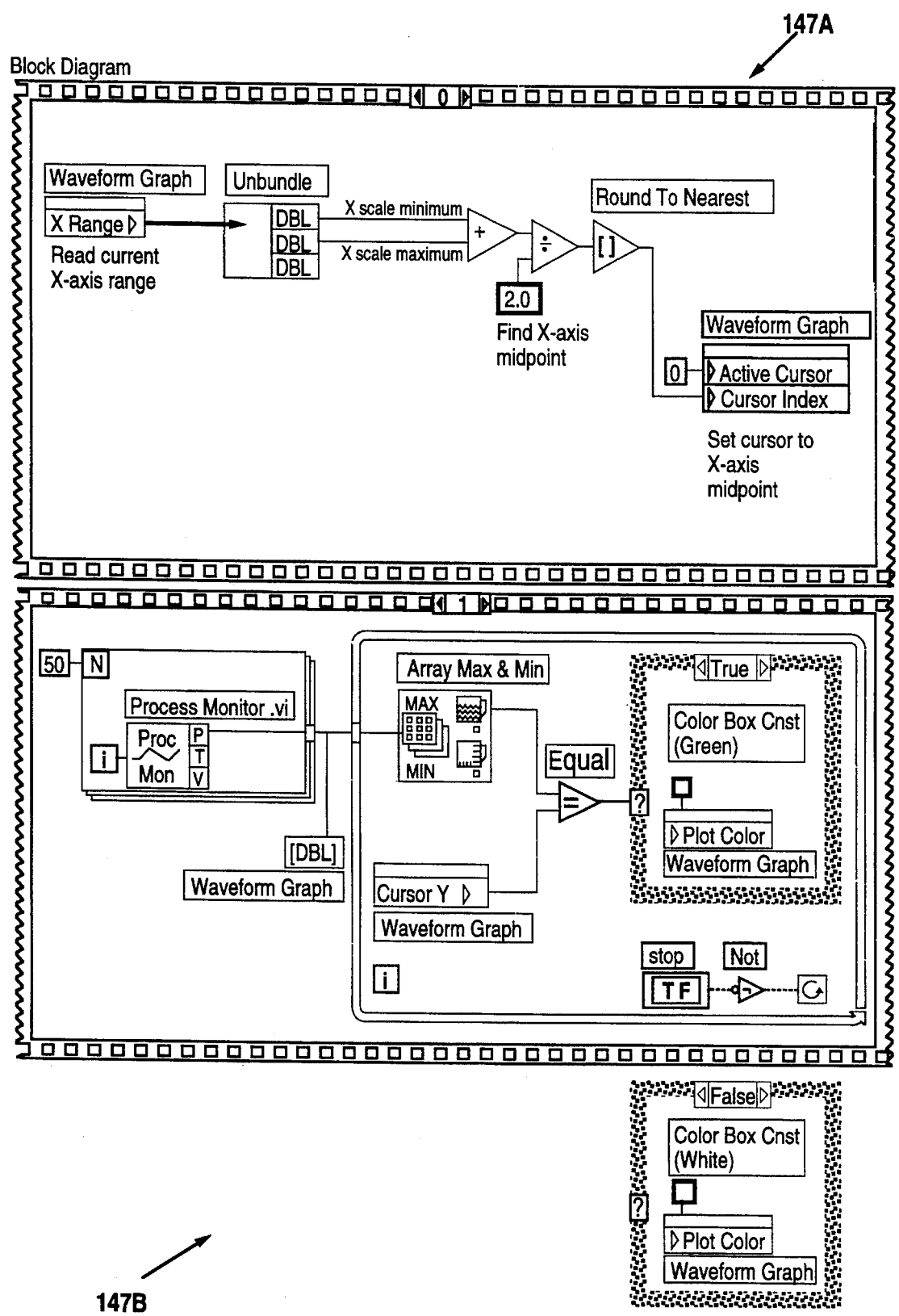
Figure 147A:
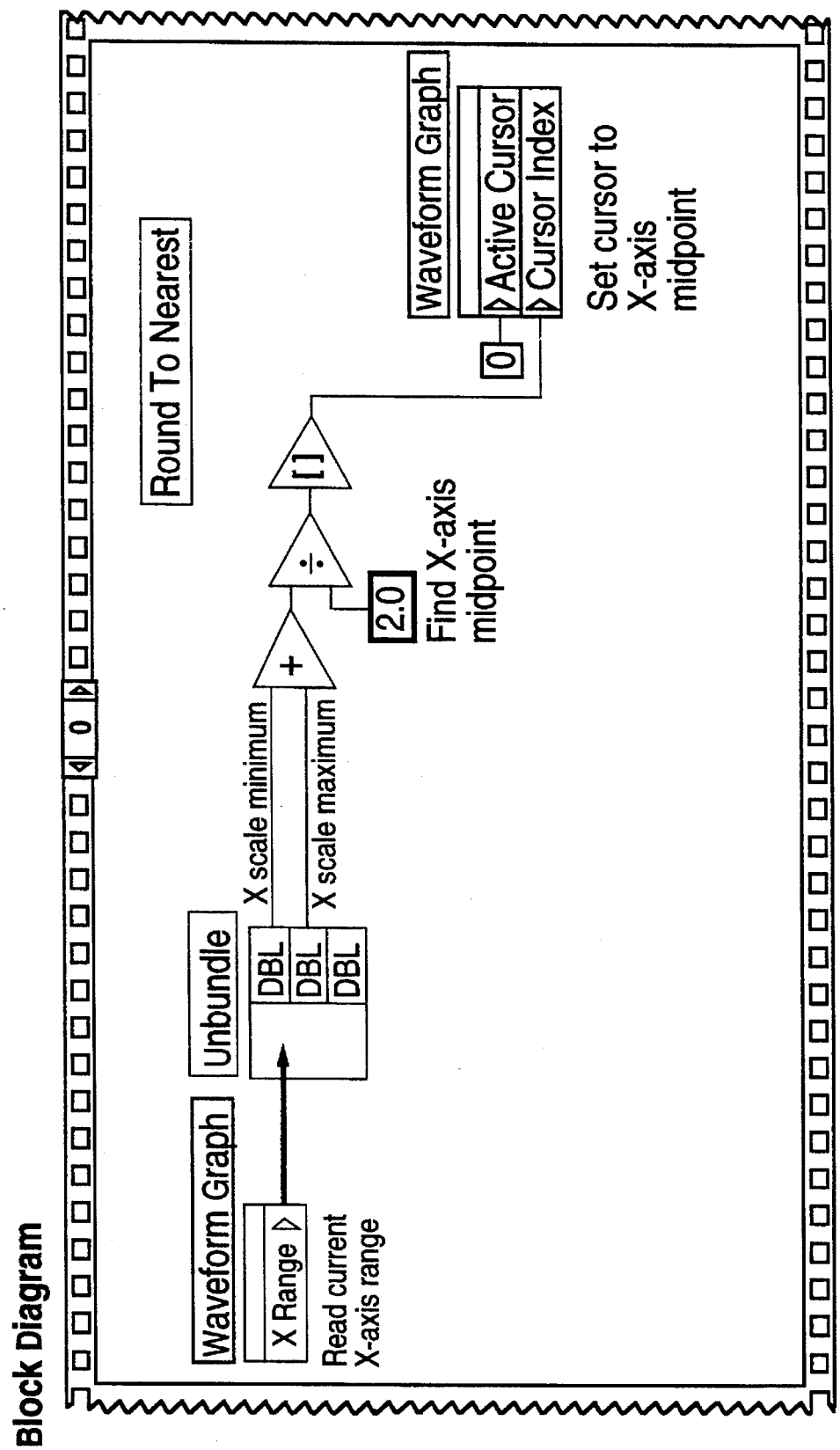
Figure 147B:
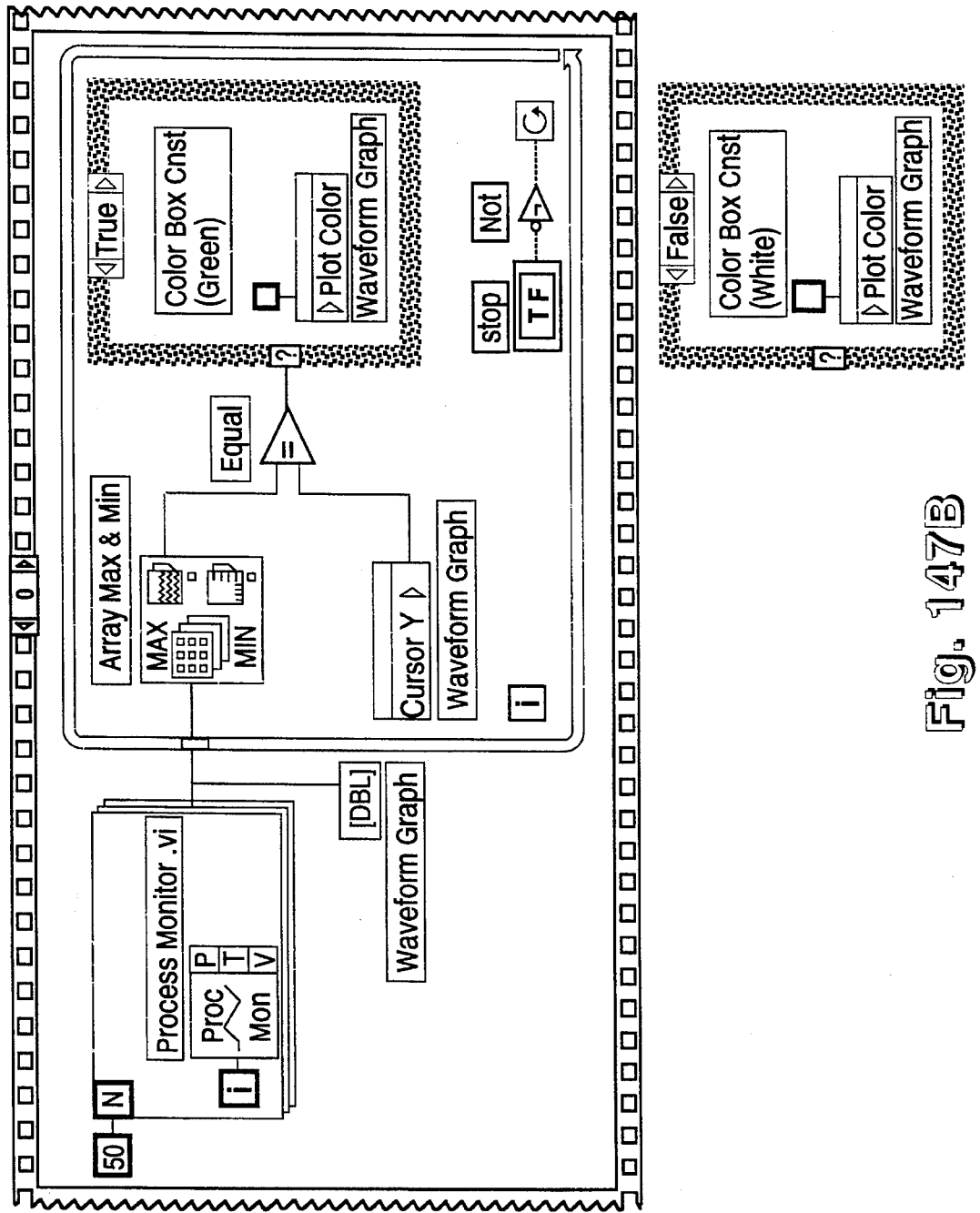
Figure 150A:
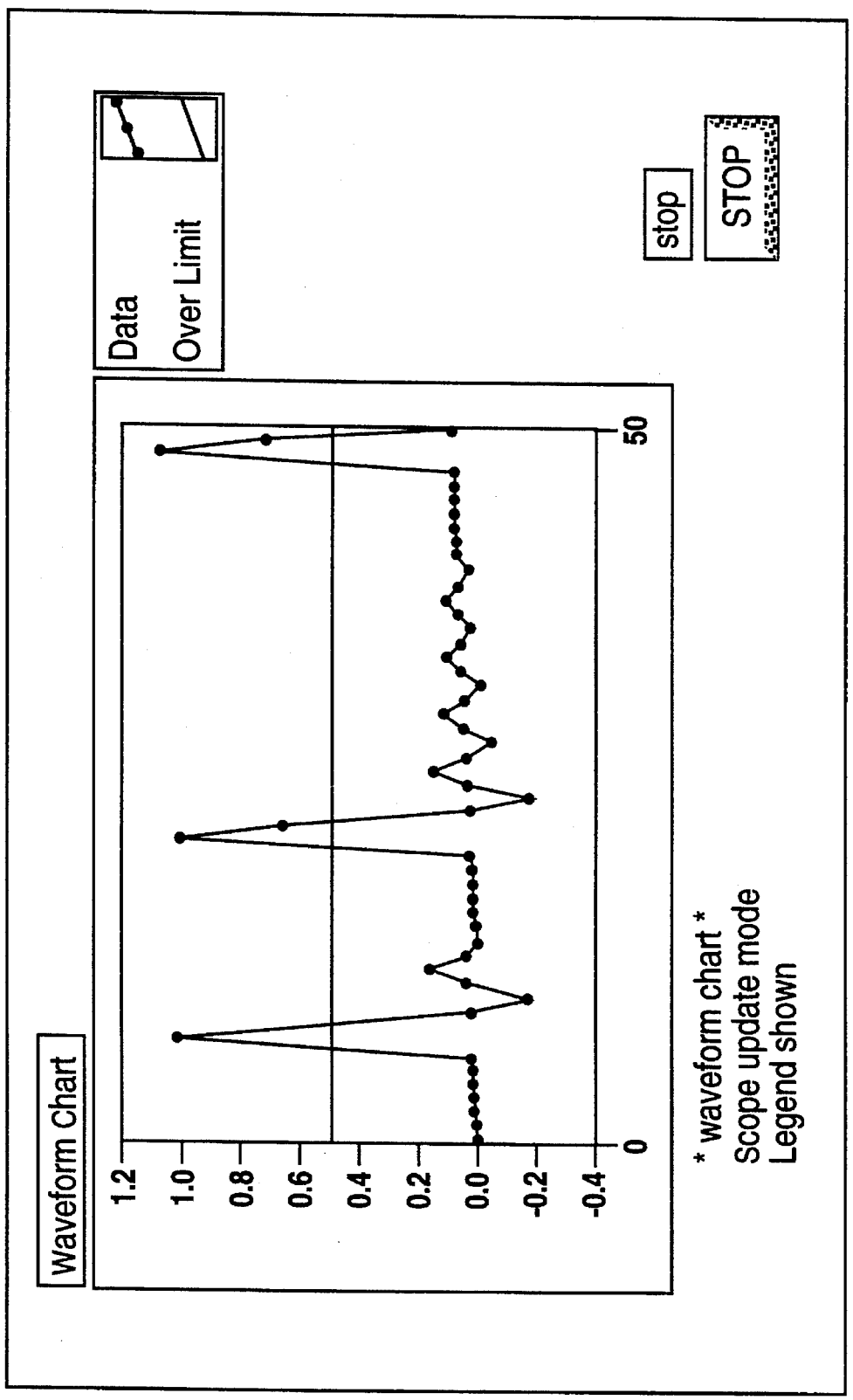
Figure 150B:
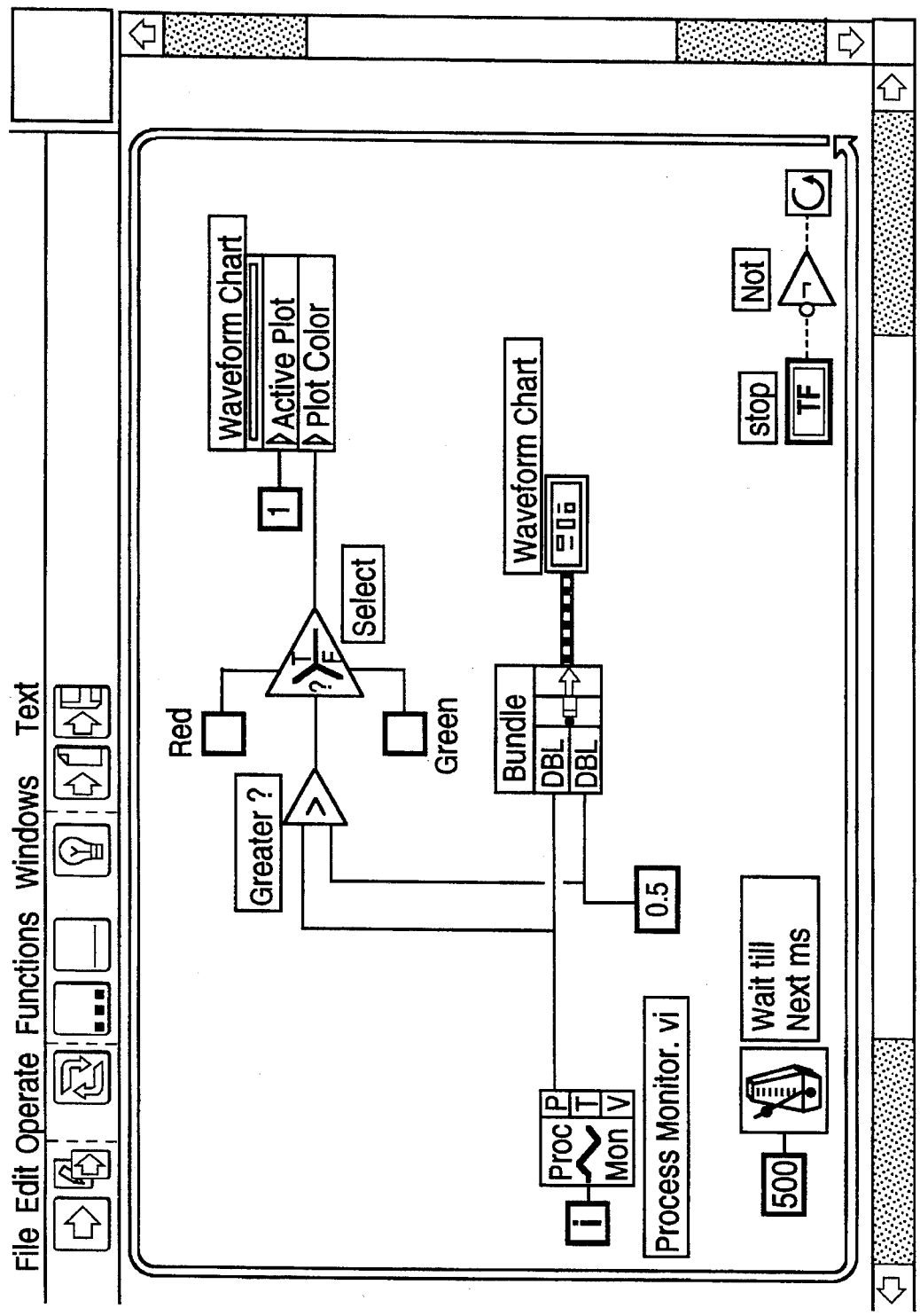
Figure 151:
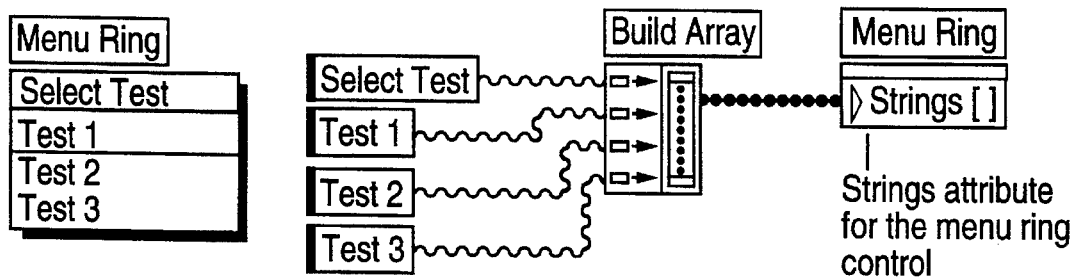
Figure 152:
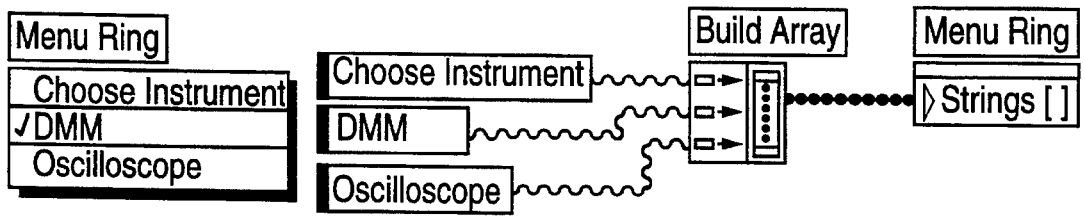
Figure 153:
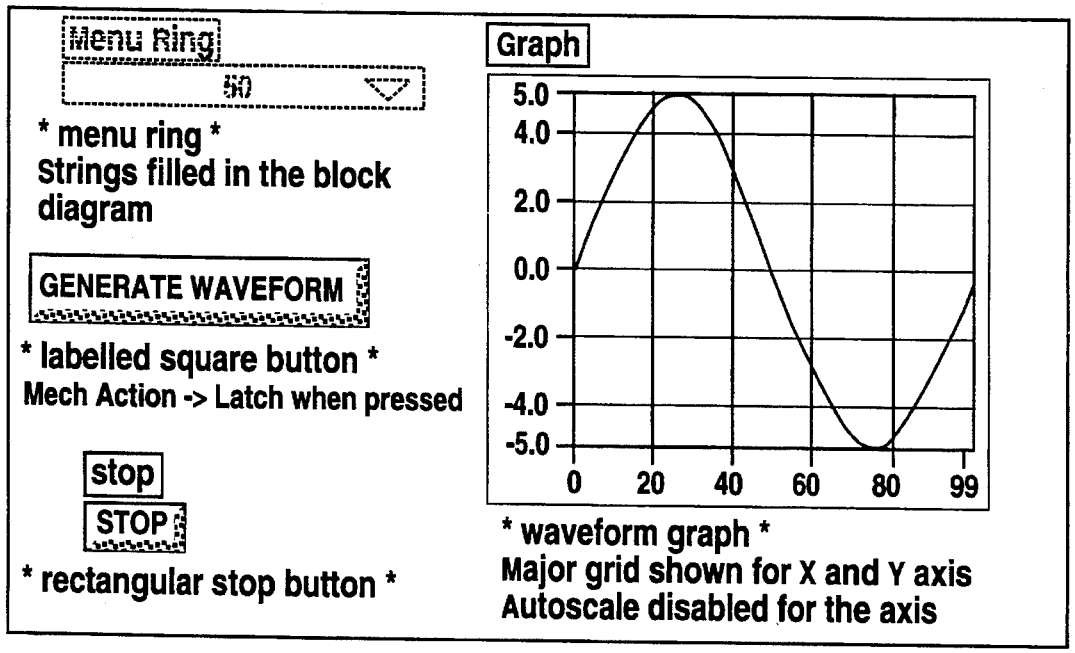
Figure 154:
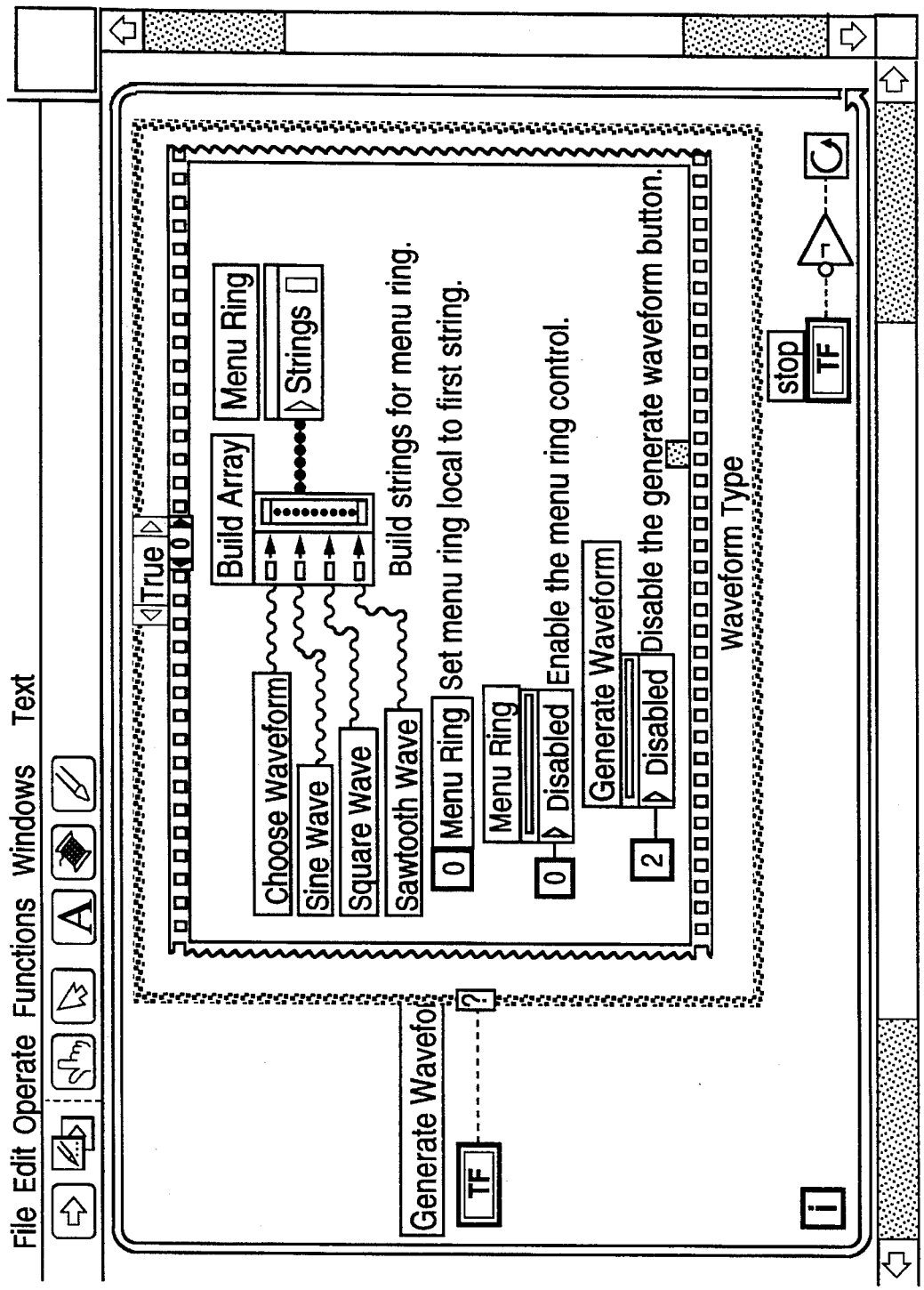
Figure 154A:
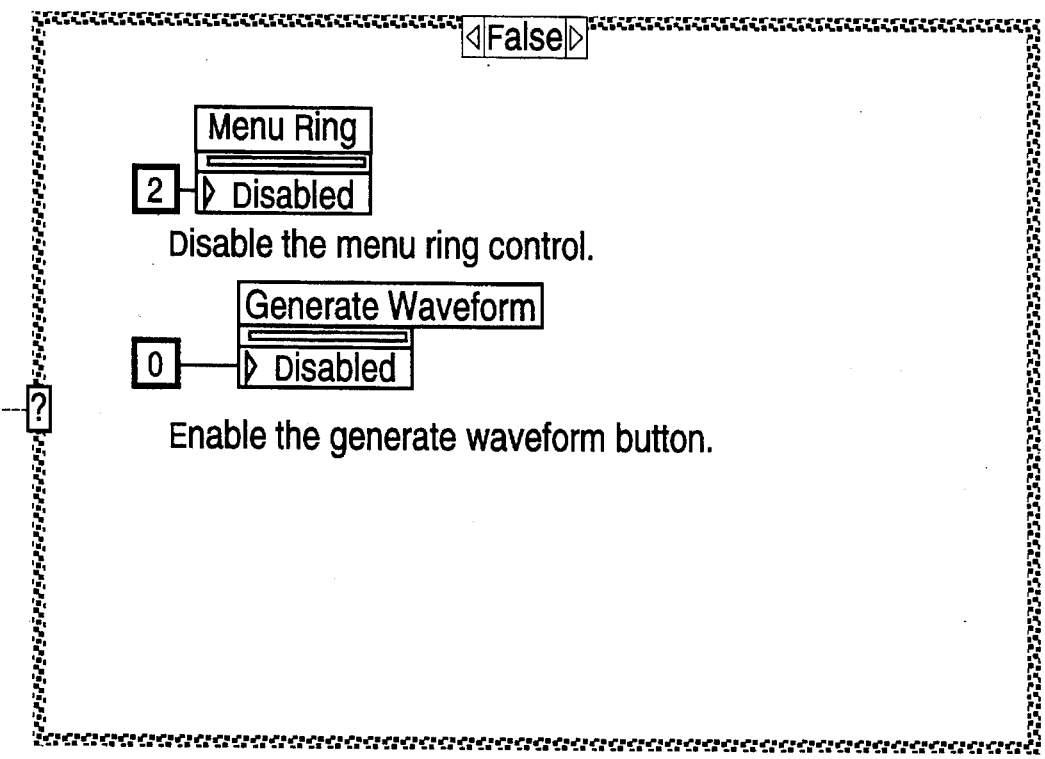
Figure 155A:
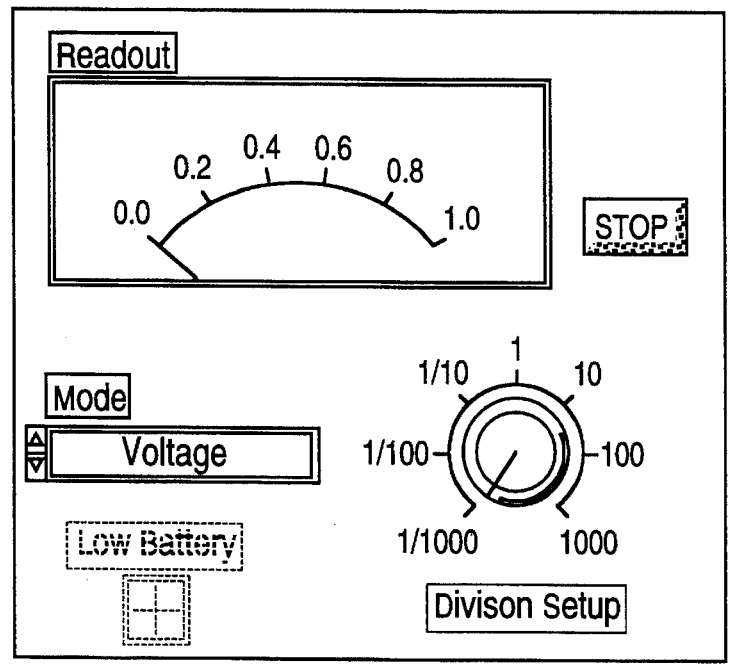
Figure 155B:
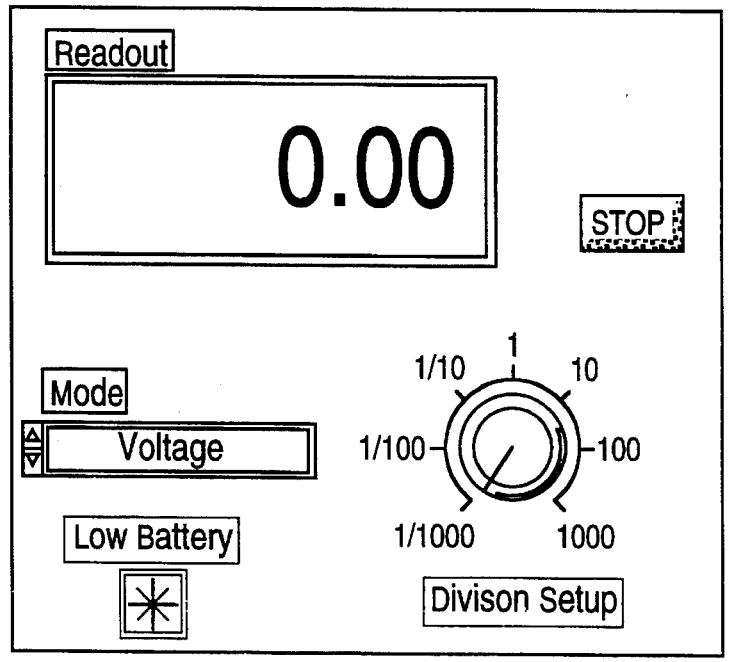
Figure 156:
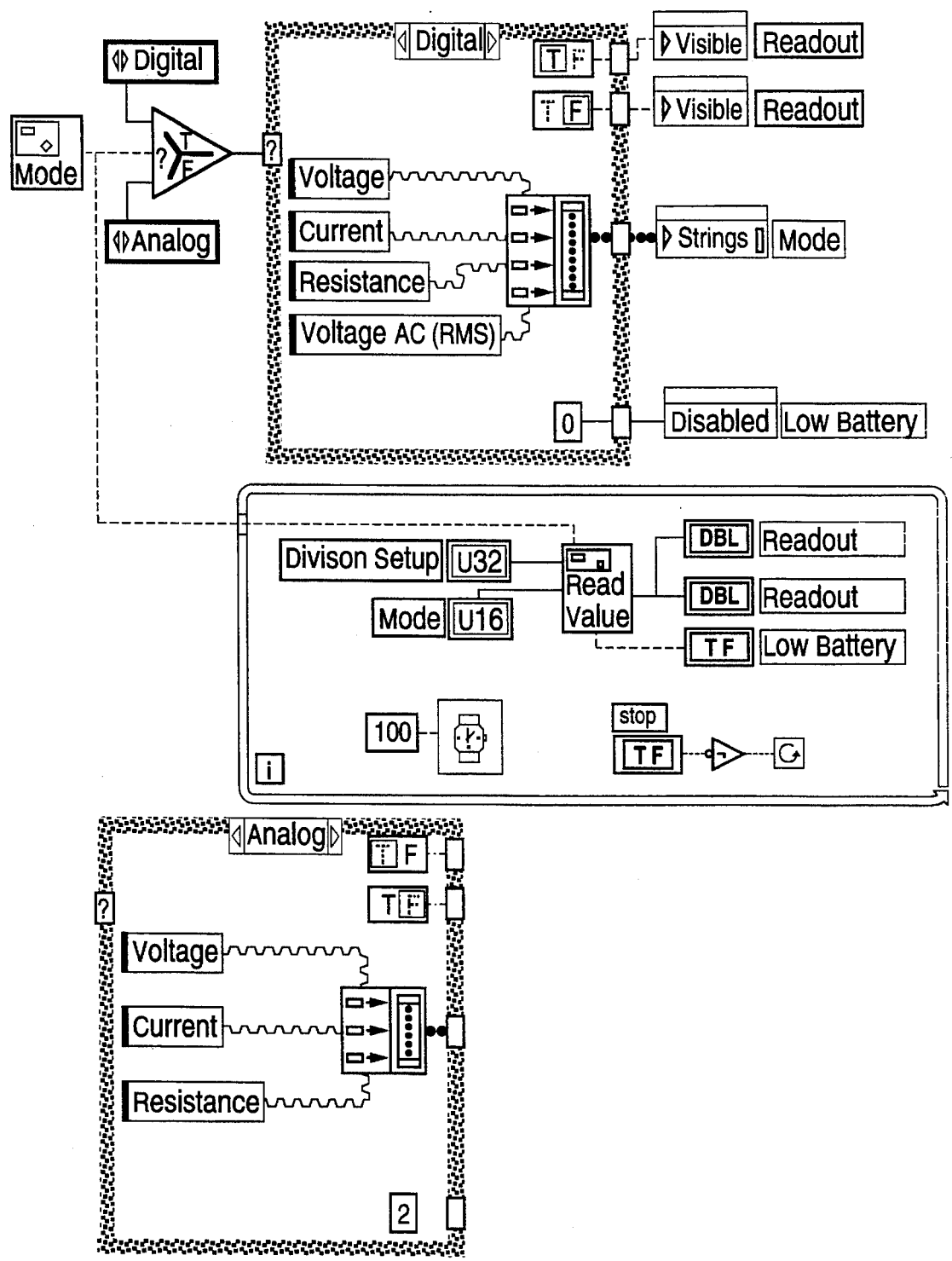

FIGS. 134A–H illustrate various icons used in the block diagram of FIG. 133;

FIG. 135 illustrates a waveform graph;

FIG. 136 illustrates the X or Y range attribute for a waveform graph as well as a wiring example;

FIG. 137 illustrates the active cursor and cursor position attributes for a waveform graph and a wiring example;

FIG. 138 illustrates the active plot and plot color attributes for a waveform graph and a wiring example;

FIGS. 139–140 illustrate the front panel and block diagram of a VI that receives user cursor input and generates a centroid value;

FIG. 141 illustrates the front panel of a VI using attribute nodes to control graph cursors and to provide programmatic zooming for a graph;

FIG. 142 illustrates the block diagram corresponding to the front panel of FIG. 141;

FIGS. 142A–C illustrate various case structure and sequence structure frames comprised in the block diagram of FIG. 142;

FIG. 143 illustrates a front panel of a VI using graph cursor and plot color attribute nodes;

FIG. 144 illustrates a cursor palette;

FIG. 145 illustrates using a selection tool to eliminate one of the cursor displays in the cursor palette;

FIG. 146 illustrates activating the cursor by clicking on the select button;

FIG. 147 illustrates a block diagram corresponding to the front panel in FIG. 143;

FIG. 148 illustrates the menu tree for various attribute nodes in the block diagram of FIG. 147;

FIGS. 149A–H illustrate various icons used in the block diagram of FIG. 147;

FIGS. 150A–B illustrate the front panel and block diagram of a VI that manipulates plot color attributes;

FIG. 151 illustrates an example using the build array function to set string attributes for a menu ring control;

FIG. 152 illustrates updating the menu ring of a different menu;

FIG. 153 illustrates the front panel of a VI that demonstrates use of menu ring controls in an ATE application;

FIG. 154 illustrates a block diagram corresponding to the front panel of FIG. 153;

FIGS. 154A–D illustrate various sequence structure and case structure frames used in the block diagram of FIG. 154;

FIGS. 155A–B illustrate respective front panels having analog and digital displays respectively; and FIG. 156 illustrates a block diagram which selects between analog and digital displays.

DESCRIPTION OF THE PREFERRED EMBODIMENTS

The following U.S. Patents are hereby incorporated by reference.

U.S. Pat. No. 4,901,221 titled "Graphical System for Modeling a Process and Associated Method," issued on Feb. 13, 1990.

U.S. Pat. No. 4,914,568 titled "Graphical System for Modeling a Process and Associated Method," issued on Apr. 3, 1990.

The following U.S. patent applications are hereby incorporated by reference.

U.S. patent application Ser. No. 07/380,329 filed Jul. 12, 1989 titled "Graphical Method for Programming a Virtual Instrument," now U.S. Pat. No. 5,301,336.

U.S. patent application Ser. No. 07/979,416 filed Nov. 19, 1992 titled "Graphical System for Executing a Process and for Programming a Computer to Execute a Process Including Graphical Variable Inputs And Variable Outputs."

U.S. patent application Ser. No. 07/647,785 titled Polymorphic Data Flow Block Diagram system and Method for Programming a Computer" and filed Jan. 30, 1991, which is now U.S. Pat. No. 5,301,301.

Figure 2:
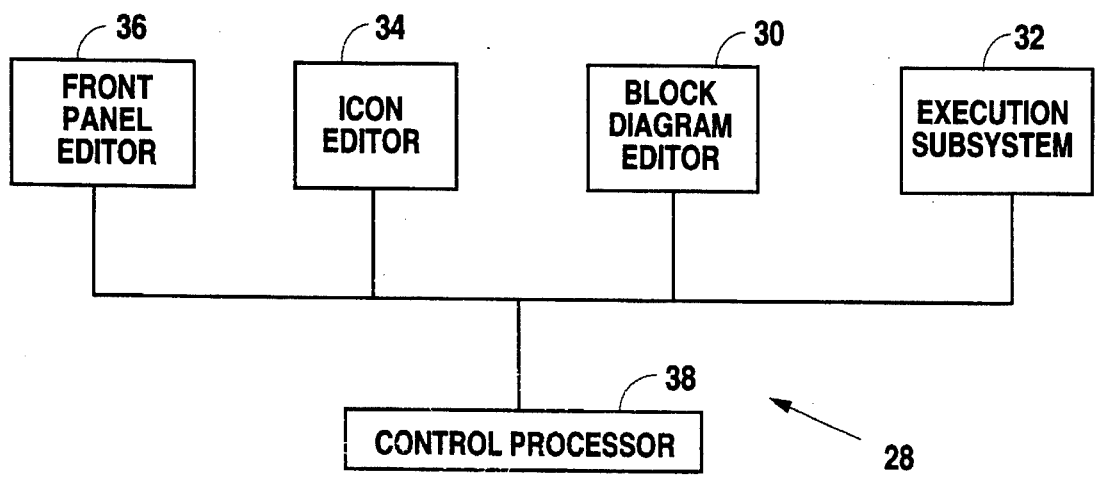
FIG. 2 is a block diagram illustrating a system for modeling a process according to the present invention.

Referring now to FIG. 2, a system 28 for modeling a process or creating a data flow program is shown. The system 28 includes a respective block diagram editor 30, an execution subsystem 32, an icon editor 34, and a front panel editor 36 all interconnected. The system 28 also includes a control processor 38 which connects to each of the front panel editor 36, icon editor 34, block diagram editor 30 and execution subsystem 32. The system 28 can be used for a number of purposes. In the preferred embodiment, the system 28 is shown primarily in creating "virtual instruments" (VIs), which are instruments created in software. However, the system 28 of the present invention has many other applications, including modeling a process or any other type of general programming.

As will be explained more fully below, the block diagram editor 30 is used to construct and display a graphical diagram, referred to as a block diagram, which visually displays a procedure by which a value for a input variable produces a value for one or more output variables. This procedure, together with the input and output variables, comprises a process model. Furthermore, as the user constructs the graphical diagram, the block diagram editor 30 constructs execution instructions which characterize an execution procedure which corresponds to the displayed procedure. In the preferred embodiment, the block diagram editor 30 constructs instructions in the machine language which execute the block diagram created by the user. The execution subsystem 32 assigns at least one value to the input variable and executes the execution instructions to produce a value for the output variable. In the preferred embodiment, the block diagram editor 30 and the execution subsystem 32 are constructed in software. The control processor 38 implements the block diagram editor 30 and the execution subsystem 32 of the preferred embodiment.

Figure 3:
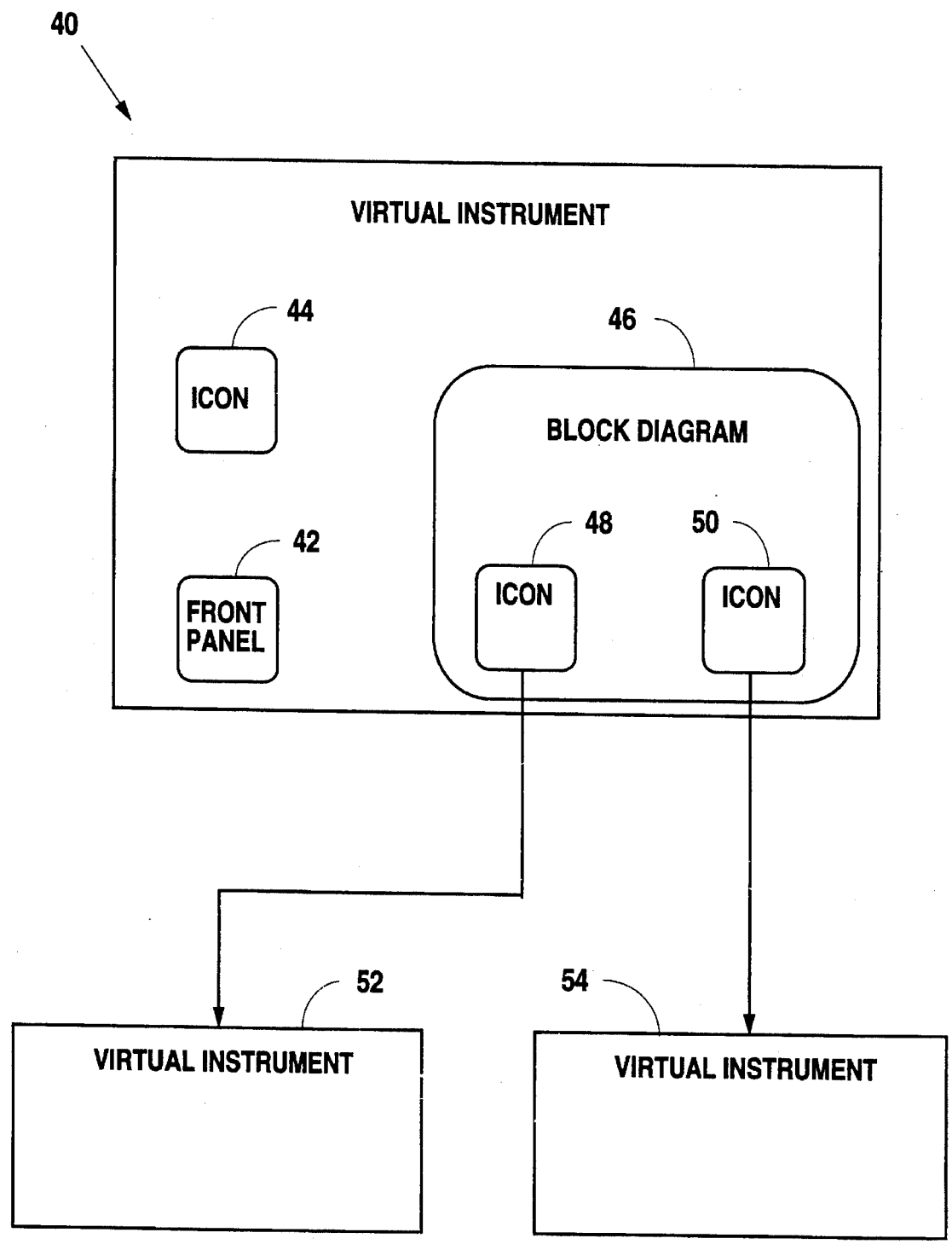
FIG. 3 is an illustrative drawing of a representation of a virtual instrument produced using the system of FIG. 2.

The system 28 permits a user to construct a virtual instrument (also referred to as a VI) 40 such as that represented in generalized form in the illustrative drawings of FIG. 3. The virtual instrument 40 includes a front panel 42 which permits interactive use of the virtual instrument 40 by a user. As will be explained more fully below, the front panel 42 permits graphical representation of input and output variables provided to the virtual instrument 40. The respective graphical representations on the front panel 42 for input and output variables are referred to as controls and indicators, respectively; although in some instances controls and indicators are referred to collectively as controls. The virtual instrument 40 also includes an icon 44 which permits use of the virtual instrument 40 as a subunit in other virtual instruments (not shown). The virtual instrument 40 also includes a block diagram 46 which graphically provides a visual representation of a procedure or method by which a specified value for an input variable displayed in the front panel 42 can produce a corresponding value for an output variable in the front panel 42. In other words, the user uses the block diagram editor 30 to create a graphical program, and the resultant graphical icons appear in the block diagram 46. The virtual instrument 40 itself is a hierarchical construction which may comprise within its block diagram 46 respective icons 48 and 50 referencing other virtual instruments (sub-VIs) indicated generally by respective blocks 52 and 54. The block diagram 46 may also include one or more "primitives" corresponding to simple functions that may be performed. Together sub-VIs, primitives and other types of data processing elements comprised within the block diagram 46 are referred to as function icons. Function icons in the block diagram 46 have associated control means or software which implement the desired functions.

Figure 4:
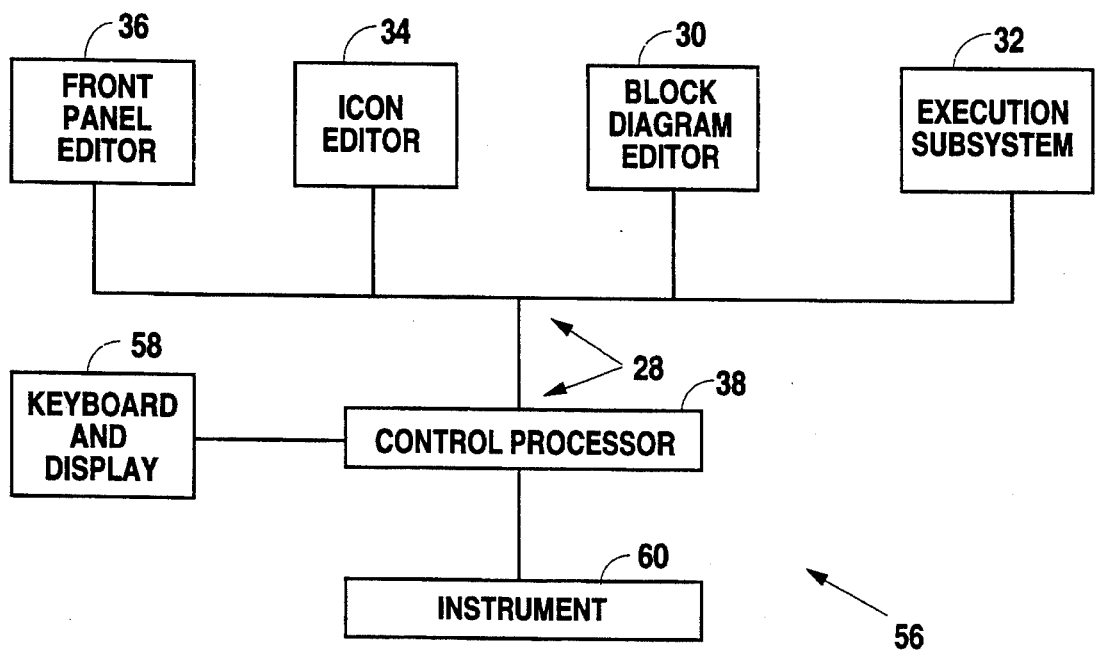
FIG. 4 shows a block diagram of an instrumentation system including the system of FIG. 2.

The generalized block diagram of FIG. 4 shows an instrumentation system 56 incorporating the system 28 shown in FIG. 2. Elements of the instrumentation system 56 which are substantially identical to those of second system 28 are designated with the same reference numerals as those of the system 28 for convenience. The instrumentation system 56 includes a keyboard and display 58 and an instrument 60. In a presently preferred embodiment, the control processor 38 and the keyboard and display 58 may be implemented using any type of general purpose computer.

The instrumentation system 56 is preferably used to control the instrument 60, i.e., acquire data from the instrument 60, analyze that data, store that data, and present that data to the user in a meaningful way. The block diagram editor 30 can also be used to create virtual instruments as desired.

Figure 5:
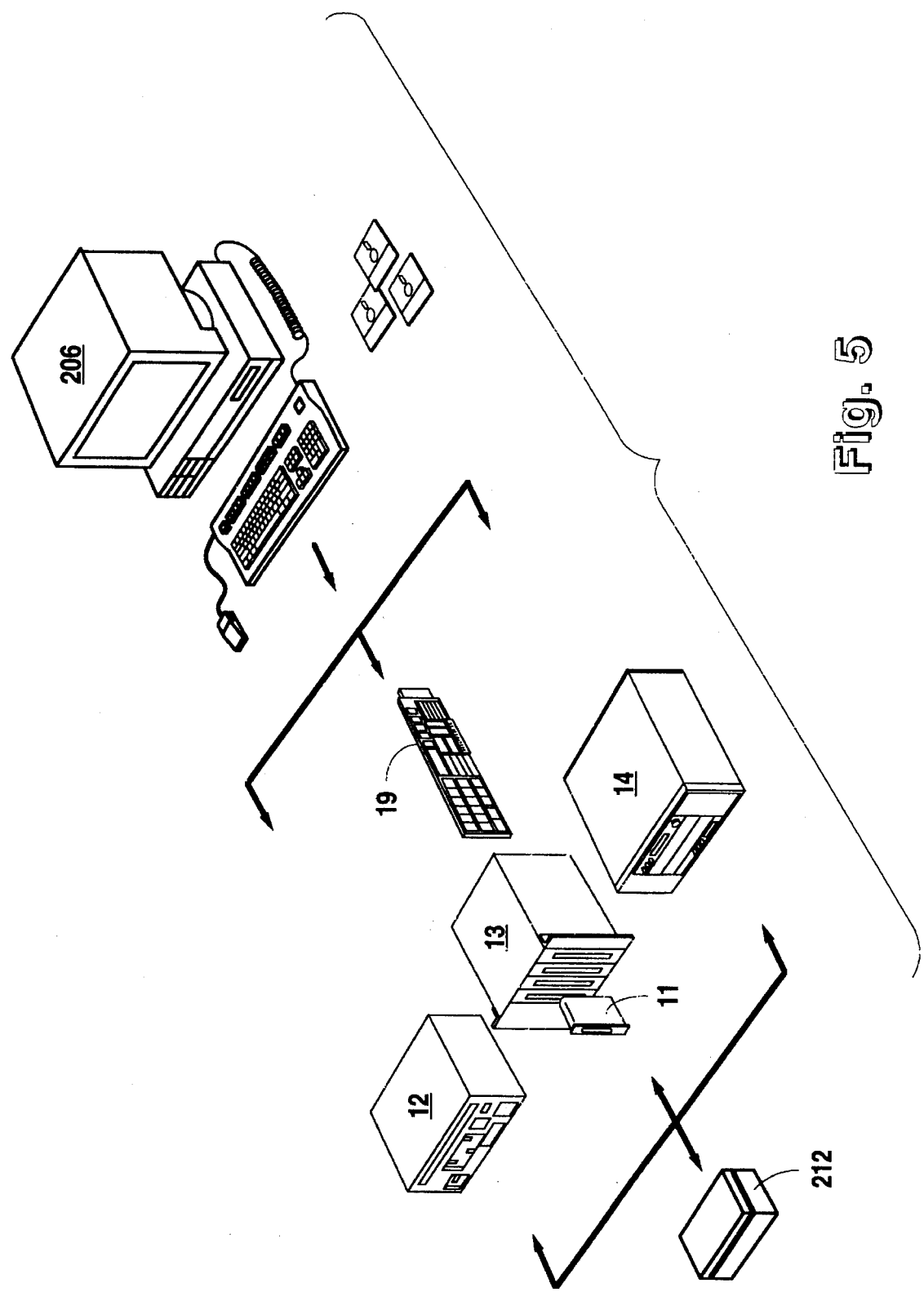
FIG. 5 is a representative drawing of various choices for an illustrative hardware instrumentation system of the preferred embodiment.

FIG. 5 illustrates various design choices available in an instrumentation system 204 in the preferred embodiment. As shown, a computer system 206 programmed according to the present invention can interface with a unit under test 212, i.e., can perform data acquisition and control of the unit under test 212, using a number of methods. These methods include using GPIB instruments 12, plug-in data acquisition boards 19 with associated signal conditioning logic 11, or VXI instruments 14. In addition a serial RS-232 method (not shown) can be used, as desired. It is noted that the computer

206 may be any type of computer including any type of Apple computer, IBM PC-compatible computer, PS/2, Sun workstation, etc.

Figure 5A:
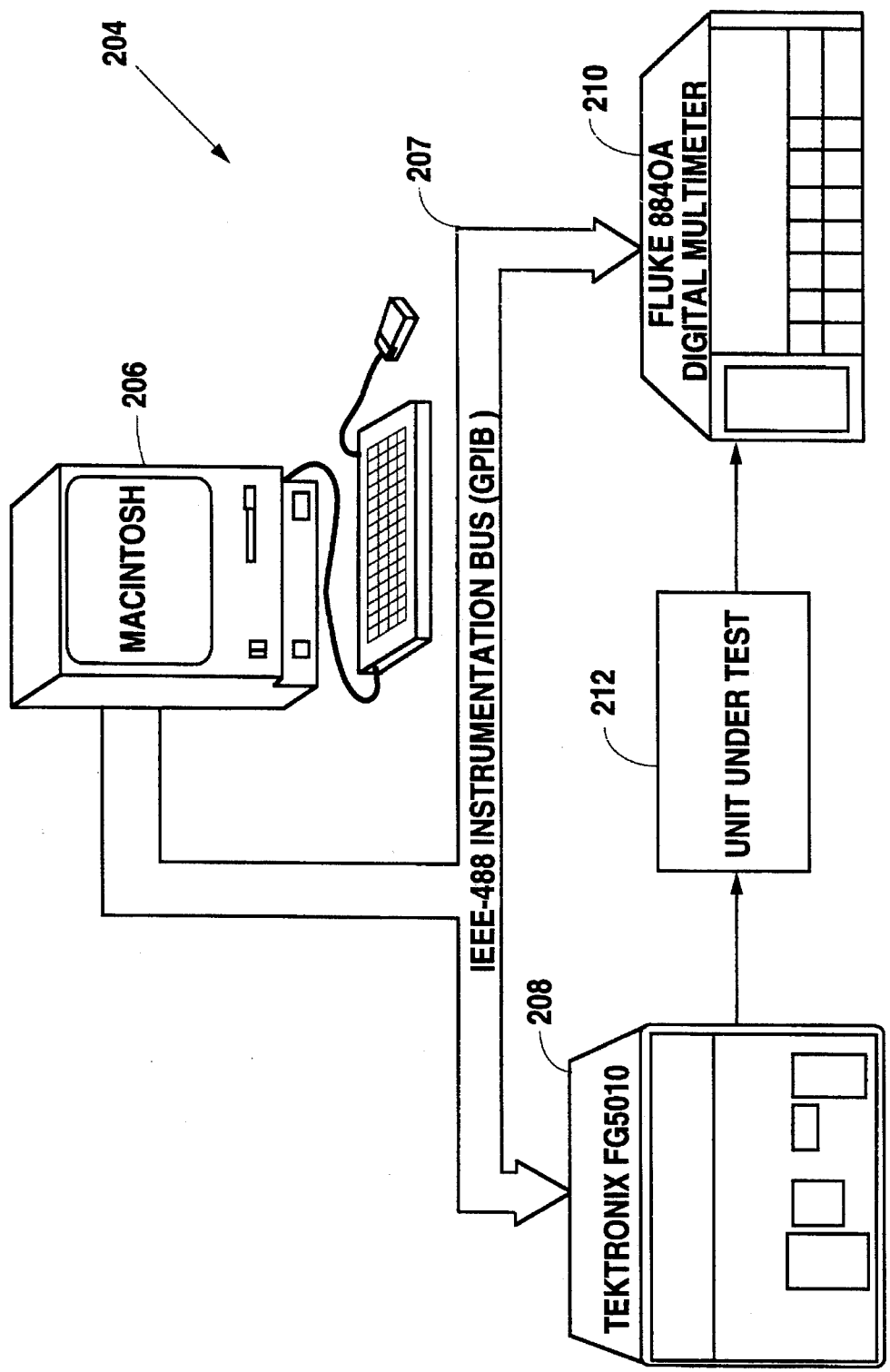
FIG. 5A is an illustrative hardware instrumentation system of the preferred embodiment.

FIG. 5A shows an illustrative hardware configuration of an instrumentation system 204 according to the present invention. The system 204 includes a computer 206 which includes the control processor 38 as well as the front panel editor 36, icon editor 34, block diagram editor 30, and execution subsystem 32. As previously mentioned the elements 30–36 are preferably implemented in software. The computer 206 illustrated in FIG. 5 includes an interface to a GPIB (general purpose instrument bus) 207 which in turn is connected to a Tektronix 5010 Function generator 208 and a Fluke 8840A digital multimeter 210. A unit under test 212 is coupled between the function generator 208 and multimeter 210 as shown.

Figure 22:
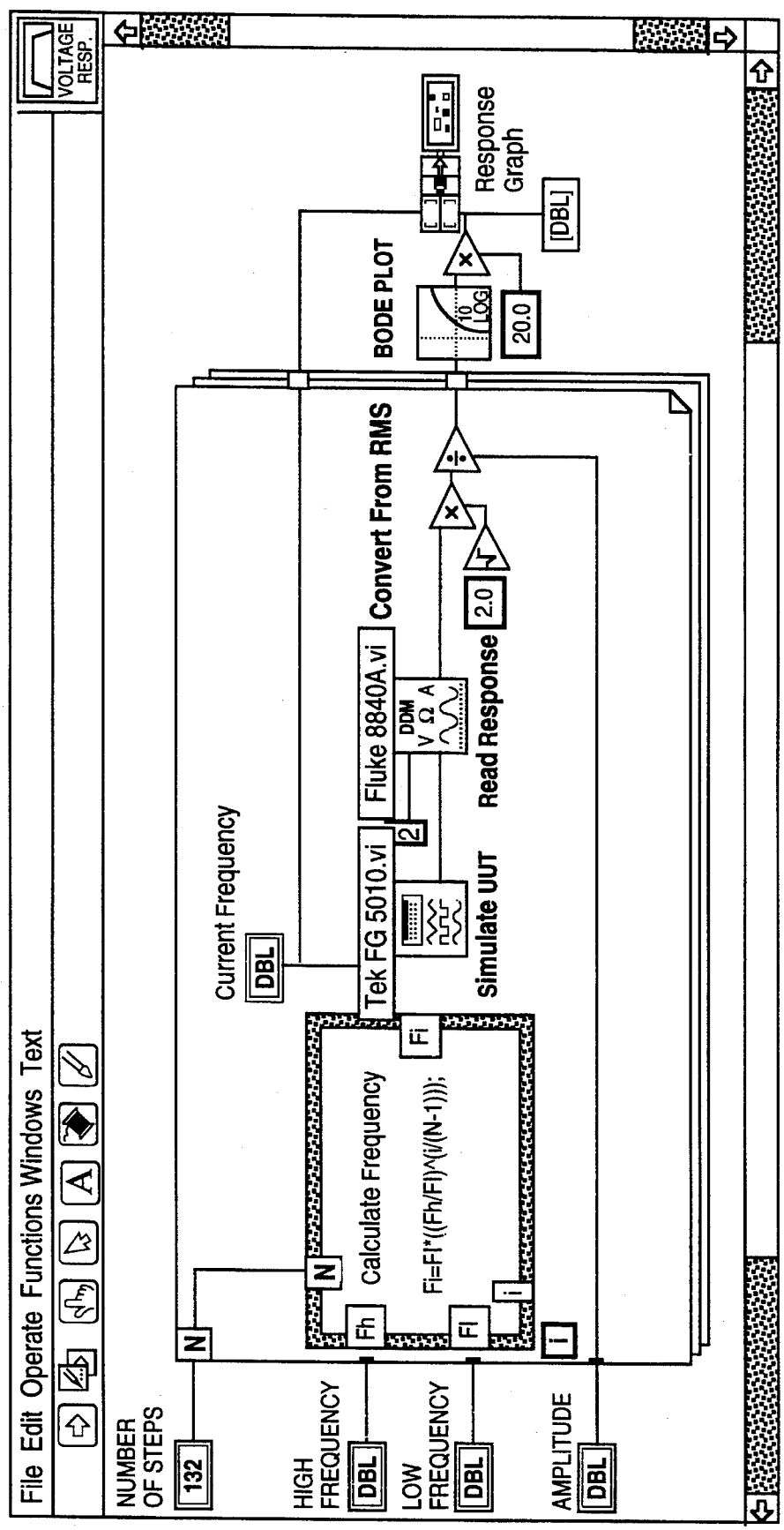
FIG. 22 is a drawing representing a block diagram according to the present invention as displayed on a computer video monitor to model the illustrative hardware system of FIG. 5A.

Referring ahead briefly to FIG. 22, a computer generated display of a completed block diagram for the instrumentation system 204 in FIG. 5A is shown. The block diagram in FIG. 22 is created by a user using the block diagram editor 30 of FIG. 2. As previously mentioned, the block diagram is essentially the graphical program representing the instrumentation system's operation and shows the interconnections between the elements of the instrument, the signal paths, and the relationship to other virtual instruments. Referring again to FIG. 5, a user uses the block diagram editor 30 to create the block diagram 46 in FIG. 22 to control the operation of the instrumentation system 204. Also, as discussed further below, the user uses the front panel editor 36 to create a front panel 42 to control the function or waveform generator 208 and multimeter 210. Once the block diagram 46 and front panel 42 have been created using the block diagram editor 30 and front panel editor 36, the user can then execute the block diagram (FIG. 22) using the execution subsystem 32. As discussed further below, the block diagram 46 can, for example, control the output of the waveform generator 208 to the unit under test 212 and can also be used to receive, analyze and present the output from the unit under test 212 which is provided from the multimeter 210.

It is also noted that other types of configurations for an instrumentation system 204 may be used. As discussed with regard to FIG. 5, instead of using actual instruments 208 and 210, the instrumentation system 204 may include one or more modular instruments on plug-in boards in conjunction with the VXI bus specification. The plug-in board instruments would then assume the function of the function generator 208 and multimeter 210. In addition, instead of requiring instruments 208 and 210 or plug-in modular instruments, the computer 206 can include a data acquisition card including A–D (analog to digital) and D-A (digital to analog) convertors, wherein the D-A convertor generates waveform signals to the unit under test 212 and the output from the unit under test 212 is then provided through an A–D convertor to the computer system 206.

Referring now to FIG. 6, a block diagram of the computer system 206 is shown. The elements of a computer system not necessary to understand the operation of the present invention have been omitted for simplicity. The computer system 206 includes a central processing unit or CPU 21 which is coupled to a processor or host bus 24. The CPU 21 acts as the control processor 38. The CPU may be any of various types, including an Intel x86 processor such as the i486, a CPU from the Motorola family of processors, as well as others. Main memory 22 is coupled to the host bus 24 by means of memory controller 23. The main memory 22 stores the front panel editor 36, icon editor 34, block diagram editor 30 and execution subsystem 32. Host bus 24 is coupled to an expansion or input/output bus 26 by means of a bus controller 25. The expansion bus 26 includes slots for various devices, including video 16 and hard drive 17. In one embodiment where the system and method of the present invention are used in an instrumentation application, a data acquisition card 19 is connected to the expansion bus 26. The data acquisition card 19 receives analog signals from an external sensor or instrument and in turn produces digital data that is provided to the CPU 21 and used by the system and method of the present invention. The computer system 206 also includes a GPIB (General Purpose Interface Bus) card 18 that interfaces to one or more instruments via the GPIB bus 15. The computer system 206 also includes an MXI card 10 that connects to VXI chassis 14.

The following discussion regarding data flow principles and a virtual instrument data structure diagram will assist in understanding the operation of the block diagram editor 30 and the execution subsystem 32 of the system 28 and the instrumentation system 56.

Figure 7:
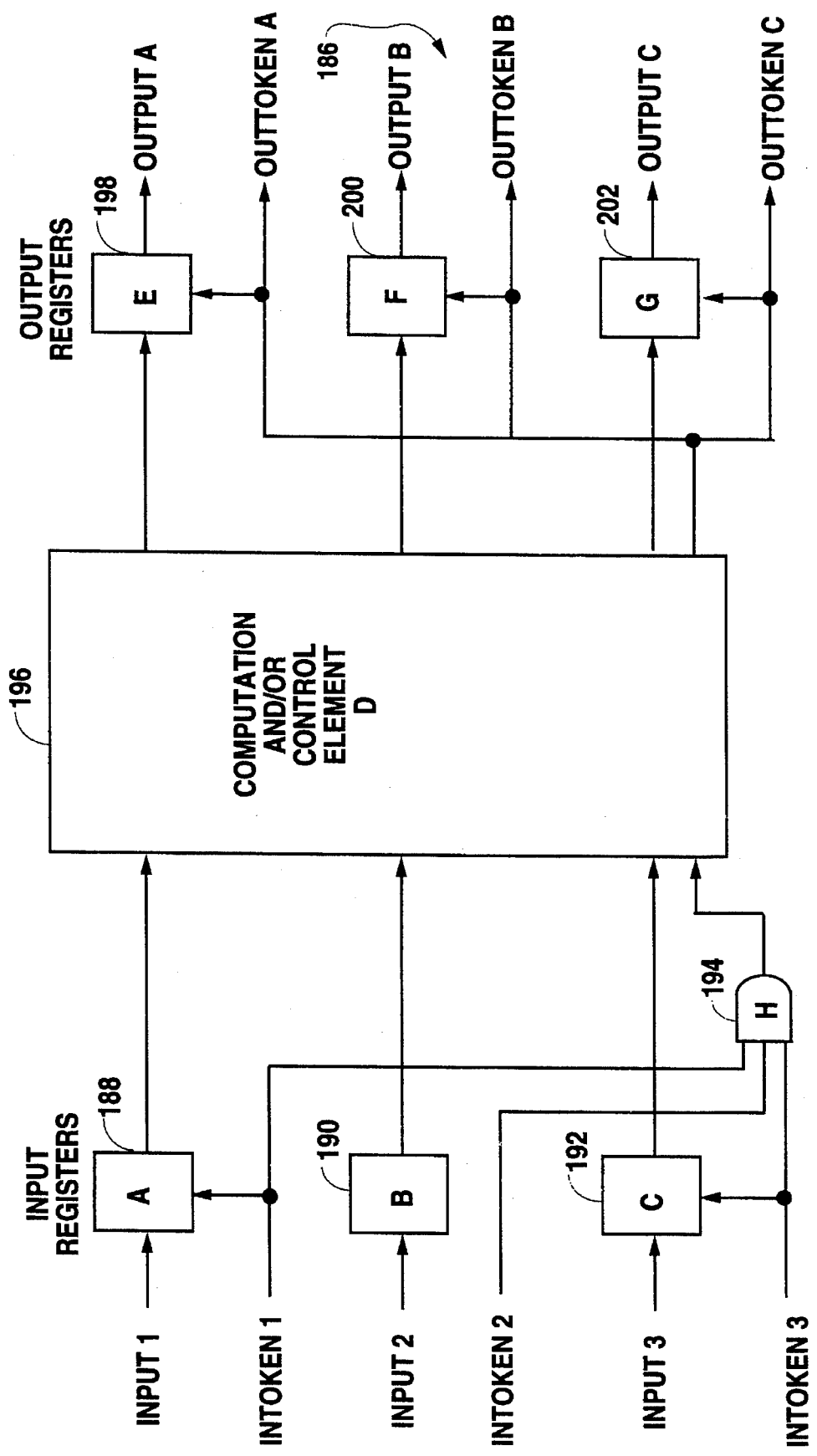
FIG. 7 shows a block diagram representing an exemplary data flow system.

Referring now to FIG. 7, a block diagram 186 of an exemplary data flow system is shown. The block diagram 186 includes three respective input registers 188, 190 and 192 which provide an accumulation of input data. As soon as all input data are present, output of AND gate 194 becomes TRUE, and computation and/or control element 196 will begin computation. The computation element 196 begins generating output data which are stored in respective output registers 198, 200 and 202. When all output data are available, an output token is generated by the computation element 196 indicating that output data are available for transmission to a next system (not shown). It will be appreciated that the computation element 196 can be a combination of more than one subsystem (not shown).

Figures 8A, 8B:
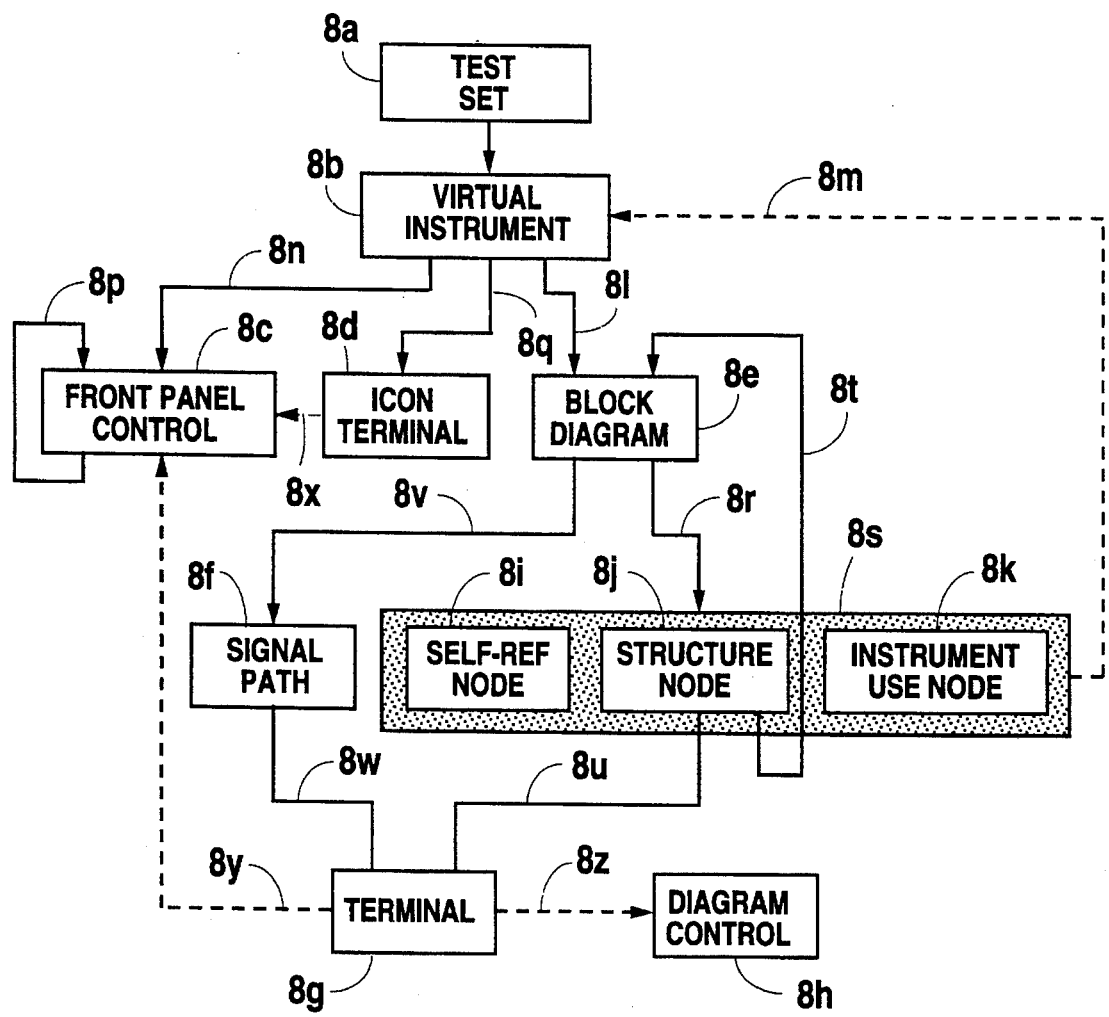
FIG. 8A illustrates a virtual instrument data structure diagram used by the system of FIG. 2 and the instrumentation system of FIG. 4.
FIG. 8B shows a legend applicable to the illustration of FIG. 8A.

FIG. 8A illustrates a virtual instrument data structure diagram. The system 28 of FIG. 2 and the instrumentation system 56 of FIG. 4 each utilize the principles set forth in the data structure diagram of FIG. 8A. It will be appreciated that implementation of a system utilizing a data structure such as that diagrammed in the diagram of FIG. 8A advantageously permits the implementation of an extended data flow system like that illustrated in FIG. 7.

Furthermore, it will be appreciated that implementation of the data structure like that of the diagram of FIG. 8A advantageously permits the implementation of a system in which execution instructions are constructed in a graphical fashion. More particularly, execution instructions are constructed by constructing a visual display or block diagram in which at least one input variable produces at least output variable according to a displayed procedure. Furthermore, the execution instructions are constructed such that, when a value is assigned to a particular input variable, a value for a corresponding output variable is produced according to the procedure illustrated in the visual display. Additionally, the execution instructions are constructed in response to the construction of a block diagram comprising the graphical display. Thus, a user need only construct an appropriate visual display or block diagram in order to construct the execution instructions.

Moreover, implementation of data flow principles by using a data structure such as that shown in the diagram of FIG. 8A advantageously permits the use of parallel processing which increases the speed with which the execution of execution instructions can be accomplished.

More particularly, FIG. 8A shows a system representation of a virtual instrument. Boxes 8a–8k, indicate conceptual objects in the system that have well-defined properties. Objects 8i, 8j, and 8k are grouped into shaded box 8s and share some properties and form a class of objects.

As indicated in FIG. 8B which represents a legend applicable to the illustration of FIG. 8A, a solid line with an arrow is used to indicate a potential one-to-many relationship, i.e., the source object contains zero or more destination objects (e.g., a vehicle containing zero or more wheels). A dashed line with an arrow is used to indicate a potential one-to-one relationship, i.e., the source object may reference zero or one destination object (e.g., a library book may or may not have a borrower).

Line 8n indicates that a virtual instrument 8b contains a front panel with a multiplicity of controls 8c. A control may be of clustered type in which case it contains a multiplicity of subcontrols as indicated by line 8p. Line 8q indicates that a virtual instrument contains an icon with a multiplicity of terminals 8d. Line 8l indicates that virtual instruments also contains a multiplicity of block diagrams 8e.

In the system of the present invention, a virtual instrument either contains one diagram or none. Built in virtual instruments representing primitive computations (primitives) have no diagrams. Line 8r indicates that a block diagram contains a multiplicity of objects of the node class. A block diagram contains exactly one self reference node 8i, and an arbitrary number of structure nodes 8j or instrument use nodes 8k. Line 8t indicates that a structure node contains a multiplicity of subdiagrams.

As discussed below with regard to FIGS. 12A–D, a sequence structure or a conditional structure contains one or more subdiagrams, and an iterative loop structure or indefinite loop structure contains exactly one subdiagram. Line 8m indicates that an instrument use node (1-use node) is used to reference another virtual instrument. The instrument use node may reference a virtual instrument in real-time; or it may reference previous data acquired by the virtual instrument. Line 8u indicates that each object of the node class contains a multiplicity of terminals 8g. Line 8v indicates that a block diagram also contains a multiplicity of signal paths 8f. Each signal path contains a multiplicity of terminals as indicated by line 8w. There is at most one terminal per signal path that is designated as the source of the signal. Each terminal contained in a signal path also is contained in a node. However, there may be terminals in nodes which are not in signal paths. The terminals in a signal path are typically in different nodes. Lines 8y and 8z indicate that each terminal may reference a front panel control or a block diagram control (e.g., a constant). A terminal references exactly one control, and it is either on the front panel or on the block diagram.

Execution Subsystem

Figure 9A:
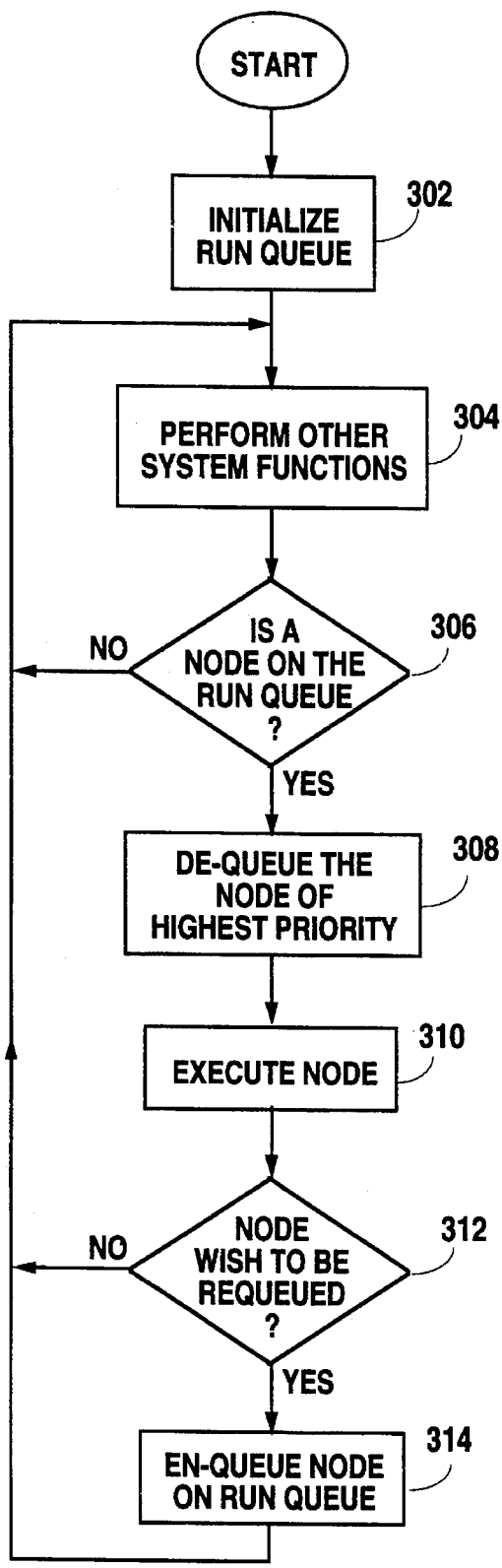
FIGS. 9A–L are flowchart diagrams illustrating operation of the execution subsystem of FIGS. 2 and 4.

Referring now to FIGS. 9A–L, a flowchart diagram illustrating the operation of the execution subsystem is shown. In FIG. 9A, the main execution loop of the block diagram execution subsystem is shown. At power on, in step 302 the execution subsystem 32 initializes the run queue. The run queue is the main queue in which all nodes are scheduled to be operated on by the execution subsystem 32. As discussed further below, the initial node is scheduled on the run queue by the execution subsystem 32, with all subsequent nodes in the block diagram being scheduled by preceding nodes in the data flow diagram. In step 304 the execution subsystem 32 relinquishes control to allow other graphical environment functions to be performed. For example, other functions include the front panel editor 36 which allows a user to create a front panel, the icon editor 34 which allows a user to create and edit icons, the block diagram editor 30 which allows a user to use the graphical programming environment to create programs, etc. These other functions at some point will invoke the execution subsystem 32. For example, when the user builds a block diagram and then clicks on the run arrow to execute the diagram, the execution subsystem 32 is invoked. When the execution subsystem 32 is invoked, the subsystem 32 checks the run queue to determine if anything has been placed on the queue. If nothing is placed on the run queue in step 306, then the execution subsystem 32 returns to step 304 and allows other systems to perform their functions until something is placed on the queue.

If a node is placed on the run queue in step 306, then the execution subsystem 32 advances to step 308 and de-queues the node having the highest priority. In step 310 the execution subsystem 32 executes the node. The node execution step includes executing all or a portion of a node and is discussed in much greater detail below. Upon completion of step 310, the execution subsystem 32 then advances to step 312 and determines whether the node has indicated a desire to be re-queued on the run queue. In general, if only a portion of the node was executed in step 310, the node will indicate in its return that it wishes to be replaced on the run queue to have its remaining portion executed. If the node has expressed a desire to be re-queued on the run queue in step 312, i.e. if the node has not been fully completed in step 310, then the execution subsystem 32 advances to step 314, re-enqueues the node on the run queue, and then returns back to step 304. If the node has completed in step 310 and thus the node has not indicated a desire to be re-placed on the run queue, the execution subsystem 32 returns from step 312 directly to step 304. In step 304 other parts of the graphical programming environment execute. When control returns to the execution subsystem 32, the execution subsystem 32 performs steps 306–314 as previously described.

Figure 9B:
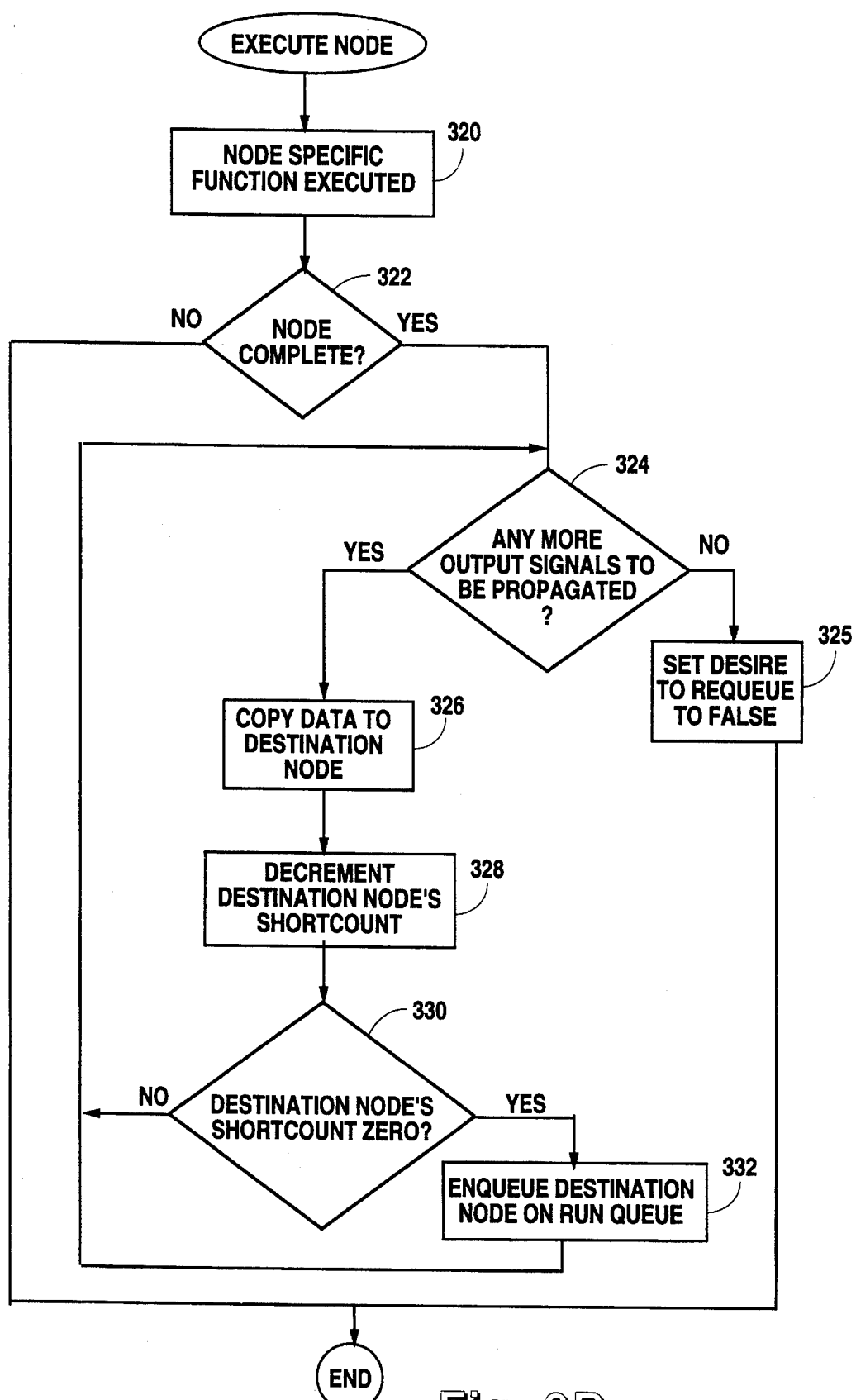

Referring now to FIG. 9B, a flowchart diagram illustrating operation of step 310, the execute node step, in FIG. 9A is shown. In step 320, the execution subsystem performs node specific functions, i.e., specific functions for the particular type or node being executed. As discussed further below, a plurality of different types of nodes can be placed on the run queue, including a self reference node, an instrument use node, a simple node such as a primitive node or code interface node, a loop structure node, a case structure node, a sequence structure node, an asynchronous node, and a long computational node. The specific functions performed by the execution subsystem for respective nodes are discussed further below with regard to FIGS. 9C–9K. When the node-specific functions have been executed in step 320, the execution subsystem 32 determines in step 322 if execution of the node has completed. If not, the subsystem 32 returns to step 312 and determines if the node should be re-queued on the run queue. If the node has completed in step 322, the subsystem 32 advances to step 324. In step 324 the execution subsystem 32 determines if the node being executed has any outputs that need to be propagated. If the node has any outputs then a certain number of those output signals will need to be propagated to subsequent nodes in the data flow diagram. If no more output signals need to be propagated, the execution subsystem 32 sets the desire to be requeued for that respective node to false in step 325 and returns to step 312. Since the node was determined to have completed step 322 and has propagated all of its signals in step 324, the node has completed all operations, and thus its desire to be requeued is set to false.

If the node does include more output signals which need to be propagated, the execution subsystem 32 advances to step 326 and copies the data that was computed in step 320 to destination nodes, i.e., nodes which receive the outputs of the respective node being executed as inputs. The destination nodes are the respective nodes which the outputs of the node being executed are connected to. In step 328 the execution subsystem 32 decrements the destination node's short count, which is described below.

Each node includes two count numbers referred to as a fire count and a short count. Each node's fire count refers to the number of inputs received by that node. Prior to execution of the block diagram, the node's short count is set to the respective node's fire count. For example, if a node has three inputs, the node's fire count would be three, and prior to execution the node's short count would also be set to three. As various output signals are produced which are received as inputs to that respective node, the short count is decremented until all inputs to that node have been received. When the node's short count has reached zero, then all inputs to that node have been received. When this occurs the node is ready for execution and thus can be placed on the run queue. In other words, a node can only be placed on the run queue for execution when all of its inputs have been received, i.e. all nodes having outputs connected to the inputs of the respective node have executed and have propagated their signals to the respective node. Thus, in step 326 when data is copied to a destination node, one of the inputs to that destination node has received its required data and thus the destination node's short count is decremented.

In step 330 the execution subsystem 32 determines if the destination node's short count has reached zero. If that node's destination short count has reached zero, then that destination node is enqueued on the run queue in step 332. The execution subsystem 32 then returns to step 324 to determine if any more output signals need to be propagated. If the respective destination node's short count has not reached zero in step 330, then that destination node is not enqueued on the run queue, but rather the execution subsystem 32 returns to step 324. The subsystem 32 continues to execute steps 324–332 as long as any output signals need to be propagated from the respective node.

Node Specific Function Execution

Referring now to FIGS. 9C–K, the node-specific function executed in step 320 of FIG. 9B depend on the type of node being executed. As previously discussed, there are a plurality of different nodes that can be executed, including a self-reference node, loop structure node, case structure node, etc. Each type of node includes a plurality of different starting points where execution can begin in step 320, these starting points being referred to as 0 for the initial starting point or initial execution of the node and 1 for a later starting point of execution in the node. The exception to this is the long computational node which includes three starting points referred to as 0, 1, and 2.

Self Reference Node Execution

Figure 9C:
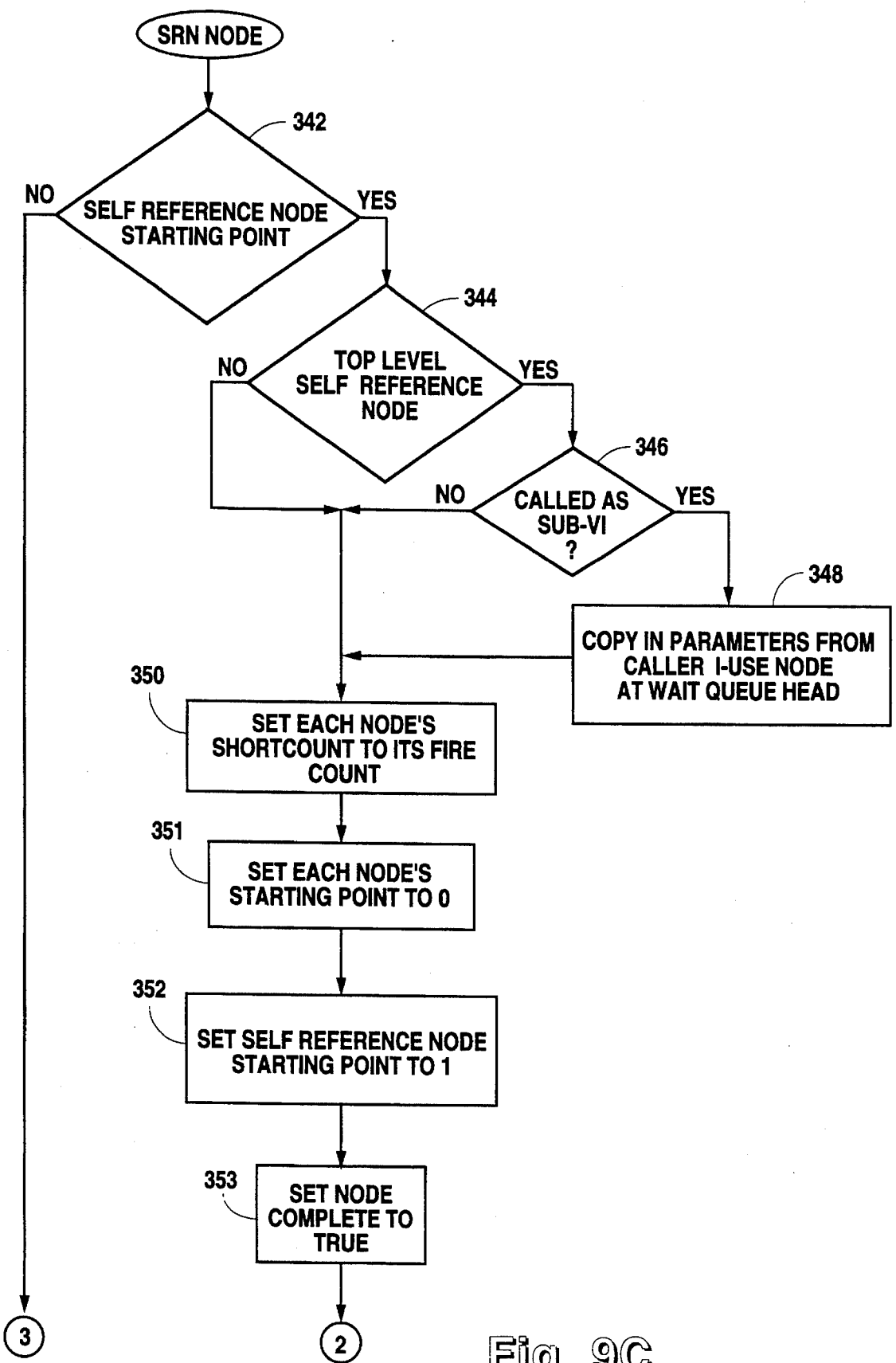
Figure 9D:
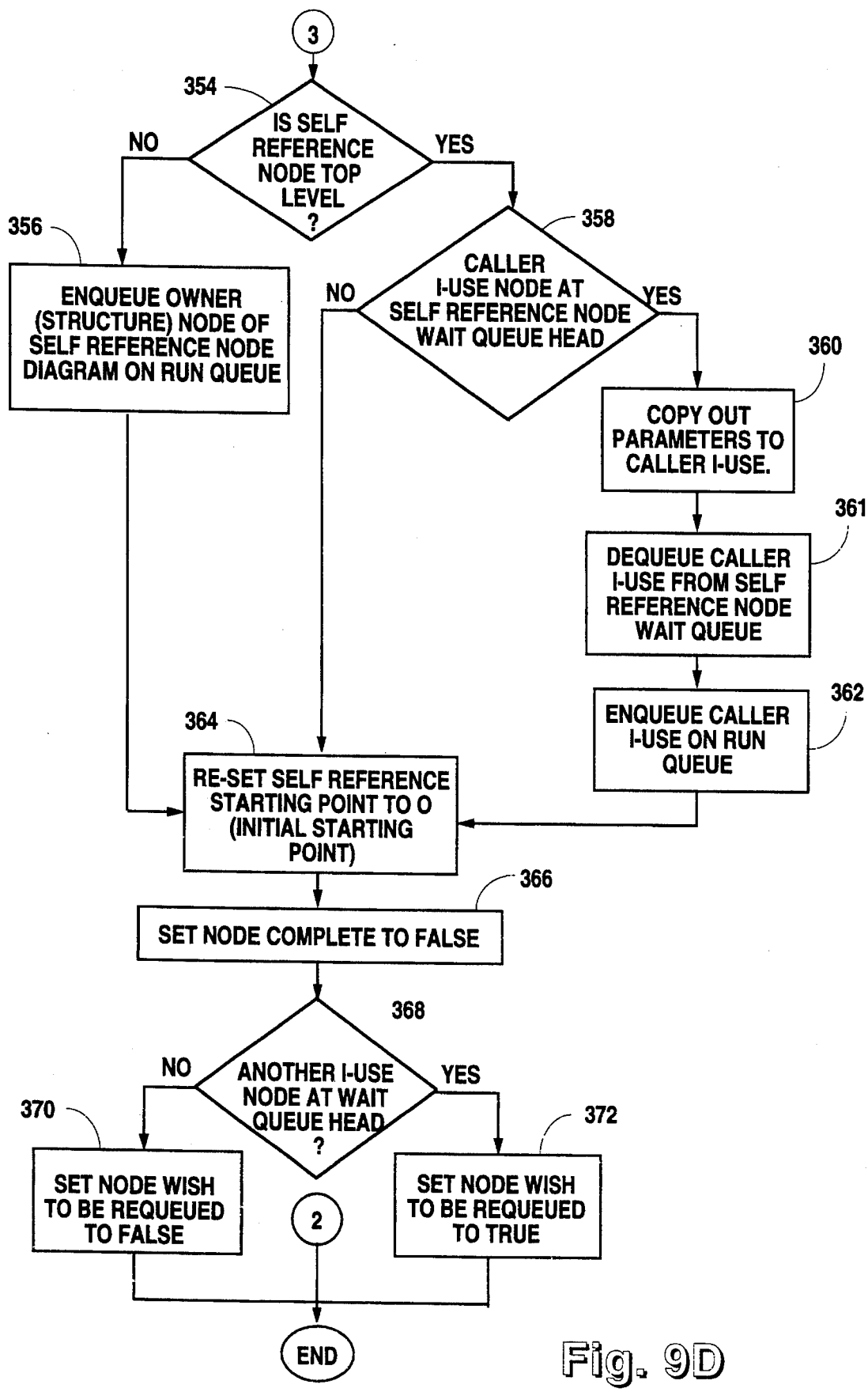

FIGS. 9C and 9D illustrate the steps performed if the node executed in step 320 is a self-reference node. In step 342, the execution subsystem 32 determines if this is the initial call to the 0 starting point of the self-reference node at the beginning of the respective diagram, or a call to the self-reference node at starting point 1 signifying the end of a diagram. Each VI, sub-VI, and loop diagram includes a self-reference node that is referenced when the diagram is entered to initialize the node and propagate signals to the node and also when the diagram is exited to place the node that called the self-reference node back on the run queue. In step 344 the execution subsystem 32 determines if the self-reference node being executed is a top level self-reference node, i.e., a self-reference node corresponding to a main block diagram. If not, the subsystem 32 advances to step 350. If so, the execution subsystem 32 advances to step 346 and determines if the self-reference node being executed was called as a sub-VI. If the self-reference node was determined to have been called as a sub-VI in step 346, then the execution subsystem 32 advances to step 348 and copies in the parameters from the instrument (I-use) node that called the self-reference node, referred to as the caller I-use node, which is at the head of the wait queue. The wait queue is described further below. The execution subsystem 32 then advances to step 350. If the self-reference node was not called as a sub-VI, the subsystem 32 advances directly to step 350.

In step 350 for each node comprised within the self-reference node's diagram, the execution subsystem 32 sets each node's short count to its fire count. In step 351 the execution subsystem 32 sets each node's starting point to its initial starting point, i.e. starting point 0. The subsystem 32 also sets the starting point of itself to its second starting point, starting point 1, in step 352. In step 353 the execution subsystem 32 sets node complete to true and returns to step 322. It is noted here that setting node complete to true where the node was entered at starting point 0 is different from all other nodes. With regard to all other nodes, node complete is set to true only at the last entry into the node. For a self-reference node, node complete is set to true in step 353 at starting point 0 of the node because it is necessary to propagate all signals to the nodes in the diagram associated with the self-reference node at the initial call to the self-reference node. With all other nodes, node complete is set to true after execution of the node, i.e., only after the last starting point of the node has been entered and the node has completed.

If the node-specific function is not an initial call to starting point 0 of the self-reference node in step 342, but rather enters at starting point 1, meaning the self-reference node is at the end of its respective diagram, then in step 354 the execution subsystem 32 again determines if the self-reference node corresponds to the diagram of a top level block diagram. If not, then the self-reference node corresponds to the diagram of a structure node such as a loop structure node, a case structure node, or a sequence structure node. The execution subsystem 32 advances to step 356 and enqueues the owning structure node of the self-reference node diagram on the run queue. The execution subsystem 32 then advances to step 364 and resets the self-reference node starting point to 0.

If the self-reference node does correspond to a top level diagram in step 354, then in step 358, the execution subsystem 32 determines if the caller I-use node is at the self-reference node wait queue head. Each self-reference node includes a wait queue where the I-use node corresponding to a call to the subVI is enqueued. This is for the situation where the self-reference node being executed corresponds to that of a sub-VI when it is called from an I-use node.

The wait queue is for the situation where a higher level VI (also referred to as a caller VI) includes one or more usages of a sub-VI, i.e. one or more instrument usage nodes (referred to as caller I-use nodes) for the same sub-VI. Where two or more usages of a sub-VI are comprised within a caller VI, it is imperative that only one usage of that sub-VI be executing at any one time (parallel or reentrant mode is discussed later). This is because each sub-VI includes its own block diagram having a corresponding self-reference node. Since there is only one self-reference node for the sub-VI (in serial node), only one version of that sub-VI can be running at any one time. Therefore, the execution subsystem must ensure that only one usage of a sub-VI executes from start to finish before another usage of the same sub-VI is initiated. In summary, since each sub-VI includes only one self-reference node in serial mode, only one usage of that sub-VI can execute at any one time, and thus the sub-VI includes a wait queue where calls to that sub-VI are placed to ensure that only one usage of the sub-VI is executing at any one time.

If the caller I-use node is not at the wait queue head in step 358, the execution subsystem 32 advances to step 364. If the caller I-use node is at the wait queue head, then the execution subsystem 32 advances to step 360 and copies out the parameters to the caller I-use node. The execution subsystem 32 then dequeues the caller I-use node from the self-reference node wait queue in step 361 and enqueues the caller I-use on the run queue in step 362. This completes a single usage of this VI as a subVI.

In step 364, the execution subsystem 32 resets the self-reference node starting point to starting point 0, i.e., the initial starting point. Thus, when the self-reference node is again called, it will be as if it were an initial self-reference node call in step 342. Upon completion of step 364, node complete is set to false in step 366, and the execution subsystem 32 determines if another instrument usage node is at the wait queue head in step 368. If not, then in step 370 the execution subsystem 32 sets the node wish to be requeued to false and returns to step 312. If another instrument usage node is determined to be at the wait queue head in step 368, then in step 372 the execution subsystem 32 sets the desire to be requeued to a true value and returns to step 312. In this instance, the diagram corresponding to the self-reference node has again been invoked, and thus the self-reference node needs to be requeued.

Instrument Use Node

Figures 9E, 9F:
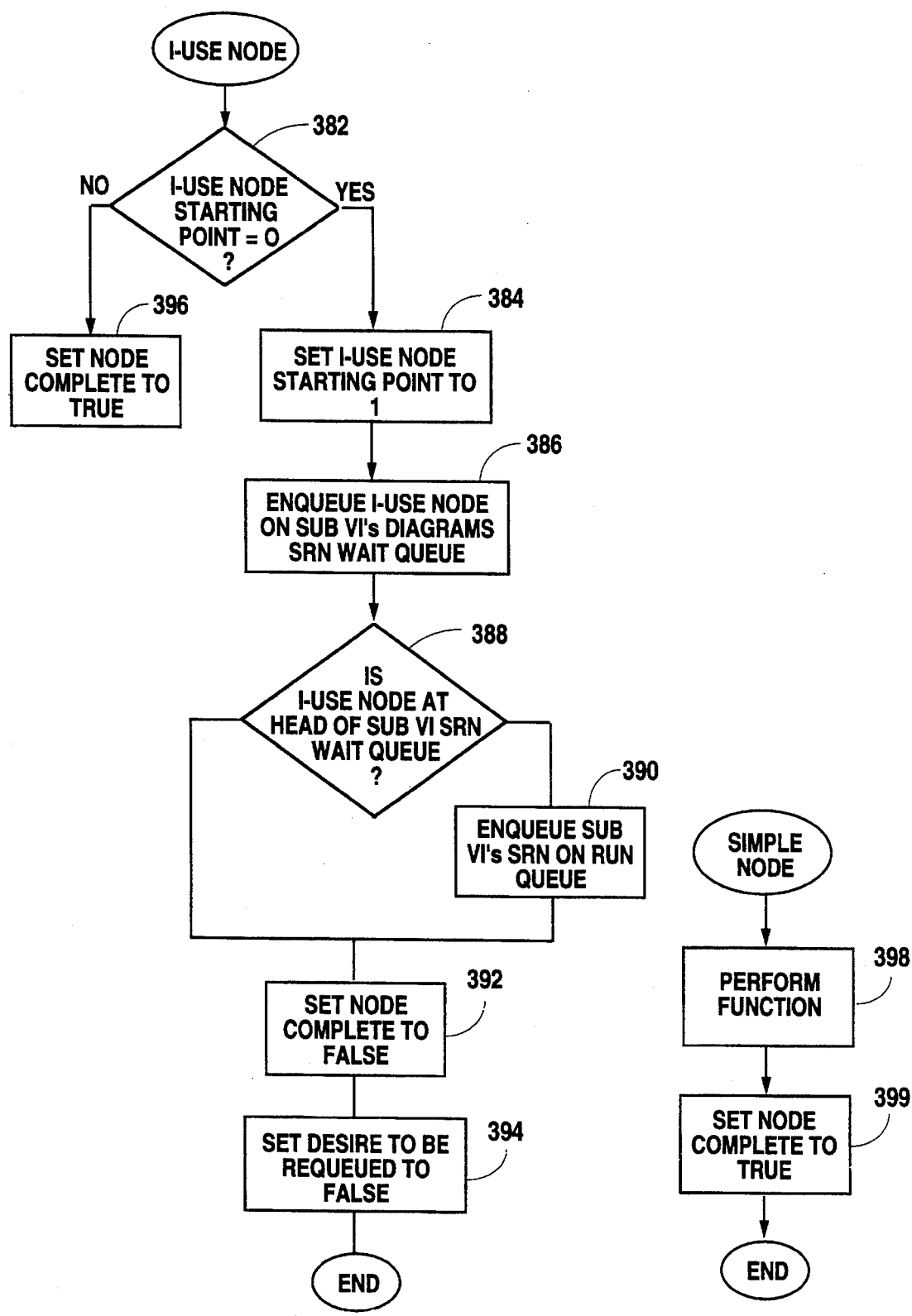

An instrument use or usage node (I-use node) is used to call a sub-VI diagram, or more correctly is used to call the self-reference node of a sub-VI diagram. Referring now to FIG. 9E, a flowchart diagram illustrating operation of the instrument use node is shown. In step 382 the execution subsystem 32 determines if the I-use node is at starting point 0, i.e. this is the initial entry into the I-use node. If not, then in step 396 the execution subsystem 32 sets node complete to true. In this instance, this is the second call to the respective I-use node, i.e. the I-use node starting point is at 1. Thus node complete is set equal to true and the node completes. This will happen when the subVI has finished executing on behalf of this Instrument usage node.

If the I-use node is at its 0 starting point in step 382, then in step 384 the execution subsystem 32 sets the I-use node starting point to 1. This is done so that the next entry to this I-use node causes the decision in step 382 to be false. In step 386 the execution subsystem 32 queues the I-use node on the sub-VI diagram's self-reference node wait queue. This is a queue where the calling nodes wait their turn to run a respective sub-VI's top level diagram, i.e. a respective sub-VI. As previously noted, if multiple usages of the respective sub-VI or diagram appear in a caller top level block diagram, only one usage of the sub-VI or diagram can execute at any one time because each contains only self-reference node. Therefore, calling I-use nodes must wait their turn in the wait queue to be able to run a respective sub-VI.

In step 388, the execution subsystem 32 determines if the I-use node is at the head of the sub-VI self-reference node wait queue. If the I-use node is at the head of the self-reference node wait queue in step 388, then in step 390 it enqueues the sub-VI self-reference node on the run queue. The execution subsystem then advances to step 392. If the I-use node is not at the head of the wait queue in step 388, then the execution subsystem 32 advances directly to step 392. (in this situation the subVI is already executing on behalf of another caller I-use node.)

In step 392, the execution subsystem sets node complete to false. Since this was the 0 starting point of the I-use node and the self-reference node was just placed on the run queue in step 390, node complete is set to false to enable the I-use node to be called again to complete operations at a later time when the subVI finishes executing on it's behalf. In step 394 the execution subsystem sets the desire to be requeued to false. In this situation, the sub-VI self-reference node has been placed on the run queue and is required to run before the instrument use node is again called at the end of the sub-VI self-reference node execution. Therefore, instead of setting the desire to requeue the I-use node to true, the sub-VI self-reference has the task of placing the I-use node on the run queue, which occurs in step 362 at FIG. 9D. The I-use node execution then completes.

Simple Node

Referring now to FIG. 9F, a flowchart diagram illustrating the execution of a simple node is shown. A simple node includes primitive nodes and code interface nodes. In step 398, the execution subsystem 32 performs the function indicated by the node. For example, if the node is a simple add or subtract node or an attribute node, bundle node, etc., the execution subsystem 32 performs the indicated operation. If the node being executed is a code interface node, then in step 398 the execution subsystem 32 invokes a text-based language routine previously created by the user which performs a desired function. In step 399 the execution subsystem 32 sets node complete to true. Thus, when the execution subsystem 32 returns to step 322 in FIG. 9B, the node's output signals will be propagated in steps 324–332.

Loop Structure Node

Figure 9G:
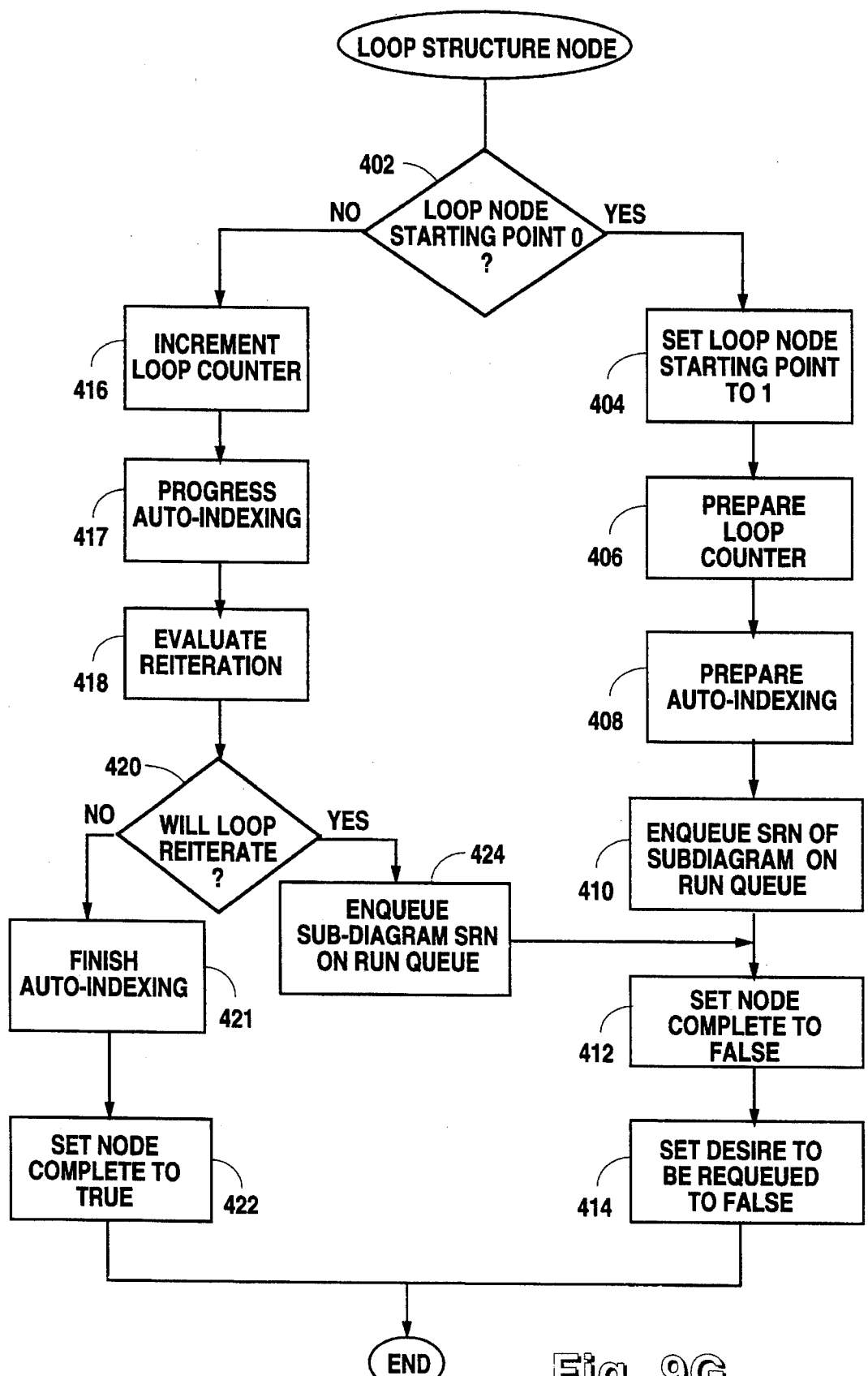

A loop structure node corresponds to an iterative loop structure node or an indefinite loop structure node, which are discussed with reference to FIGS. 12B and 12D. Referring now to FIG. 9G, if the node being executed in step 310 is a loop structure node, then the following node specific functions are executed in step 320. In step 402 the execution subsystem 32 determines if it has begun execution at the loop node's 0 starting point, i.e. the loop node's initial starting point. If so, then in step 404 the execution subsystem 32 sets the loop node starting point to 1. In step 406 the subsystem 32 prepares a loop counter and in step 408 prepares auto-indexing for the loop. Auto-indexing is a feature of loop structure nodes wherein arrays are indexed or accumulated at the loop boundary automatically. In step 410 the execution subsystem 32 enqueues the self-reference node (SRN) of the subdiagram on the run queue. In step 412 the subsystem sets node complete to false and in step 414 sets the node's desire to be requeued to false. The node's desire to be requeued is set to false because the node places itself back on the run queue in step 424, as discussed below.

If execution of the loop begins at starting point 1 and hence this is not the loop's initial starting point in step 402, then in step 416 the subsystem increments the loop counter to index into the loop. The execution subsystem 32 progresses auto-indexing in step 417 and evaluates the reiteration in step 418. In step 420 the subsystem 32 determines if the loop will reiterate. If not, then the loop is done, i.e., the loop has finished iterating, and the subsystem sets node complete to true in step 422 and returns to step 322 (FIG. 9B). It finishes the auto-indexing feature in step 421. Here it is noted that the node complete question in step 322 will be answered in the affirmative and thus the subsystem will advance to step 324 and propagate signals. If the loop has not completed and thus further iterations are determined to be required in step 420, then in step 424 the subsystem 32 enqueues the subdiagram self-reference node on the run queue in step 420 and advances to step 412. In steps 412 and 414, node complete is set to false and the desire to be requeued is also set to false. The execution subsystem then returns to step 322 (FIG. 9B). Here it is noted that the node complete question in step 322 will be answered in the negative, and thus the subsystem will return back to step 312 (FIG. 9A).

Case Structure Node

Figure 9H:
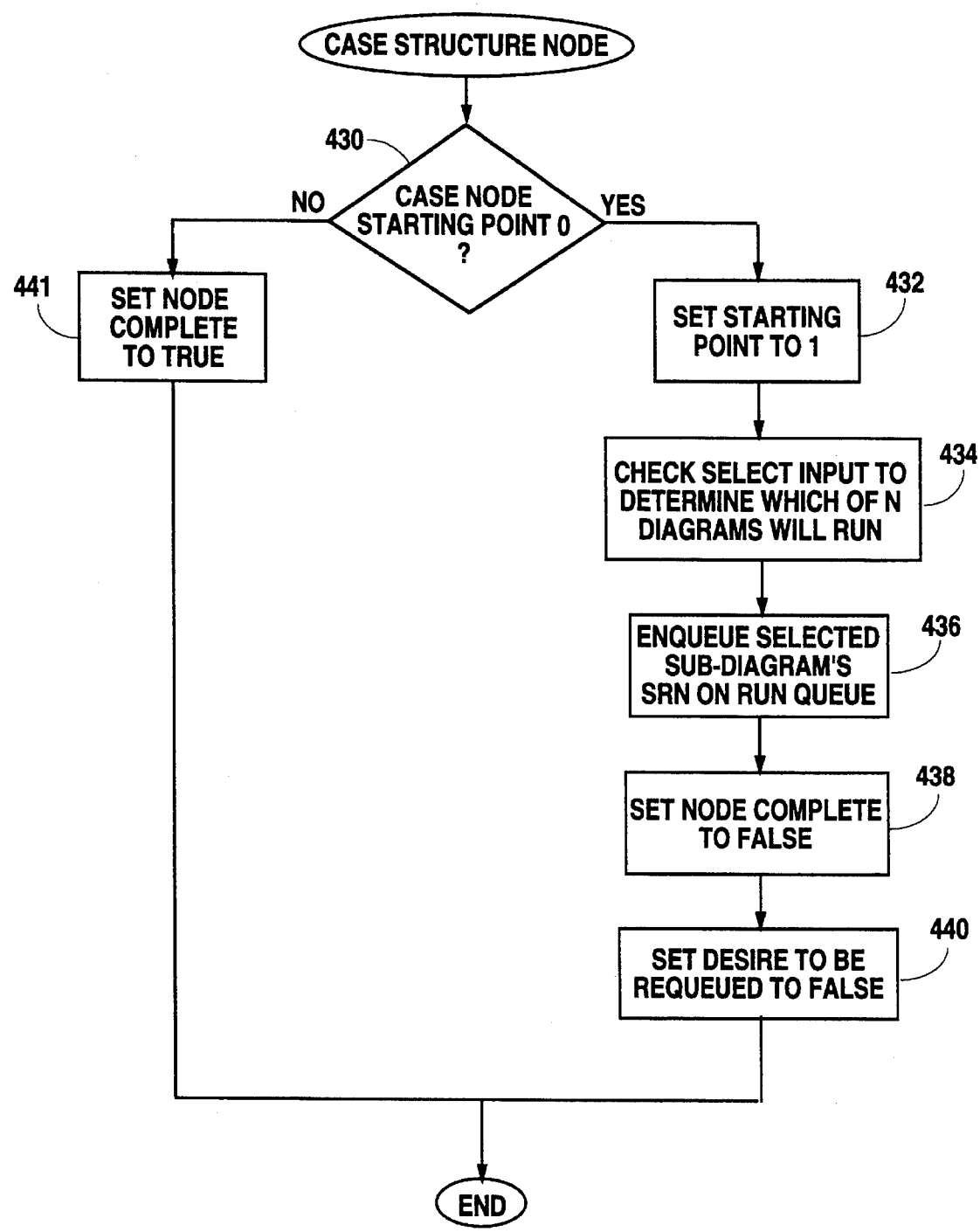
Figure 12A:
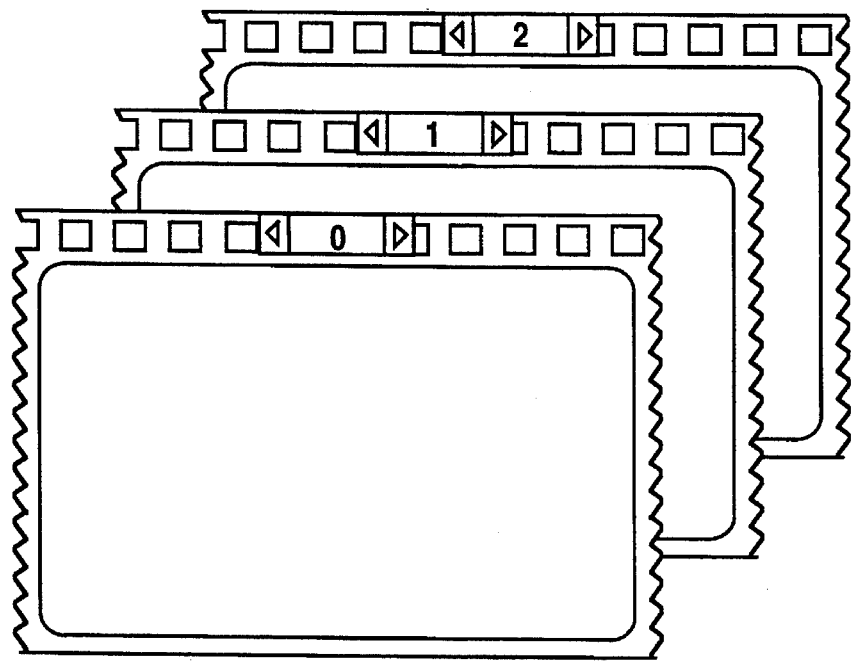
FIG. 12A shows a graphical representation of a sequence structure.
Figure 12B:
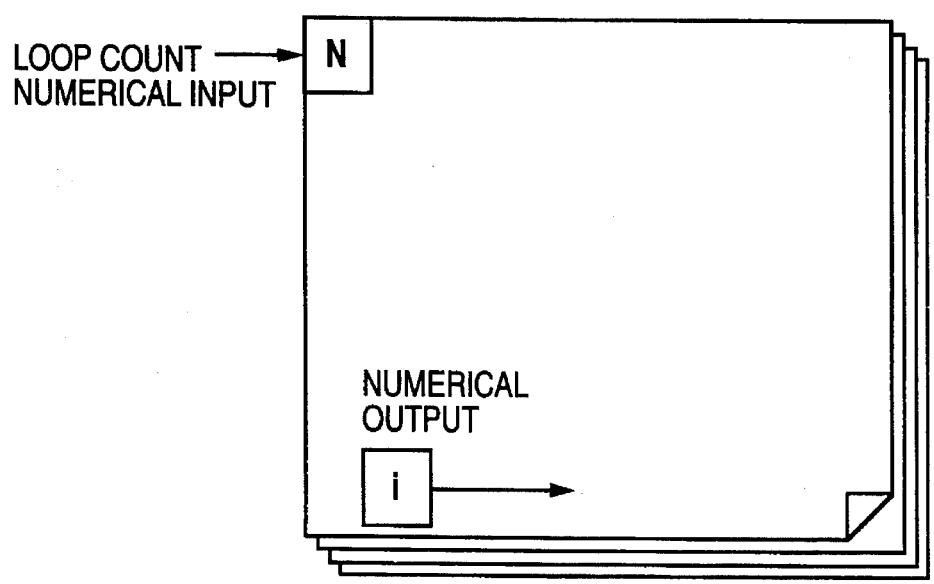
FIG. 12B shows a graphical representation of an iterative loop structure.
Figure 12C:
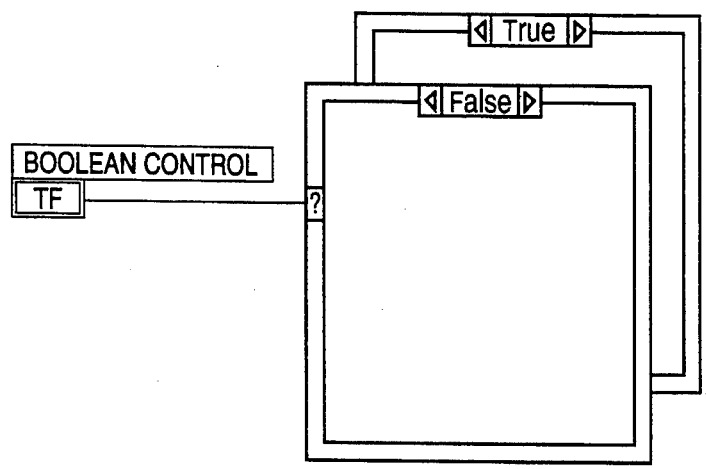
FIG. 12C shows a graphical representation of a conditional structure.

A case structure node corresponds to the conditional structure illustrated in FIG. 12C. Referring now to FIG. 9H, if the node being executed in step 310 is a case structure, then the node specific functions performed in step 320 are as follows. In step 430 the execution subsystem 32 determines if the case node has been entered at its 0 starting point, i.e. if this is the initial entry into execution of the case node. If so, then in step 432 the execution subsystem sets the starting point of the case node to 1. Thus, the next time the case node is entered, the question in step 430 will be answered in the negative. In step 434 the execution subsystem 32 checks the select input to determine which of the N diagrams will run. In other words, since a case statement includes a number of possible cases, one of which will be executed depending upon the select input, the input must be checked to determine which of the N diagrams in the case statement will be executed. In step 436 the subsystem enqueues the selected subdiagram self-reference node on the run queue. In step 438, the execution subsystem sets node complete to false and in step 440 sets the desire to be requeued to false. Execution then completes. If the case node starting point is determined to be 1 in step 430, then in step 441 the execution subsystem sets node complete to true and then completes.

Sequence Structure Node

Figure 9I:
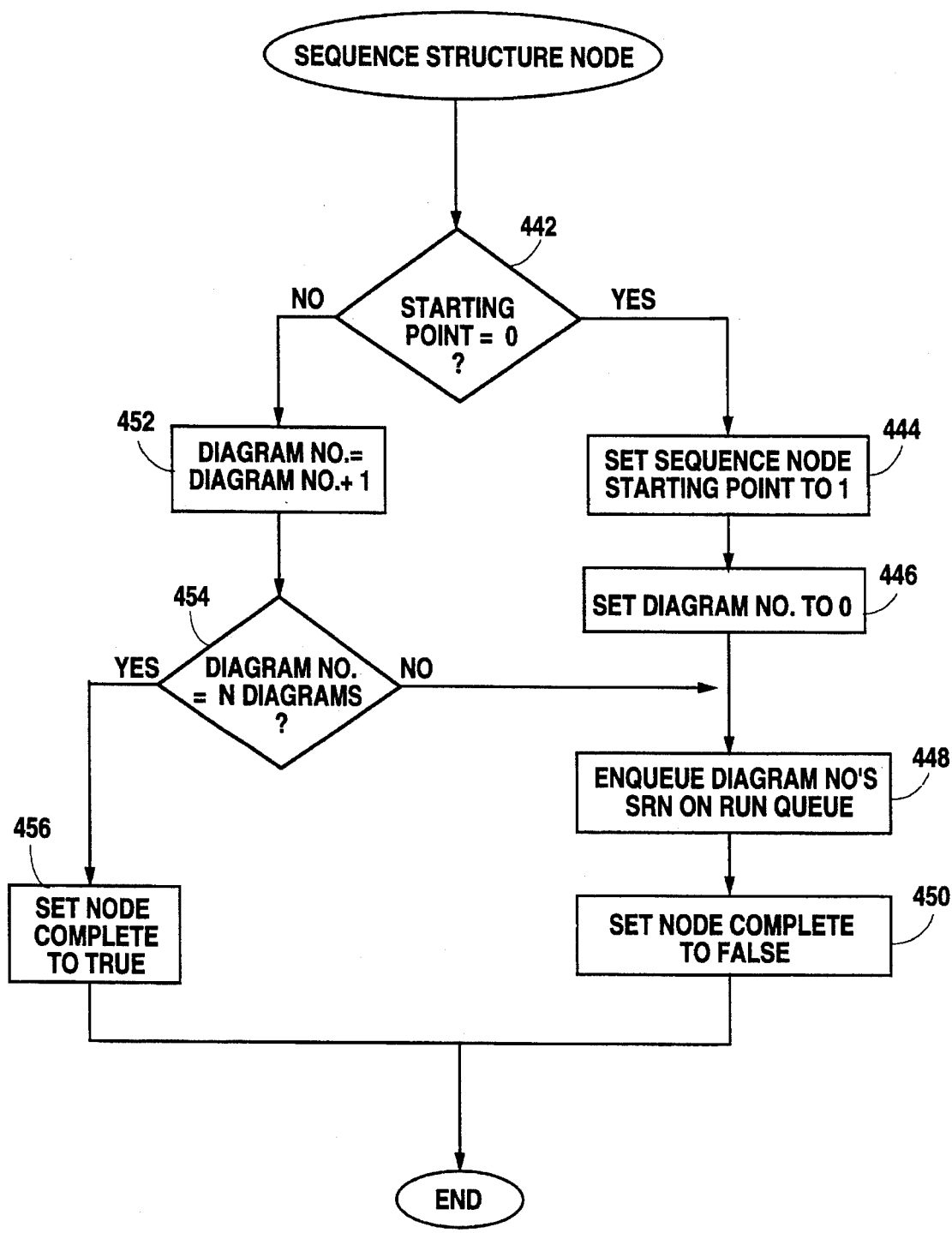

A sequence structure node corresponds to the sequence structure illustrated in FIG. 12A. Referring now to FIG. 9I, if the node executed in step 310 is a sequence structure node, then the following node specific functions are executed in step 320. In step 442, the subsystem determines if this is the initial starting point (starting point 0) for the sequence structure node. If so, then in step 444 the subsystem 32 sets the sequence node starting point to 1. In step 446 the execution subsystem 32 sets a variable referred to as Diagram Number to zero. The variable Diagram Number refers to the particular diagram of the sequence structure, which includes a plurality of diagrams. In step 448 the subsystem 32 enqueues the Diagram Number's self-reference node on the run queue. In step 450 the subsystem 32 sets node complete to false and completes.

If the entry into the sequence structure node is determined not to be the initial entry in step 442, but rather is determined to be entry at starting point 1, then in step 452 the subsystem 32 increments the variable Diagram Number by one. In step 454 the subsystem 32 then determines if Diagram Number is equal to N, i.e. if all the diagrams in the sequence structure node have been executed. If not, the execution subsystem returns to step 448 and enqueues the self-reference node of the next Diagram Number on the run queue and sets node complete to false in step 450. If all the diagrams have been executed in step 454, then the subsystem 32 sets node complete to true and completes. It is noted that the node will be determined to have completed in step 322 (FIG. 9B), and thus the subsystem 32 will then proceed to step 324 to propagate its signals.

Asynchronous Node

Figure 9J:
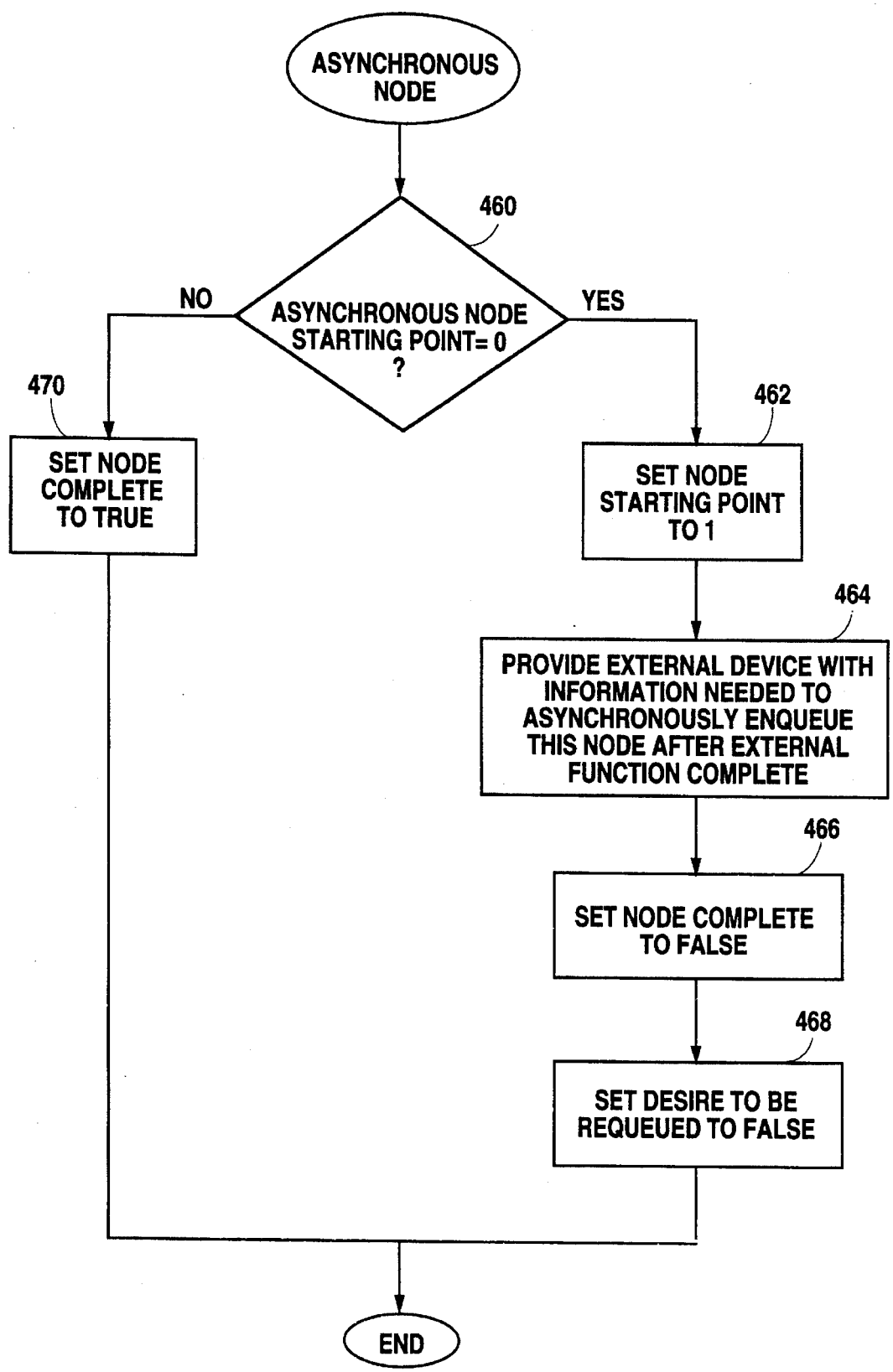

An asynchronous node is a node which is required to wait on external events before executing. Referring now to FIG. 9J, if the node executed in step 310 is an asynchronous node then the following node specific functions are executed in step 320. In step 460 the execution subsystem 32 determines if the asynchronous node has entered execution 32 at starting point 0. If so, then in step 462 the execution subsystem 32 sets the node starting point to 1 so that a subsequent entry into this node will affect a negative choice in step 460. In step 464 the execution subsystem 32 provides the respective external device with information needed to asynchronously enqueue this node after external functions have completed. For example, this external device may be a timer or a device driver or it may be another node if an occurrence has been set. For more information on occurrences, please see related co-pending application Serial No. 08/125,642, entitled "Method and Apparatus for More Efficient Function Synchronization in a Data Flow Program," and filed concurrently herewith which is hereby incorporated by reference. In step 466 the execution subsystem sets node complete to false and then in step 468 sets the desire to be requeued to false. The node specific function for the asynchronous node then completes. At some later time after the respective external device has completed operations and has enqueued the asynchronous node, the asynchronous node will again be entered in step 460. If an occurrence has been set, the node will be re-entered in step 460 when the occurrence is triggered. For more information on this, please see the above-referenced application. When the node is reentered, the asynchronous node starting point will be determined to be 1. When this occurs, node complete is set equal to true in step 470 and the node specific operation for the asynchronous node completes.

Long Computational Node

Figure 9K:
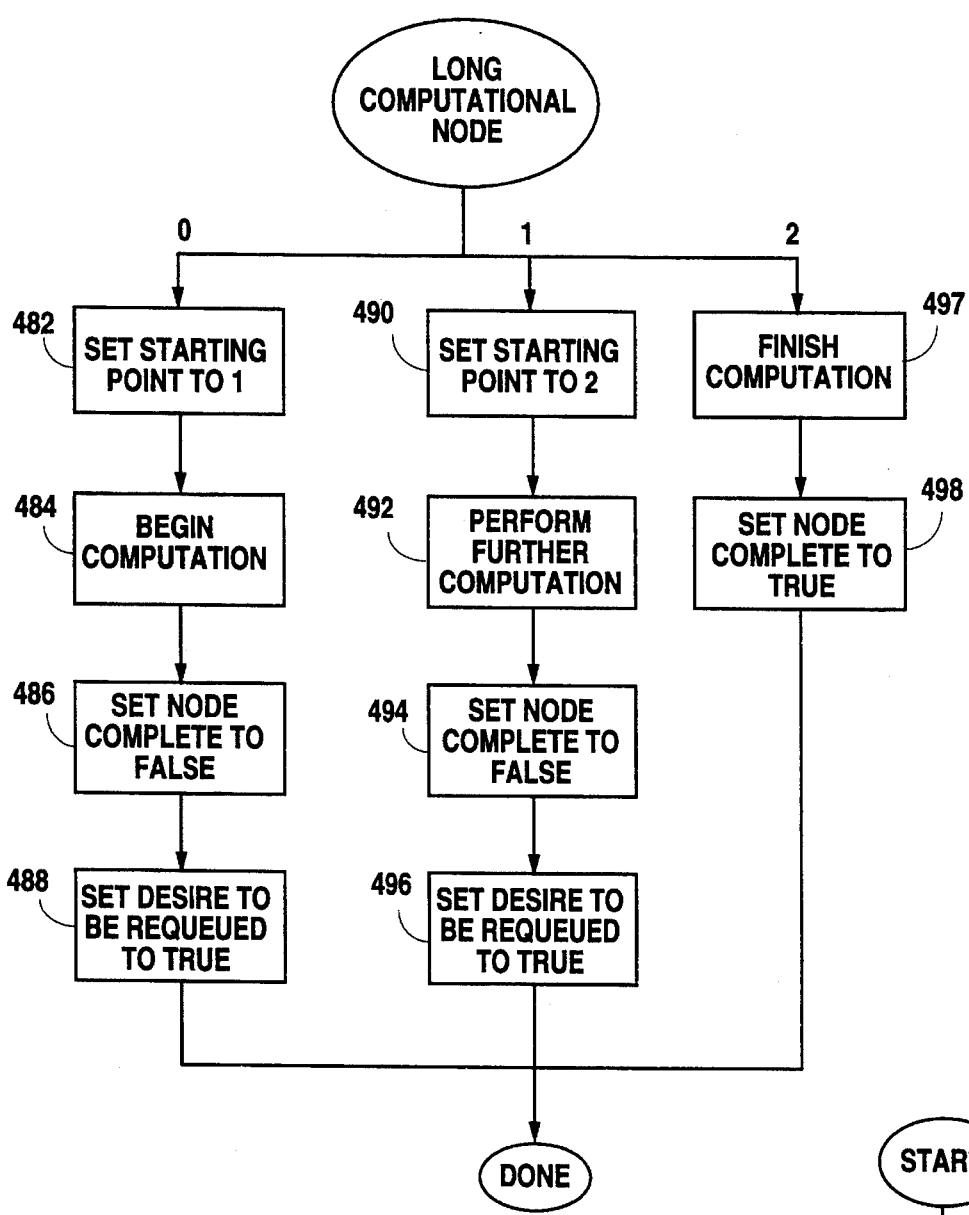

A long computational node can be described as a node which requires a large amount of computation and thus is required to share execution time with other nodes. Unlike other nodes, the long computational node includes any number of different starting points. In the example illustrated in FIG. 9K, the long computational node includes three different starting points referred to as 0, 1, and 2. Referring now to FIG. 9K, when the long computational node is first called, it enters at starting point 0, its initial starting point. In step 482 the execution subsystem 32 sets its starting point to a later point referred to as point 1. In step 484 the execution subsystem 32 begins computation on the long computational node, performing a portion of the computation required. In step 486 the subsystem sets node complete to false and in step 488 sets the desire to be requeued to true. The desire to be requeued is set to true because further computations are required to complete the node.

When the long computational node is again entered, it enters at point 1. As shown in step 492, the execution subsystem 32 sets the starting point to 2. In step 492 the execution subsystem 32 performs further computations on the node. In steps 494 and 496 the subsystem 32 sets node complete to false and sets the desire to be requeued to true, respectively.

When the long computational node is entered for a third time, it enters at starting point 2. In step 497, the subsystem 32 finishes computation on the node and in step 498 sets node complete to true. It is again noted that additional similar stages may be present and a long computational node with 3 stages is shown only as an example.

Starting a Top Level VI

Figure 9L:
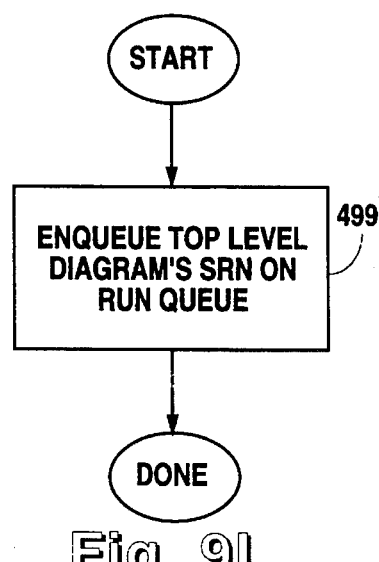

Referring now to FIG. 9L, a flowchart diagram illustrating operation of the routine which kicks off the first self-reference node of a large block diagram is shown. In step 499 the execution subsystem 32 enqueues the top level diagram's self-reference node on the run queue. This flowchart is necessary to place the first self-reference node on the run queue. Subsequent to this, the self-reference node places other nodes within respective self-reference node on the run queue. As data output signals are propagated, other nodes in turn are placed on the run queue and so forth. The operation in FIG. 9L is necessary merely to place the initial self-reference node in the run queue to "kick things off."

Execution Subsystem Operation Overview

The following description summarizes and further describes the operation of the execution subsystem 32 of the system 28 and the instrumentation system 56.

The first step in the execution of a virtual instrument is accomplished by executing its block diagram. The first step in the execution of a block diagram is accomplished by scanning the terminals contained in the diagram's self-reference node. For each terminal which is the source of a signal, the data token is moved from the control reference by the terminal to the terminal itself. The second step in the execution of a diagram is to initialize the token short-count of each node in the diagram to the number of input signals to that node, i.e. its fire count. The third step in the execution of a diagram is to propagate signals from the self-reference node. Propagation of signals from a node is accomplished by scanning all of the node's terminals. For each terminal that is source of a signal the data token on the terminal is copied to each destination terminal of the signal path. Each token placed on a destination terminal causes the short-count of the node containing the terminal to be decremented. If it becomes zero in the process, then that node is scheduled to execute.

The first step in the execution of a node is accomplished by copying the tokens from the node's terminals to the reference controls. The second step depends upon the type of node. For an instrument use node that references a real-time virtual instrument, the next execution step is to copy the tokens from the node's controls to the virtual instrument's controls and to execute the virtual instrument. For an instrument use node that references previously stored data of a virtual instrument, the tokens from the appropriate data record are read in and placed on the node's terminals. For a sequence structure node, the next step is to execute the first subdiagram. For a conditional structure node, the next step is to execute the subdiagram indicated by the value of the token on the selected control. For an iterative or indefinite loop structure node, the next step is to set the value of the token on the iteration number control to zero and to execute the subdiagram. For a self-reference node, the next step is to perform the next step in the execution of the node or the virtual instrument which contains the diagram that contains the self-reference node.

The third step in the execution of a node also depends upon the type of node. For an instrument use node or a conditional structure node the output data tokens are propagated along the signal paths. For a sequence structure node, the next subdiagram is executed, if one exists, and if not, the output tokens are propagated. For a loop structure node, the shift registers are clocked (the data is shifted), the iteration number incremented, and the subdiagram is reexecuted, if appropriate; otherwise the output tokens are propagated.

The second step in the execution of the virtual instrument is to log the tokens on the front panel controls if data logging is enabled. The third step in the execution of the virtual instrument is to copy the tokens from the virtual instrument's indicators to the instrument use node's output terminals and to schedule the instrument use node to execute its next step. The third step of virtual instrument execution is performed only if the virtual instrument was executed in response to an instrument use node request. If the virtual instrument was executed interactively, there is no third step.

Front Panel Generation

Figure 10:
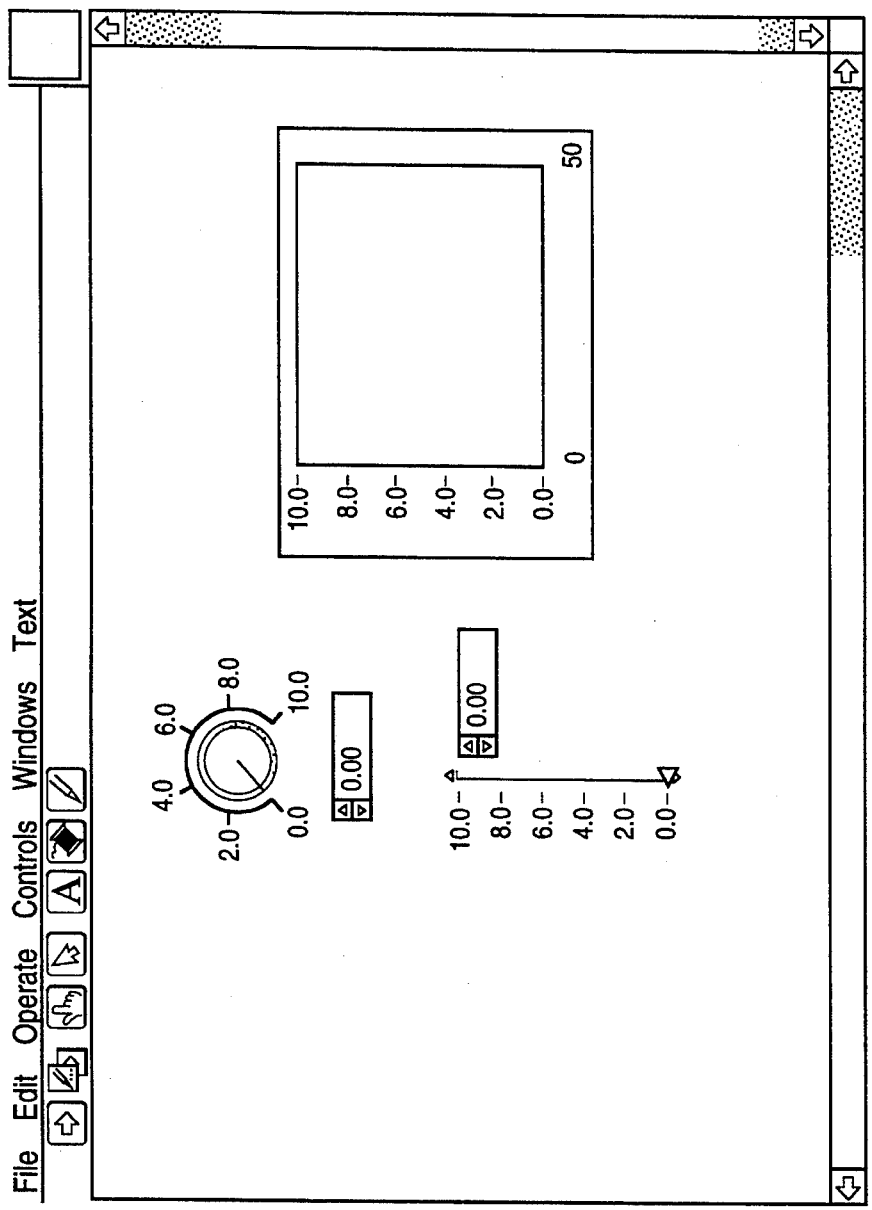
FIG. 10 shows an illustrative front panel produced using the front panel editor of the instrumentation system of FIG. 4.

FIG. 10 shows details of an illustrative front panel 62 which is produced using the front panel editor 36 and which is displayed using the keyboard and display 58. It will be appreciated that the illustration of FIG. 10 represents an actual graphical computer-generated display of an exemplary front panel for the instrument 60. The graphical representation of FIG. 10 illustrates physical control dials and switches for providing variable input information and illustrates a coordinate plane type indicator for displaying variable output information. More particularly, FIG. 10 shows a circular turn-dial and a slide switch for setting input variable data. The turn-dial and slide switch each correspond to respective rectangular boxes for digitally illustrating variable input data in digital form. The illustrative front panel also includes a display for illustrating variable output data. The graphical representations of input controls and output indicators are stored in a memory library, and a user may select from among a variety of different graphical representations of input controls and output indicators in order to construct a panel display which conforms to a user's intuitive understanding of how the instrument 60 is controlled and how it provides data.

Figure 11:
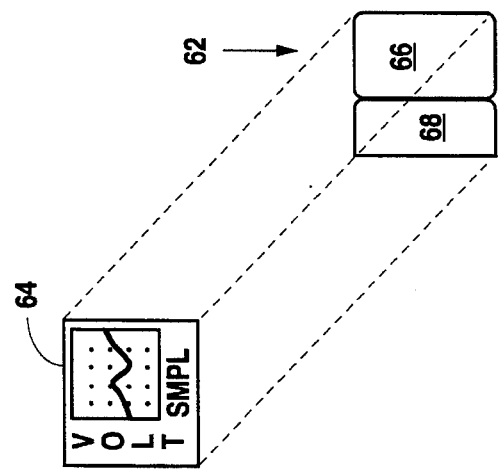
FIG. 11 shows an illustrative icon produced using the icon editor of the instrumentation system of FIG. 4.

FIG. 11 illustrates an icon 64 which can be used to reference a front panel (not shown). A visual representation of the icon 64 can be produced using the icon editor 34. The icon 64 corresponds to a particular front panel (not shown). As will be explained more fully below, the icon 64 can be used as a building-block in a hierarchical system constructed using the block diagram editor 30. The dashed lines of FIG. 11 indicate the one-to-one correspondence between the icon 64 and the respective two-dimensional regions (or hot spots) 66 and 68 which correspond to respective variable input data and variable output data illustrated by controls and displays of the corresponding front panel (not shown). For example, the front panel might include input data in the form a sequence of samples and might provide output data in the form of an indicator showing voltage reading per sample. The icon 64 then might be divided into two two-dimensional regions 68 and 66 which respectively correspond to the input sample count and the voltage reading for that sample count.

Structure Nodes

Figure 12D:
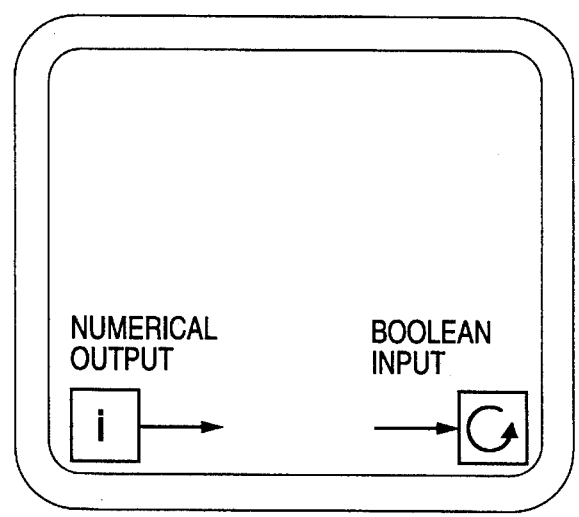
FIG. 12D shows a graphical representation of an indefinite loop structure.
Figure 12E:
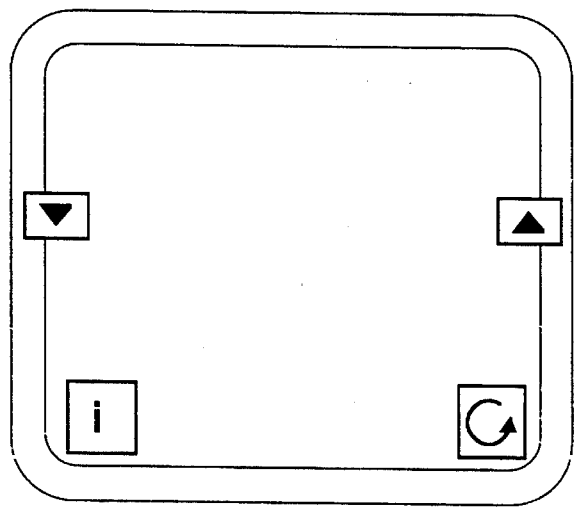
FIG. 12E shows a graphical representation of shift registers on the indefinite loop structure of FIG. 12D.

The drawings of FIGS. 12A–E show the graphical representations of structures utilized in constructing a block diagram as described below using the block diagram editor 30. The structures represented in FIGS. 12A–E substantially facilitate the application of data flow programming techniques which are used in the preferred embodiments of the present invention. FIG. 12A illustrates a sequence structure. FIG. 12B illustrates an iterative loop structure. FIG. 12C illustrates a conditional structure. FIG. 12D illustrates an indefinite loop structure. FIG. 12E illustrates a shift register on an indefinite loop structure.

It will be appreciated that the graphical representations of the structures illustrated in FIGS. 12A–E can be stored in a memory library as can execution instructions corresponding to the respective structures. Thus, a user can call upon a graphical structure library in order to display any one or more of the structures using the display facilities of the control processor 38 and keyboard and display 58 of the instrumentation system of FIG. 4.

Sequence Structure

The sequence structure, which has its graphical representation illustrated in Figure 12A, serves to divide a data-flow diagram into two subdiagrams, one representing an inside and another representing an outside of the sequence structure borders. The outside diagram behaves exactly as if the sequence structure and its contents were replaced by an icon with a terminal (or hot spot) for each line crossing the sequence structure border. The drawing of FIG. 12A shows a three-diagram sequence. In order to minimize space used on a computer console screen, only one diagram of the sequence structure is visible at a time. Inside the structure border, multiple diagrams (not shown) can be constructed which execute in sequence. The sequence of diagrams are indicated by the respective numbers in the respective sequence diagrams. When the first diagram (indicated by the number 0) in this sequence completes its execution, the next one begins. The process is repeated until all diagrams in the sequence have been executed.

Each diagram in the sequence uses a subset of incoming signal paths and produces a subset of outgoing signal paths (the outgoing subsets must be mutually exclusive, but the incoming subsets are arbitrary). Constants may be used with any of the diagrams without any constraints. Sequence variables indicated by rectangular boxes attached to the inside edge of the sequence structure (not shown in FIG. 12A) can be used multiple times in the diagrams following the diagram where the variable was assigned.

In accordance with data-flow principles used in the preferred embodiments of the present invention, the sequence structure does not begin execution until all incoming signal paths have data available, and none of the outgoing signal paths produce data until all diagrams have completed execution.

Figure 13:
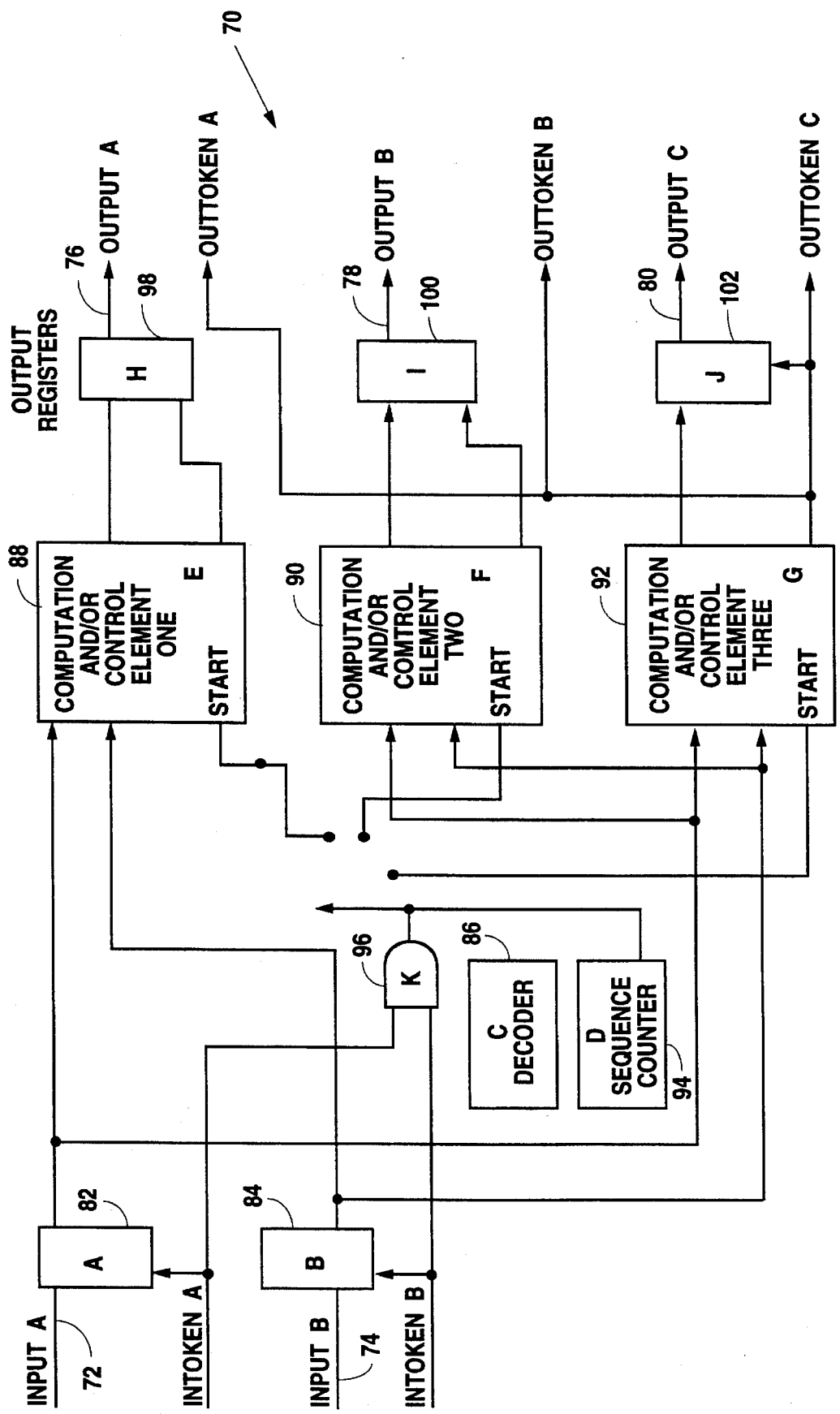
FIG. 13 shows an illustrative block diagram generally corresponding to the graphical representation of a sequence structure shown in FIG. 12A.

FIG. 13 shows an illustrative block diagram 70 of a sequence structure. The sequence structure is coupled to receive input signals on respective lines 72 and 74 and to provide respective output signals on respective lines 76, 78, and 80. Input registers 82 and 84 are provided to collect input data. A decoder 86 is provided to determine which computation and/or control element 88, 90, or 92 to select, and a sequence counter 94 is included to undertake a count for sequencing between respective elements 88, 90, and 92. When all data inputs are present, an output of AND gate 96 becomes TRUE. This starts computation in computation and/or control element 88 (assuming that it is the first element selected). When the control element 88 has completed computation, its output is stored in register 98. When the first element 88 has completed computation, the sequence counter 94 is free to advance by one. The decoder 86 will select the second computation element 90. The output of AND gate 96 will become TRUE again and, computation will begin in the second element 90. the output of the second element 90. The output of the second element 90 will be stored in output register 100. The sequence repeats for the third element 92, and its output is stored in output register 102. After the completion of the computation by the third element 92, the output data from all computations will be available for further computation by other instruments (not shown) of a block diagram system as will be explained more fully below.

Iterative (For) Loop Structure

The iterative loop structure, a graphical representation of which is shown in FIG. 12B is similar to the sequence structure in that the iterative loop structure partitions the data-flow graph into two parts. The interior diagram contains the body of the loop. Signal paths crossing the border of an iteration loop structure typically have a transformation applied. Incoming data are indexed in the most significant dimension so that the data inside the structure have dimensionality one less than outside. Outgoing data has the inverse transformation performed. The iterative loop structure is similar in operation to a for-next loop in a text-based program.

It is possible to disable the indexing on a signal path, in which case, the data behaves as if it were a constant available to each iteration. If indexing is disabled on an outgoing signal path, the data value is repeatedly overwritten and only the last value propagates out from the iteration structure.

There are two special variables which behave as constants within the body of the iterative loop structure: the number of iterations, N, and the iteration number or index, i. Usually, the number of iterations to be executed is automatically set by the size of the dimension being indexed for an incoming signal path (or the minimum of the indexed dimension sizes of all the incoming signal paths if there are more than one). In the event that there are no incoming signal paths, a scalar value must be specifically connected to the variable to specify the number of iterations. The iteration number, i, is similar to a constant within the diagram except that its value is 0 for the first iteration and increments by 1 at the end of each iteration.

Iteration Structures that have no data dependencies can, in principle, be executed in any order or completely in parallel except in the case where a non-reentrant virtual instrument is used by more than one structure. An example of a non-reentrant virtual instrument is a VI which controls an instrument or data acquisition card. In that case, the iteration structures would be executed strictly sequentially, in accordance with data flow principles. All inputs must be available to start execution of an iteration loop. Furthermore, all outputs are generated after execution completes.

Figure 14:
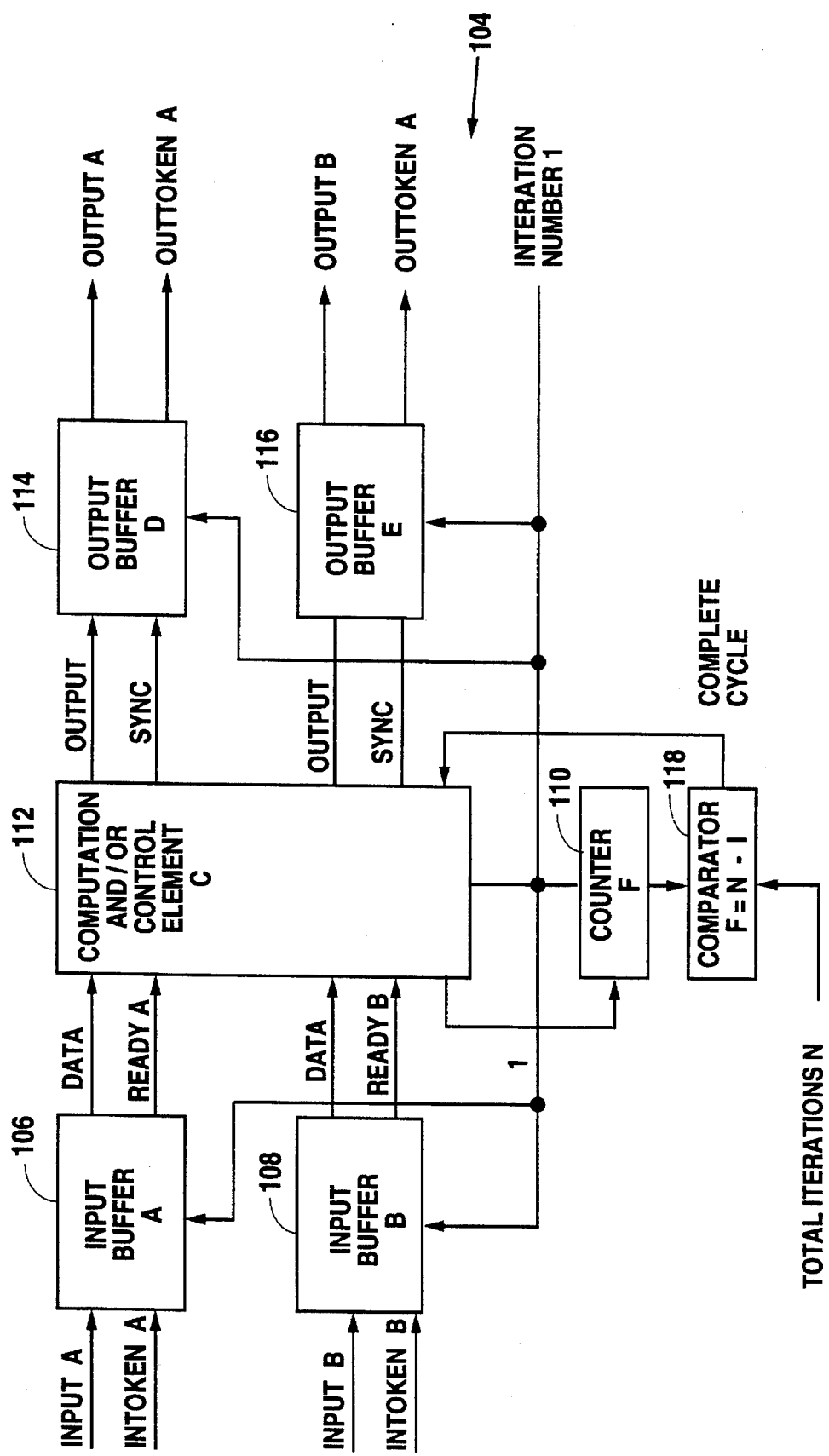
FIG. 14 shows an illustrative block diagram generally corresponding to the graphical representation of an iterative loop structure shown in FIG. 12B.

Referring to the illustrative drawings of FIG. 14, there is shown a block diagram 104 for an iterative loop. An iterative loop structure operates on data in an array one element at a time. The data for each element are sequentially stored in respective input buffers 106 and 108. A counter 110 begins its count at 0. When the first data elements are available for both inputs of both respective input buffers 106 and 108, computation and/or control element 112 will generate outputs to be stored in respective output buffers 114 and 116. At that time, the counter 110 will advance to 1, and the process will repeat for the second data element in the array. This process will repeat until the counter 110 reaches N−1 making a total of N computations. At that time a complete cycle signal will be generated by the comparator 118. The output signals stored in the respective output buffers 114 and 116 then will be available for use by other computation instruments (not shown).

Conditional Structure

The conditional structure, a graphical representation of which is shown in Figure 12C, is similar in appearance to the sequence structure in its use of screen space, but it differs in its handling of signal paths crossing its border in that in each case a diagram may use any subset of incoming signal paths, but must produce all outgoing signal paths. In accordance with data-flow principles, all inputs must be available in order to start execution. Furthermore, all outputs are generated after execution is completed. The conditional structure is similar in operation to a case or switch statement used in certain text-based programming environments.

There must be a signal path that terminates at the case-selection terminal on the structure border. In the simplest case, a Boolean-valued scalar is connected to the selector to select between case FALSE and case TRUE. In the general case, a scalar number is connected to the selector to select among diagram case 0, case 1, etc.

Figure 15:
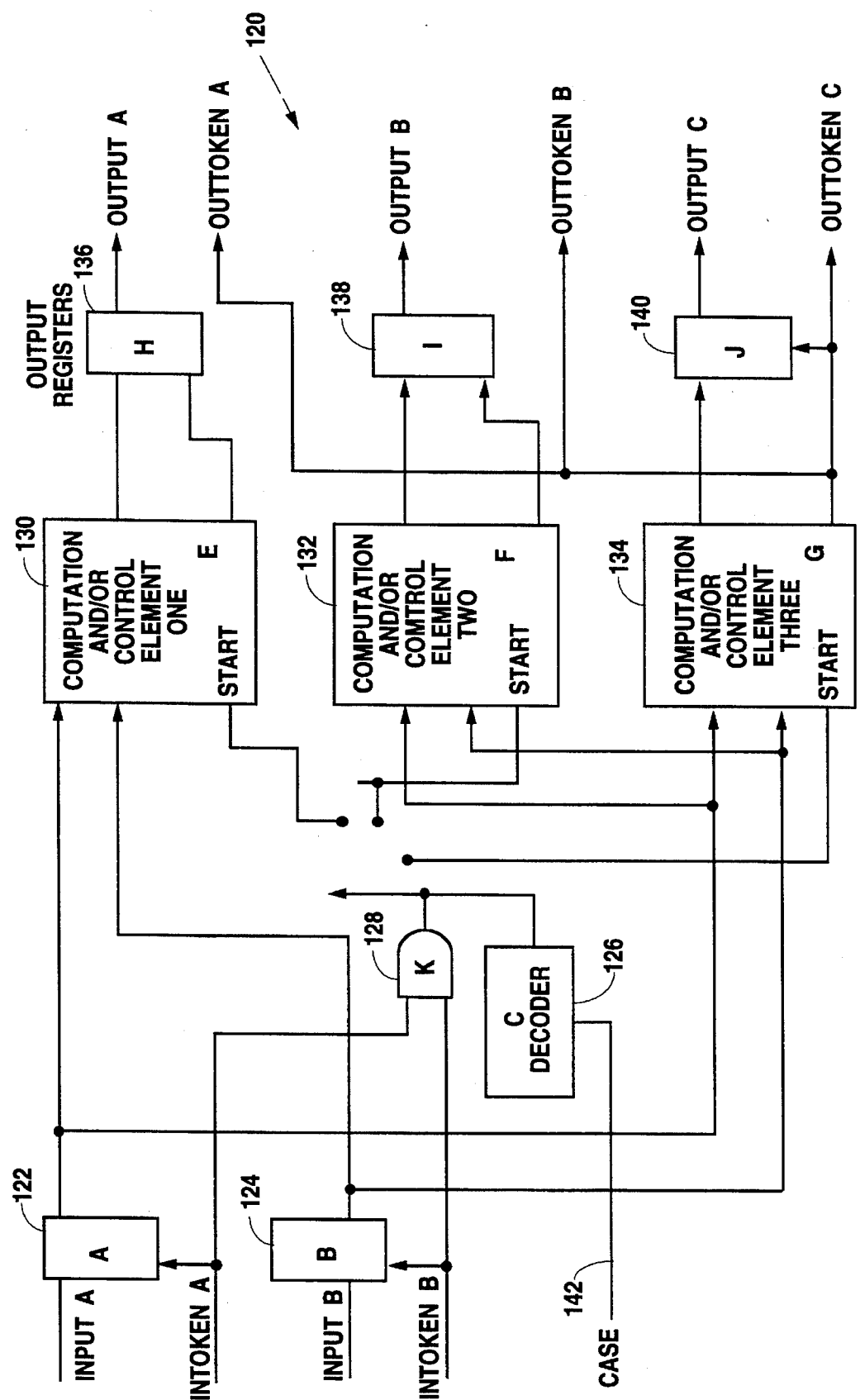
FIG. 15 shows an illustrative block diagram generally corresponding to the graphical representation of a conditional structure shown in FIG. 12C.

The drawings of FIG. 15 illustrate a block diagram 120 corresponding to a conditional structure. The block diagram 120 for the conditional structure is substantially similar to that of the block diagram 70 for the sequence structure. The block diagram 120 for the conditional structure includes respective input registers 122 and 124, a decoder 126, an AND gate 128, three respective computation and/or control elements 120, 132, and 134 and three respective output registers 136, 138, and 140 all coupled as shown in the drawings of FIG. 15. In operation, the conditional structure block diagram 120 operates in a manner substantially similar to that of the sequence structure block diagram 70, except that the decoder 126 of block diagram 120 is directly controlled by the case selection input provided on line 142 to select only one diagram.

Indefinite (=While) Loop Structure

The indefinite loop structure, a graphical representation of which is shown in FIG. 12D, is similar in concept to the iterative loop structure in that the interior of the structure diagram represents the body of the loop, but it differs in that signal paths crossing the border of the indefinite loop structure do not usually have an indexing transformation applied. The indefinite loop structure is similar to a do-while loop in text-based programming languages.

There are two special variables applied within the body of the indefinite loop structure: iteration number or index, i, and continuation flag. The iteration number starts at zero and increments by one at the end of each iteration. A boolean value or expression is connected to the continuation flag. A value of TRUE means that another iteration will be performed. If the continuation flag is left unconnected, it is equivalent to connecting a FALSE constant. In accordance with data-flow principles applied in the preferred embodiments, all inputs must be available in order to start execution. Furthermore, outputs are generated after execution is complete.

Figure 16:
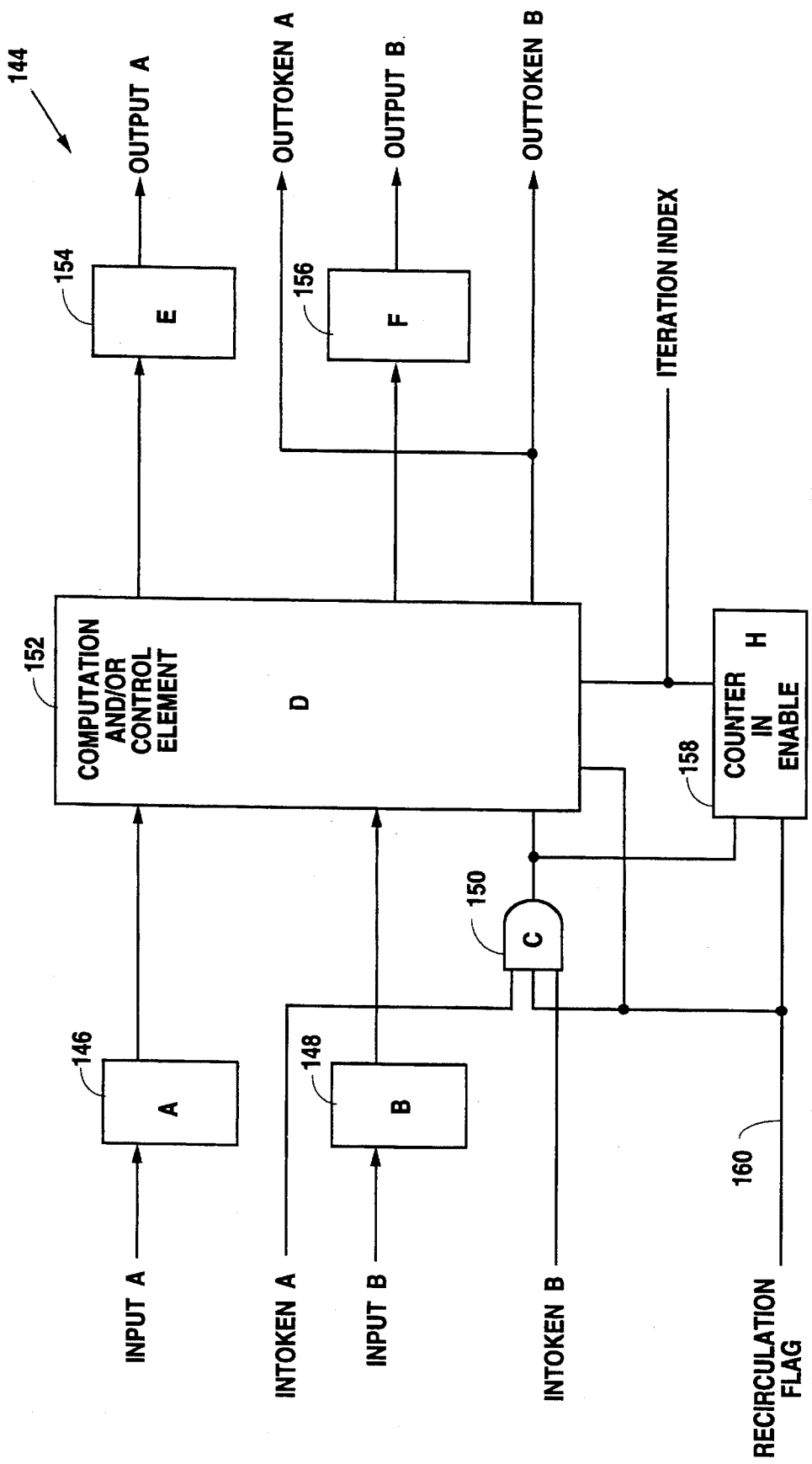
FIG. 16 shows an illustrative block diagram generally corresponding to the graphical representation of an indefinite loop structure shown in FIG. 12D.

The illustrative drawing of FIG. 16 shows a block diagram 144 which corresponds to the graphical representation of an indefinite loop structure shown in FIG. 11. In operation, when data inputs are available on both respective input registers 145 and 148, an output of AND gate 150 will become TRUE to enable computation and/or control element 152. After computation is complete, output data are stored in respective output registers 154 and 156. After completion of the first loop, counter 158 increments, and the cycle begins again. This process continues until a continuation flag provided on line 160 goes FALSE. The output data are present after each cycle.

Shift Register

A special construction available for use only within the respective loop structures is the shift register. A graphical representation of each respective loop structure type incorporating a shift register is shown in FIG. 12E. The shift register eliminates the need for cycles in a data-flow graph, making the result easier to comprehend and to prove correct. The shift register behaves as if it were an ordered set of two or more variables, all of the same type and dimensionality.

The first variable in a set is an output of the loop-body diagram and is located on the right border of the loop structure. The other variables of the set are inputs to the loop-body diagram and are located on the left border of the structure at the same elevation.

At the conclusion of each loop iteration, the data from the shift register output variable are shifted into the first input variable, and the previous value of the first input variable is shifted into the second input variable.

Figure 17:
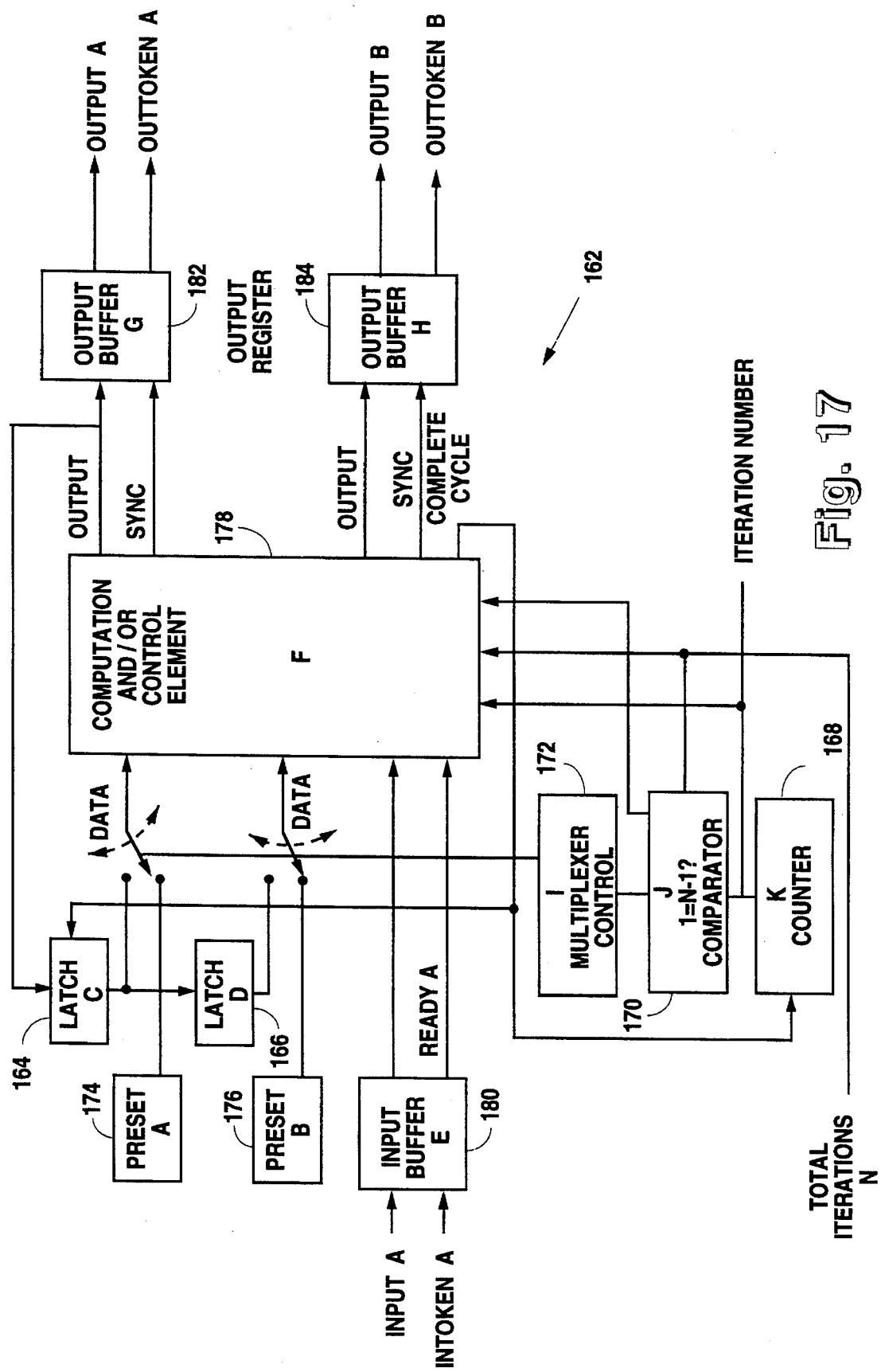
FIG. 17 shows an illustrative block diagram generally corresponding to the graphical representation of an iterative loop structure including a shift register shown on the left in FIG. 12E.

The drawing of FIG. 17 shows an illustrative block diagram 162 illustrating operation of an iterative loop structure including a shift register. Respective latches 164 and 166 are provided to implement the shift register. In operation, the block diagram 162 of FIG. 17 (which represents an iterative loop structure with a shift register) operates similarly to the block diagram 104 of FIG. 14 (which represents an iterative loop structure minus a shift register) except that computation inputs are provided which give the system feedback from a previous cycle.

An output provided by loop counter 168 is sensed by the comparator 170. For the first loop, the multiplexor control 172 selects preselect inputs from respective preset gates 174 and 176. For all other cycles, respective latches 164 and 166 are selected. The selected input is fed into the computation and/or control element 178. data from input buffer 180 also is fed into the computation element 178. After each cycle, the computed output data are fed into respective output buffers 182 and 184. When the comparator 170 reaches N−1, the process is completed, and the output data can be passed to a next instrument (not shown).

Type Descriptors

The system and method according to the preferred embodiment uses type descriptors to describe the contents of clusters and arrays. A type descriptor is essentially a language or grammar for describing data types used in the preferred embodiment. Referring now to FIG. 18, a diagram illustrating a type descriptor for a cluster containing an integer, a string, a character, and a float is shown. The block diagram editor encodes this cluster in the following manner. The first three elements in the type descriptor are a size word representing the size of the cluster, 22 bytes in this example; a word containing the number 50 representing a cluster code; and a word containing 4 for the number of elements within the cluster. The next word contains the number 4 representing the size of the first element of the cluster in bytes followed by the code of the first element of the cluster, an integer, which is encoded as a 3. The next element in the cluster also has a size of 4 bytes and it is a type string, which is encoded as a 30. Thus the next element is encoded as 4, 30. The third element has a size of 4 and is a character, so it is encoded as a 4,1. The last element has a size of 4 and is encoded as a 10. Therefore, in summary, the type descriptor includes elements for size, data type code, and number of elements, as well as a size and code for each of the elements in the data structure.

Construction of an Exemplary Block Diagram

FIGS. 19A–K illustrate computer screen displays during each successive step in a construction of an exemplary block diagram using the block diagram editor 30 such as that of FIGS. 2 or 4. In FIGS. 19A–D, the front panel window appears on the left and the block diagram window appears on the right.

Figure 19A:
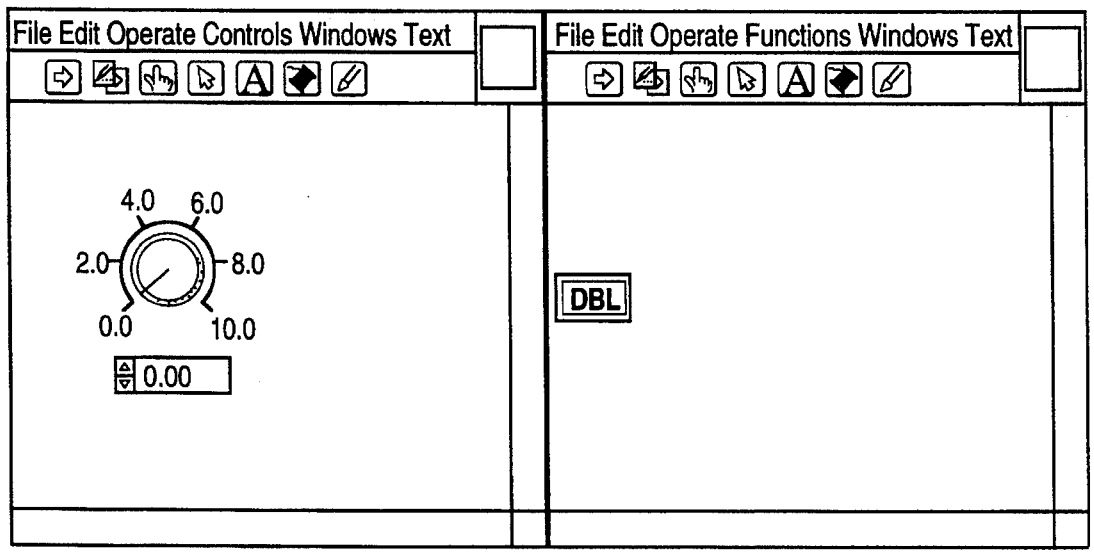
FIGS. 19A–K illustrate computer video displays during each successive step in a construction of an exemplary block diagram using the block diagram editor of FIGS. 2 or 4.
Figure 20A:
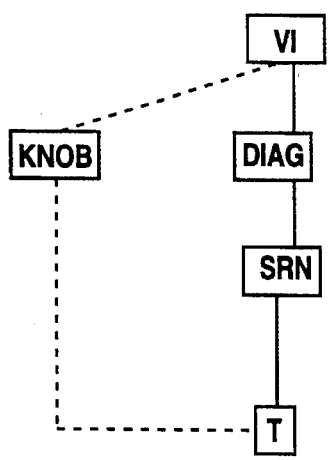
FIGS. 20A–C illustrate a system representation corresponding to FIGS. 19A–D.

More particularly, in FIG. 19A, a control knob is placed in the front panel, and its associated terminal automatically appears in the block diagram. Referring to FIG. 20A, the system representation shows the virtual instrument with a diagram containing a self reference node, and a terminal in the self reference node which references the front panel control.

Figure 19B:
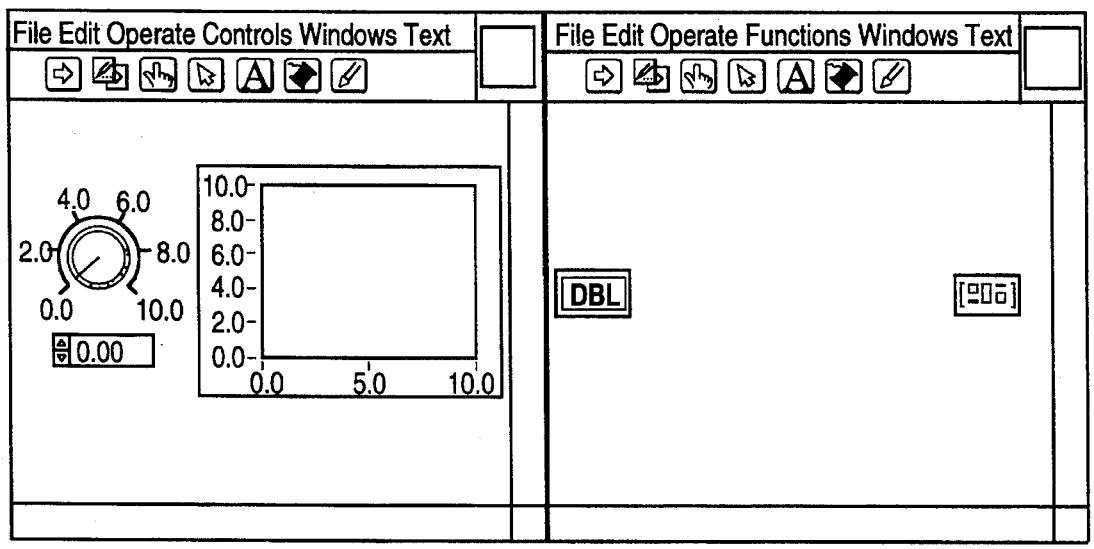

In FIG. 19B, a control graph indicator type is placed in the front panel, and its associated terminal automatically appears in the block diagram in the same position relative to the other terminal as the graph is to the knob. This makes it possible to distinguish the terminal even without supplementing the graphics with text labels.

Figure 19C:
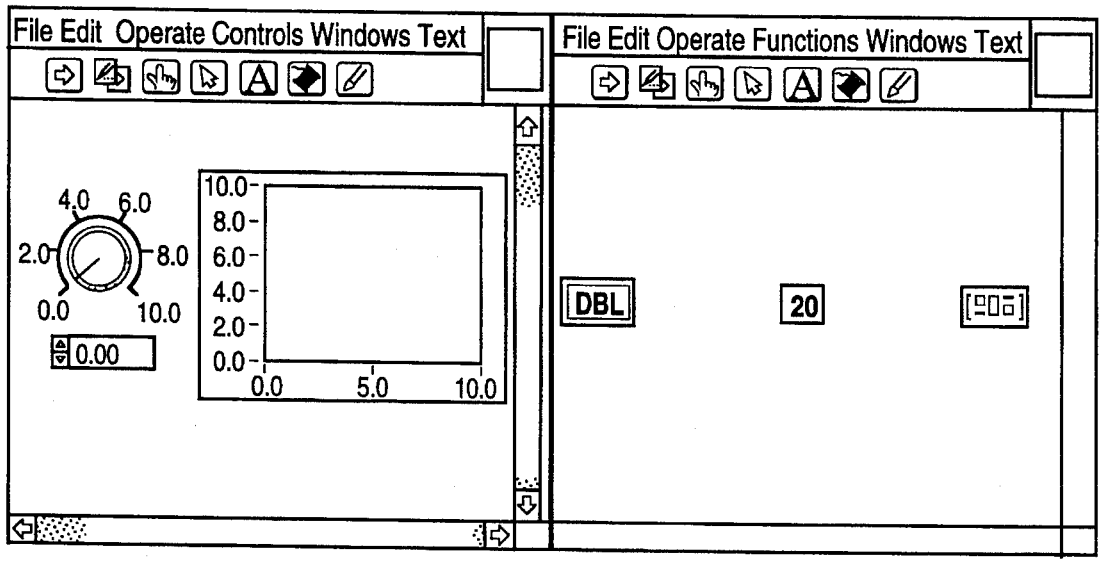
Figure 20B:
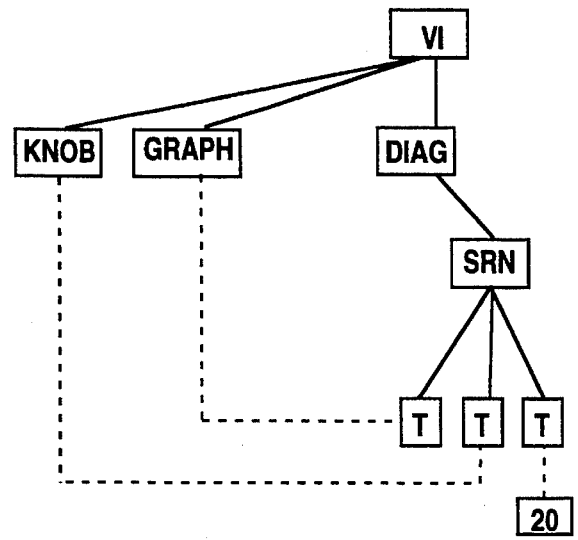

In FIG. 19C, a constant with value 20 is placed in the block diagram. As shown in FIG. 20B, this is reflected in the system representation by another terminal and control attached to the self reference node.

Figure 19D:
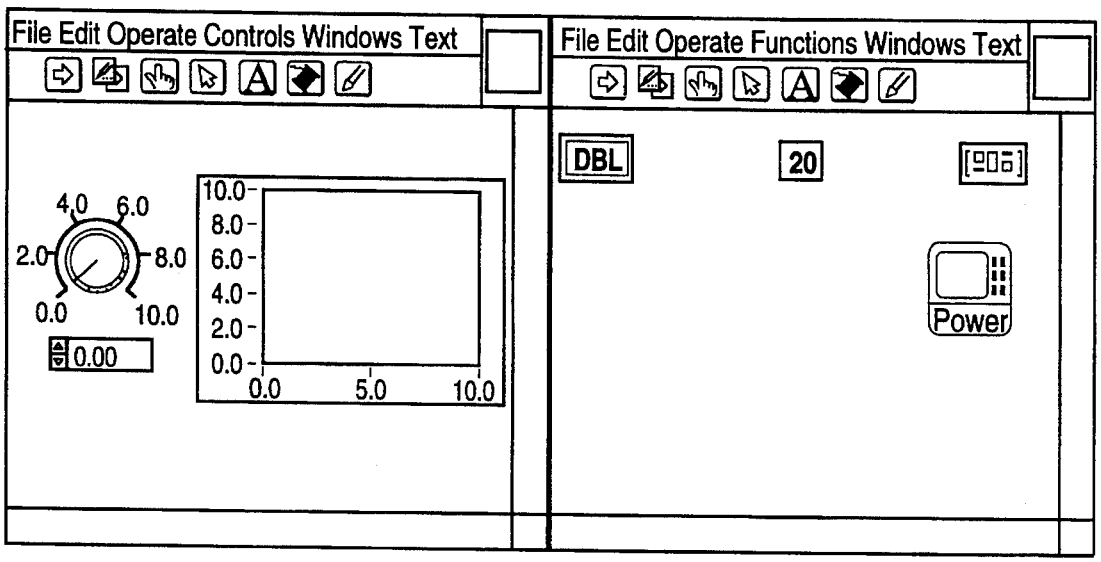
Figure 19:
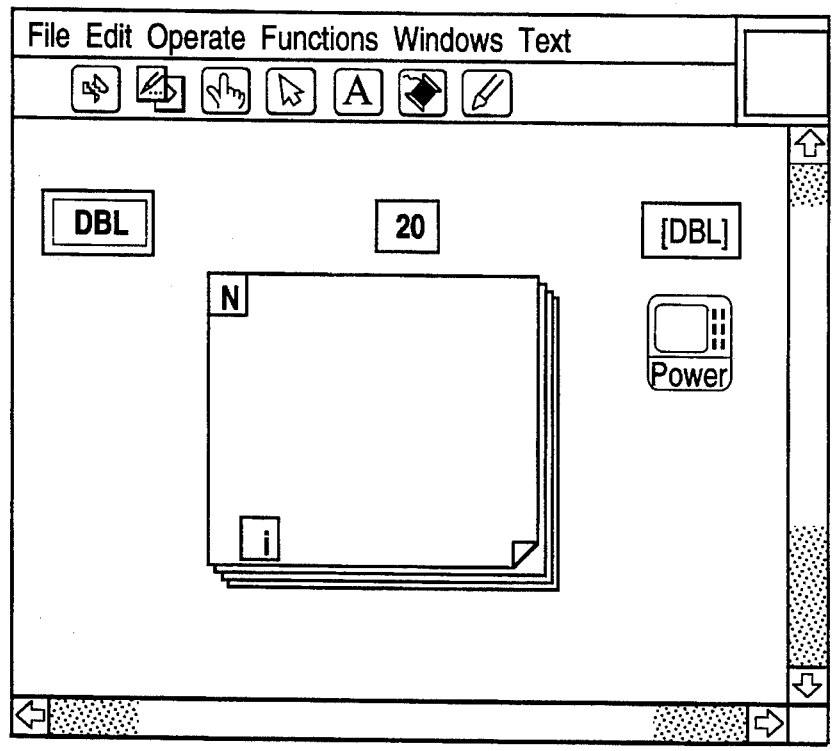
Figure 19:
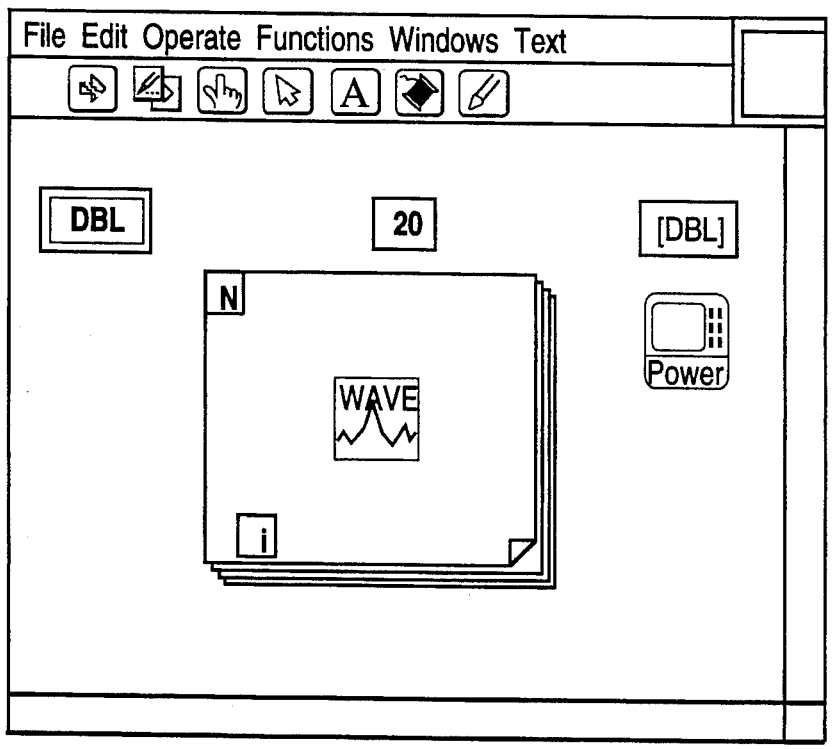
Figure 20C:
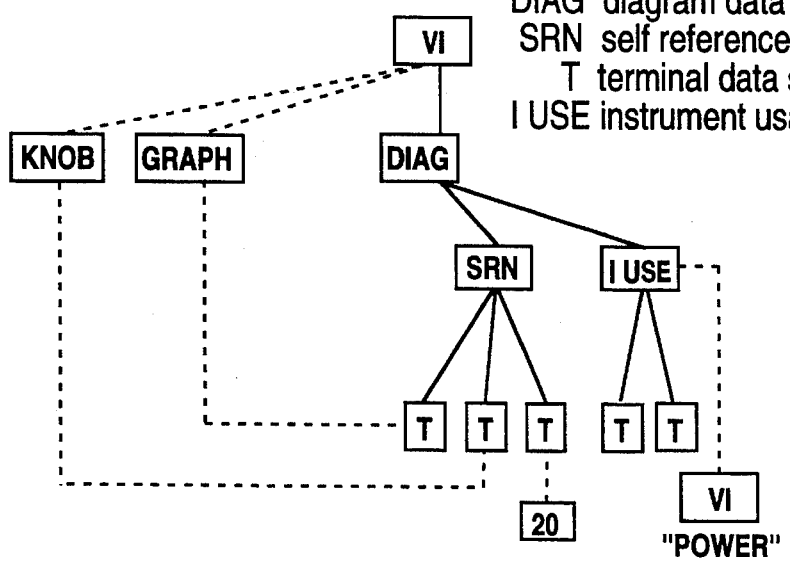

In FIG. 19D, an icon referring to a built-in virtual instrument is placed in the block diagram. (An alternative view of the block diagram could show the icon terminals instead of the icon itself). As shown in FIG. 20C the system representation shows another node of instrument use type in the virtual instrument diagram and three terminals and controls corresponding to the terminals and controls in the referenced virtual instrument.

Figure 21A:
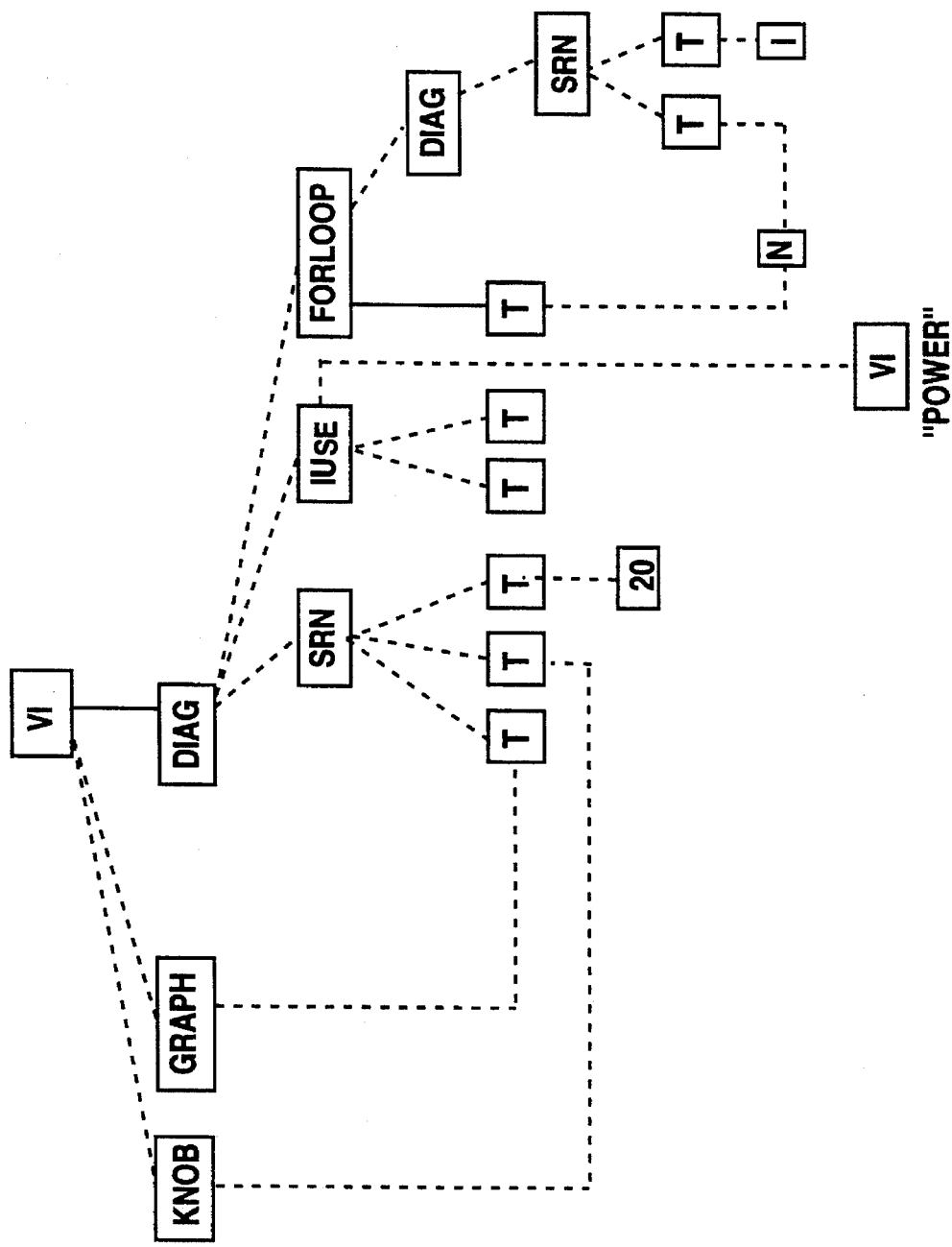
FIGS. 21A–B illustrate a system representation corresponding to FIGS. 19E and 19H.

In FIG. 19E, an iterative loop structure is placed in the block diagram. As shown in FIG. 21A, the system representation shows the structure node in the diagram along with terminals and controls for the loop variables. Note that the iteration number is accessible only from within the loop; while the iteration limit is available inside and outside the loop as evidenced by the two terminals which reference it, one in the structure node and the other in the self-reference node of the diagram within the structure node.

In FIG. 19F, an icon referencing another built-in virtual instrument is placed inside the iterative loop structure.

Figure 19G:
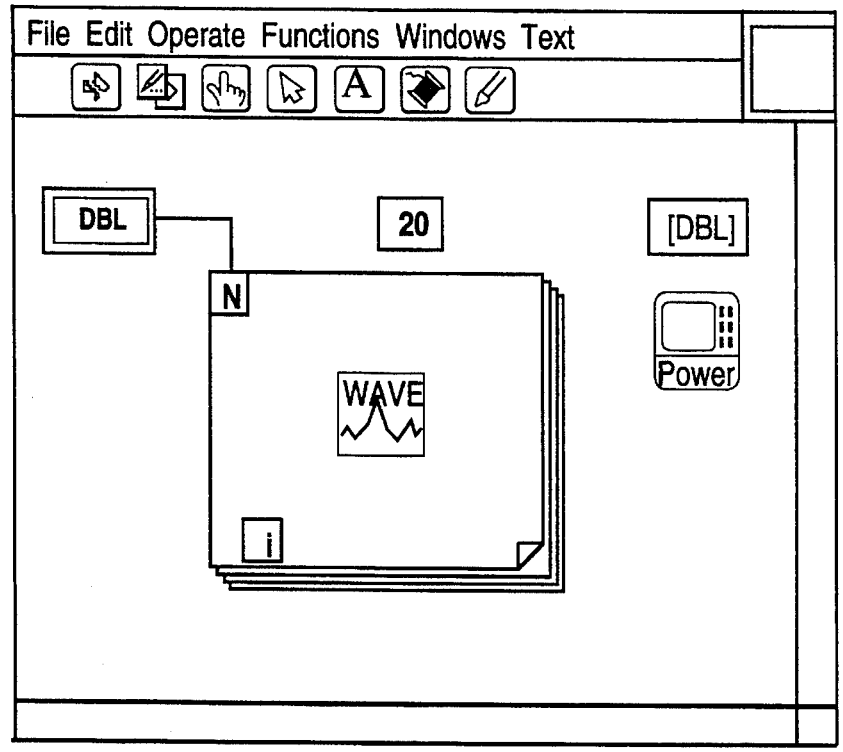

In FIG. 19G, a wire is connected from the terminal associated with the front panel knob to the loop limit terminal of the loop structure. The front panel knob terminal is determined to be the signal source.

Figure 19H:
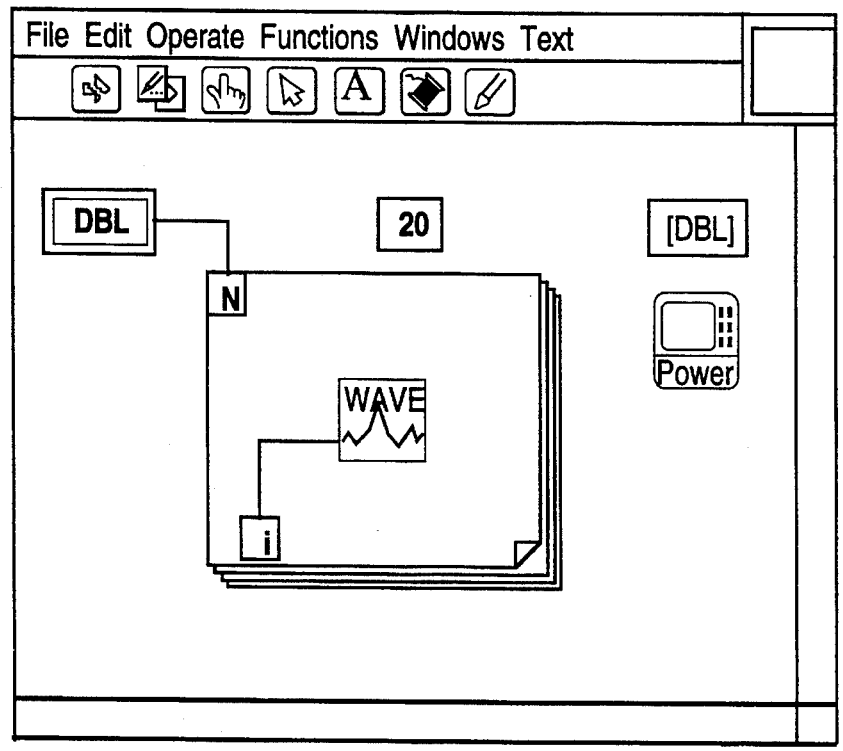
Figure 19:
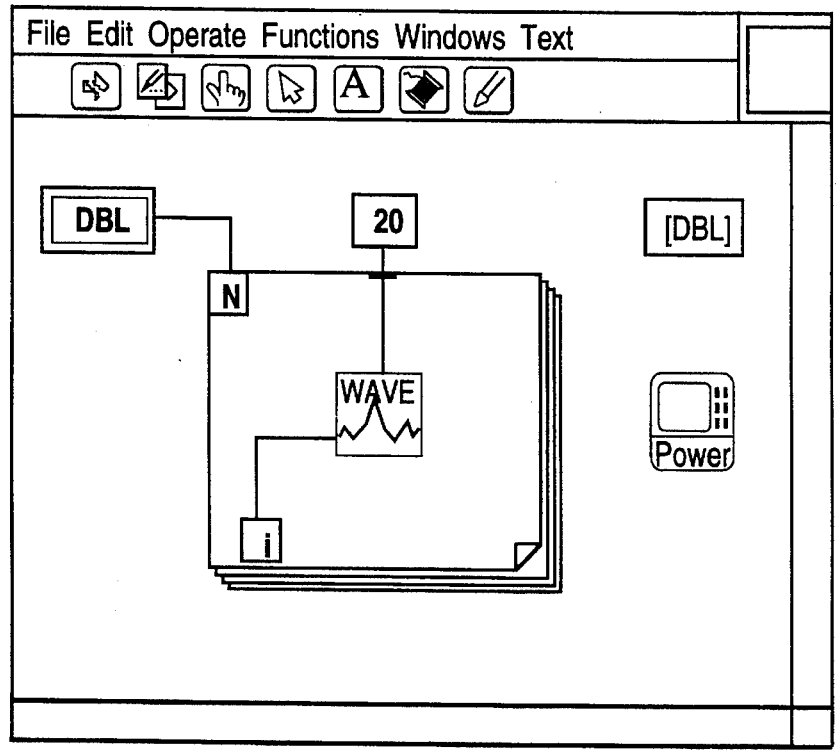
Figure 21B:
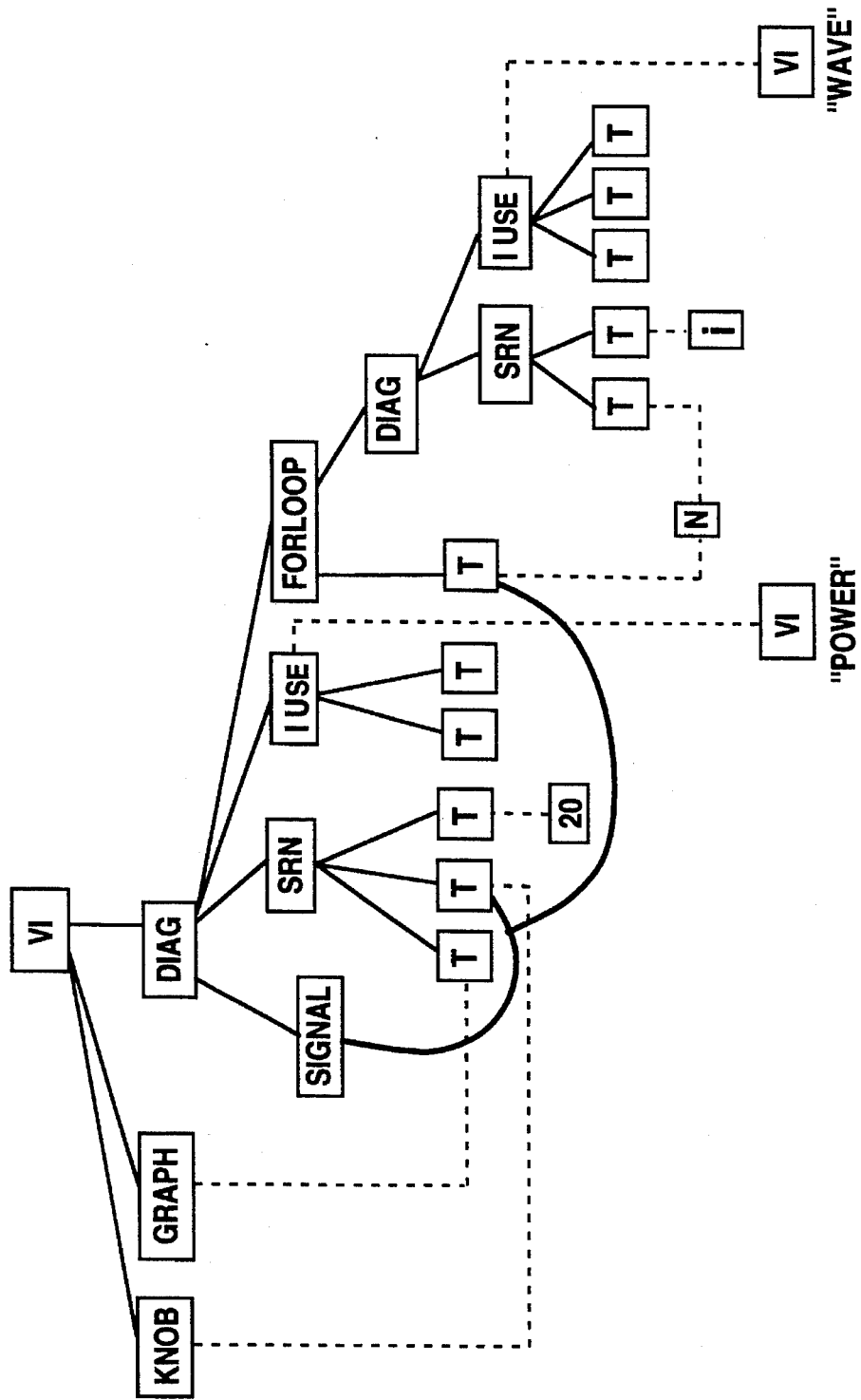

In FIG. 19H, a wire is connected from the iteration number terminal to a terminal on the virtual instrument inside the loop. This signal path lies completely within the loop structure subdiagram. As shown in FIG. 21B, the system representation shows the signal path with the iteration number terminal and the terminal on the instrument use node. The iteration number terminal is determined to be the signal source.

In FIG. 19I, the constant is wired to a terminal of the virtual instrument within the loop. In this case, the wire crosses the structure border so that a pair of terminals and a control are created, and the wire is split into two signal paths, one outside the loop structure and one inside. The constant is determined to be the source terminal of the outside signal, and the inside terminal at the border is determined to be the source of the inside signal.

Figure 19J:
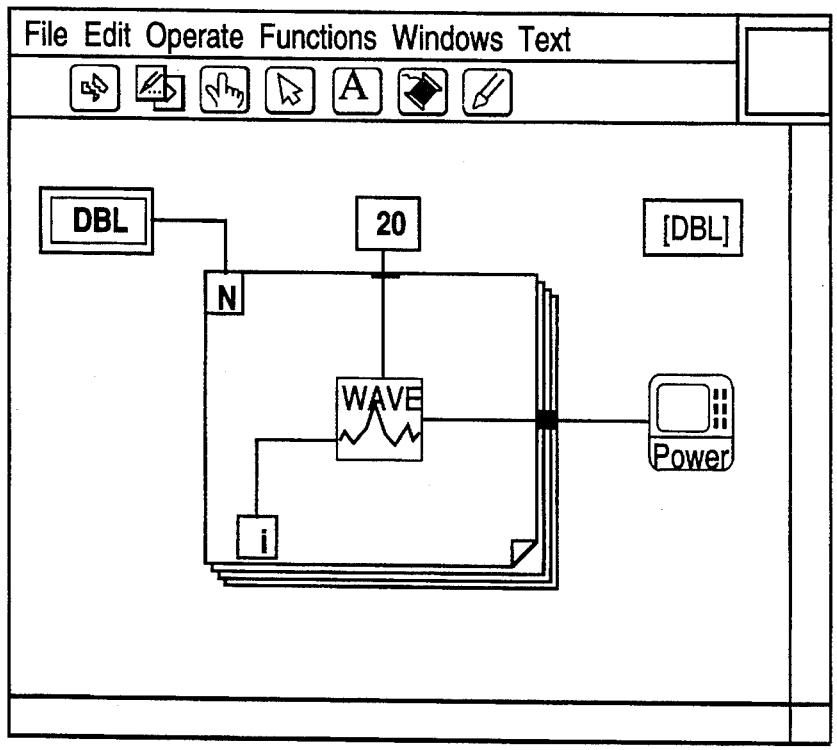

In FIG. 19J, a wire is drawn from the virtual instrument inside the loop to the virtual instrument outside the loop. This wire crosses the border so it is split into two signal paths. The wire on the outside is thicker because it represents an array signal path (as will be explained more fully below).

Figure 19K:
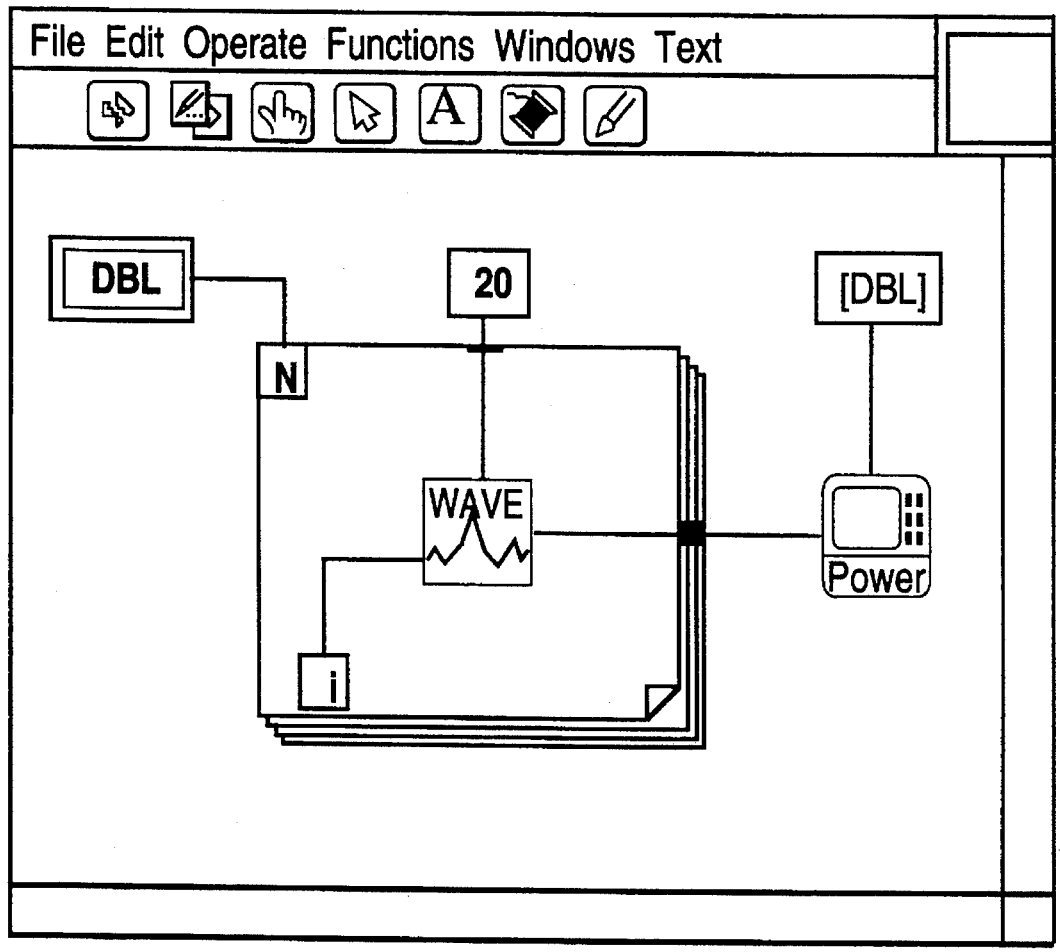

In FIG. 19K, the output of the virtual instrument outside the loop is connected to the terminal associated with the front panel graph. The wire pattern indicates that it represents a cluster signal path (as will be explained more fully below).

Block Diagram of FIG. 5A

FIG. 22 shows a drawing of a computer-generated display of a completed block diagram for the design example of FIG. 5A. This block diagram is the graphical program representing the instrument's operation, showing the interconnections between the elements of the instrument, the signal paths, and the relationship to other virtual instruments. The large rectangular region in the center of the diagram is an iteration loop structure. The diagram placed inside this region is executed multiple times: for i=0 to N−1. At the upper left of the diagram, four front panel inputs from controls are shown connected to the iteration loop. The inputs to the iteration loop are the Number of Steps, High and Low Frequencies, and Amplitude.

The Number of Steps and High and Low Frequency inputs are connected to a Formula Node icon called "Calculate Frequency," which is comprised within the iteration loop. This icon is a built-in function which in this example includes a formula that calculates a frequency.

The Number of Steps input is connected to the loop-count (the N at the upper left corner) of the iteration loop, which in turn, is connected to the variable N in the Formula Node. The index i of the iteration loop is connected to the variable i of the Formula Node. The High and Low Frequency inputs are connected to the Fh and Fl inputs of the Formula Node.

Two virtual instrument icons referred to as Tek and Fluke are also inside the iteration loop. The Tek VI takes as input Amplitude and the frequency Fi output from the Formula Node and performs the appropriate IEEE-488 operations to set the function generator 208 of FIG. 5A. The Fluke VI performs the appropriate IEEE-488 operations to obtain a voltage measurement from the multimeter 210 of FIG. 5A. These two icons represent simple virtual instruments that are easily designed using built-in high level IEEE-488 functions to communicate with the multimeter 210. The output from the multimeter (Fluke) icon is provided to logic nodes which convert from the RMS (root-mean square) value. This signal is output from the iteration loop and provided to nodes which convert the data to dB (decibel) form. This output is then provided to a bundle node which also receives the output from the Formula Node. The bundle node is a bundle by position node and acts to bundle the two arrays of data it receives, i.e., frequency and response for plotting purposes. This bundled data in then provided to an indicator on the front panel.

Each iteration of the iteration loop produces as output the input frequency and the corresponding voltage measurement. This results in two arrays of values which exit the loop at the right. The bundle function converts these two arrays into X, Y plots which are then provided to the front panel graph indicator. Note the self-documenting effect of the graphical language, with the iteration loop structure contributing to the readability of the program.

With the front panel and block diagram complete, the instrument is ready to be used. The instrument is operated from the front panel. To execute the instrument, the user simply configures the input controls and "clicks" the Run Arrow button on the top of the screen (as will be appreciated from the description below).

VI Execution Overview

The graphical system and method described above permits the computer-aided modeling of a process using graphical techniques which generally are more easily comprehended, especially by persons who do not possess specialized skills in computer programming techniques. The use of a computer-generated image of a front panel display permits a user to easily understand how data is provided to a system being modeled and how data is provided by the system. The block diagram editor permits a user to construct a graphical representation of a procedure for producing output data from input data using icons which reference modularized procedural units. A user may use the icon editor to construct his own icons; or he may call upon a ready-made library of icons. The execution subunit executes execution instructions which are constructed in response to the graphical images produced by a user to model a process. Thus, a user can program a computer substantially by constructing a hierarchy of icons connected to one another so as to model a process. A user, therefore, can use the system and method of the present invention to program a computer to model a process using graphical techniques which generally are easier to comprehend.

Furthermore, the system and method of the present invention advantageously can use data flow techniques. The use of the structures illustrated in FIGS. 12A-E facilitates the use of such data flow techniques. By using such techniques, a system modelled in block diagram form can operate in a parallel fashion, since each individual icon in a hierarchy comprising such a block diagram operates as soon as all input data provided to it are available. In addition, such structures render graphical representations of block diagrams using such data flow techniques more comprehensible to a user, and, therefore, simplify the task of using such techniques.

Parallel and Serial VI Execution

Having described how a VI is constructed and used, additional explanation regarding the execution description is provided. In the preferred embodiment, all VIs are referred to as diagram VIs. Diagram VIs in turn are comprised of nodes, which are discussed with regard to FIGS. 9C–9K. Referring once again to FIG. 8B, a node (icon or structure) begins execution when all its inputs are available. If a diagram has two or more icons referring to the same VI and a second one has all its inputs available before the first finishes execution, it is not always clear how to handle this second node. In fact, it depends on the "execution mode" of the VI. Absent some way to execute VIs in parallel, VIs would be executed in serial. In a serial mode of execution, the second node is placed on a FIFO wait queue of the self-reference node associated with the VI, and execution of the VI in the context of the second node is delayed until the execution in the context of the first node is completed.

Parallel or reentrant execution dynamically creates multiple instances of the VI at execution time in order to allow multiple nodes to execute in parallel. In the preferred embodiment, parallel execution is implemented for VIs designated as reentrant by the user.

Figure 23:
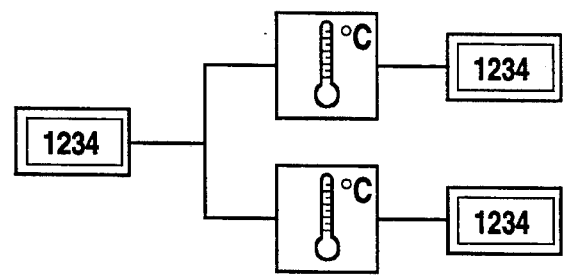
FIG. 23 illustrates serial execution mode of a VI.
Figure 25:
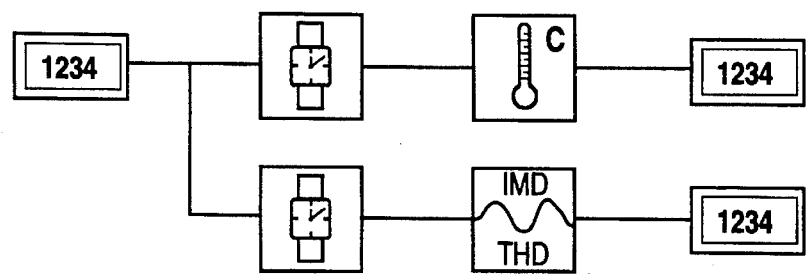
FIG. 25 illustrates parallel execution mode for a VI.

FIGS. 23 and 25 illustrate serial and parallel execution modes. In FIG. 23, one "thermometer" icon must wait until the other finishes execution before it can start, even though it has all its inputs at the same time as the other. This is because the "thermometer" VI is a serial VI.

Figure 24:
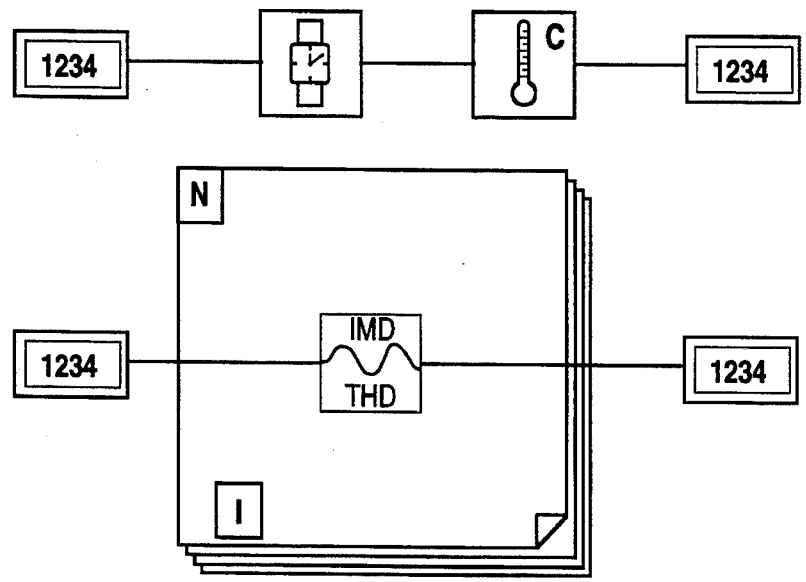
FIG. 24 illustrates "wait" icon execution.

In FIG. 24, the asynchronous behavior of the wait VI (the watch icon) is shown. It is a code type VI that does not execute atomically. During the time that it is executing (waiting) other components of the diagram may execute.

In FIG. 25, both "wait" icons execute at the same time showing the parallel execution mode of the wait VI. If execution were not parallel either the "thermometer" VI or the "IMD/THD" VI would effectively wait for the sum of the time delay intervals caused by the two "wait" VIs together.

The preferred embodiment can be embodied in software, hardware, or a combination of both. One way to implement a parallel VI in hardware is to have enough instances of the hardware to account for the maximum number of VI instances that must run in parallel.

The present invention provides the ability of a virtual instrument (with icon, front panel, and diagram or code) to be a template and effectively automatically replicate itself as necessary in order to allow multiple instances to run in parallel.

Figure 26:
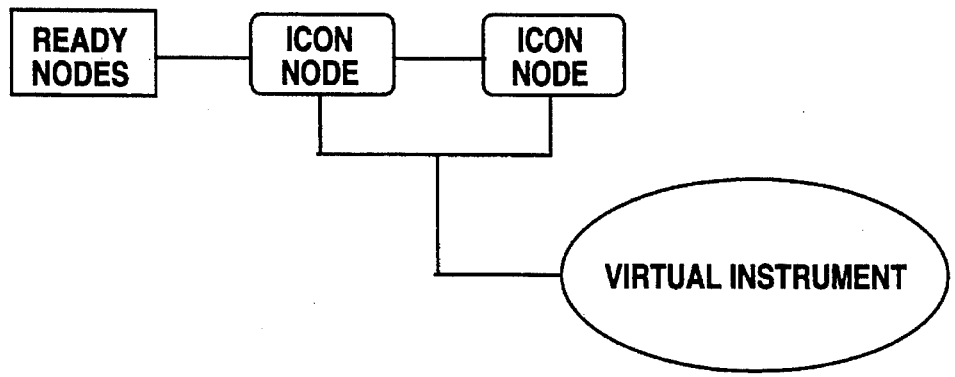
FIG. 26 illustrates a ready node list, also referred to as the run queue.

A node is executed when all its inputs have data ready. When this happens the node is put on a list of ready nodes, i.e., is placed on the run queue. This is illustrated in FIG. 26. One by one the ready nodes are taken off the list and executed. When more than one of the ready nodes are I-use nodes which refer to the same virtual instrument the scheduling of the execution depends on the mode of the virtual instrument. The possible modes are serial and parallel.

Serial Mode (Block Diagram Virtual Instruments)

Figure 27:
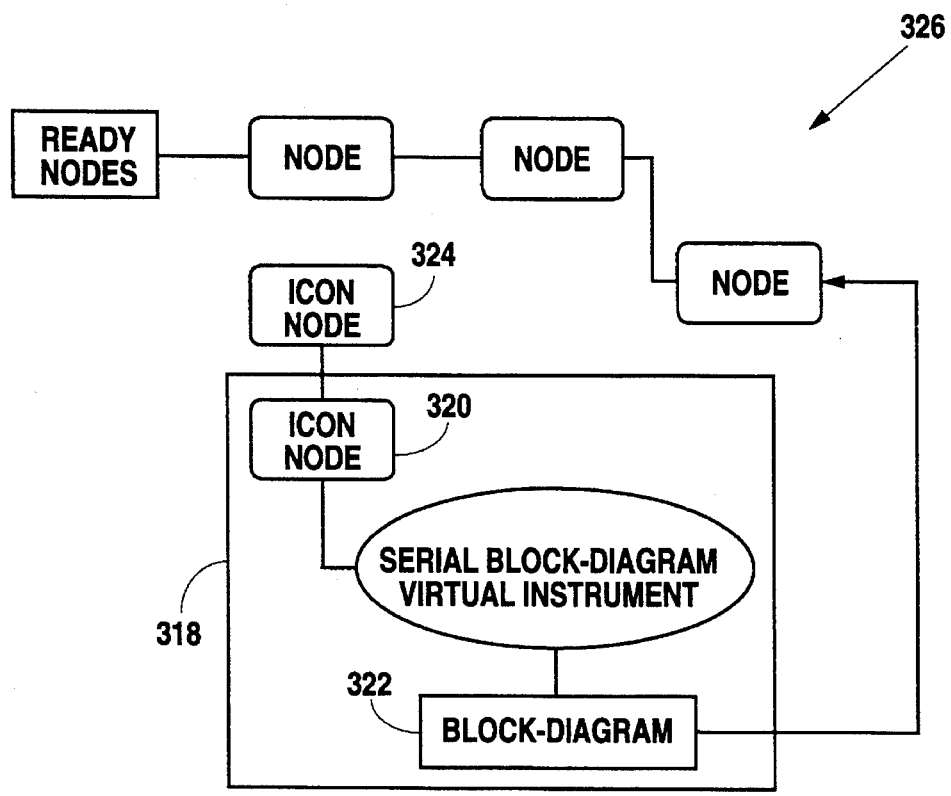
FIG. 27 illustrates how nodes are placed on the run queue as they become ready and are interleave with other nodes.

Serial mode instruments place contending nodes on a list of nodes which execute the block diagram of the virtual instrument in turn. This list of nodes is the self-reference node wait queue. Because the block diagram of an instrument consists of more nodes which will become ready, the execution of the block diagram instrument is not atomic. The nodes of the diagram are put onto the ready node list or run queue as they become ready and are "interleaved" with ready nodes from other diagrams. This is illustrated in FIG. 27. The dashed box 318 once again contains the node on whose behalf the block diagram 322 of the virtual instrument is executing. The node 324 outside the dashed box must wait for the diagram to complete before it gets its turn. The arrow from the block diagram to the Ready Nodes list 326 shows that the block diagram 322 will produce more ready nodes which will be added to this list.

Parallel Mode (Block Diagram Virtual Instruments)

Figure 28:
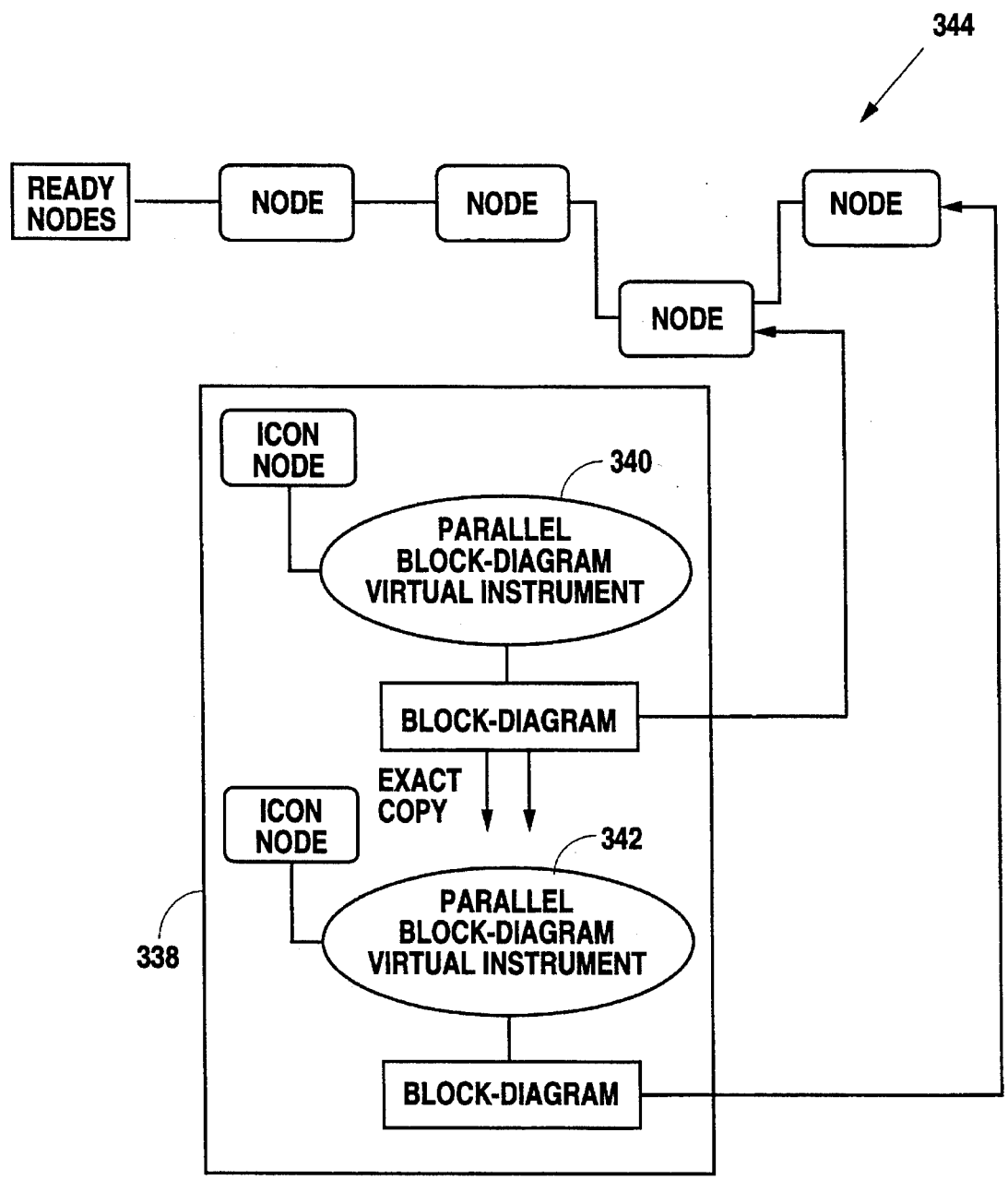
FIG. 28 illustrates parallel execution of nodes in a block diagram virtual instrument.

Block diagram instruments can be built to execute in parallel or reentrant mode. The means of making parallel execution possible for block diagram instruments is by using the instrument as a template to make identical copies of the instrument automatically as needed for contending nodes. Each block diagram then executes, producing ready nodes for the Ready Nodes list or run queue in such a way that the nodes can be "interleaved" and the execution of the identical diagrams takes place "at the same time." This is illustrated in FIG. 28. Inside the dashed box 338 the replicated virtual instrument 340, 342 is shown and each I-use node has "its own copy" of the instrument. Both diagrams are shown putting ready nodes onto the Ready Nodes 334 list.

Execution States

The fundamental capability which execution states permit is the interactive operation of more than one virtual instrument at a time, as well as the construction or editing of some virtual instruments while others are executing.

When a VI is interactively started (i.e., run from its front panel) it enters its active state. It remains active until it completes, at which time it returns to its idle state. At the point it becomes active all lower level VIs are "reserved." This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful troubleshooting aid. While a VI is reserved it may not be edited; however the values assigned to its front panel controls may be changed. Depending on the design of the VI and the point in time when the control value is changed such a change may produce unexpected results.

A "breakpoint" may be set so that a reserved VI enters its "suspended" state when it is about to execute. "Suspended" is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables top-down implementation and testing. "Stub" VIs can be built (icons and front panels but no diagram or code), and their execution simulated by setting the breakpoint, supplying relevant outputs when the VI becomes suspended, and then resuming.

Breakpoints have been used in conventional programming languages, but there is no analogy in instrumentation systems. A related but different analogy in instrumentation is remote/local loosely related to reserved/idle (no analogy to suspended). Stubs are known in programming but not in hardware or instrumentation development.

The present invention provides the ability of VIs to exist in different states in order to protect execution from editing changes. Furthermore, it provides the ability to change the value of a VI indicator (output) while it is in its suspended state.

Controls

Figure 29:
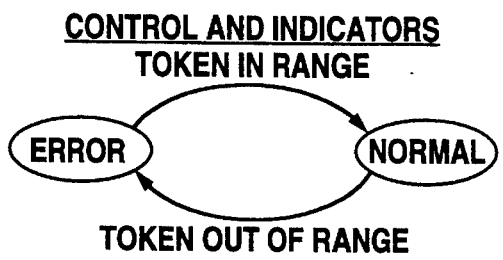
FIGS. 29–37 illustrate various virtual instrument execution states.

As illustrated in FIG. 29, whenever a token is propagated to a control the control is set to its normal or error state depending on whether the value of the token is in or out of range for the control.

Signals

Figure 30:
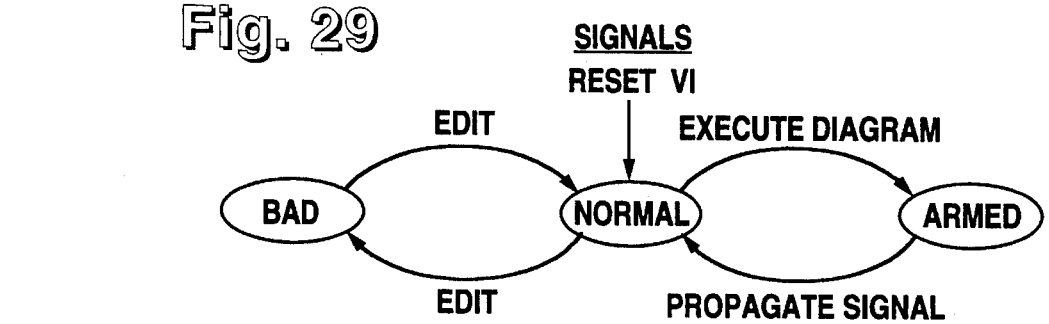

In FIG. 30, after a wiring change or a control type, dimension, direction, or unit change the type propagation code will set each signal to bad or normal. The VI is not executable unless all its signals are normal. When a diagram is about to be executed, all its signals are set to their armed state. When a signal is propagated from its source node it is set to its normal state. When the owning VI becomes idle all remaining armed signals are set to their normal states.

Diagrams

Figure 31:
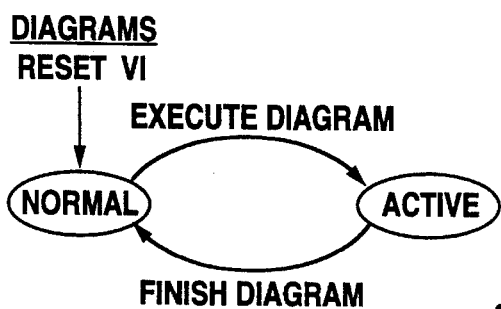

In FIG. 31, when a diagram begins execution it is set to its active state. When it finishes it is set to its normal state. When the owning VI becomes idle all active diagrams are set to their normal states. The diagram state is needed only for reset to be able to identify the active diagram of a select or sequence structure.

Self Reference Nodes

Figure 32:
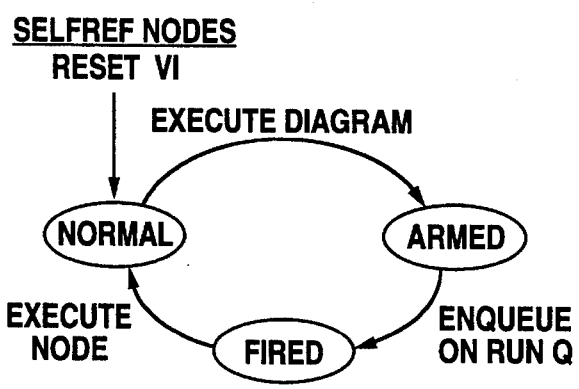

In FIG. 32, when a diagram is about to be executed the self reference node as well as all the other nodes in the diagram are set to their armed states. When all the other nodes have finished executing the self reference node is scheduled to run by being placed on the run queue. At that point it is set to its fired state. When it is removed frame the run queue and executed, signalling the completion of the diagram, it is set to its normal state. When the owning VI becomes idle all remaining armed self reference nodes are set to their normal states.

Structure Nodes

Figure 33:
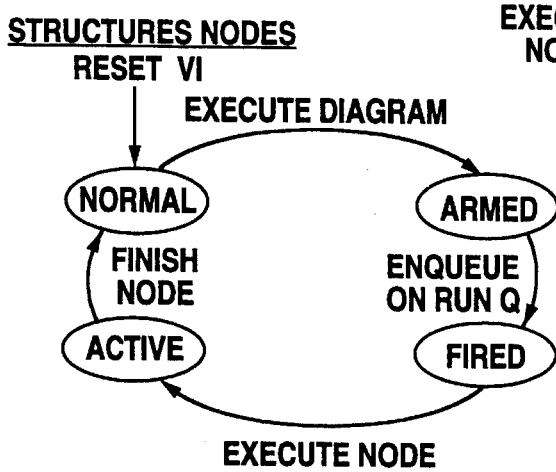

In FIG. 33, when a diagram is about to be executed all the nodes in the diagram are set to their armed states. When a node's short count is decremented to zero, it is scheduled to run by being placed on the run queue. At that point the node is set to its fired state. When it is removed from the run queue and begins execution it is set to its active state. When the subdiagrams finish (the required number of iterations) the structure node is set to its normal state and its outputs are propagated. When the owning VI becomes idle all remaining armed structure nodes are set to their normal states.

Instrument Usage Nodes

Figure 34:
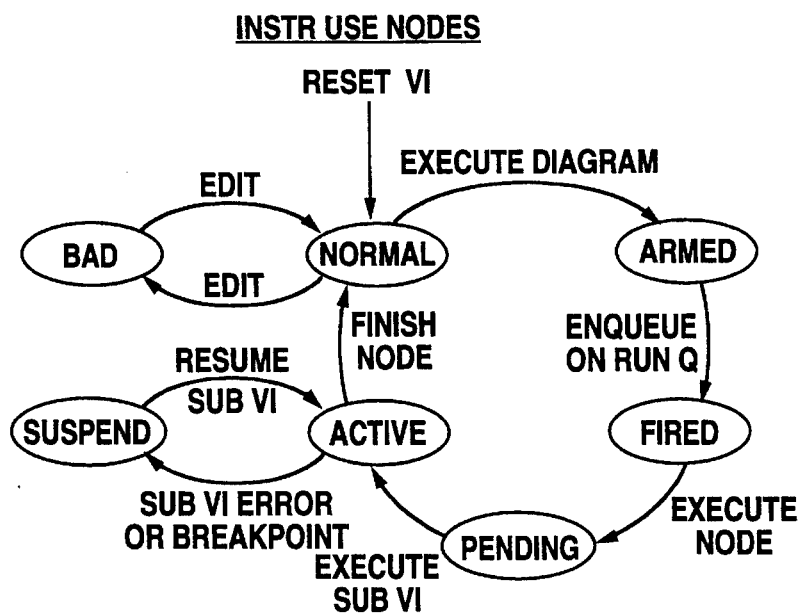

In FIG. 34, after a load operation or a change to the front panel of the sub VI the linking code will set the node to bad or normal (a node is bad also if the link is good but the sub VI is not executable). The owning VI is not executable unless all its nodes are normal. When a diagram is about to be executed all nodes are set to their armed states. When a node's short count is decremented to zero it is scheduled to run by being placed on the run queue. At that point the node is set to its fired state. When an instrument usage node is removed from the run queue and enqueued on the sub VI's self-reference node wait queue it is set to its pending state. When the sub VI actually begins execution in the context of the calling node the calling node is set to its active state. When the sub VI completes normally and the calling node is dequeued from the VI's ready queue the calling node is set to this normal state. If the referenced VI is stopped in its suspended state or executing in its retrying state the calling node is set to its suspended state. When the owning VI becomes idle all remaining armed nodes within it are set to their normal states.

Serial Virtual Instruments

Figure 35:
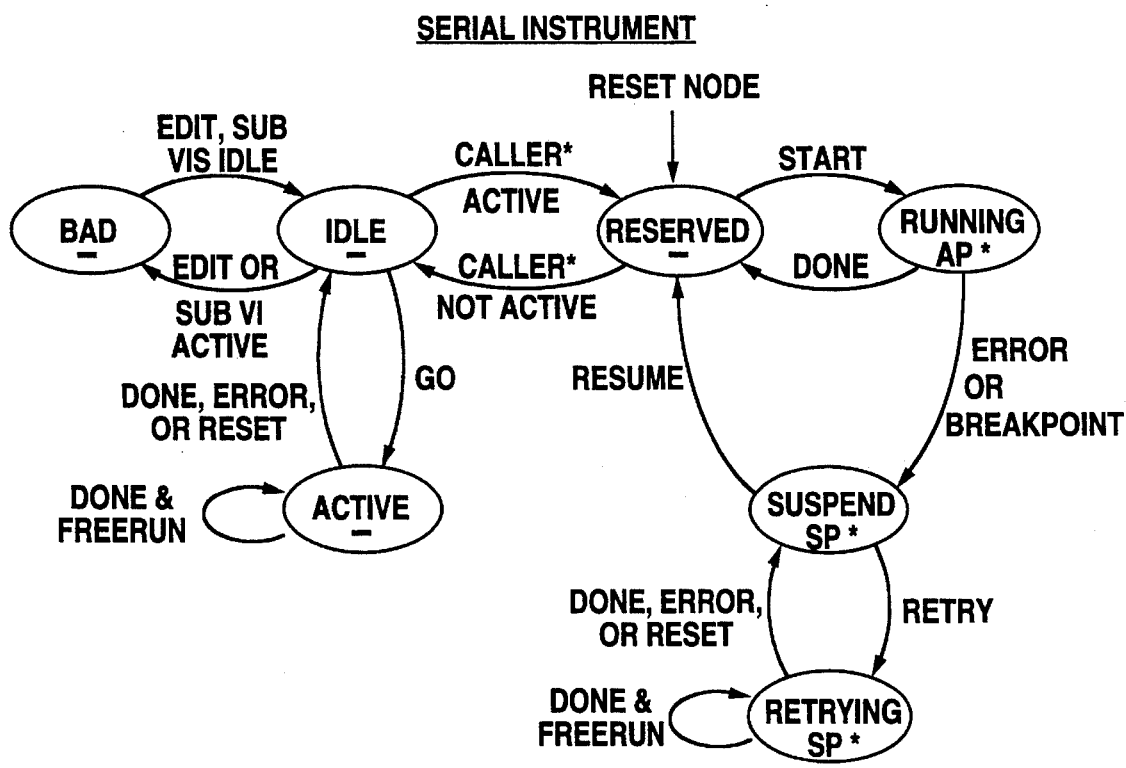

In FIG. 35, after a block diagram edit operation the type propagation code sets the VI to its bad or normal state depending on the presence of bad signals or nodes (a serial VI is bad also if any sub VI is not executable, or if it or any sub VI contains a recursive reference to it). When the go button is hit the VI in the front window (panel or diagram) is set to its active state. At this point all of its subVIs and all of theirs, etc., are set to their reserved states. When the VI completes normally or with an error it is placed in its idle state. If the reset button is hit while the VI is in its active state it is placed in its idle state, and all nodes in their pending, active, or error states are reset (which may involve resetting their subVIs). When a VI enters its idle state from its active or reserved state each of its subVIs still in its reserved state checks all its callers to see if it too can return to its idle state.

When a reserved VI actually begins execution in the context of a calling node it is placed in its running state. Whenever a VI has to abort execution because its calling node is being reset it is placed in its reserved state (it may subsequently have the opportunity to discover whether it should return to its idle state).

If the VI has a breakpoint set or if it detects an error on a control then instead of being placed in its running state at the start of execution it is placed in its suspended state.

When a VI completes normally it is placed back in its reserved state. If a VI detects an error on an indicator the VI is placed in its suspended state. When the retry button is hit the VI is placed in the retrying state. If the VI then completes normally or with an error or if the reset button is hit it is placed in the suspended state. A suspended VI is placed in the reserved state when the resume button is hit.

Front panel controls can be adjusted in any VI state but the effects are nondeterministic except for the idle and suspended states. Edit changes to the front panel or block diagram are not allowed in any state except idle and bad. The go button is inoperative except in the idle state. The reset button is inoperative except in the active and retrying states. The resume and retry buttons are inoperative except in the suspended state.

While the VI is in its running, suspended, or retrying state, additional pending I-use nodes may be enqueued on its wait queue. When the current node is completed it is dequeued from the wait queue, the next one is set active, and the VI begins execution in its context.

Parallel Block Diagram Virtual Instruments

Figure 36:
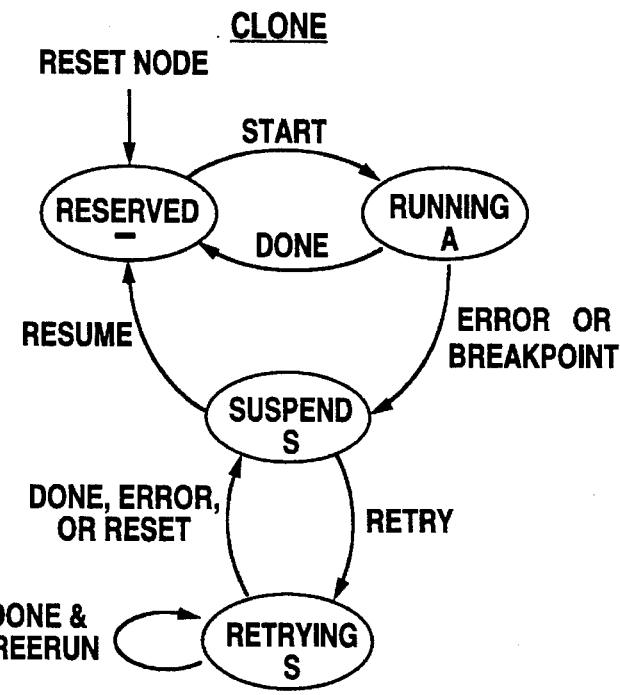
Figure 37:
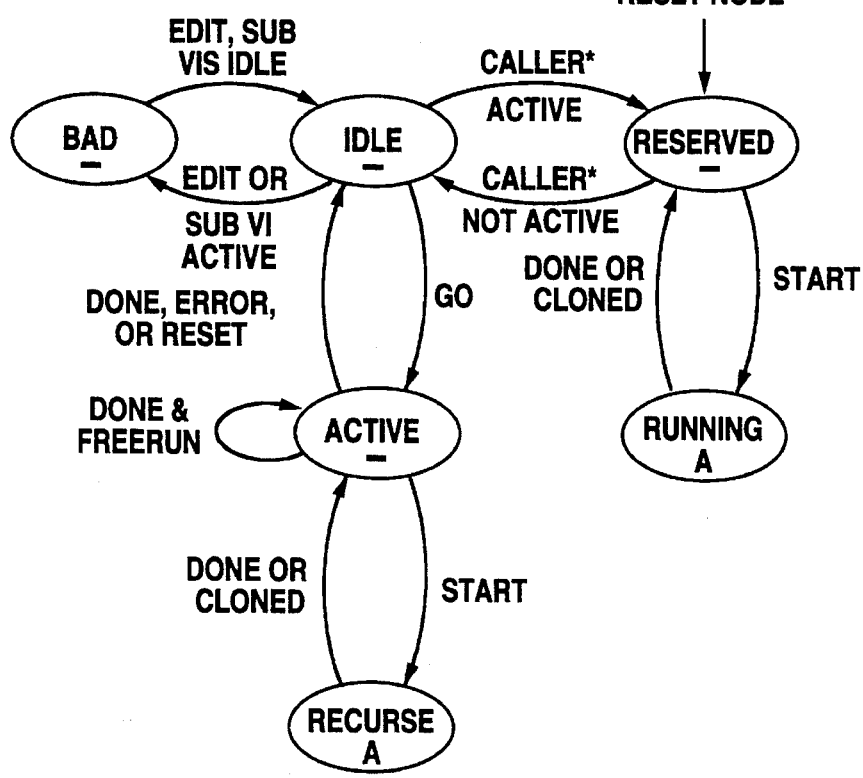

In FIG. 37, a parallel block diagram VI is similar to a serial VI except it has no suspended or retrying states. When a parallel VI actually begins execution in the context of a calling node a clone is created and placed in its running state. FIG. 36 illustrates a clone. When the clone completes normally it is discarded. The clone is discarded also whenever it has to abort execution because its calling node is being reset. If the VI has a breakpoint set then instead of placing the clone in its running state it is placed in its suspended state. The execution behavior of a VI clone is similar to that of a reserved serial VI.

TABLE

State and Indication and Transition Methods

Controls and indicators:

normal: normal image
error: gray indicator or red outline

Figure 38:
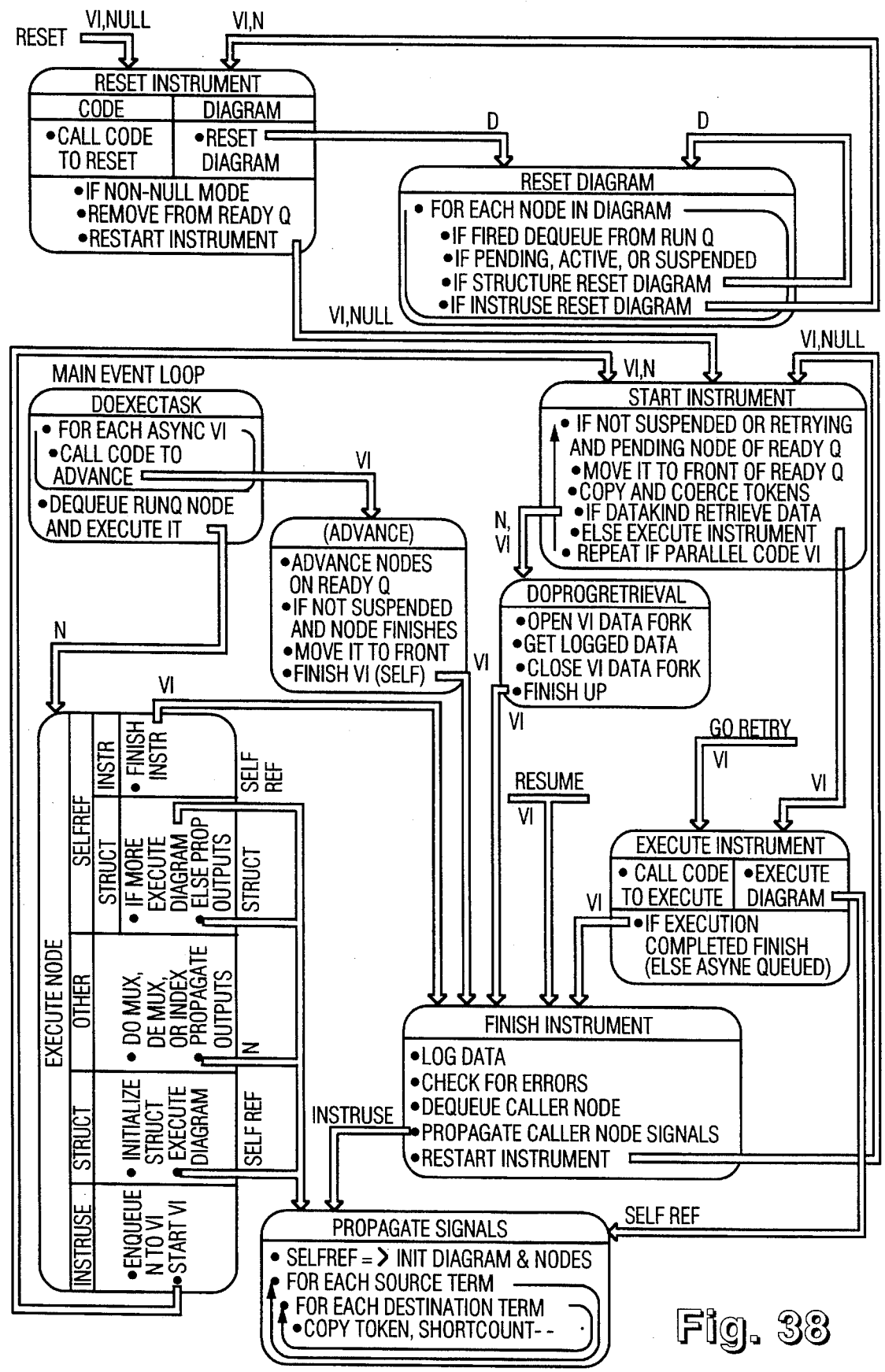
FIG. 38 illustrates an execution road map.

Signals:

Bad: dashed
Normal: normal wire pattern and color
Armed: normal width light gray line Nodes:

Bad: Grayed out icon
Normal: Normal image
Armed: Grayed out icon
Fired: Normal image
Pending: Normal image
Active: Normal image
Error: Normal image VIs:

Bad: go button drawn broken
Idle: go button normal
Active: reset button present
Reserved: reserved indicator in place of go button
Running: running indicator in place of go button
Suspended: retry button in place of go button, resume button present
Retrying: reset button present, resume button disabled
Error on VI Control: go button disabled
Error on VI Indicator: resume button disabled FIG. 38 further explains execution states. In addition, the flowchart included as Appendix B in U.S. Pat. No. 4,914,568 explains FIG. 38 with regard to a prior embodiment and is incorporated herein by this reference.

Execution States

The fundamental capability which execution states provide is the interactive operation of more than one virtual instrument at a time, as well as the construction or editing of virtual instruments while others are executing.

Figure 39:
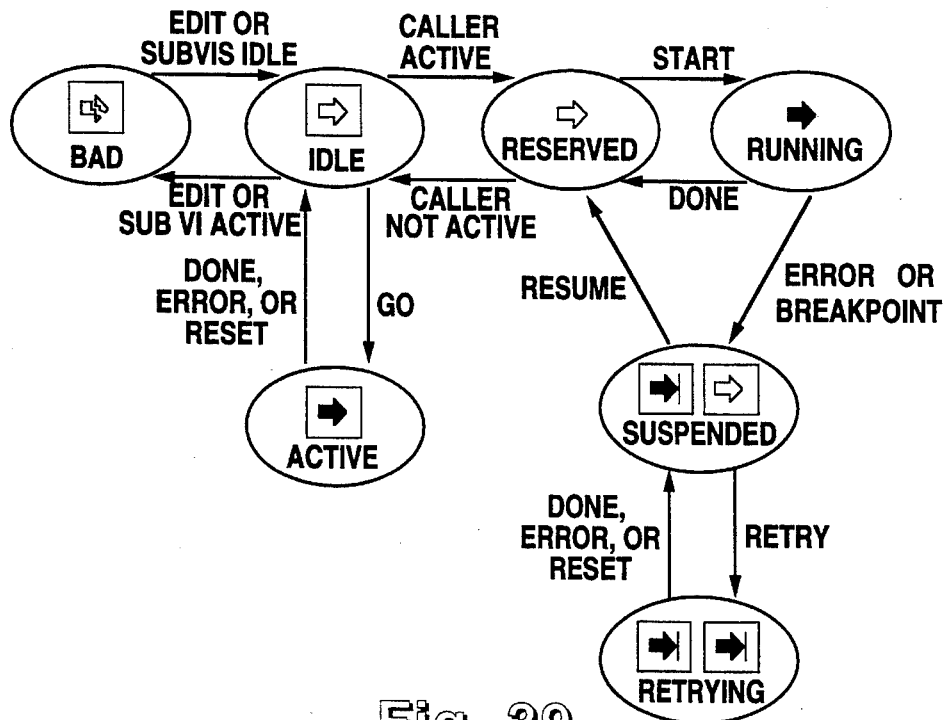
FIG. 39 illustrates execution state symbols.

The execution state diagram is shown in FIG. 39. State information is maintained internally for each virtual instrument. When the VI is in the front window, the state information for that VI is shown on the control palette by the one or two controls shown within each state in FIG. 39.

When the VI is interactively started (i.e., run from its front panel) it enters its active state. It remains active until it completes, at which time it returns to its idle state. At the point it becomes active, all lower level VIs are "reserved." This prevents them from being changed (a change could result in an execution error). A reserved VI executes in the context of one or more icon nodes within the diagrams of one or more higher level VIs. It is unreserved when all those higher level VIs become idle.

Reserved VIs can have their front panel and block diagram windows open while they execute. This ability to observe VIs at any and all levels of the hierarchy while they execute is a powerful trouble-shooting aid. While a VI is reserved it may not be edited; however the values assigned to its front panel controls may be changed. Depending on the design of the VI and the point in time when the control values is changed such a change may produce unexpected results.

Figure 40:
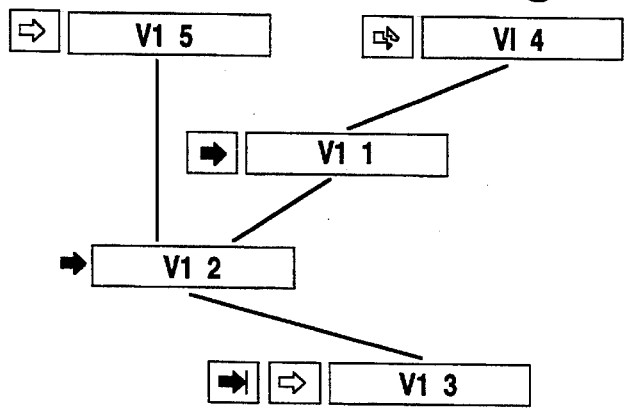
FIGS. 40–41 illustrates virtual instruments in various execution states.
Figure 41:
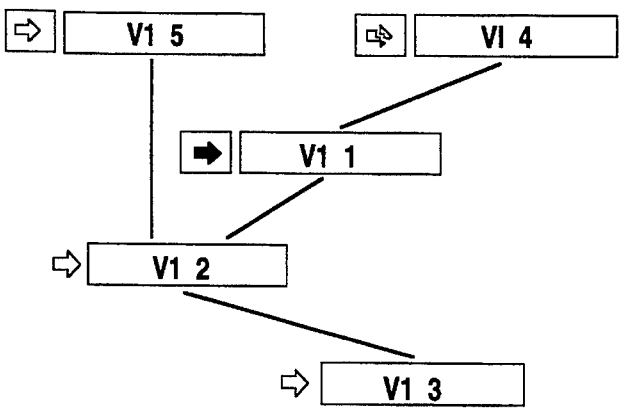

FIGS. 40 and FIG. 41 show five VIs in various stages of execution. The purpose of this example is to show how the change in state in one VI may cause state changes in other VIs, both above and below in the hierarchy. Assume all VIs have been loaded and all are initially in the idle state. FIG. 41 shows the execution states of all of the VIs after VI 1 is interactively started. Notice the changes caused in the execution states of VI 1's subVIs, VI 2 and VI 3, which are now reserved. They may not be edited or executed interactively. Notice also the state of VI 4. It is in the bad VI state because a sub-VI is active. VI 4 may not be executed interactively, but editing is allowed. If VI 4 was allowed to be executed interactively, it would attempt to reserve VI 1, which is already active. There is no transition from active to reserved in the state diagram, so we must guarantee that a VI cannot become active if any of its subVIs are already active. VI 5 has not changed states. It may be edited or executed interactively. One of its subVIs is reserved, but that does not affect the state of VI 5.

Setting breakpoints is a useful debugging tool. Stopping on a breakpoint is implemented with execution states. A "breakpoint" may be set so that a reserved VI enters its "suspended" state when it is about to execute. Suspended is similar to idle in that the VI can be run interactively one or more times. However, a suspended VI can be resumed (passing its outputs back to the icon node) and reenter its reserved state. It can actually be resumed without running it at all. While it is suspended its indicators (outputs) can be modified as well as its controls (inputs). This capability enables topdown implementation and testing. "Stub" VIs can be built (icons and front panels but no diagram or code) and their execution simulated by setting the breakpoint, supplying relevant outputs when the VI becomes suspended, and then resuming.

Breakpoints are known in conventional programming languages, but there is no analogy in instrumentation systems. Stubs are prior art in programming but not in hardware or instrumentation development.

FIG. 40 shows the control palette execution state buttons corresponding to the VIs when VI 3 becomes suspended. A breakpoint was set on VI 3, and execution is suspended before it is executed. VI 1 is still active, VI 2 is running, and VI 3 is suspended. The VI states of VI 4 and VI 5 do not change.

The system is protected from executing with an error on the block diagram (wiring error). If the VI is in the bad state, the VI may not be executed interactively, or programmatically by a higher level instrument. When a VI becomes bad, all of its callers are also bad because they now contain a bad sub VI. When a VI changes from bad to idle, all of its callers are notified of the state change and they must check to see if any of their subVIs are still bad. This guarantees that when a VI is interactively executed, it does not contain errors on the block diagram or any subVI block diagrams.

To protect execution from editing changes that may cause errors, editing is not allowed except in the idle or bad state. Since the system guarantees that there are no block diagram errors when the execution begins, and no editing is allowed during execution, no diagram errors will be encountered during execution.

The present invention provides the ability of VIs to exist in different states in order to protect execution from editing changes. Furthermore, the ability of VIs to have a breakpoint and suspended state enable top-down implementation (running a top level VI without having all the subVIs finished yet). Also, it provides the ability to change the value of a VI indicator (output) while it is in its suspended state.

Operation of the Graphical System

The graphical system and method for modeling a process are implemented in software. A copy of a program listing for one embodiment of the graphical system and method in which the present invention may be incorporated is filed as an Appendix to U.S. Pat. No. 4,901,221 and is hereby incorporated by reference. The present invention is described further below beginning at FIG. 115. The following description explains certain embodiments of the operation of the graphical system and method in which the present invention may be incorporated. The explanation is intended to be illustrative and not exhaustive and uses specific examples to explain the principles of operation of the preferred embodiments. It will be appreciated that the principles of operation explained below will serve as a basis for the heuristic learning process necessary to fully appreciate and practice the full scope of the present invention. Thus, it is not intended that the scope and content of protection afforded to the present invention be limited in any way by the following explanation.

The following explanation explains how to use the implemented functions of the preferred embodiments. A brief review of virtual instruments (VIs) is provided first, followed by a walk through of the display menus. This presentation is followed by a general discussion of how VIs are created and executed.

Virtual Instruments

In instrumentation applications according to the preferred embodiment, graphical data flow programs are referred to as virtual instruments (VIs). As previously discussed VIs have three main parts: the front panel, the block diagram, and the icon/connector.

Figure 42:
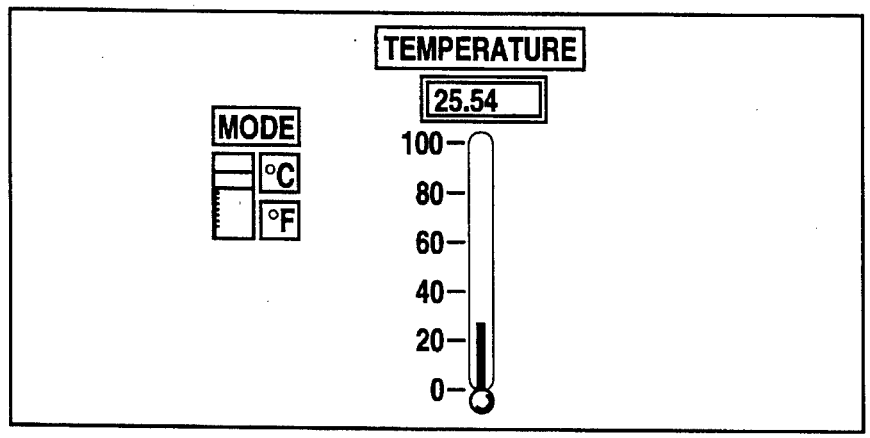
FIG. 42 illustrates an example of the front panel for a temperature VI.

The front panel is the means of setting input values and viewing outputs from the VI block diagram. Because the front panel is analogous to a front panel of a real instrument, the inputs are called controls and the outputs are called indicators. However, the term "control" is also used in this specification to mean both controls and indicators for convenience. A variety of controls and indicators, such as knobs, switches, buttons, charts, graphs, and so on can be used to make the front panel easily identifiable and understandable. An example of the front panel for a Temperature VI is illustrated in FIG. 42.

Figure 43:
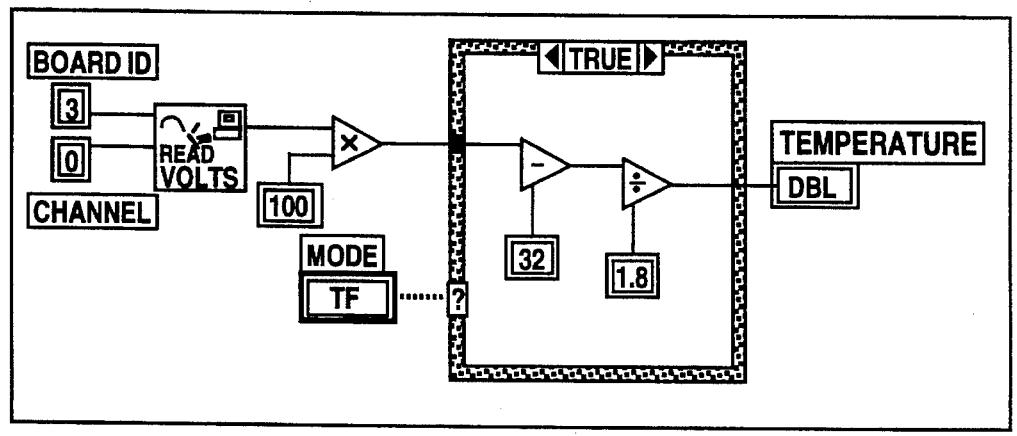
FIG. 43 illustrates the block diagram for the temperature VI in FIG. 42.

Each front panel has an accompanying block diagram, which is the VI program. The block diagram is built using a graphical programming environment, and the block diagram can be thought of as source code in this environment. The components of the block diagram represent program nodes that are "wired" together to show the flow of data within the block diagram. The block diagram for the Temperature VI is shown in FIG. 43.

Figure 44:
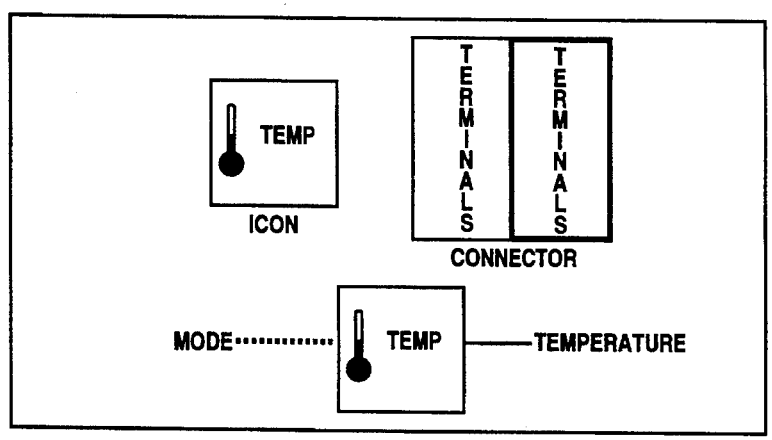
FIG. 44 illustrates the icon and connector for the temperature VI in FIGS. 42 and 43.

Referring now to FIG. 44, an icon connector is the means by which a VI is turned into an object that can be used in the block diagrams of other VIs as if it were a subroutine. The icon graphically represents the VI in the block diagram of other VIs. The connector terminals determine where the inputs and outputs on the icon must be wired. The terminals are analogous to parameters of a subroutine. They correspond to the controls and indicators on the front panel of the VI. FIG. 44 shows the icon and connector for the Temperature VI. The connector is usually hidden under the icon until the user chooses to view it.

Figure 45:
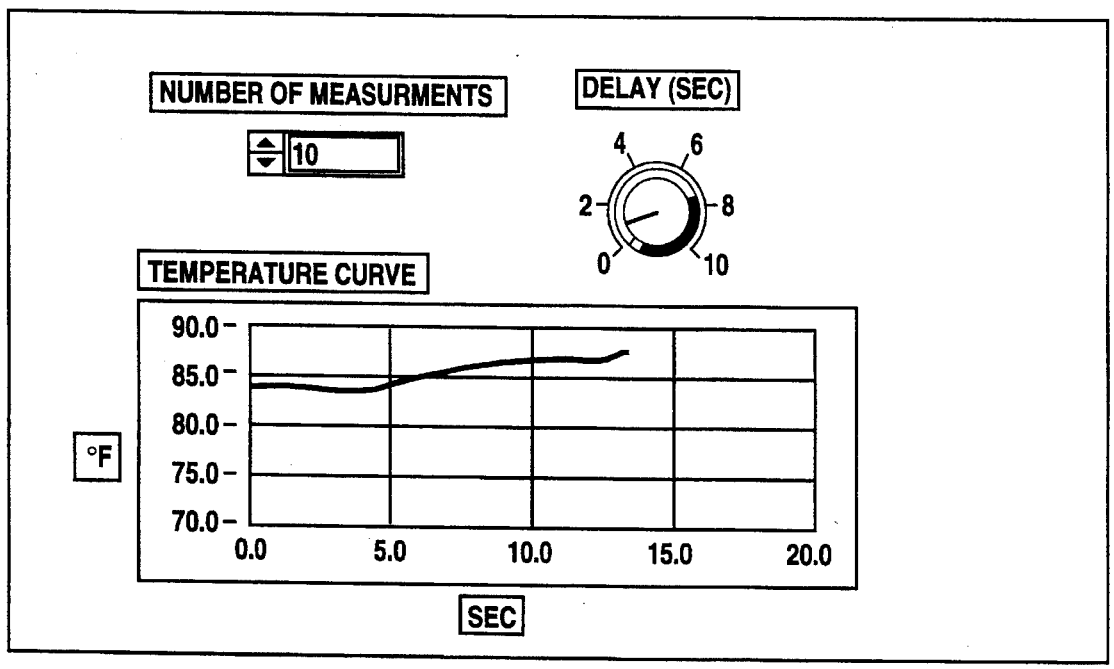
FIGS. 45 and 46 illustrate the front panel and block diagram of a VI that uses the temperature VI in FIGS. 42–44 as a subVI in its block diagram.
Figure 46:
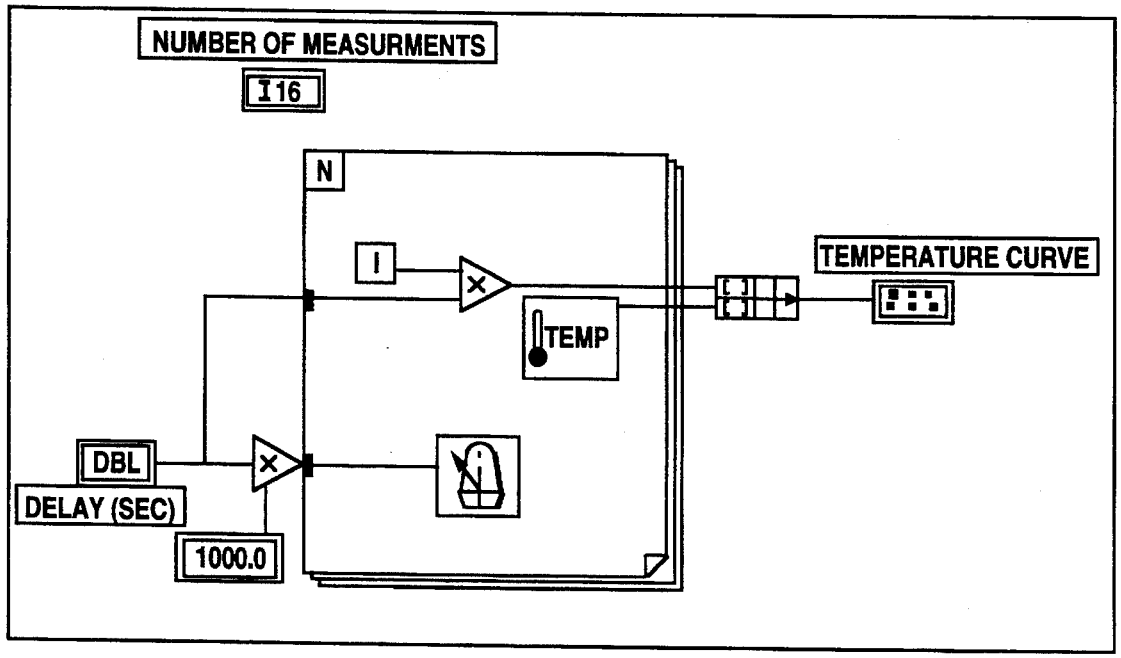

A powerful feature of the preferred embodiment lies in the hierarchical nature of the VI. Once a VI is created, it can be used as a subVI in the block diagram of a higher-level VI. There is no limit on the number of layers in the hierarchy. As an example, the VI illustrated in FIGS. 45 and 46 uses the Temperature VI as a subVI in its block diagram. The front panel for this VI is shown in FIG. 45 and the block diagram is shown in FIG. 46. Referring to FIG. 45, the Temperature VI collects data, and then the top-level VI graphs the results. The user specifies the number of measurements and the delay between each measurement on the top-level VI front panel. The top-level VI block diagram illustrated in FIG. 46 shows the Temperature VI in a loop. The VI collects the measurement during each iteration of the loop. After the loop has executed a specified number of times, the VI passes the data to an icon that graphs it on the front panel of the top-level VI. Therefore, in the preferred embodiment, a VI can be used as a subVI. This makes block diagrams modular, and easy to debug, understand, and maintain.

Panel and Diagram Windows

When the graphical programming environment is begun by double-clicking on its icon, a new, untitled Panel window appears. The Panel window displays the VI front panel and is one of the two windows used to build a VI in the preferred embodiment. The other window, the Diagram window, contains the block diagram.

Figure 47:
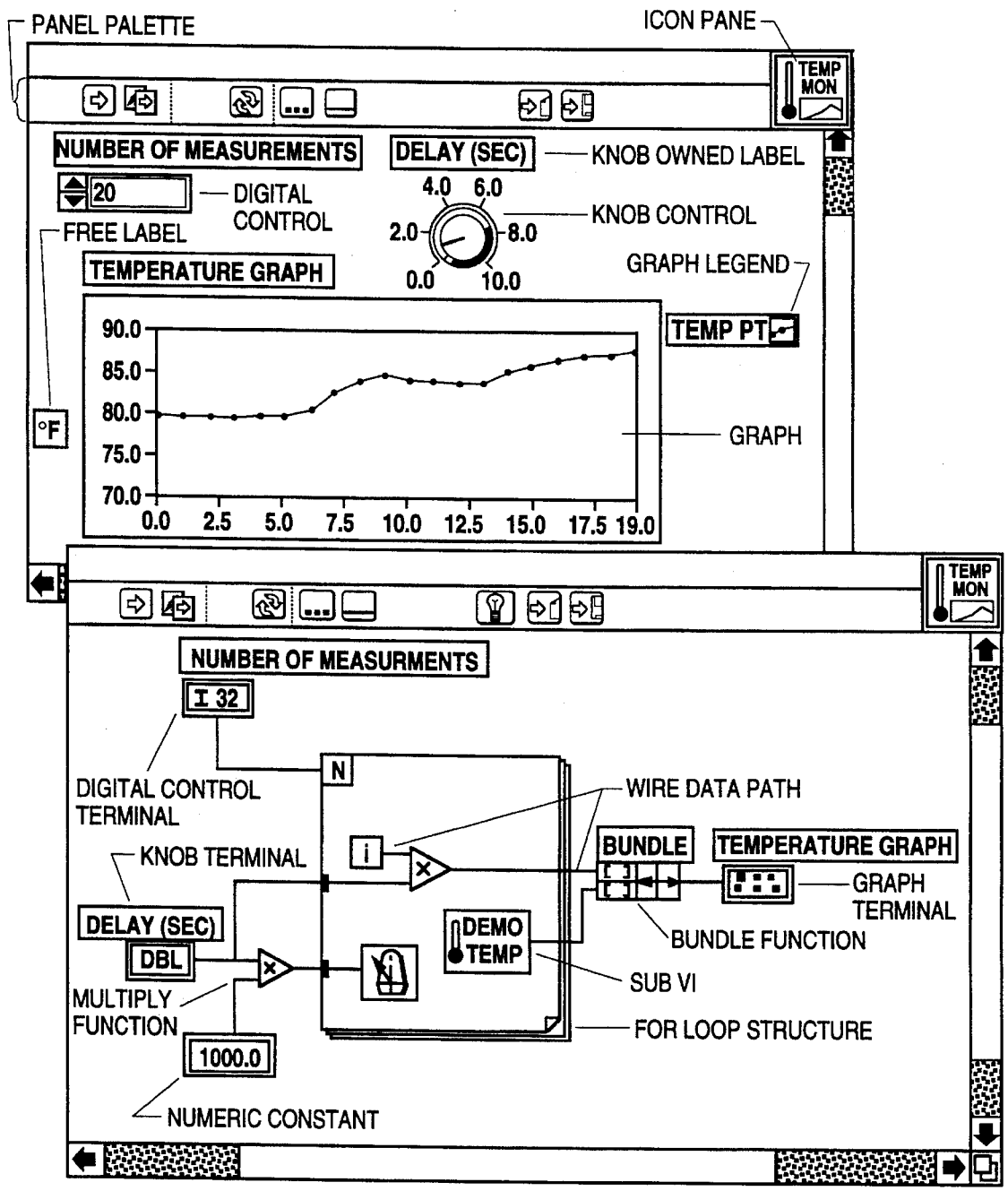
FIG. 47 illustrates a front panel and its associated block diagram.

Front panels and block diagrams comprise collections of graphical objects which represent programming elements. Front panels contain various types of controls and indicators. Block diagrams contain terminals corresponding to front panel controls and indicators, as well as constants, functions, subVIs, structures, and wires that carry data from one object to another. FIG. 47 shows a front panel and its associated block diagram.

Panel Palette

Both the Panel and Diagram windows contain a palette of command buttons and status indicators that are used for controlling the VI. One of two palettes is available depending on whether the user is operating in run or edit mode. The palette illustrated in FIG. 48 appears at the top of the window when the VI is in run mode. This panel includes, from left to right, icons referred to as the Run button, the Mode button, the Continuous Run button, the Breakpoint button, the Step Mode button, the Execution Highlighting button, the Print Mode button, and the Data logging button.

1. Run Mode

The user clicks on the Run button (FIG. 49A) to run the VI. While the VI is executing, the button changes to alternate appearances as shown in FIG. 49B depending on whether the VI is a top-level VI or one of the VI callers is running at the top level. While the VI is executing, the Stop button appears as illustrated in FIG. 49C. The user clicks on this button if it is necessary to halt the VI immediately. However, it is noted that the user should avoid using the Stop button to terminate a VI. The user preferably should either let the VI execute to completion or design a method to stop the VI gracefully. For example, placing a switch on the front panel to stop the VI is one method. If a VI contains an error, an icon referred to as the Broken Run button shown in FIG. 49D replaces the Run button and indicates that the VI cannot compile due to errors. To find out why, the user can click on this button and a pop-up window will list all errors.

The Mode button switches operation of the block diagram editor between run mode and edit mode. In run mode, the user can execute but not edit a VI. In edit mode, the user can create and change a VI. Thus the button appears differently depending on whether the program is in run mode (FIG. 50A) or edit mode (FIG. 50B).

If the user desires to run the VI from the edit mode without setting other options in the run mode palette, the user clicks on the run arrow (FIG. 49A). If necessary, the execution subsystem compiles the VI first, then switches to run mode, runs the VI, and returns to edit mode after the VI has run.

The user clicks on the Continuous Run button (FIG. 51A) to execute the VI repeatedly. While in the continuous run mode, the symbol changes to where the two arrows are darkened as shown in FIG. 51B. The user clicks on this button to disable continuous running.

The user clicks on the Breakpoint button (FIG. 52A) to set a breakpoint in the VI. The button changes its appearance (FIG. 52B) to indicate when a breakpoint is set.

The user clicks on the Step Mode button (FIG. 53A) to enable single-step mode. When in the single-step mode, the button changes appearance as indicated in FIG. 53B, and the Step button (FIG. 53C) appears besides it. The user clicks on the Step button to single-step through the VI.

The user clicks on the Execution Highlighting button (FIG. 54A) to enable execution highlighting. In this mode, the button changes its appearance to that illustrated in FIG. 54B, and the flow of data can be viewed through the block diagram. Execution highlighting is commonly used with single-step mode discussed above to trace the flow of data in the block diagram.

The user clicks on the Print Mode button (FIG. 55A) to automatically print the front panel after the VI finishes executing and the VI has updated the indicators with new values. The symbol changes to indicate that the print mode is activated as illustrated in FIG. 55B.

The user clicks on the Data logging button (FIG. 56A) to log all front panel control and indicator data to the separate log file when the VI executes. As shown in FIG. 56B, the button changes to indicate when data logging is active, and a complementary button (FIG. 56C) indicates that data is logged in a log file.

2. Edit Mode

In edit mode, the user has access to the palette illustrated in FIG. 57 and VIs can be created and modified. Along with the Run and Mode buttons, this palette contains the tools needed to build and operate VIs. These tools include from left to right the Operating tool, Positioning tool, Labeling tool, Wiring tool, and Coloring tool. After a tool is selected from the menu, the mouse cursor takes its shape.

The Operating tool (FIG. 58A) is used to manipulate front panel controls and indicators. As shown in FIG. 58B, the tool changes when it passes over a text-based control such as a digital or string control.

The Positioning tool (FIG. 59A) is used to select, move, or resize objects. The tool changes form when it passes over a corner of a resizable object, as illustrated in FIG. 59B and 59C.

The Labeling tool appears as shown in FIG. 60B and is used to enter text into labels or create free labels. The tool changes to the form illustrated in FIG. 60C when the user creates free labels.

The Wiring tool (FIG. 61) is used to wire objects together on the block diagram.

The Coloring tool (FIG. 62) is used to color an object. FIG. 62B shows the alternate form of the coloring tool when the user wishes to set the color of the tool from the object.

When any tool is placed over a subVI or function icon, information pertaining to the particular subVI or function is displayed in the Help Window. It is noted that the user must first select Show Help Window from the Windows menu to do so.

Pop-Up Menus

The menu used most often in the preferred embodiment is the pop-up menu. Nearly all the objects required to build VIs require pop-up menus for selection and modification. The action of accessing a pop-up menu is known as "popping-up."

Pull-Down Menus

Figure 70:
FIG. 70: illustrates the menu bar when the diagram window is active.

The menu bar at the top of the screen illustrated in FIG. 63 contains several pull-down menus. The pull-down menus contain options common to most applications, such as Open, Save, Copy, and Paste, as well as many others. FIG. 63 shows the menu bar when the Panel window is active. As shown in FIG. 70 the Functions menu replaces the Controls menu when the Diagram window is active.

1. File Menu

Referring now to FIG. 64, options in the File menu are used primarily to open, close, save, and print VIs.

The New option creates a new VI and opens its panel.

The Open . . . option opens an existing VI.

The Close option closes the active window.

The Save option saves the current VI.

The Save As . . . option saves the current VI under a new name.

The Save A Copy As . . . option saves a copy of the current VI under a new name.

The Save with Options . . . option allows options for saving VIs without hierarchy and/or block diagrams.

The Revert . . . option reverts the current VI to the last saved version.

The Page Setup . . . option sets configuration options for the printer.

The Page Layout . . . option sets options for printing the VI.

The Print Preview . . . option displays selected VI components as they appear when printed.

The Print . . . option prints selected components of the current VI.

The Data Logging option displays data logging options.

The Get Info . . . option displays a dialog box containing information on the current VI.

The Edit VI Library . . . option removes VIs in a library or rearranges VI palette order.

The Mass Compile . . . option compiles all VIs in a library.

The Import Picture . . . option imports graphics files.

The Build Application . . . option builds a stand-alone application using Application Builder (optional).

The Quit or Exit option quits operation.

2. Edit Menu

As shown in FIG. 65 the options in the Edit menu are used to build the front panel and block diagram of a VI.

The UNDO option restores the current VI to its state immediately prior to the last editing step (currently not implemented).

The Cut option removes the selected object and places it on the Clipboard.

The Copy option copies the selected object and places it on the Clipboard.

The Paste option places a copy of the Clipboard contents in the active window.

The Clear option deletes the selected object.

The Remove Bad Wires option deletes all faulty wiring connections.

The Panel Order . . . option changes the order number for front panel objects interactively.

The Edit Control . . . option invokes the Control Editor.

The Alignment option aligns selected items using a selected Alignment axis.

The Align option aligns the selected items by the current Alignment setting.

The Distribution option distributes selected items using a selected Distribution setting.

The Distribute option spaces the selected items by the current Distribution setting.

The Move Forward option moves selected item one position higher in the stack.

The Move Backward option moves the selected item one position lower in the stack.

The Move to Front option moves the selected item to the top of the stack.

The Move to Back option moves the selected item to the bottom the stack.

The Preferences . . . option sets preferences for memory, disk, and display.

The Move Forward, Move Backwared, Move to Front, and Move to Back options are useful when multiple objects are "stacked up" so that they overlap. This is a useful feature for creating certain visual effects on the front panel.

3. Operate Menu

As shown in FIG. 66 the commands in the Operate menu are used to execute the VI.

The Run option executes the current VI.

The Stop option stops execution of the current VI.

The Change to Run Mode option toggles between Run mode and Edit mode. (In run mode the menu item reads "Change to Edit Mode")

The Make Current Values Default option makes current values the default on all controls and indicators.

The Reinitialize All to Default option sets all controls and indicators to their default values.

4. Controls Menu

Referring now to FIG. 67 controls and indicators are added to the front panel via the Controls menu. Each option in the menu displays a palette of available controls and indicators for that selection. The Controls menu is available only when the Panel window is active.

The Numeric option displays controls and indicators for numeric data.

The Boolean option displays controls and indicators for Boolean values.

The String option displays controls and indicators for ASCII character strings.

The Array & Cluster option displays controls and indicators that group sets of data types.

The Graph option displays indicators that plot numeric data in graph or real time chart form.

The Path & RefNum option displays controls for file paths and refnums.

The Decoration option displays graphical objects that enhance the panel display.

The Control . . . option displays a dialog box to load custom controls.

The Picture option displays indicators for drawing graphical objects.

5. Windows Menu

Figure 68:
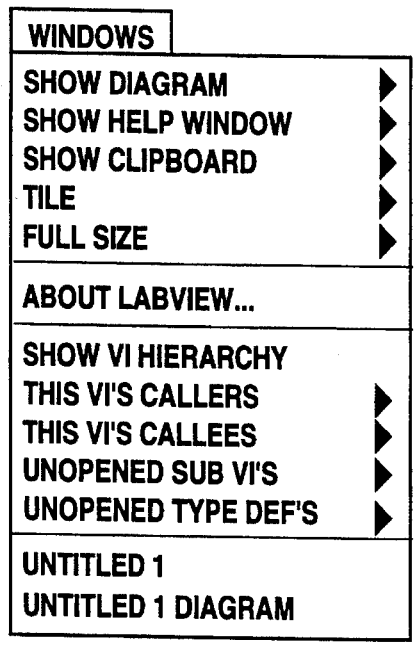
FIG. 68 illustrates the windows menu.

Referring now to FIG. 68 the Windows menu is used to locate opened windows quickly and to open windows of subVIs and calling VIs.

The Show Diagram option makes the diagram window active. (When the diagram is active, the menu item reads "Show Panel")

The Show Help Window displays the help window for block diagram function and VIs. (When the Help Window is visible the menu item reads "Hide Help Window")

The Show Clipboard option displays the contents of the clipboard. (if clipboard visible then "hide")

The Tile option displays the front panel and block diagram of a VI side by side.

The Full Size option uses the entire screen to display the active window.

The About LabVIEW . . . option displays a dialog box with the LabVIEW version number. The preferred embodiment of the graphical dataflow programming environment is marketed under the trademark LabVIEW®.

The Show VI Hierarchy option graphically displays the calling hierarchy of all VIs in memory. (if hierarchy window visible, menu reads "hide hierarchy window")

The This VI's Callers and the This VI's Callees options displays a palette of VIs that call the current VI and a palette of subVIs of the current VI, respectively.

The Unopened SubVIs option displays a palette of subVIs that are unopened,

The Unopened Type Defs option . . . allows the user to open a file containing the original of a type definition. For more information please see related U.S. patent application Ser. No. 0/125,459, titled "Method and Apparatus for Providing Improved Type Compatability Checking Data Structure Variable Referencing in a Graphical Data Flow Program," filed Sep. 22, 1993, which is hereby incorporated by reference.

At the bottom of the Windows menu, all the Panel and Diagram windows currently open are listed. A check mark indicates an active window.

6. Text Menu

Figure 69:
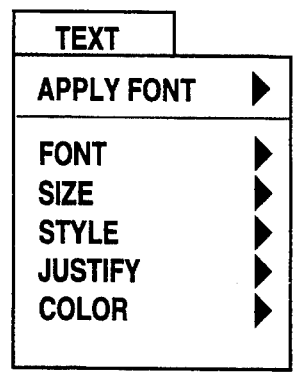
FIG. 69 illustrates the text menu.

Referring now to FIG. 69, the Text menu is used to change the font, style, and color of text.

The Apply Font option displays options to let the user choose from predefined font styles.

The Font option displays available fonts.

The Size option displays font sizes.

The Style option displays font styles such as plain, bold, italic, and underline.

The Justify option displays options to justify text such as left, center, and right.

The Color option displays a color palette to color text.

Figure 71:
FIG. 71 illustrates the functions menu.

As shown in FIG. 70, when the Diagram window is active, the Functions menu illustrated in FIG. 71 replaces the Controls menu from the Panel window menu bar. All other menu selections are identical.

7. Functions Menu

The user builds the block diagram with the Functions menu. Each option in the menu displays a palette of available icons for that option. As mentioned above, the Functions menu is only available when the Diagram window is active.

The Structs & Constants option displays program control structures, such as For Loops and constants.

The Arithmetic option displays arithmetic and logical functions.

The Trig & Log option displays trigonometric and logarithmic functions.

The Comparison option displays functions to compare numbers, Booleans, or strings.

The Conversion option displays functions to convert from one data type to another.

The String option displays functions to manipulate strings.

The Array & Cluster option displays function to process arrays and graph data.

The File I/O option displays functions for reading and writing files.

The Dialog & Date/Time option displays functions for operator dialog, timing, and time/date acquisition.

The Miscellaneous option displays miscellaneous functions.

The VI . . . option invokes the Select File dialog box, from which you can select any VI.

The Analysis option displays analysis VIs.

The DAQ option displays data acquisition VIs (for plug-in data acquisition boards).

The GPIB option displays VIs for controlling the GPIB interface.

The Basics Course option displays the VIs used in the Basic training course manual.

The Network option displays VIs for communicating over a network.

The Picture option displays VIs for creating pictures.

The Serial option displays VIs for controlling a serial port.

The Tutorial option displays VIs used in the tutuorial manual.

The Utility option displays utility VIs.

Creating a VI

VIs have three main parts: the front panel, the block diagram, and the icon/connector. The front panel and the block diagram are discussed here, and the icon/connector is discussed below.

Front Panel

The front panel of a VI is built with a combination of controls and indicators. Controls are the means of supplying data to the VI. Indicators display data that the VI generates. There are several types of controls and indicators. These include numeric, Boolean (True-False), string, array and cluster, and graph. Controls and indicators are added to the front panel through the Controls menu.

"Popping up" is the preferred method for placing objects on the Panel and Diagram windows. If a free area in the Panel window is popped up on, the Controls menu is accessed. Similarly, if a free area in the Diagram window is popped up on, the Functions menu is accessed. This method is not only quicker than moving the cursor to the panel palette, but the selected item will appear where the cursor is positioned instead of at the center of the window.

Numeric Controls and Indicators

Figure 72:
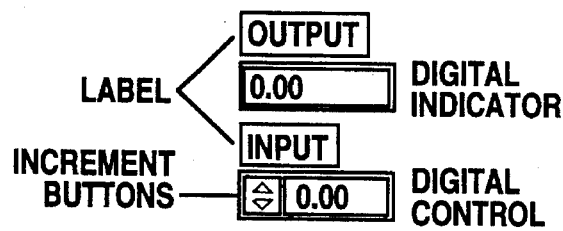
FIG. 72 illustrates examples of numeric controls and indicators.

Numeric controls are used to enter numeric quantities, while numeric indicators display numeric quantities. The two most commonly used numeric objects are the digital control and the digital indicator illustrated in FIG. 72.

Boolean Controls and Indicators

Figure 73:
FIG. 73 illustrates examples of Boolean controls and indicators.

Boolean controls and indicators are used to enter and display Boolean (True-False) values. Boolean objects simulate switches, buttons, and LEDs. The most commonly used Boolean objects are the vertical switch and the round LED illustrated in FIG. 73.

Configuring Controls and Indicators

Figure 74:
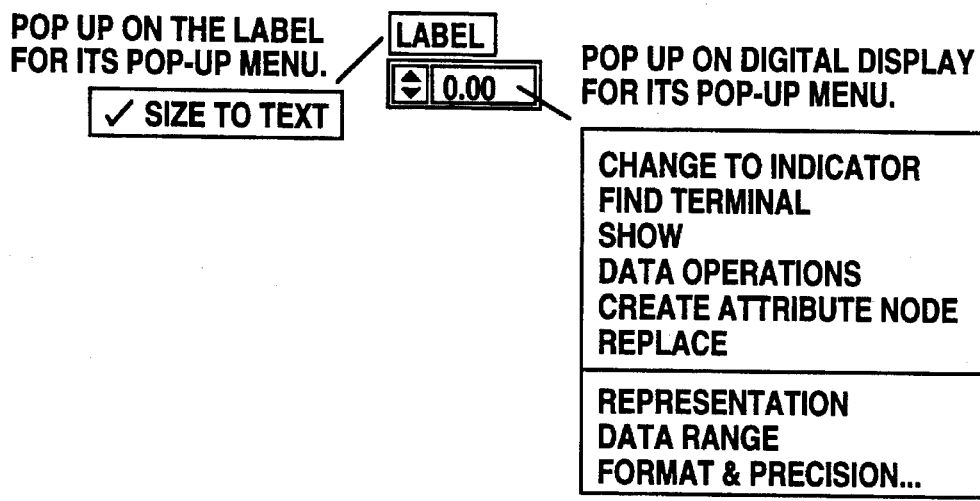
FIG. 74 illustrates how controls and indicators are configured.

Nearly all of the controls and indicators can be configured using options from their pop-up menus. Popping up on individual components of controls and indicators displays menus for customizing those components. This method is illustrated in FIG. 74 for a digital control.

Block Diagram

Figure 75:
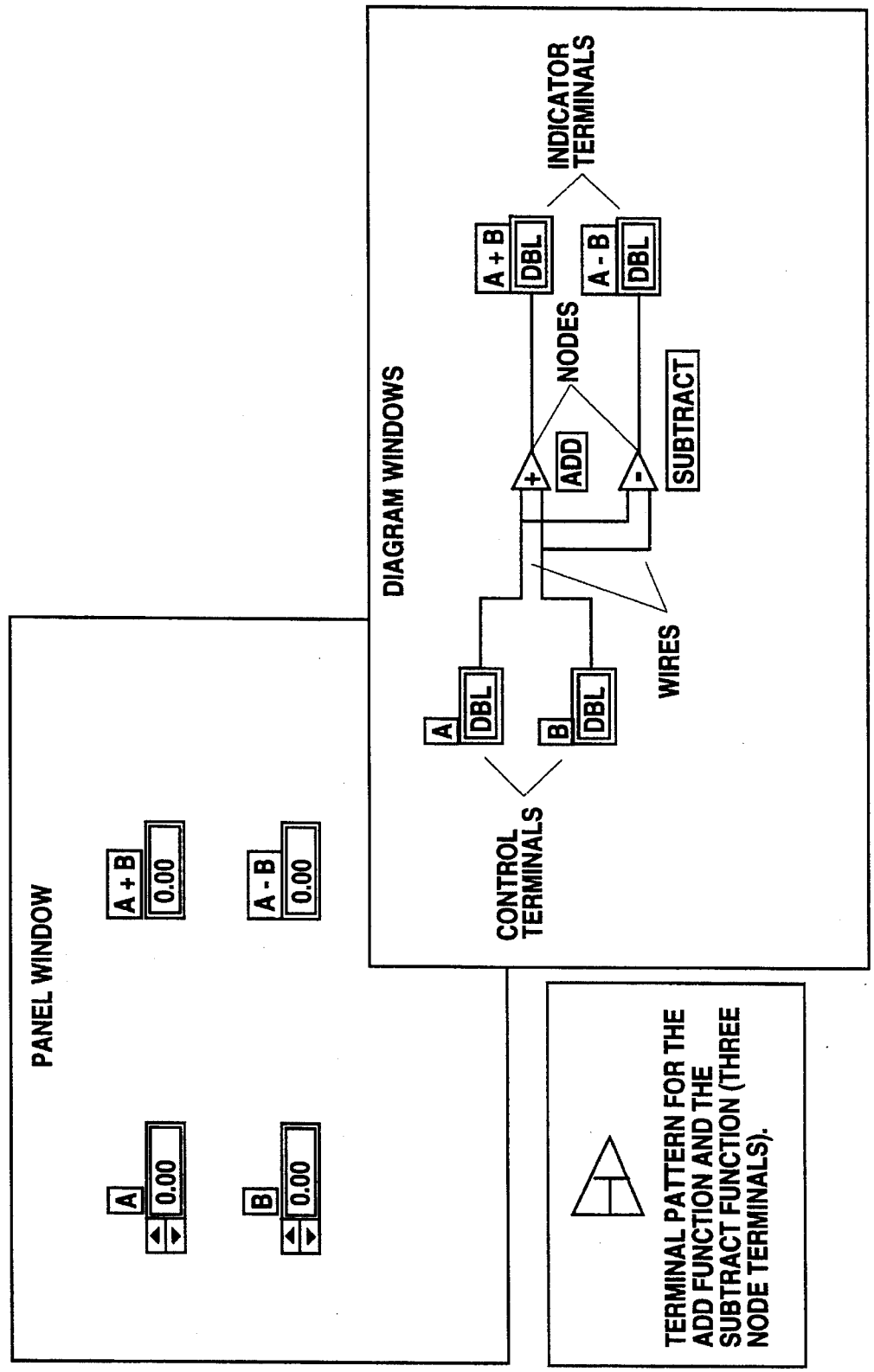
FIG. 75 illustrates the panel window and diagram window of a VI illustrating nodes, terminals, and wires.

As illustrated in FIG. 75, the block diagram is composed of nodes, terminals, and wires. Nodes are program execution elements and nodes are analogous to statements, functions, and subroutines in conventional, text-based programming languages. There are four node types—functions or primitives, subVI nodes, structures, and Code Interface Nodes (CINs). Functions are the built-in nodes for performing elementary operations such as adding numbers, file I/O, or string formatting. SubVI nodes are VIs that are designed by the user and later called from the diagram of another VI. Structures such as For Loops and While Loops control the flow of the program. CINs are interfaces between the block diagram and user-supplied code written in a text-based programming language. FIG. 75 shows a VI that has two function nodes, one that adds two numbers and one that subtracts them.

Terminals are ports through which data passes between the block diagram and the front panel and between nodes of the block diagram. Terminals are analogous to parameters and constants. There are two types of terminals—control or indicator terminals and node terminals. Control and indicator terminals belong to front panel controls and indicators. The values that an operator or a calling VI enters into these controls pass to the block diagram through these terminals when the VI executes. When the VI finishes executing, the output data passes from the block diagram to the front panel through the indicator terminals. Control and indicator terminals are automatically created or deleted when a front panel control or indicator is created or deleted. The block diagram of the example VI in FIG. 75 shows terminals belonging to four front panel controls and indicators. Like VIs, the Add and Subtract functions also have node terminals which underlie the icon. The terminal pattern for the Add function and the Subtract function is also illustrated in FIG. 75.

Wires are data paths between terminals and are analogous to variables in conventional languages. Data flows in only one direction, from a source terminal to one or more destination terminals. Different wire patterns represent different data types, as shown in FIG. 76. On a color monitor each data type appears in a different color for emphasis. Examples of the more common wire types are also shown in FIG. 76.

Data Flow Programming

The principle that governs how a program executes in the preferred embodiment is called data flow. A node executes only when data is available at all its input terminals; the node supplies data to all of its output terminals when it finishes; and the data passes immediately from source to destination terminals. Data flow contrasts with the control flow method of executing a conventional program, in which instructions execute in the sequence in which they are written.

As an example, consider a VI that multiplies two numbers together and then subtracts 50.0 from the result of the addition. The block diagram for such a VI is shown in FIG. 77. In this case, the block diagram executes from left to right, not because the objects are placed in that order, but because one of the inputs of the Subtract function is not valid until the Multiply function has multiplied the numbers together and passed the data to the Subtract function. It is again noted that a node (function) executes only when data is available at all of its input terminals, and it supplies data to its output terminals only when it finishes.

In the example shown in FIG. 78, it is not clear which function would execute first—the multiply or divide. This is unknown because input to both the divide and multiply functions is available at the same time. In a situation where one function must execute before another, and there is no type of dependency between the functions, a Sequence structure must be used to force the order of execution.

Basic Ideas

Figure 79:
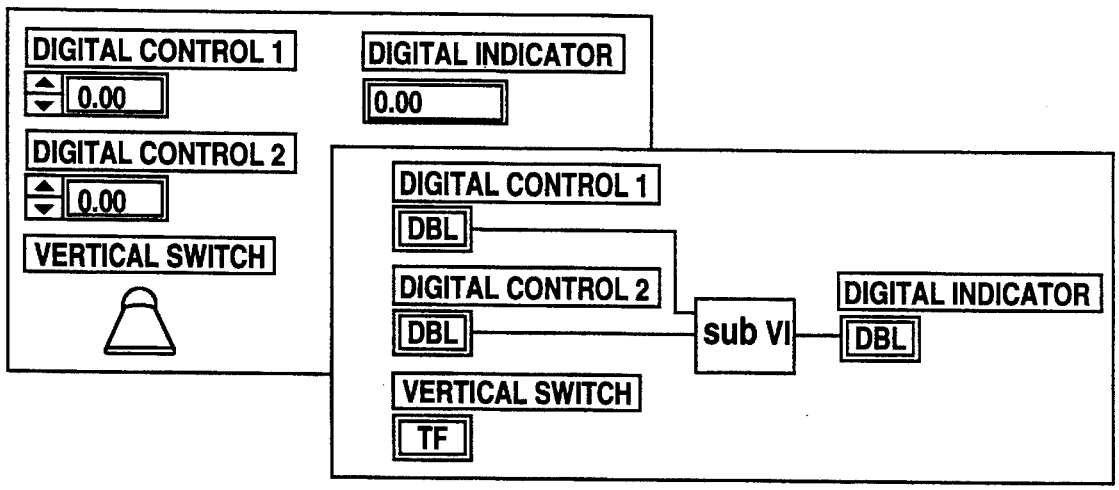
FIG. 79 illustrates icons grouped together into a lower level VI.

Referring now to FIG. 79, one key to creating applications in the preferred embodiment is understanding and using the hierarchical nature of the VI. That is, once a VI is created, it can be used as a subVI in the block diagram of a higher-level VI. When creating an application, the user should start at the top-level VI and define the inputs and outputs for the application. Then, subVIs are constructed to perform the necessary operations on the data as it flows through the block diagram. If a block diagram has a large number of icons, they should be grouped into a lower-level VI to maintain the simplicity of the block diagram. This modular approach makes applications easy to debug, understand, and maintain.

Figure 80:
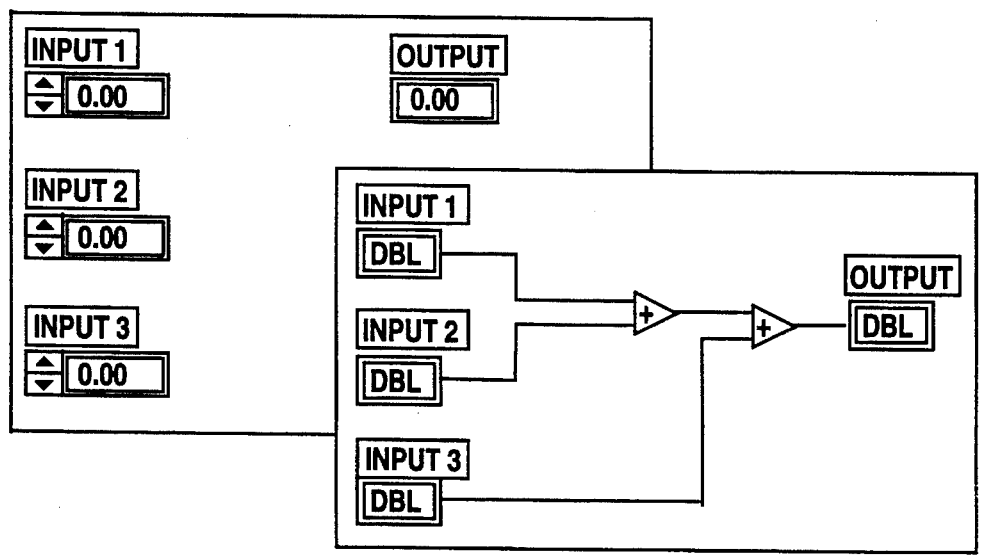
FIG. 80; illustrates a VI that adds three numbers together and returns their result.

As an example, consider a VI that adds three numbers together and returns the result. The front panel and the block diagram for the VI shown in FIG. 80. To use this VI as subVI, an icon and a connector must be created for it.

Creating the Icon and Connector

A VI used as a subVI needs an icon to represent it in the block diagram of a calling VI. The subVI also must have a connector with terminals to pass data to and from the higher-level VI.

Icon

Figure 81:
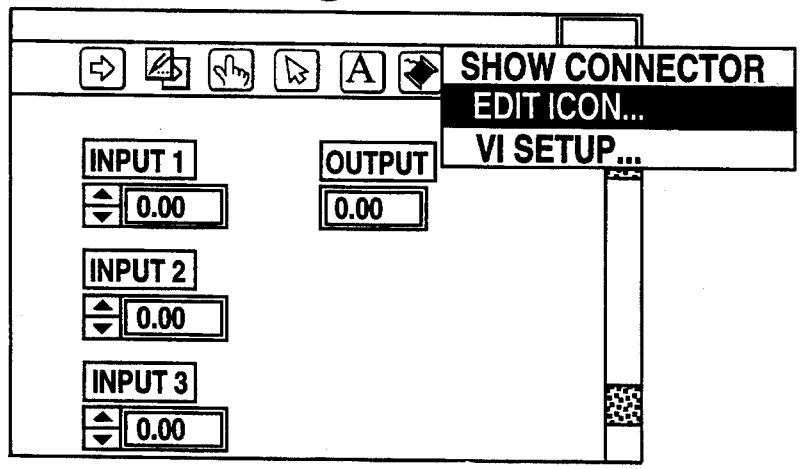
FIG. 81 illustrates activating the icon editor.
Figure 82:
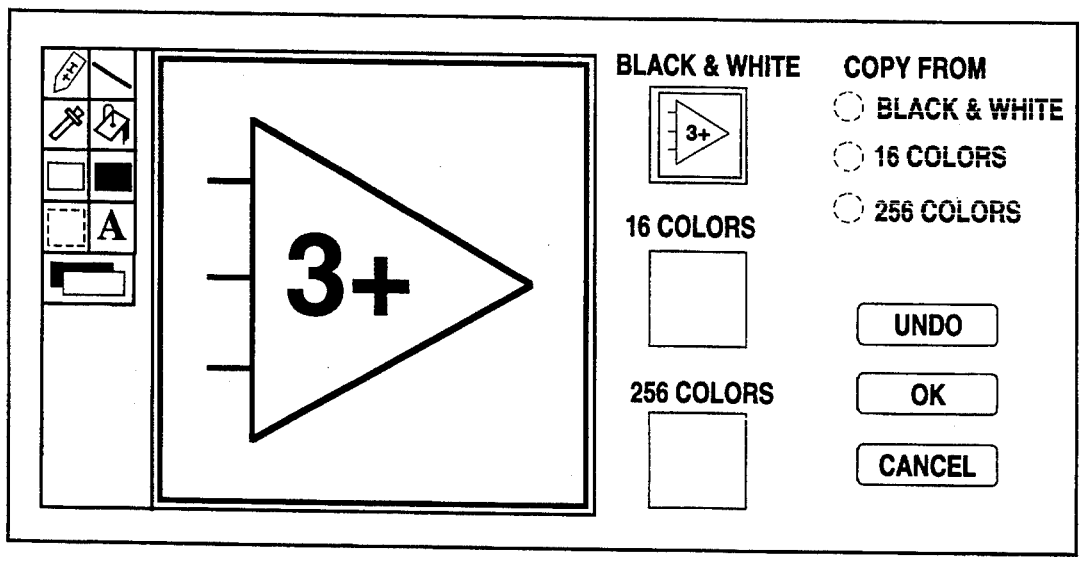
FIG. 82 illustrates the tools that may be used to create an icon design.

Every VI has a default icon displayed in the upper-right corner of the Panel and Diagram windows. The default icon is a blank frame. The Icon Editor is used to design the icon by turning individual pixels on and off. To activate the Icon Editor, pop up on the blank icon in the top right corner of the Panel window and select Edit Icon as shown in FIG. 81. It is noted that the menu is available only in the edit mode. The window illustrated in FIG. 82 appears. The tools shown on the left side of the illustration are used to create the icon design in the fat pixel editing area. The actual-size icon image appears in one of the boxes to the right of the editing area.

Connector

The connector is the programmatic interface to a VI. Data passes from front panel controls and to front panel indicators via the connector terminals. Connections are defined by choosing the number of terminals desired for the VI and assigning a front panel control or indicator to each of those terminals. If the panel controls or indicators are used programmatically, these controls or indicators need terminals on the connector pane.

Figure 83:
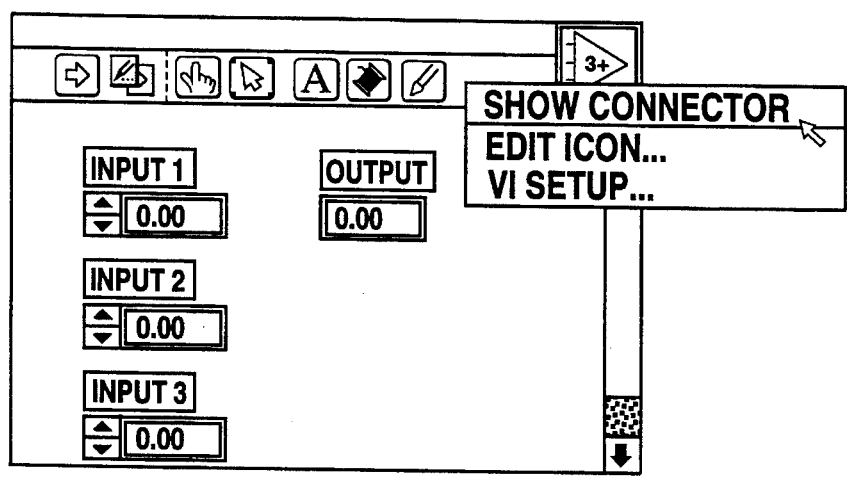
FIG. 83 illustrates the show connector function in the icon pane pop-up menu which may be used to define a connector.
Figure 84:
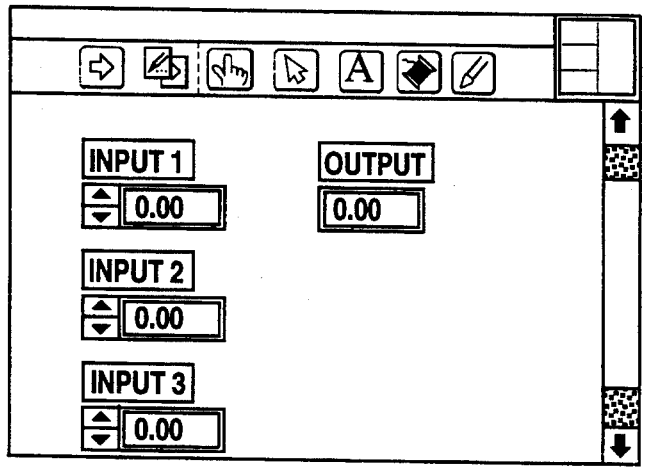
FIG. 84 illustrates a front panel with the connector replacing the icon pane in the upper right corner of the panel window.

To define a connector, Show Connector is selected from the icon pane pop-up menu, as illustrated in FIG. 83. The Diagram window does not have a connector pane. The connector replaces the icon in the upper-right corner of the Panel window, as shown in FIG. 84. The block diagram editor tries to select a terminal pattern for the VI with as many terminals on the left of the connector pane as controls on the front panel, and as many terminals on the right of the connector pane as indicators on the front panel.

Each rectangle on the connector represents a terminal area, and the rectangles may be used for either input to or output from the VI. If necessary, different terminal patterns can be selected for the VI.

Selecting and Modifying Terminal Patterns

Figure 85:
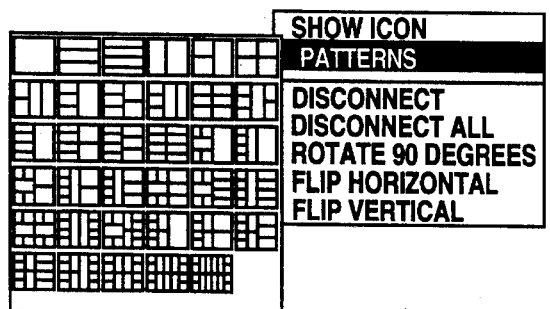
FIG. 85 illustrates the various choices for terminal patterns selected using the patterns option from the pop-up menu.

Referring now to FIG. 85, to select a different terminal pattern for the VI, pop up on the connector and choose Patterns from the pop-up menu. A boldfaced border highlights the pattern currently associated with the icon. To change the pattern, click on a new pattern. If a new pattern is chosen, any assignment of controls and indicators to the terminals on the old connector pane will be lost.

In order to change the spatial arrangement of the connector terminal patterns, one of the following commands from the connector pane pop-up menu is chosen: Flip Horizontal, Flip Vertical, or Rotate 90°. These items are disabled if any terminal connections exist.

Assigning Terminals to Controls and Indicators

Figure 86:
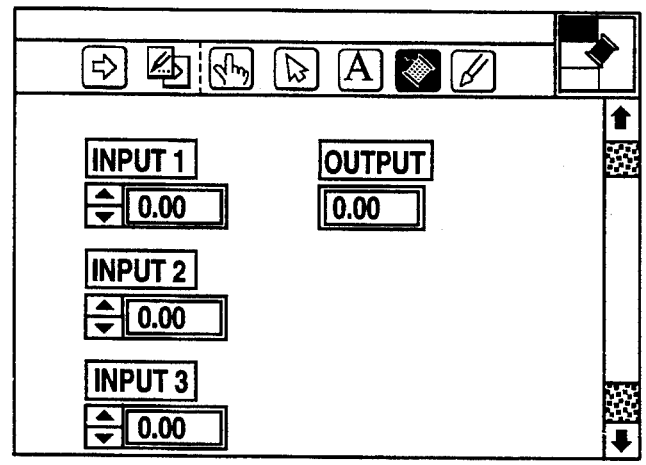
FIG. 86–88 illustrates how a user assigns front panel controls and indicators to the terminals using the wiring tool.
Figure 87:
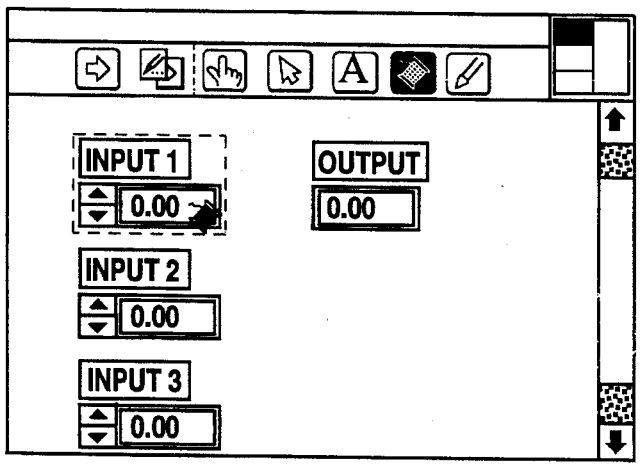
Figure 88:
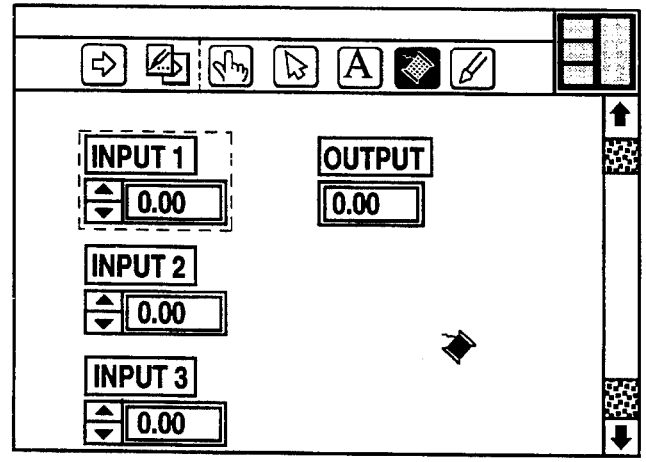

Front panel controls and indicators are assigned to the terminals using the wiring tool. The following steps detail the method to follow in order to associate the connector pane with the front panel controls and indicators.
1. Click on a connector terminal. The tool automatically changes to the Wiring tool. The terminal turns black (See FIG. 86).
2. Click on the front panel control or indicator to be assigned to the selected terminal. A marquee frames the selected control as shown in FIG. 87. As shown in FIG. 88, if the cursor is positioned in free space and clicked, the dashed line disappears and the selected terminal dims, indicating that the control or indicator selected now corresponds to the dimmed terminal. It is noted that although the Wiring tool is used to assign terminals on the connector to front panel controls and indicators, no wires are drawn between the connector and these controls and indicators.
3. Steps 1 and 2 are repeated for each control and indicator to be connected.

It is also possible to select the control or indicator first and then select the terminal. A pattern can be chosen with more terminals than necessary. Unassigned terminals do not affect the operation of the VI. There can also be more front panel controls than terminals.

Using a VI as a SubVI

Figure 89:
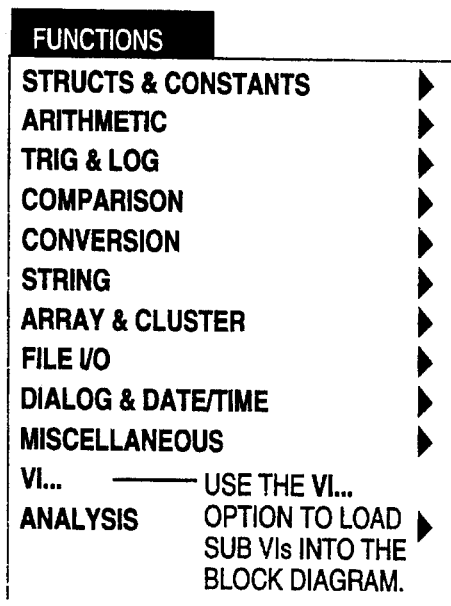
FIG. 89 illustrates the VI option which is used to place a VI as a subVI in the block diagram of another VI.

Any VI that has an icon and a connector may be used as a subVI in the block diagram of another VI. VIs to be used as subVIs are selected from the VI . . . option of the Functions menu as shown in FIG. 89. Choosing this option produces a file dialog box, from which any VI in the system can be selected. If a VI is opened that does not have an icon and a connector, a blank square box appears in the calling VI's block diagram. This node cannot be wired to.

A subVI is analogous to a subroutine. A subVI node (icon/connector, i.e., I-use node) is analogous to a subroutine call. The subVI node is not the subVI itself, just as a subroutine call statement in a text-based program is not the subroutine itself. A block diagram that contains several identical subVI nodes calls that subVI several times.

Opening, Operating, and Changing SubVIs

A VI used as a subVI may be opened from the calling VI block diagram. The Panel window of the subVI is opened by double-clicking on the subVI icon. The Diagram window can then be opened by selecting Show Diagram from the Windows menu.

Any changes made to a subVI alter only the version in memory until the subVI is saved. It is noted that the changes affect all calls to the subVI and not just the node used to open the VI.

Online Help for SubVI Nodes

Figure 90:
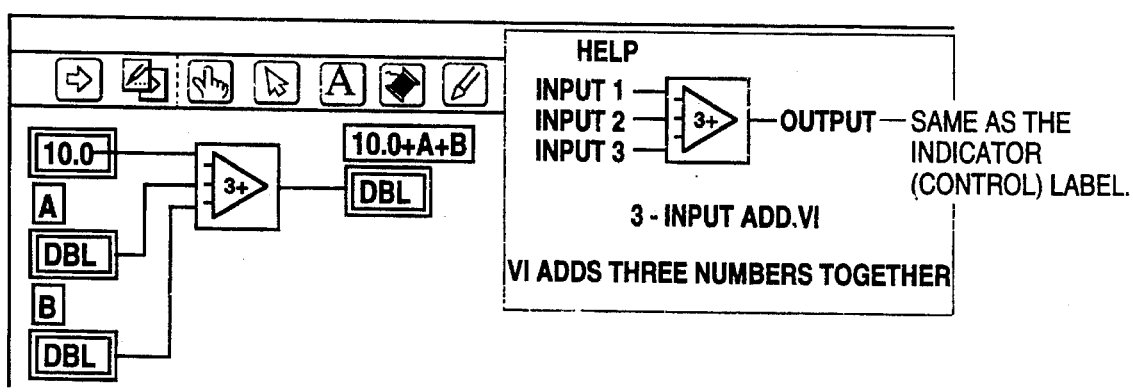
FIG. 90 illustrates the help window for a subVI icon.

When one of the editing tools is moved across a subVI node, the Help window shows the subVI icon with wires attached to each terminal. An example is shown in FIG. 90. Show Help Window is first selected and then an editing tool is placed on the subVI to display the wiring diagram. After choosing the Help window, the Diagram window must be clicked on to make it active.

While Loop

Figure 91:
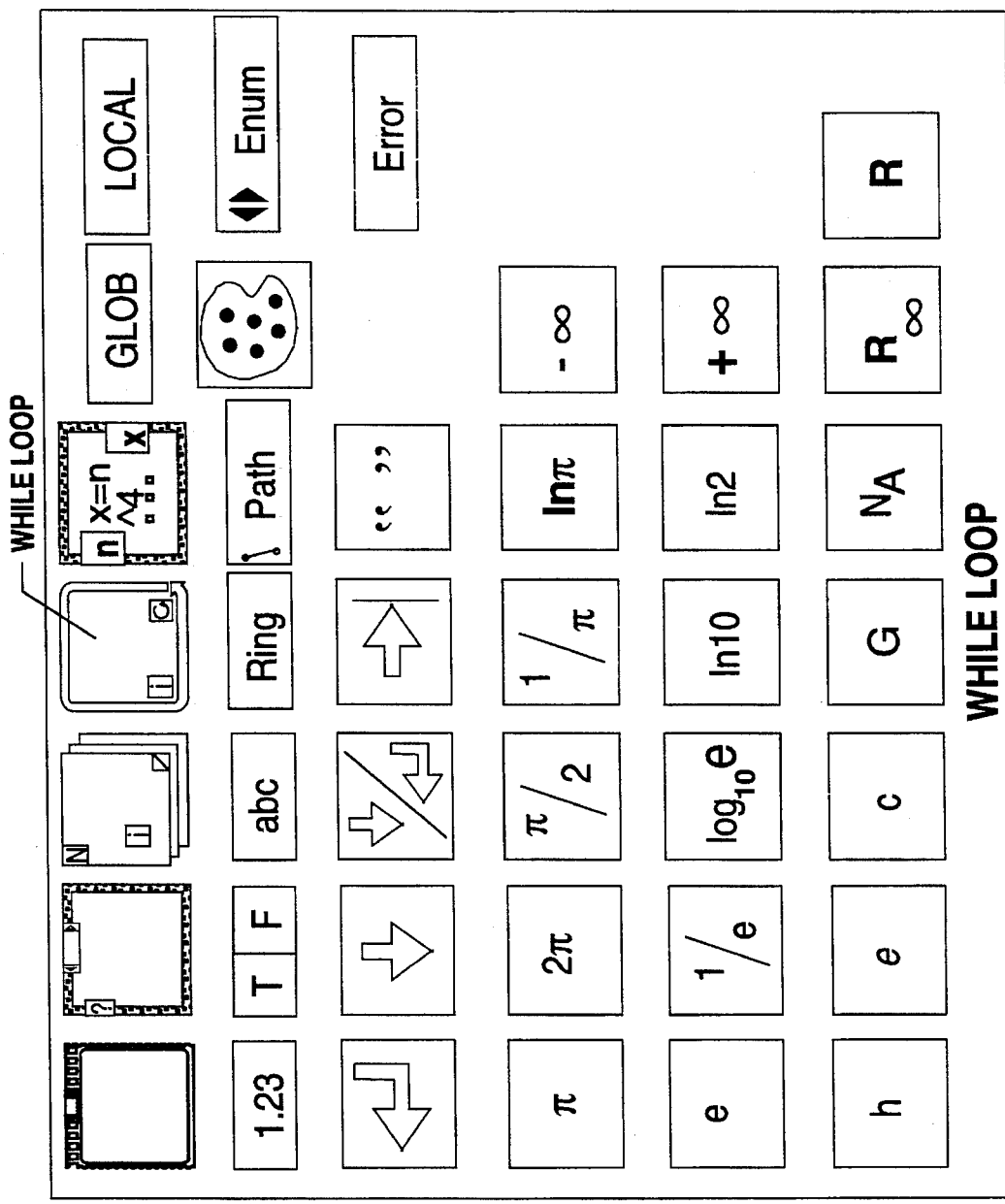
FIG. 91 illustrates a While Loop selected from the Structs and Constants palette of the Functions Menu.
Figure 92:
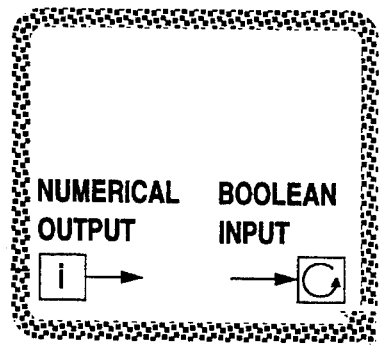
FIG. 92 illustrates a while loop.

Referring now to FIG. 91, the While Loop, which is referred to in FIG. 12D as an indefinite loop structure, is placed in the block diagram by selecting it from the Structs & Constants palette of the Functions menu (FIG. 71). As shown in FIG. 92, the While Loop is a resizable box used to execute the diagram inside it until the Boolean value passed to the conditional terminal is FALSE. The VI checks the conditional terminal at the end of each iteration; therefore, the While Loop always executes once. The iteration terminal is an output numeric terminal that contains the number of times the loop has executed.

The While Loop is equivalent to the following pseudo-code: Do

Figure 93:
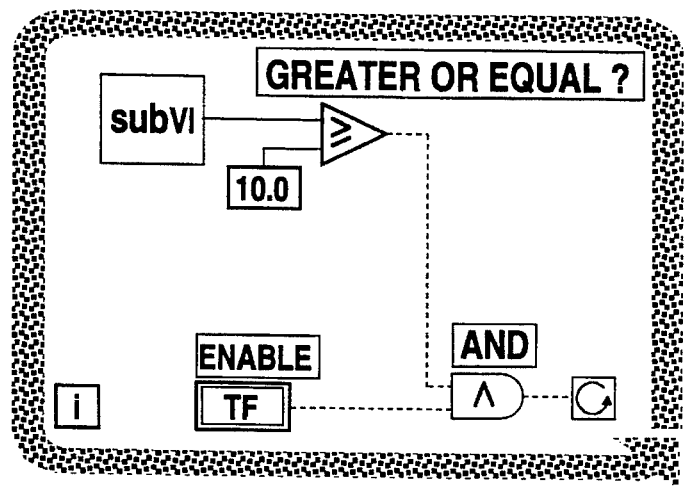
FIG. 93 illustrates an example of a while loop.

Execute Diagram Inside the Loop (which sets the condition) While Condition is TRUE In the example shown in FIG. 93, the While Loop executes until the value output from the subVI is less than 10 or the Enable Boolean is FALSE. (The And function outputs a TRUE only if both inputs are TRUE; otherwise it outputs a FALSE.)

For Loop

Figure 94:
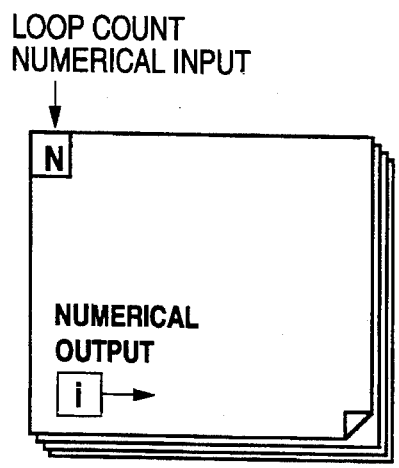
FIG. 94 illustrates a for loop.

Referring now to FIG. 94, the For Loop, which is referred to in FIG. 12B as an iterative loop structure, is placed on the block diagram by selecting it from the Structs & Constants palette of the Functions menu (FIG. 71). The For Loop is a resizable box, and it executes the diagram inside its border a predetermined number of times. The For Loop has two terminals: the count terminal (an input terminal) and the iteration terminal (an output terminal). The count terminal specifies the number of times (N) to execute the loop. The iteration terminal contains the number of times (i) the loop has executed.

Figure 95:
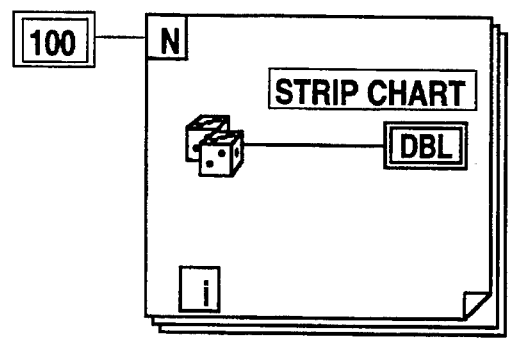
FIG. 95 illustrates an example of a for loop.
Figure 100A:
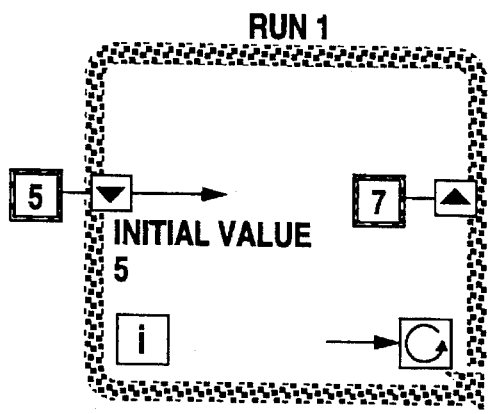
FIG. 100 illustrates operation of initialized and uninitialized shift registers.
Figure 100B:
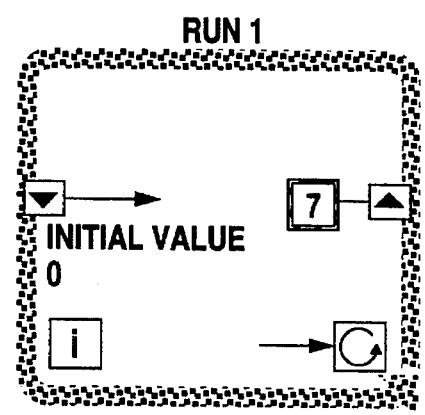
Figure 100C:
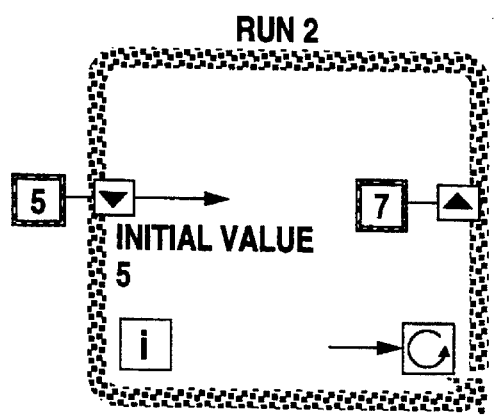
Figure 100D:
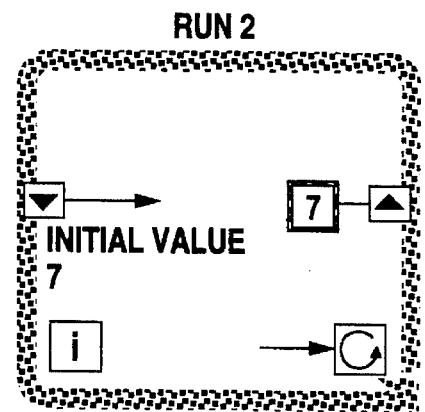

The For Loop is equivalent to the following pseudo-code:
For i=0 to N−1 Execute Diagram Inside The Loop The example in FIG. 95 shows a For Loop that generates 100 random numbers and displays the points on a waveform chart. It is noted that the loop timing of For Loops and While Loops can be controlled using a function referred to as "Wait Until Next ms Multiple." This function ensures that no iteration is shorter than a specified number of milliseconds.

Numeric Conversion

All previous numeric controls and indicators are double-precision floating-point numbers. In the preferred embodiment, however, numerics can be represented as integers (byte, word, or long) or floating-point numbers (single, double, or extended precision). The default representation for a numeric is double precision floating point.

If two terminals are wired together that are of different data types, the block diagram editor converts one of the terminals to the same representation as the other terminal. As a reminder, the editor places a gray dot, called a coercion dot, on the terminal where the conversion takes place.

For example, consider the For Loop count terminal "N" in FIG. 96. The terminal representation is a long integer. If a double-precision floating-point number is wired to the count terminal, the block diagram editor converts the number to a long integer.

When the VI converts floating-point numbers to integers, the VI rounds to the nearest integer. x.5 is round to the nearest even integer. For example, 2.5 is rounded to 2 and 3.5 is rounded to 4.

Shift Registers

Referring now to FIG. 97, shift registers (available for While Loops and For Loops) are local variables that transfer values from one iteration to the next. A shift register is created by popping up on the left or right loop border and selecting Add Shift Register from the pop-up menu.

As shown in FIG. 97, the shift register contains a pair of terminals directly opposite each other on the vertical sides of the loop border. The right terminal stores the data upon the completion of an iteration. That data is shifted at the end of the iteration and it appears in the left terminal at the beginning of the next iteration (see FIG. 98). A shift register can hold any data type—numeric, Boolean, string, array, and so on. The shift register automatically adapts to the data type of the first object that is wired to the shift register.

As shown in FIG. 99, the shift register can be configured to remember values from several previous iterations. This feature is very useful when averaging data points. Additional terminals are created to access values from previous iterations by popping up on the left terminal and choosing Add Element from the pop-up menu. For example, if three elements are added to the left terminal, values can be accessed from the last three iterations.

Initializing Shift Registers

Referring now to FIG. 100, to initialize the shift register with a specific value, the initial value is wired to the left terminal of the shift register (outside the While Loop). If the initial value is left unwired, the initial value will be the default value for the shift register data type. For example, if the shift register data type is Boolean, the initial value will be FALSE. Similarly, if the shift register data type is numeric, the initial value will be zero.

It is noted that values stored in the shift register are not discarded until the VI is closed and removed from memory. In other words, if a VI is run which contains uninitialized shift registers, the initial values for the subsequent run will be the ones left from the previous run.

Case Structure

Figure 101:
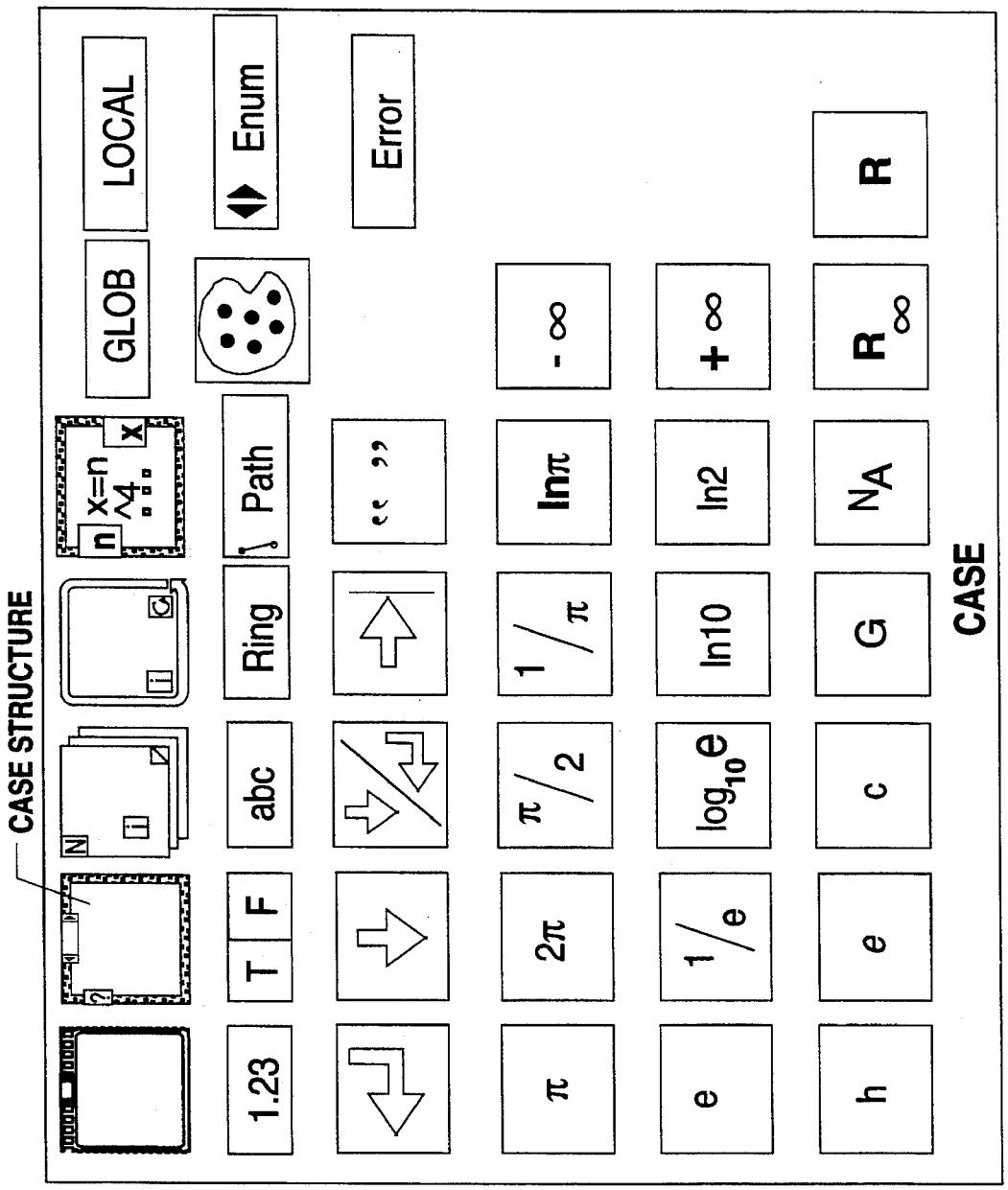
FIG. 101 illustrates selection of a case structure from the Structs and Constants palette of the Function Menu.
Figure 102:
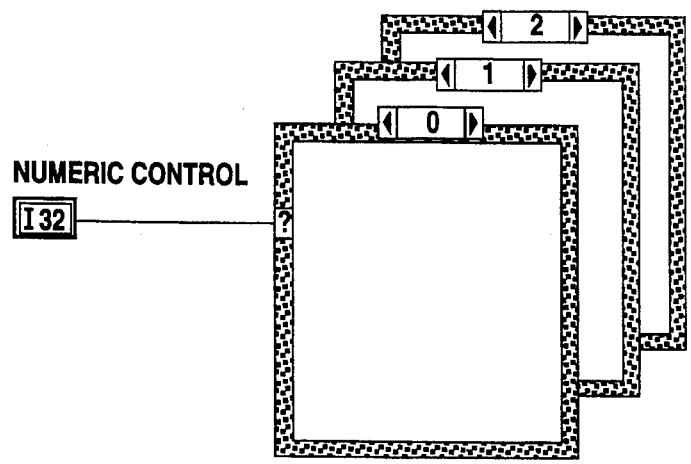
FIG. 102 illustrates a numerical case structure.
Figure 103:
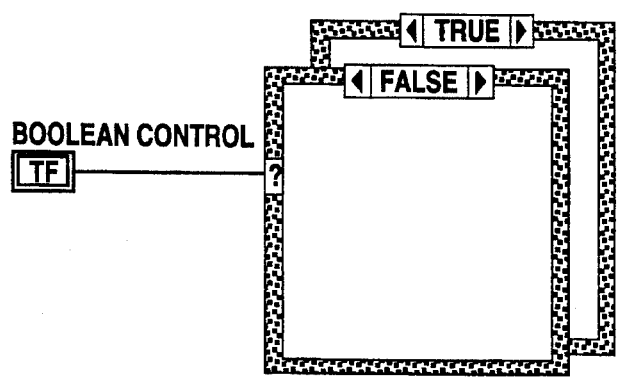
FIG. 103 illustrates a Boolean case structure.

Referring now to FIG. 101, the Case Structure is placed on the block diagram by selecting it from the Structs & Constants palette of the Functions menu (FIG. 71). The Case Structure shown in FIGS. 102 and 103 are analogous to case statements or if . . . then . . . else statements in conventional, text-based programming languages. The Case Structure is configured like a deck of cards; only one case is visible at a time. Each case contains a subdiagram. Only one case executes depending on the value wired to the selector terminal. The selector terminal can be either numeric or Boolean as shown in FIGS. 102 and 103, respectively. If the data type is Boolean, the structure has a True case and a False case. If the data type is numeric, the structure can have up to $2^{31}-1$ cases.

Figure 104:
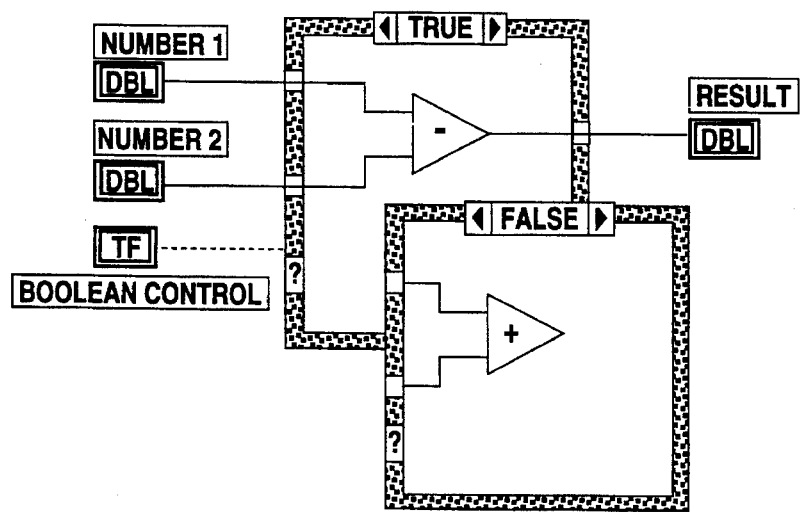
FIG. 104 is an example of a Boolean case structure.

FIG. 104 is an example of a Boolean Case structure. In this example, the numbers pass through tunnels to the Case structure, and are either added or subtracted, depending on the value wired to the selector terminal. If the Boolean wired to the selector terminal is FALSE, the VI will add the numbers; otherwise, the VI will subtract the numbers.

Sequence Structure

Figure 105:
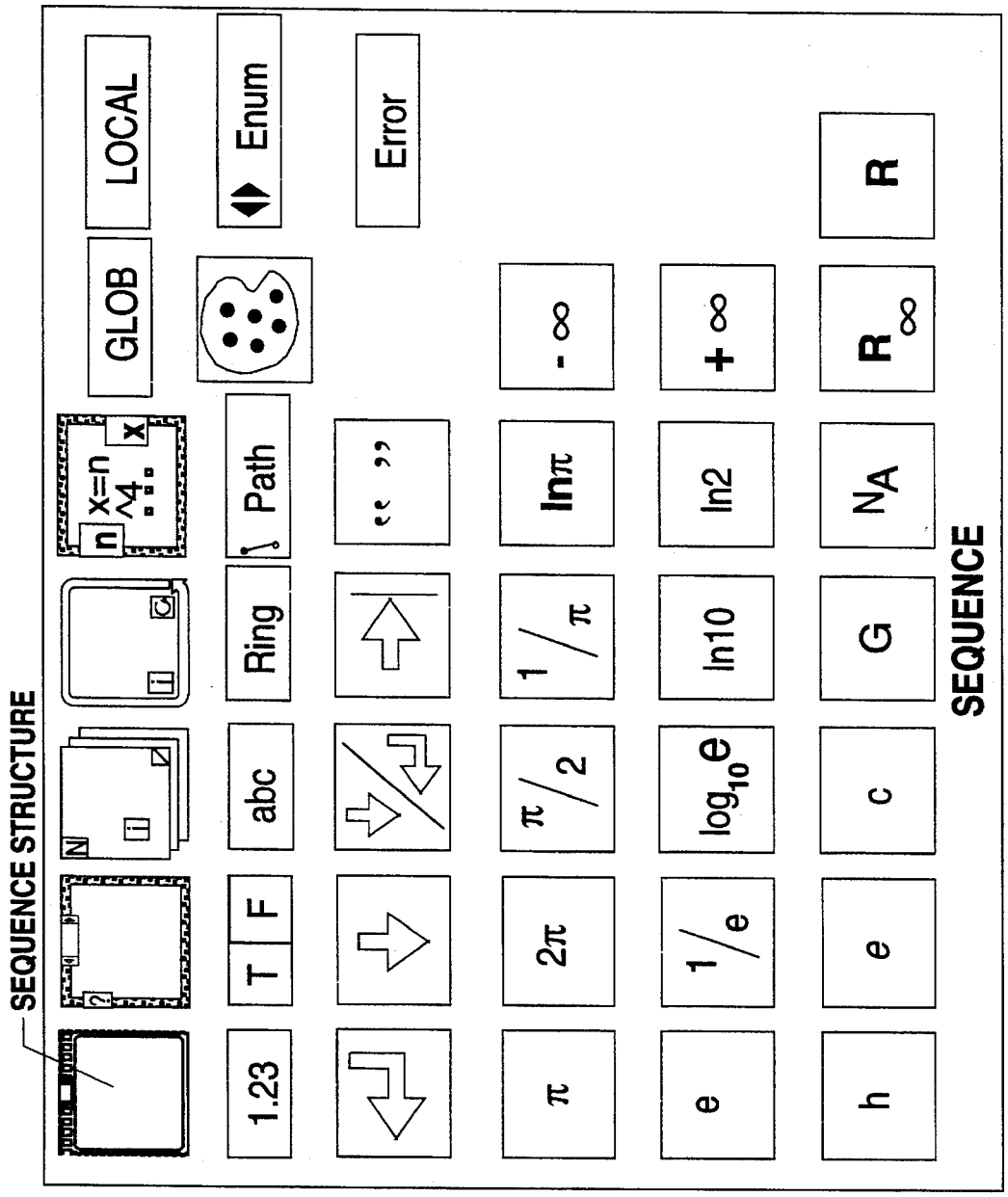
FIG. 105 illustrates a sequence structure selected from the Structs and Constants menu palette of the; Functions Menu.
Figure 106:
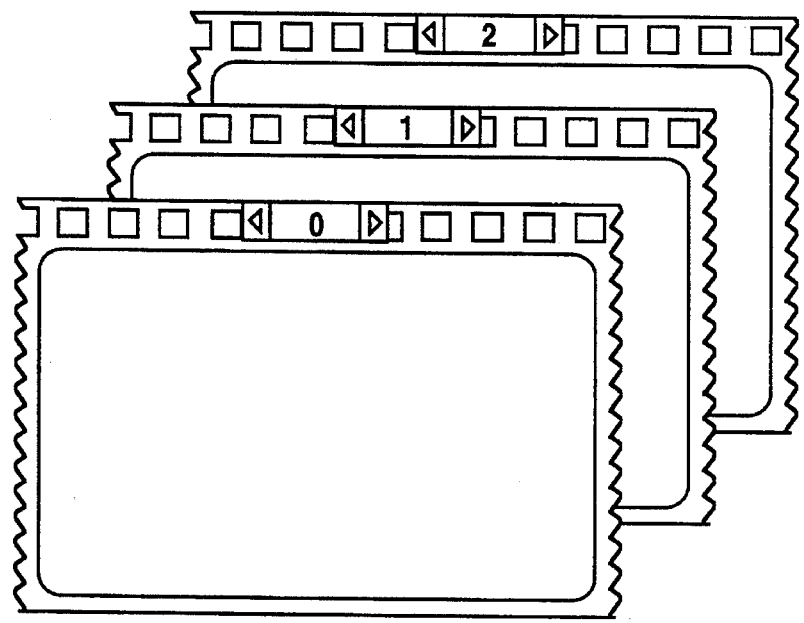
FIG. 106 illustrates a sequence structure.

Referring now to FIG. 105, the Sequence Structure is placed on the block diagram by selecting it from the Structs & Constants palette of the Functions menu (FIG. 71). As shown in FIG. 106, the Sequence Structure looks like a frame of film, and it operates to execute diagrams sequentially. In conventional text-based languages, the program statements execute in the order in which they appear. In contrast, in data flow programming a node executes when data is available at all of the node inputs. However, sometimes it is necessary to ensure that one node is executed before another. The Sequence Structure is a method of controlling the order in which nodes execute. The diagram to be executed first is placed inside the border of Frame 0, the diagram to be executed second is placed inside the border of Frame 1, and so on. As with the Case Structure, only one frame is visible at a time.

Sequence Locals

Sequence locals are variables that pass data between frames of a Sequence structure. Sequence locals can be created on the border of a frame the data wired to a frame sequence local is then available in subsequent frames. The data, however, is not available in frames preceding the frame in which the sequence local was created.

Figure 107A:
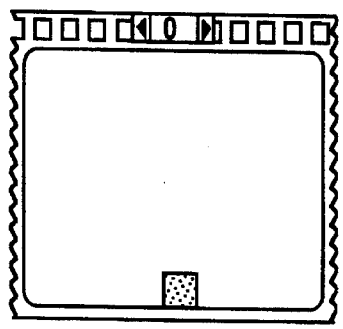
FIG. 107 illustrates an example of a three framed sequence structure using sequence locals.
Figure 107B:
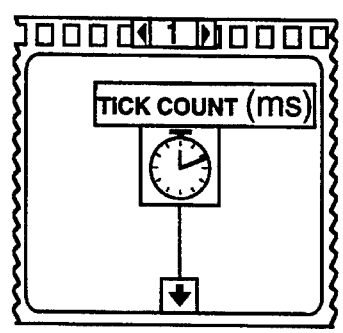
Figure 107C:
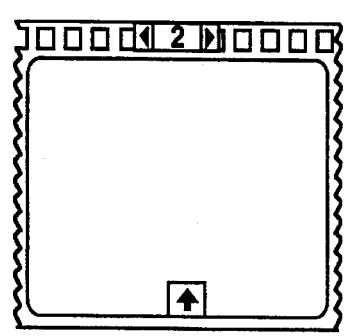

The example illustrated in FIG. 107 shows a three-frame Sequence structure. A sequence local in Frame 1 passes the value that the Tick Count (ms) function returns. (The Tick Count (ms) function returns the number of milliseconds that have elapsed since power on.) Note that this value is available in Frame 2 (as the arrow pointing into Frame 2 indicates). Also note that the VI displays only one sequence frame at a time.

Formula Node

Figure 108:
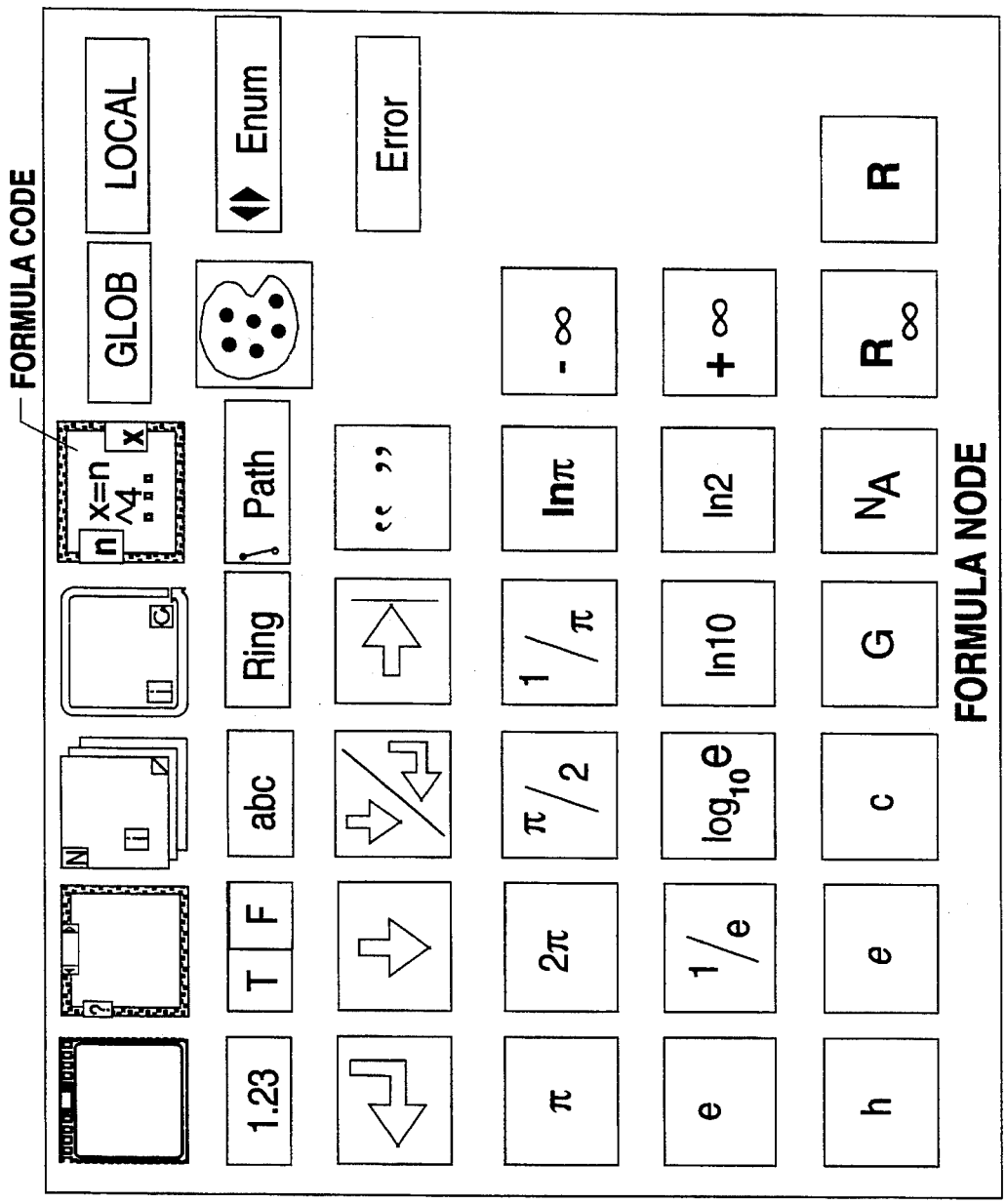
FIG. 108 illustrates a formula node selected from the structs and constants palette of the functions menu.
Figure 109:
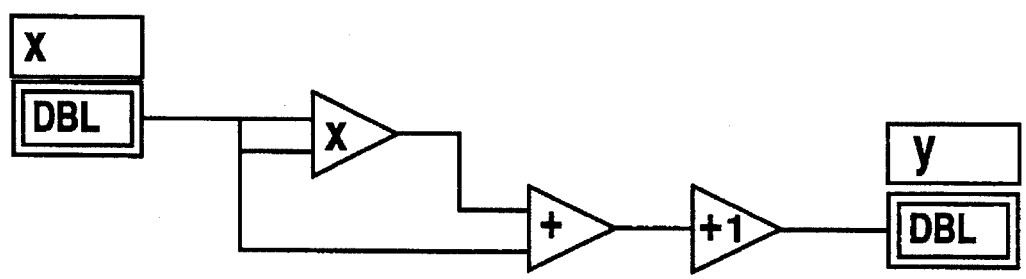
FIG. 109 illustrates an equation implemented using arithmetic functions.
Figure 110:
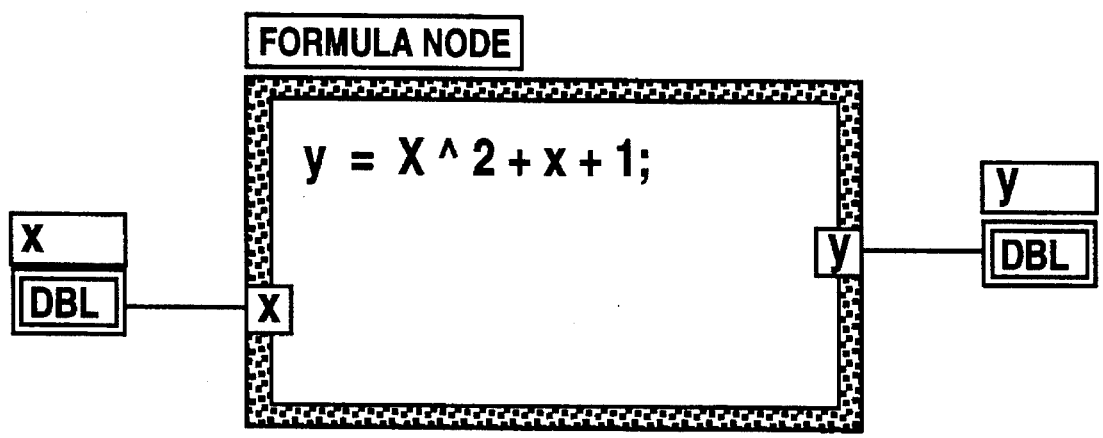
FIG. 110 illustrates the same equation implemented using a formula node.

Referring now to FIG. 108, the Formula Node is placed on the block diagram by selecting it from the Structs & Constants palette of the Functions menu (FIG. 71). The Formula Node is a resizable box that is used to enter algebraic formulas directly into the block diagram. This feature is extremely useful when the function equation has many variables or is otherwise complicated. For example, consider the equation $y=x^2+x+1$. If this equation is implemented using regular arithmetic functions, the block diagram appears like that shown in FIG. 109. The same equation can be implemented using a Formula Node, as shown in FIG. 110.

With the Formula Node, the user can directly enter a complicated formula, or formulas, in lieu of creating block diagram subsections. The input and output terminals of the Formula Node are created by popping up on the border of the node and choosing Add Input (Add Output) from the pop-up menu. The formula or formulas are entered inside the box. Each formula statement must terminate with a semi-colon (;).

Waveform Charts

Figure 111:
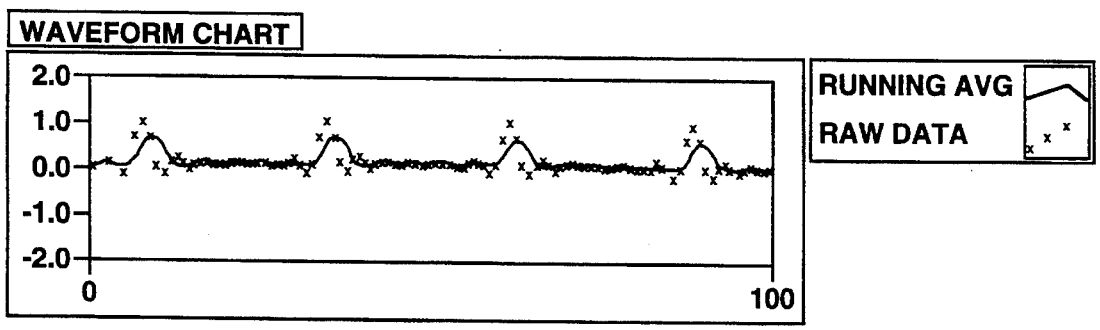
FIG. 111 illustrates a waveform chart.

The waveform chart is a special numeric indicator that displays one or more plots. The waveform chart is in the Graph palette of the Controls menu. Waveform charts may display single or multiple traces. An example of a multiple-plot waveform chart is shown in FIG. 111.

Figures 112A, 112B, 112C:
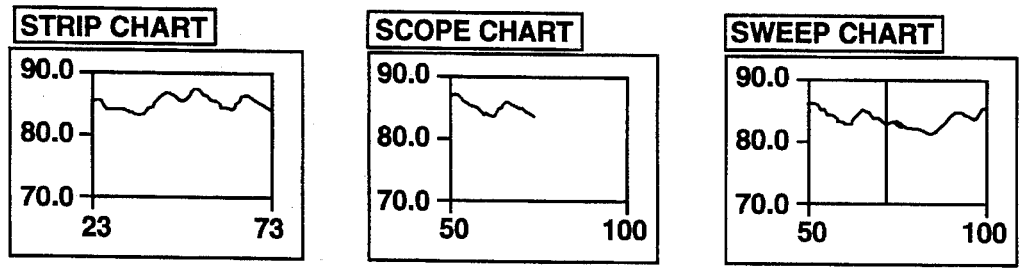
FIG. 112 illustrates the three update modes of a waveform chart, referred to as strip chart, scope chart, and sweep chart.

As shown in FIG. 112, the waveform chart has three update modes—strip chart, scope chart, and sweep chart. The update mode can be selected by popping up on the waveform chart and choosing one of the options from the Data Operation Update Mode menu. (In the run mode, Update Mode from the chart pop-up menu is selected.)

The strip chart has a scrolling display similar to a paper strip chart. The scope chart and the sweep chart have retracing displays similar to an oscilloscope. Because there is less overhead in retracing a plot, the scope chart and the sweep chart are significantly faster than the strip chart in displaying plots. On the scope chart, when the plot reaches the right border of the plotting area, the plot is erased, and plotting begins again from the left border. The sweep chart acts much like the scope chart, but the display does not blank when the data reaches the right border. Instead, a moving vertical line marks the beginning of new data and moves across the display as new data is added.

Wiring a Single-Plot Chart

Figure 113:
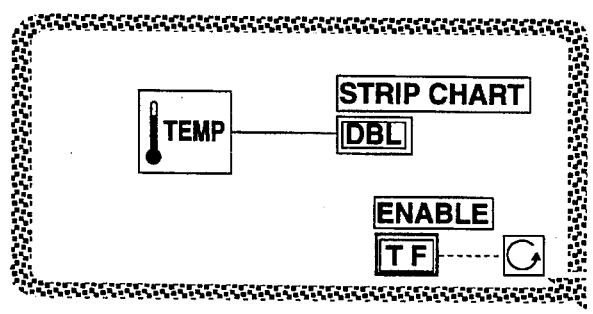
FIG. 113 illustrates how a scalar output is directly wired to a waveform chart.

A scalar output can be directly wired to a waveform chart. The data type displayed in the waveforms chart's terminal icon matches the input type, as shown in FIG. 113.

Wiring a Multiple-Plot Chart

Figure 114:
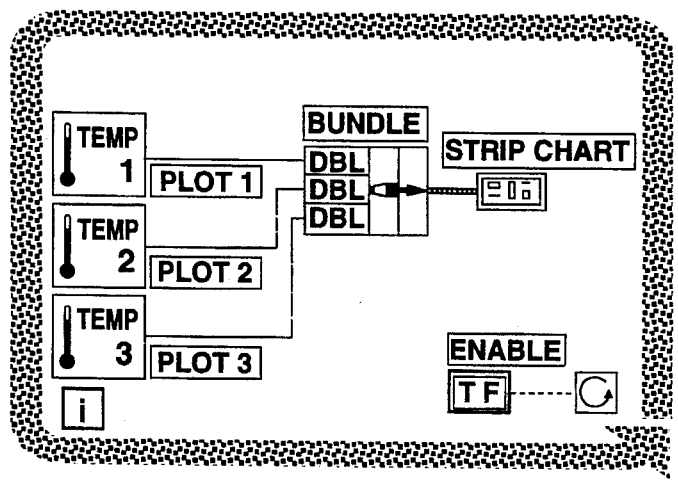
FIG. 114 illustrates how a waveform chart accommodates more than one plot using the bundle function.

Waveform charts can accommodate more than one plot. The data must be bundled together using the Bundle function (Array & Cluster menu). As shown in FIG. 114, the Bundle function "bundles" or groups the output of the three different VIs that acquire temperature for plotting on the waveform chart. It is noted that the waveform chart terminal icon changes. To add more plots, the number of Bundle function input terminals are increased by resizing the Bundle function using the Positioning tool.

Attribute Nodes of the Present Invention

To summarize, in creating a virtual instrument, a user first creates a front panel including various controls or indicators that represent the respective input and output that will be used by the VI. When the controls and indicators are created in the front panel, corresponding icons are automatically created in the block diagram by the block diagram editor. The user then chooses various functions, etc. that accomplish his desired result, connecting these function icons between the terminals of the respective control icons and indicator icons. In other words, the user creates a block diagram representing the graphical data flow program which accomplishes his desired function. This is done by wiring up various functions between the control icons and indicator icons. The manipulation and organization of icons in turn produces machine language code that accomplishes the desired method or process as shown in the block diagram. A user then optionally chooses a connector pane representing the input and output terminals corresponding to the respective controls and indicators already created.

Once the controls and indicators have been placed on the front panel and once a connector pane has been selected, a user then associates respective terminals on the connector pane to the respective controls and indicators. For example, if a connector pane having three terminals has been selected, and two controls and one indicator are created on the front panel, the user selects which respective terminal on the connector pane corresponds to each respective control on the front panel and then associates the final terminal on the connector pane to the remaining indicator.

A user adjusts the input to the virtual instrument by changing data input using the controls. This input data from the user propagates through the data flow block diagram or graphical program and appears as changes on the indicators. The data that flows from the controls to the indicators in this manner is referred to as control data.

Controls can be of varying types including numeric, boolean, or string. A control can also be a cluster or array of the above types. For a numeric type control, the control data input or output from the control comprises a numeric type, i.e., a number. For a boolean type control, the control data input or output from the control comprises a boolean value, i.e., true or false. For a string type control the control data input or output from the control comprises a text string. In the following description, controls and indicators are referred to collectively as controls.

As discussed in the Background section, it would be highly desirable for the system and method described in Kodosky et al. to allow a block diagram to programmatically access various parameters of a control or indicator. It would be desirable to provide access to these parameters to the user during execution and also programmatically from the block diagram. In other words, it would be highly desirable for a block diagram to be able to both read various parameters from a control and write to the respective parameters of the control, it being further desirable that a user be allowed to write data to the parameters of a control which can then be read by the block diagram to allow the user to more fully interact with a block diagram.

In the preferred embodiment of the invention, a system and method is provided which allows a user to programmatically access various parameters of a control. In this manner, a user can programmatically make changes that affect the output or appearance of controls. A user can also access these parameters interactively during execution of a block diagram. In the preferred embodiment of the invention, a user can create an object referred to as an attribute node containing one or more attributes corresponding to controls that affect a parameter or attribute of the control, such as the color used for the respective display, the visibility of the control, the scales or cursor position for respective graphs or charts, etc. The parameters of a control on the front panel which can be accessed by the user or programmatically accessed by a block diagram according to the present invention are referred to as attributes.

An attribute of a control can be defined as affecting or regarding the appearance of the control. Thus an attribute is different from control data passed to or from a control which is strictly limited to the data type of the control and is not associated with the appearance of the control. An analogy can be drawn to a clock. With regard to a clock, the control data output from the clock is the time. Various attributes of the clock include the numbering style used for the hours, i.e., Roman numerals or Arabic numerals. Other attributes would be the size and color of the hands of the clock, the background color, the size of the face, etc.

An attribute node is associated with a control on the front panel and operates to provide a more meaningful visual output to the user. One purpose of an attribute node is to affect the visual output of a control provided on the front panel depending on events which occur during execution of a VI or on user input during execution of a VI. Another purpose of an attribute node is to allow the execution subsystem to monitor user interaction by reading attribute data that previously was not available to the program. In the following description, the front panel can include one or more data sources (controls) and one or more data sinks (indicators). An attribute node operates on panel display elements regardless of whether the data flow happens to be from a data source or a data sink. Also, as discussed above, the term control is used herein to refer to both controls and indicators.

An attribute node allows two types of operations, these being reading an attribute node or writing to an attribute node. These operations of reading and writing an attribute can be performed either by a block diagram during execution, wherein the user has programmed the block diagram to perform this function, or interactively by the user that can be read by a block diagram during execution. The process of writing to an attribute node refers to the execution subsystem updating an attribute of a control on the front panel display to reflect an attribute that has been set programmatically in a block diagram. The user can also "write" to an attribute by providing input to a control in the front panel during execution of a block diagram. Reading an attribute node refers to the execution subsystem reading the value of an attribute for a certain control during block diagram execution that may have been changed by the user, or may have been changed during execution of a VI. Reading an attribute also refers to the user viewing changes to the attribute during execution. Some attributes can be changed by a user and practically all can be changed by the execution subsystem. Therefore, during execution of a VI, the process of writing to an attribute node corresponds to changing the front panel display and thus affecting what the user actually sees. The step of reading an attribute node does not actively change the front panel, but allows the program to see how the user is changing the front panel. Knowing this, the program can make further decisions, thus greatly increasing the flexibility of a VI.

As previously noted, an attribute is defined as a parameter of a control other than conventional control data which primarily affects the appearance of the control. In the preferred embodiment, attribute data is comprised in a data structure separate and apart from control data. Therefore, one way to distinguish control data from attribute data is that control data passes through terminals on a block diagram using the connector pane. However, it is also noted that a different embodiment of the present invention can include a single data structure type wherein data that propagates through the connector pane and data that is used to affect attributes on controls are incorporated into one single data type. However, this is not deemed to be as useful or user friendly due to the fact that any one change to one element of this data set would require the block diagram editor to read all elements, replace that element, and then update the entire data type, all in one piece. In addition, a data type so created would be large and unwieldy, and thus it would be difficult for a user to manipulate and understand properly. Therefore, in the preferred embodiment of the invention, control data resides in a data structure separate from attribute data.

One novel feature of the present invention is that an attribute node can include within it a plurality of different attributes some of which are to be read and some of which are to be written. In other words, an attribute node can include one or more attributes which are read in order for the program to determine how the user is influencing the program as well as attributes which are written, i.e. attributes that change the behavior or appearance of controls and indicators on the front panel. In addition, the same attribute within an attribute node can be both read and written. This provides a great amount of flexibility in allowing the user to provide a more meaningful visual interaction with the front panel. Another novel feature is that each attribute node containing a plurality of attributes will sequence through the node from top to bottom and the attributes in the node are chosen from a menu allowing them to be arranged in any order. This provides a convenient means for sequencing through the attributes in a user specified order without requiring the sequencing structure. This greatly simplifies the creation of attribute nodes in a VI and simplifies sequencing through the reading and writing of attributes within a node. In a data flow language, sequencing can be cumbersome. If respective nodes are not connected together by a data line, it cannot be determined from data flow as to which node should be executed first. Various structures illustrated in FIG. 12A–D allow sequencing of instructions without the necessity of having these connected by a data line. Along this line, an attribute node can have a plurality of attributes which are inherently ordered such that they are executed according to the user's desire, thus providing greatly simplified use of attributes and hence greatly simplified visual control of the front panel. Therefore, the attribute node also serves the purpose of ordering attributes within the node so that they can be executed as desired by the user.

Creating Attribute Nodes

Figure 115:
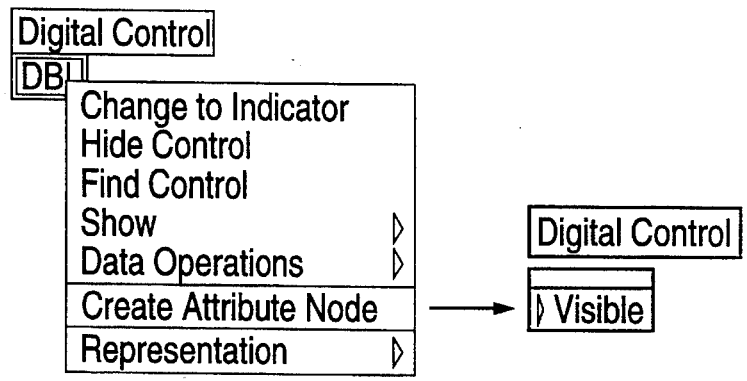
FIG. 115 illustrates creating an attribute node by selecting the create attribute node option from a pop up menu on the control terminal.

As shown in FIG. 115, the user creates an Attribute Node by selecting the Create Attribute Node option from the pop-up menu of a front panel control or the control's terminal on the diagram. Selecting this option creates a new node on the diagram located near the terminal for the control, as shown.

If the control has a label associated with it, the control's label is used for the initial label of the Attribute Node. The user can change the label after the node has been created. In an alternate embodiment, the label on the attribute node is always the same as the control's label.

When a user creates an attribute node having one or more attributes, the block diagram editor automatically creates a data type to associate with that attribute. For example, if a user was selecting an attribute affecting the color of a control or indicator, the block diagram editor creates a numeric data type used to store that color. If a user had selected the cursor position attribute, the block diagram editor would create a numeric cluster having two or three elements depending on whether the cursor position is two or three dimensional. This is done transparent to the user.

Figure 116:
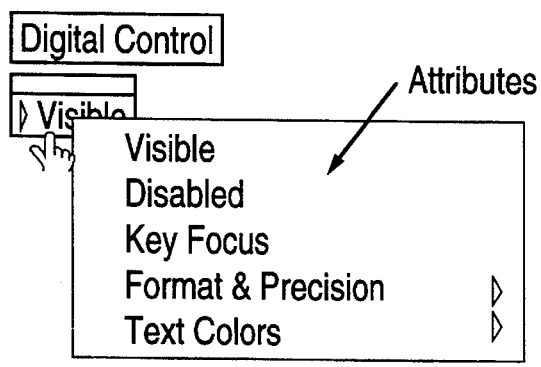
FIG. 116 illustrates the available attributes from the pop up menu of an attribute node.

If the user clicks on an attribute terminal, the user gets a menu of options which he can write to or read from the control, as shown in the FIG. 116. The user can also display this menu by popping up on the terminal and choosing Select Item.

Figure 117:
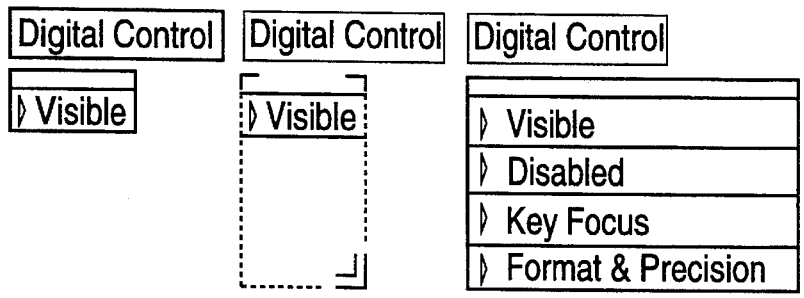
FIG. 117 illustrates enlarging an attribute node to read or set more than one attribute within the node.
Figure 118:
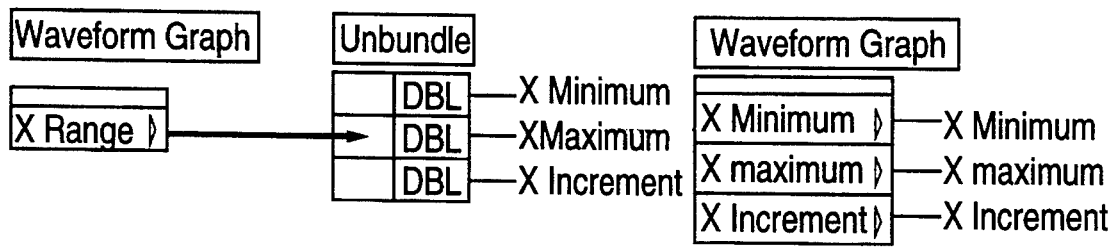
FIG. 118 illustrates an attribute node bundled into categories which can be unbundled or accessed as one unit.

Referring now to FIG. 117, the user can read or set more than one attribute with the same node by enlarging the Attribute Node. Using the Positioning Tool, the user clicks on the lower corner of the attribute node and drags the corner down to enlarge the node. As the node is enlarged, new terminals are added. The user associates a terminal with a given attribute by clicking with the operating tool on the terminal and selecting an attribute from the Attribute Node pop-up menu. With this procedure, the user customizes the attribute node to allow access to only those attributes wanted. Certain options on attribute nodes are bundled into categories. These categories contain multiple attributes that the user can unbundle using the Unbundle function (Array & Cluster menu) or access as one unit, as illustrated in FIG. 118.

Attribute nodes can set and read attributes for front panel objects. Referring now to FIG. 119, the user sets whether an attribute node reads or sets an attribute by selecting either the Change To Read or Change To Write option from the attribute node pop-up menu. Newly created attribute nodes default to a write attribute state. The user can set an attribute when the direction arrow is located on the left side of the node, pointing into the node. If the user changes the node to read an attribute, the arrow is located on the right side, pointing out of the node. For example, the Disabled attribute provides programmatic control of user access to front panel controls. FIG. 120 illustrates how to disable and gray out a control using the Disabled attribute. To disable the control, the user wires a 2 to the attribute node and to enable the control, the user wires a 0 to the attribute.

In the case of multiple-terminal attribute nodes, the user can configure each terminal to set or read its attribute. The user can pop up on each terminal and select either Change To Read or Change To Write. This method is used to create attribute nodes with a mixture of read and write terminals as shown in FIG. 121. In addition, the user configures all terminals in an attribute node to set or read attributes by selecting Change All To Write or Change All To Read from the pop-up menu.

A user can create multiple attribute nodes for each front panel control which allows access to the attributes for a control in multiple locations in the block diagram. The user can also create an additional attribute node by cloning an existing node, or using the Create Attribute Node option again.

By popping up on an attribute node and selecting Find, the user locates the front panel control, its terminal, or other attribute nodes. If the user pops up on a control with an associated attribute node, the Attribute Nodes option appears in the Find menu. If the user selects this option, all attribute nodes associated with the control are highlighted. If nodes exist in frames that are not displayed, such as nodes present in different frames of a structure, they are displayed as a highlighted outline, as shown in FIG. 122.

Figure 123:
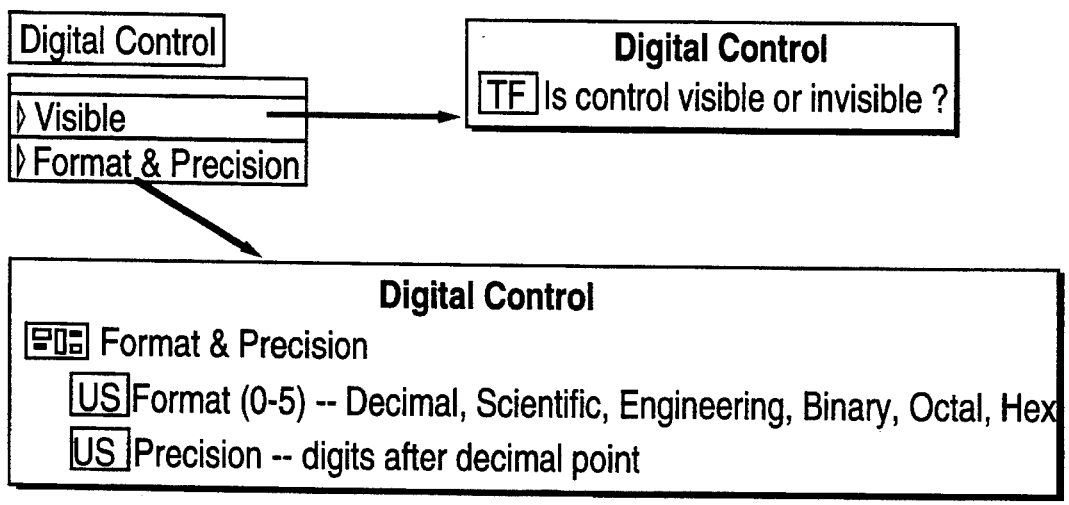
FIG. 123 illustrates using the Help window to find information on the meaning of an attribute.

If the user does not know the meaning of a given attribute, he can use the Help Window to find information on the attribute meaning, its data type, and acceptable values. If the attribute is a more complicated type, such as a cluster, then the Help Window displays a hierarchical description of the data structure. With the Help Window active, the cursor is passed over terminals in the attribute node to display information. FIG. 123 shows Help for both a single attribute and a cluster of multiple attributes.

Figure 124:
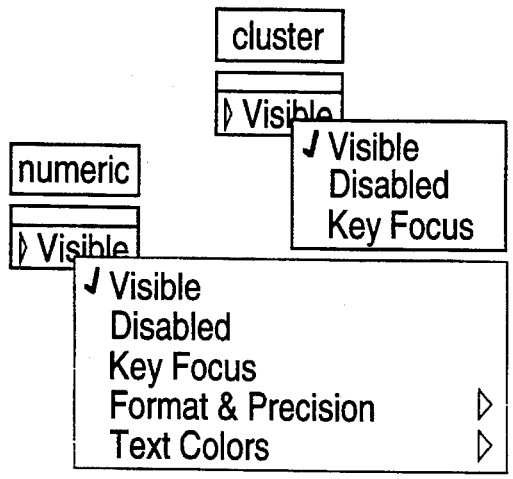
FIG. 124 illustrates possible attributes for numeric and cluster data types.

The user can create Attribute Nodes for any control on a front panel. The user can create Attribute Nodes for any of the controls in a cluster and for the control of an array by selecting Create Attribute Node from the subcontrol pop-up menu. The attributes for a cluster and for a numeric control inside the cluster are shown in FIG. 124.

Figure 125:
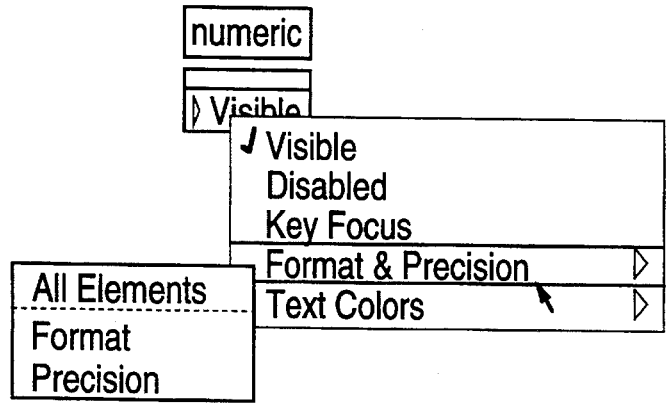
FIG. 125 illustrates the format and precision attribute options for a numeric data type.

Some controls, such as the graph, have a large number of attributes the user can read or set. Some of these attributes are grouped into categories, listed in submenus, such as the Format and Precision category for a numeric. The user can choose to set all of the attributes at once by selecting the All Elements option of the menu. The user can also set one or more of the elements individually by selecting the specific attribute(s). The Format and Precision option on a numeric control is shown in FIG. 125.

Figure 126:
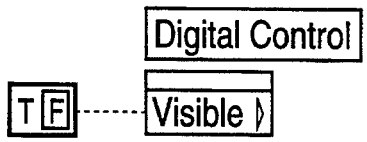
Figure 127:
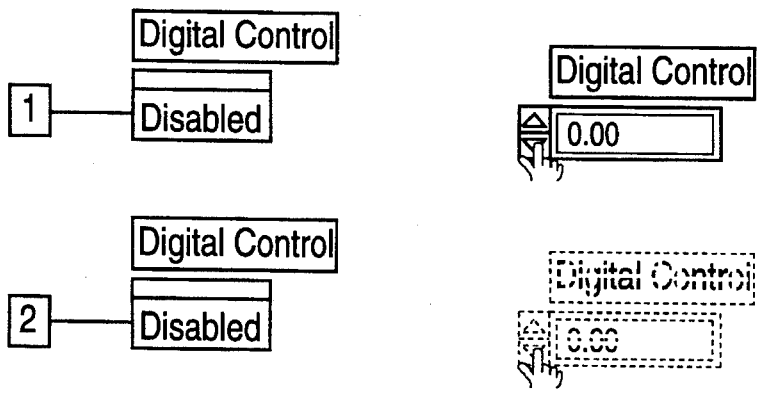
Figure 128:
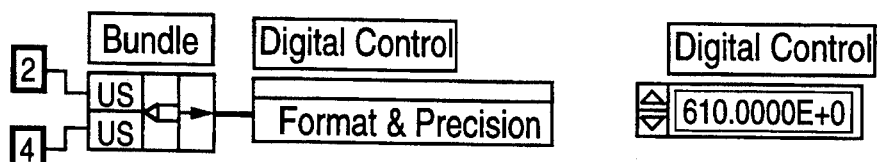

FIGS. 126–128 illustrate a few common attributes for digital controls and the wiring of each attribute. Referring now to FIG. 126, the Visible Attribute sets or reads the visibility status of a control or indicator. The control is visible when True, hidden when False. The wiring example of FIG. 126 sets the Digital Control to an invisible state. A Boolean True value makes the control visible.

Referring now to FIG. 127, the Disabled Attribute sets or reads the user access status of a control. A value of 0 enables the control so the user can access it. A value of 1 disables the control, preventing access. A value of 2 disables and grays out the control. In the upper wiring example of FIG. 127 a 1 value is provided to the node. This disables user access to the Digital Control. However, the control will not change appearance when it is disabled as shown. In the lower wiring example of FIG. 127, a 2 value is provided to the node. This disables user access to the Digital Control, and the control appears grayed out when in this state.

Referring now to FIG. 128, the Format and Precision Attribute sets or reads the format and precision attributes for the numeric control. The input is a cluster of two integers: one for format and one for precision. Format and Precision attributes can be addressed individually. The wiring example of FIG. 128 sets the format of the Digital Control to Engineering and the digits after the decimal point to 4.

Common attributes for Booleans are illustrated in FIGS. 129 and 130. Examples of the wiring of each attribute are also shown. It is also noted that the visible and disabled attributes are common for most controls and are covered in the previous Digital Control section. Referring now to FIG. 129, the Strings[4] Attribute sets or reads the labels on a Boolean control. The input is an array of four strings that correspond to the False, True, True Tracking, and False Tracking states. True and False are on and off states of the Boolean. True Tracking and False Tracking states are temporary transition levels between the Boolean states. True Tracking is the transition state when the Boolean is changed from True to False. The wiring example of FIG. 129 sets the display strings for the Labelled Button to the string choices Stop, Run, Stop? and Run?.

Referring now to FIG. 130, the Colors[4] Attribute sets or reads the colors for foreground and background colors in each Boolean mode. The input comprises an array of four clusters where each cluster contains two integers representing color. The wiring example of FIG. 130 sets the display colors for the Labelled Button to the color choices. The selection shown would display black on white for each Boolean mode.

Execution of the Attribute Node

Figure 131:
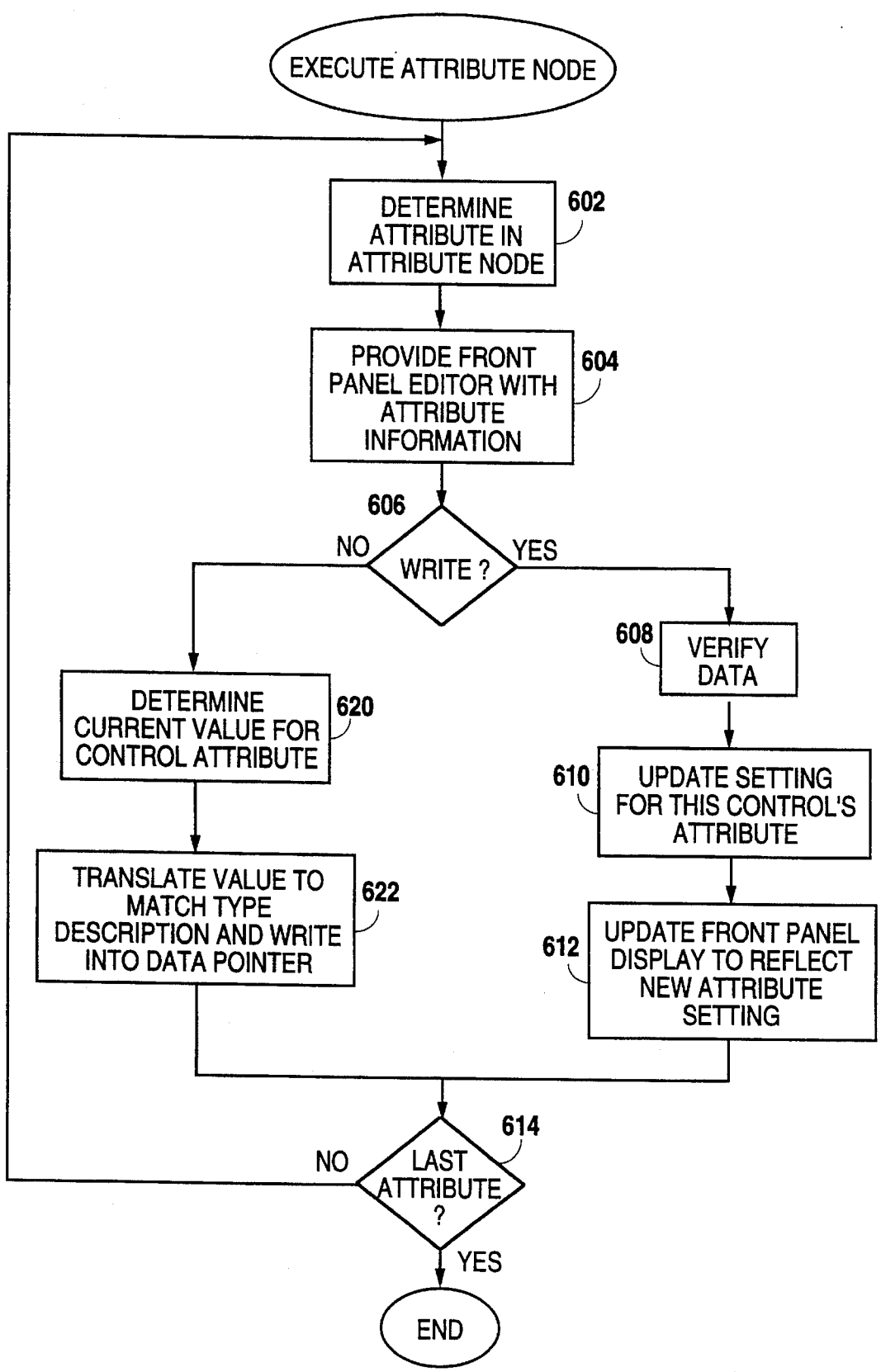

Referring now to FIG. 131, a flowchart diagram illustrating a method which is performed by the execution subsystem to execute an attribute node is shown. As previously discussed, an attribute node can be categorized as a simple node, and its node specific functions are executed as shown in FIG. 9F. The flowchart in FIG. 131 illustrates the Perform Function step (step 398) when the simple node being executed is an attribute node. In step 602 the execution subsystem determines or locates an attribute in the attribute node. When an attribute node is first executed, this will be the first attribute within the node, and if the attribute node includes a plurality of attributes, subsequent executions of this step will index down the attributes in the node in sequence. In step 604 the execution subsystem provides the front panel editor with attribute information for the respective attribute being executed. This attribute information comprises a type descriptor pointer, a read/write flag, index, and a data pointer. The data pointer points to a location in memory which corresponds to a data line path which stores the attribute and which is read from and written to when executing the attribute. The respective data line will either provide data corresponding to the attribute to this location, or will read this location to obtain the data corresponding to this attribute. The type descriptor refers to the data type of the attribute. The type descriptor is a grammar describing a data type used in the method of the present invention. The index refers to the unique number assigned to a respective attribute. In other words, every attribute comprised in the present invention includes a unique index number. The read/write information corresponds to whether the attribute is being read or written.

In step 606, the execution subsystem determines if the attribute is being read or written. If the attribute is determined to be written in step 606, then in step 608, the execution subsystem verifies the data obtained corresponding to the attribute. The step of verifying data in step 608 essentially means that the computer program is potentially adjusting the information received or provided to the front panel in step 604 in order to ensure that the data type corresponds to what the user has indicated.

The purpose of verifying the data is to allow the user to provide the data in various formats, rather than forcing the user to provide the data in one specific format. This makes changing attributes much easier because the user is not required to conform to a certain data type, but rather, for example, could use INT, FLOAT, BYTE, LONG, etc. at any point where a numeric data type is called for. Once the verification process has been performed in step 608, then in step 610, the execution subsystem changes the attribute for the respective control or indicator to its new value. Each control or indicator has associated storage with it for the purposes of attributes. Step 610 operates to change data in this storage inherently and may also in all probability change the visual output associated with that control or indicator. In step 612 the execution subsystem updates the front panel display to reflect the new attribute setting. This provides, as previously discussed, a more meaningful visual output to the user. Upon completion of step 612 the execution subsystem advances to step 614 and determines whether this is the last attribute in the attribute node. If so, then the execution subsystem has completed executing this attribute node. If not, the execution subsystem returns to step 602 and determines the next attribute in the attribute node.

Referring again to step 606, if a read is determined to have occurred in step 606, then the execution subsystem advances to step 620. In step 620 the execution subsystem determines the current value or setting for the control's or indicator's attribute. This essentially involves reading the attribute from the memory location where the attribute is stored. For example, when the attribute is updated in step 610, this location is rewritten to reflect the new attribute setting. Likewise step 620 involves reading the attribute for the specified control or indicator. In step 622 the execution subsystem translates the value or setting to match the type descriptor. As previously discussed with regard to step 608, the translation step in 622 allows an attribute to be stored in memory, but is not required to conform to specific data type. Rather, for example, if the data is numeric, the attribute data can be stored as either INT, FLOAT, BYTE, etc. Step 622 can essentially be considered the counterpart to verifying the data in step 608. In step 608, the verifying data step essentially involves insuring that the data type of the attribute conforms to what the front panel control requires. In contrast, in step 622, this verify or translation step involves translating the attribute to conform to the data type that the block diagram editor required. This attribute is then used by the block diagram editor during execution of the VI as programmed by the user. Upon completion of step 622, the execution subsystem advances to step 614 and determines if this is the last attribute. If not, the execution subsystem returns to step 602 as previously described. If this is determined to be the last attribute in the node, then operation completes.

EXAMPLES

Figure 132:
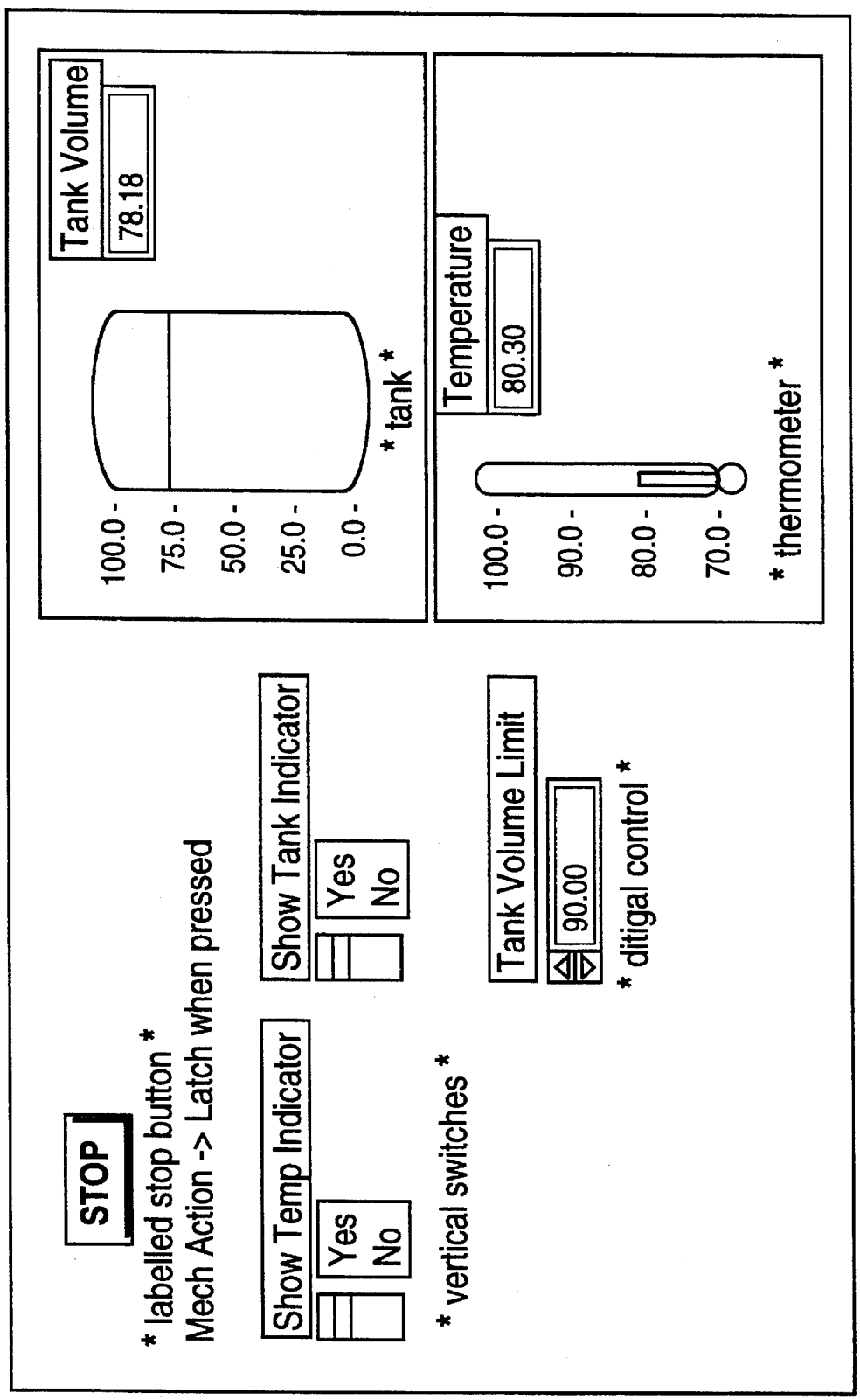

Referring now to FIGS. 132–133, a VI that simulates a process monitor system is shown. This VI programmatically hides either the temperature indicators or the volume indicators based on user input. The VI also sets the color of the tank level depending on its value. FIG. 132 illustrates the front panel of the VI, and FIG. 133 illustrates the block diagram.

Referring now to FIG. 132, the front panel includes two vertical switches referred to as show temp indicator and show tank indicator. The front panel also includes a digital controller referred to as tank volume limit and a stop button. Also, the front panel includes a tank volume indicator display illustrating the volume of a tank and a temperature gauge displayed as a thermometer. Referring now to FIG. 133, the show temp indicator control is connected to a Visible attribute associated with the temperature indicator. The show tank indicator switch is connected to a Visible attribute (FIG. 134A) corresponding to the tank volume indicator. The block diagram includes a process monitor VI that reads values referred to as tank level or volume and temperature and returns an output. The process monitor VI is connected to a temperature icon corresponding to the temperature indicator, a tank volume icon corresponding to the tank volume indicator and one input of a Greater? function (FIG. 134E). The tank volume limit control is the other input of the Greater? function. The output of the Greater? function is connected to one input of a select function (FIG. 134F). The other two inputs of the select function receive values from a color box constant (red) and a color box constant (blue). The color box constant is illustrated in FIG. 134G. The output of the select function is provided to a fill color attribute associated with the tank volume indicator. The block diagram also includes a Wait Until Next ms Multiple function (FIG. 134D). The above logic is contained within a while loop, wherein a stop icon corresponding to the stop button on the front panel is connected to a not function (FIG. 134H) and is connected to the while loop. Thus the while loop executes repeatedly until the stop button is pressed.

To create the attribute node "Visible" (FIG. 134A), the user pops up on the Tank Volume terminal and selects Create Attribute Node from the menu. A default attribute node will appear in the block diagram with the label "Tank Volume." This is repeated for the Temperature terminal.

To create the attribute node "Fill Color" (FIG. 134B), the user pops up on the Tank Volume terminal and selects Create Attribute Node. The user then pops up on the newly created node and selects Fill Color from the Select Item menu. The Process Monitor VI (FIG. 134C), simulates the operation of a VI monitoring a process over time. It returns one point for each of two waveforms—tank level and temperature. The VI requires a scalar index input. The Wait Until Next ms Multiple (FIG. 134D) function (Dialog and Date/Time menu) dictates that each loop iteration occurs every 500 ms. The Greater? Function (FIG. 134E) (Comparison menu), returns TRUE if the value is over range; otherwise, the function returns FALSE. The Select function (FIG. 134F) (Comparison menu) selects the red color if the tank volume is greater than the set limit; otherwise, it selects the blue color. The Color Box Constant (FIG. 134G) (Structs & Constants menu), allows the user to set the box color by popping up on the box with the Coloring tool. The Not function (FIG. 134H) (Arithmetic menu) inverts the value of the STOP button; thus, the While Loop executes repeatedly until the user clicks on the button.

When the VI is run, the user can set the visibility of the tank and thermometer indicators using the vertical switches. If the user enters a value of 90 inside the Tank Volume Limit control, the tank level color changes when the tank level exceeds the limit input of 90.

Graph Attribute Nodes

Referring now to FIG. 135, attribute nodes greatly enhance the programmatic flexibility of graphs and charts. Graphs and charts possess a full set of features, most of which the user can control with attribute nodes. Graph attributes include plot color, X and Y scale information, visibility of the legend and palette, and cursors, among others.

One major option in a graph attribute is the scale information. With attribute nodes, the user can set or read the scale information for both the X and Y scales. For each axis, the VI can read or set the minimum value, maximum value, and the range values, making the graph plot settings fully configurable.

Also in graphs and charts, with attribute nodes the user can programmatically read or set the plot colors, the background, and the grids. Therefore, the user can set plot colors or background color depending on program conditions such as out-of-range values or error conditions.

Finally, with attribute nodes, the user has full use of the cursors provided on graphs. Graph cursors appear as graphical plot selectors, typically with whiskers drawn top to bottom and left to right. The user employs cursors to move a graphic selector on the plot surface. A cursor can be locked to the plot or may move freely on the plotting surface. Values from each cursor are returned to a digital readout on the front panel. Attribute nodes present a means to set or read cursor position on the graph, allowing user input from the cursors to be used in the VI.

A few common attributes for the waveform graph are shown in FIGS. 136–138, along with the wiring of each attribute. Referring now to FIG. 136, the X (or Y) Range Attribute sets or reads the range and increment for the graph axis. The attribute accepts a cluster of three integers: X axis minimum value, X axis maximum value, and increment between the X axis markers. The wiring example of FIG. 136 sets the X axis and corresponding plot area to a range of 0 to 100 with axis increments of 10.

Referring now to FIG. 137, the Active Cursor and Cursor Position Attributes, in combination, select or read both the active cursor and the position of that cursor. The active cursor attribute accepts an integer corresponding to the desired cursor. Cursor position comprises a cluster of two floating-point numbers representing the X and Y positions on the plot. The wiring example of FIG. 137 places the cursor 1 at position (55.5, 34.8). When choosing the cursor, the Active Cursor terminal must precede the Cursor Position terminal.

Referring now to FIG. 138, the Active Plot and Plot Color Attributes, in combination, set or read the plot color for the active plot selected. Active Plot is an integer corresponding to the desired plot and Plot Color is an integer representing a color. The wiring example of FIG. 138 sets the color of the active plot selected. The color corresponds to the choice made in the Color Box Constant. If a user is choosing the active plot, the Active Plot terminal must precede the Plot Color Terminal.

Cursor Position Example

Referring now to FIGS. 139–140, a front panel and block diagram of a VI is shown which uses Active Cursor Position attributes. The attributes described below allow a user to input two points on a waveform using left and right cursors, and these points are used to find the center point of the area under the signal waveform between these two points, referred to as the centroid. The front panel includes a Waveform Graph as well as left, right, and centroid cursor readouts. The left and right cursors are lines on the graph on the front panel (FIG. 139) which include the circle and darkened square, as shown. The centroid is illustrated by a line including an X located at the point between the left and right cursor lines which is the middle point with respect to the area under the graph. The attribute described below reads the position of the left and right cursors as they are moved by a user during execution of the VI. This attribute node passes this data to a subVI which finds the centroid or the center point of area between the left and right cursors.

The block diagram illustrated in FIG. 140 includes an icon referred to as GetSignal which acquires the signal data. The data received by the GetSignal icon is first provided to the "Waveform Graph" icon and hence is displayed into the graph on the front panel (FIG. 139). At this point the user can read the left and right cursor positions using the "Read Positions" attribute node. The left cursor position is read by setting the active cursor to the left cursor and reading the cursor position. The active cursor is then set to the right cursor, and the value of that cursor is read. Those two inputs along with the signal are passed into the centroid VI. The output of the centroid VI is another cursor position that is provided to a "Write Position" attribute node. In this attribute node, the active cursor is set to the centroid cursor and the execution subsystem places that cursor at the value specified by centroid VI.

The order of execution of the "Read Positions" attribute node is as follows: left cursor becomes active cursor, determine active cursor position, right cursor becomes active cursor, and determine active cursor position. Thus the attribute node at the left of the diagram is executed from top to bottom whereby the left cursor is deemed the active cursor and its position is found and then the right cursor is deemed active and its position is then found. This information is then passed to a VI which finds the centroid between those two cursor positions, and the output is written onto the front panel using the Write Position Attribute.

The example described above utilizes an attribute which enables a block diagram program to read the location where a user has positioned a cursor on the screen. A user could position cursors in prior art embodiments, but the user could not program the block diagram to read their position or set their position. In other words, the program could not use the cursor position to influence the execution of a VI, and a cursor would not appear on the screen showing the user a point of interest. Therefore, the cursor position attribute node according to the present invention allows the program to read as input the user's movement of the cursor and to set a cursor to indicate points of interest on the plot.

In the cursor position example described above, the waveform graph in the front panel includes a connector pane with one input and one output. The input terminal corresponds to the waveform signal received and the output corresponding to the centroid produced. The cursor position attribute allows a user to select two points on the waveform, which are then provided as input to the centroid sub-VI which computes the centroid based on those two points. The centroid VI then outputs this one piece of data representing the centroid of the signal between the two points selected by the user, which is then output on the front panel. Therefore, in the example described above, the waveform graph essentially acts as a data sink with regard to the GetSignal function in that the GetSignal function provides a waveform to the waveform graph. The waveform graph indicator also acts as a data source for the centroid function in that the cursor position attributes are used to select points from the signal on the waveform graph which are then provided to the centroid. In this manner, attribute nodes enable a user to blur the distinction between controls and indicators as data sources and data sinks.

Attributes enable a user to define other meaningful data values for the indicators and controls some of which change the appearance or the form of the control. These include attributes such as color, size, etc. Others provide additional meaningful interaction with the user, such as reading or writing to a cursor position. Attribute values are not bundled with the control data, that being the data passed to the control panel through the connector pane because that would make the data types too complex to deal with, therefore, the attribute data values from an attribute node are manipulated separately from the control data.

Programmatic Zooming Example

Referring now to FIGS. 141, 142, and 142A–D, a VI that uses attribute nodes to control graph cursors is shown. This VI uses attribute nodes to provide programmatic zooming for a graph and uses the cursor attributes and graph scale attributes to allow selection of a zoom area. As shown, the front panel includes a number of points control, a waveform graph, its graph palette, and its cursor display for cursor 0 and cursor 1. The front panel also includes zoom in, zoom out, and stop buttons. Referring now to FIG. 142, the block diagram of the VI is shown. As shown, the block diagram includes a large while loop. A sequence structure having frames 0 and 1 is located at the bottom left hand portion of the block diagram. A for loop is situated above the sequence structure loop, as shown. Frame 0 of the sequence structure is illustrated in FIG. 142 C. The large while loop includes a first case structure displaying its true case in FIG. 142 (False case is shown in FIG. 142A), and a second case structure is comprised with the first case structure in the true case. The second case shows its true case in FIG. 142 and its false case in FIG. 142B. Frame 1 of the sequence structure illustrated in FIG. 142 uses a graph attribute node including active cursor and cursor position attributes to read the X and Y access values from the graph and set the cursor locations accordingly. Frame 1 of the sequence structure provides an output to the input of the while loop as shown, thus creating an artificial data dependency. The for loop includes a sine wave generation icon and is used to create a waveform that is provided to the graph on the front panel, as shown. In the upper left portion of the block diagram, a bundle function is used receiving an array of 0 values that is used to create a shell of a cluster. The output of the bundle function is provided to an initialize array icon which initializes an array. The output of the initialize array icon is provided to a shift register associated with a while loop. The output of the shift register is provided to an array size icon that indicates the size of the array. The output of this icon is in turn provided to a >0 comparator which is in turn provided to one input of an AND gate whose output is provided to one input of an OR gate. A zoom out icon corresponding to the zoom out control on the front panel provides the other input to the AND gate. The zoom in icon corresponding to the zoom in control on the front panel is provided to the other input of the OR gate. The output of the shift register is provided through the outer case structure, as shown. It is also provided to the inner case structure. The output of the OR gate is provided to the selector input of the case structure and determines whether the outer case structure is true or false. When the outer case structure is true, then the zoom feature is activated. The output of the zero comparator is also provided to the outer case structure and is used during the false case. Likewise, the output of the zoom in icon is provided to the outer case structure and is used during the false case. This output is also provided to the inner case structure which is used as a selector for the inner case structure. The output of the shift register is provided through the first case structure through the second, inner case structure and is provided to a split 1D array in the false frame (FIG. 142B). The split 1D array includes two inputs. The top input being the actual array, and the bottom input, which receives a 1, being the index where the array is split. The output of this function is two, separate, one dimensional arrays, as shown. The first element in the array is the most recent zoom. Therefore, the split 1D array function . . . each element in the array contains a cluster of all the range information. Element 0 is the newest or closest in zoom. The 0 element is provided to an index array function. The index array function receives a 0 and thus selects a new top element of the array, this being element 0. The output of the index array function is provided to an unbundle function which in turn provides its outputs to X minimum, X maximum, Y minimum, and Y maximum attributes, as shown. This graph attribute node also includes active cursor and cursor position attributes, as shown. The right-most graph attribute node within the outer case structure is used to set the new cursor and axis position. A second graph attribute node on the left side of the outer case structure includes Xmin, Xmax, Ymin, Ymax, and active cursor and cursor positions used to read the current cursor and access values. This attribute node reads the current cursor and access values using a bundle function connected to the inner case structure, as shown. The attribute nodes in the block diagram illustrated in FIG. 142 can be used to read and set cursor position and graph the axis range. Attribute nodes are employed in several other sections of the block diagram to read or change the front panel objects programmatically. Examples of attribute node use include changing the graph axis and disabling the Zoom Out button. It is noted that multiple attribute nodes are used for a single front panel object, allowing access to an object's attributes more than once in a block diagram.

Graph Cursor and Plot Colors

Referring now to FIGS. 143–147, a VI example is shown which uses attribute nodes with graph cursors and plot colors. The VI allows the user to move the cursor along the graph using the cursor control. When the cursor is moved to the maximum plot point, the plot changes color. As shown in FIG. 143, the front panel includes a waveform graph, a cursor display, and a labeled stop button. Referring now to FIG. 147, the block diagram includes a sequence structure having two frames, referred to as 0 and 1. The 1 frame in turn includes a while loop, which itself comprises a case or conditional structure having true and false frames as shown. Frame 0 of the sequence structure includes an X range attribute associated with the waveform graph. This attribute is provided to an unbundle function, as shown, which is then provided to logic which finds the X axis midpoint. Once the X axis midpoint is found, this logic is provided to a round to nearest function, which in turn is provided to an active cursor and cursor index attributes associated with the waveform graph that set the cursor to the X axis midpoint. Frame 1 of the sequence structure includes a for loop including a process monitor icon that returns one point of simulated pressure waveform. The output of the process monitor is provided to the waveform graph icon and hence to the waveform graph on the front panel. It is also provided as an input to the while loop, as shown. The output is provided to an array max and min icon which is in turn provided to an equal function. The cursor Y attribute associated with the waveform graph is provided to the other input of the equal function, as shown. The output of the equal function is provided to the select of the case structure, wherein if the two values are equal, the true case is selected, and if the values are not equal, the false value is selected. The array max and min function returns the maximum point in the waveform and is compared with the cursor Y attribute. The true frame of the case structure includes a green color box constant provided to a plot color attribute of the waveform graph. Thus, if the Y cursor is at the maximum point in the waveform, the plot color is selected to be green. As shown in the false frame of the case structure, if the Y cursor is not at the maximum point in the waveform, the white color box constant is provided to the plot color attribute and thus the output of the waveform graph is white. To enable the cursor, the user pops up on the graph and selects ShowCursor Display. This places the cursor palette shown in FIG. 144 on the front panel. The user can define the number of cursors by stretching the cursor box. This example uses one cursor and thus the selection tool is used on the corner of the cursor display to eliminate one of the cursor displays as shown in FIG. 145. The user activates the cursor by clicking on the Select Button as shown in FIG. 146. It is noted that the cursor appears in the graph window at the coordinates shown in the cursor display. A cursor can move freely or be locked to the plot. The user controls this action using the Lock Control button at the far right side of the cursor display.

Building the block diagram shown in FIG. 147 requires the following steps. To create the attribute nodes, the user pops up on the Waveform Graph terminal and chooses Create Attribute Node from the pop-up menu. The user can then select the attribute by popping up on the newly created node and choosing the attribute from the Select Item menu. The menu tree for the different nodes is shown in FIG. 148.

The Process Monitor VI (FIG. 149A) (Advanced Course menu) returns one point of a simulated pressure waveform. The VI requires a scalar index input.

The Unbundle function (FIG. 149B) (Array and Cluster menu) unbundles the X scale range cluster into its individual elements—minimum axis value, maximum axis value, and increment between markers. The DBL labels appear when the Unbundle function is connected to the cluster. The Add function (FIG. 149C) (Arithmetic menu) adds the X scale maximum and minimum values. The Divide function (FIG. 149D) (Arithmetic menu) divides the sum of the X scale maximum and minimum by two to find the average. The Round to Nearest function (FIG. 149E) (Arithmetic menu), rounds the midpoint to the nearest whole number. The Array Max & Min function (FIG. 149F) (Array and Cluster menu) returns the maximum point in the waveform. This value is for comparison with the Cursor Y attribute. The Equal? function (FIG. 149G) (Comparison menu) compares the Y cursor position with the plot maximum. The Color Box Constant (FIG. 149H) (Structs & Constants menu) provides a constant value for the color selected in the box. To choose a color, the user pops up on the constant with the Coloring tool. When the VI is run, the user can move the cursor along the graph using the cursor control. When the user moves the cursor to the maximum plot point, the plot changes color.

Plot Color Attributes

Referring now to FIGS. 150A and 150B, the front panel and block diagram of a VI that manipulates plot color attributes is shown. The front panel includes a waveform chart and a data overlimit line as well as a stop button. The block diagram includes a large while loop, as shown. The I or index of the while loop is provided to a process monitor VI as shown whose output is provided to a 1 input of a 2 input bundle function. The other input receives a constant 0.5. The output of the bundle function is provided to the waveform chart icon which corresponds to the waveform chart of the front panel. The output of the process monitor VI and the 0.5 constant are also provided to a Greater? function which in turn is provided to the select input of a selector. Two color box constants are provided to the true and false inputs of the select function and the output of the select function is provided to a plot color attribute associated with the waveform chart. This VI uses an attribute node to change a limit plot if the trace exceeds the limit. The "Over Limit" line turns red whenever the trace exceeds the limit value of 0.5. When the trace falls below the limit, the limit line returns to its green default state. As shown Color Constants are used on the block diagram to provide the selected colors. As shown, the active plot is selected to allow the color to be changed, the Limit plot being plot 1. Thus, the attribute node incorporates two terminals; one for Active Plot and one for Plot Color.

Dynamic Ring Control Menus

Attribute nodes are useful for creating automated test executive (ATE) VIs. For example, with the Visible attribute, the VI can control what front panel objects are visible to the user, changing the appearance of the front panel for different test routines.

The ability to set strings in a ring control adds further ATE functionality. With the menu ring and text ring controls, the user is presented with a menu of options. If the options cannot be determined until run-time, an Attribute node can be used to set the options. The user can select an option from the menu ring and then, using the attribute node for the menu ring, the strings can be changed during execution to display a different set of choices. FIG. 151 illustrates the Build Array function to set the Strings attributes for a menu ring control. Also, the same menu ring can be updated with a different menu as shown in FIG. 152. Boolean controls with labels also feature the ability to update string displays. The VI can change the text on the Boolean for different user selections. For example, the initial label might state "Select." After the user presses the button to enter a selection, the label can be changed to "Run Test" for test execution.

Figure 154B:
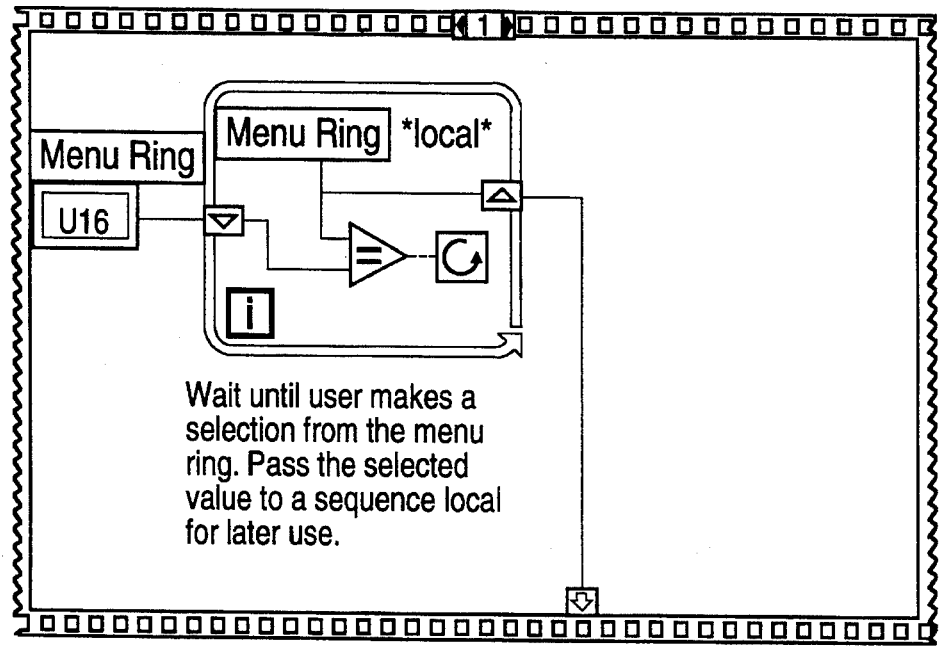
Figure 154C:
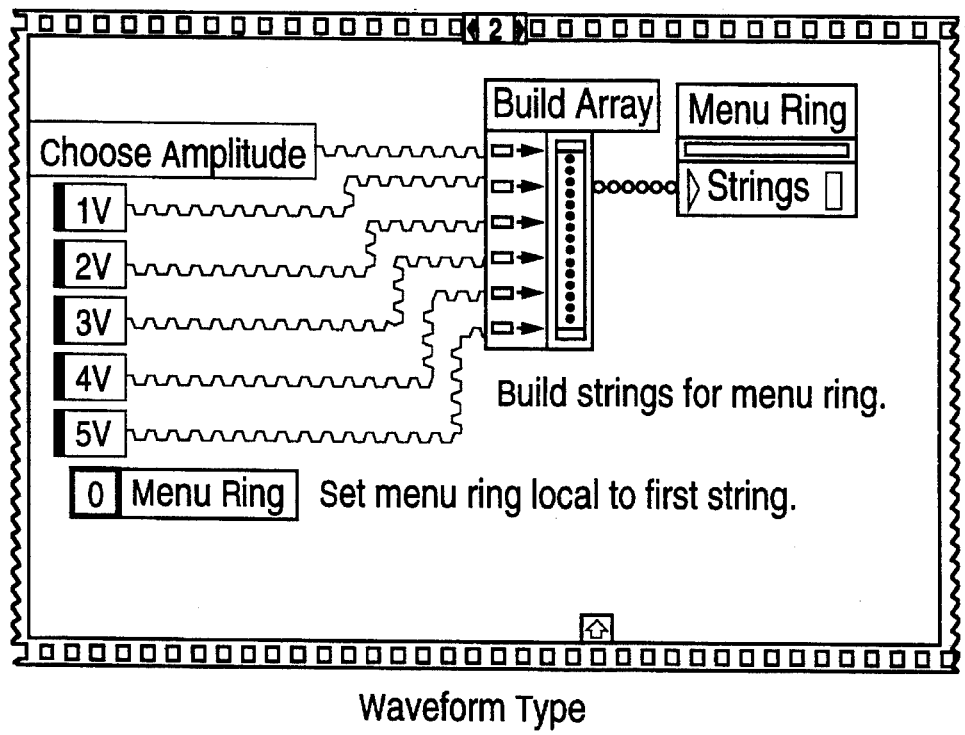
Figure 154D:
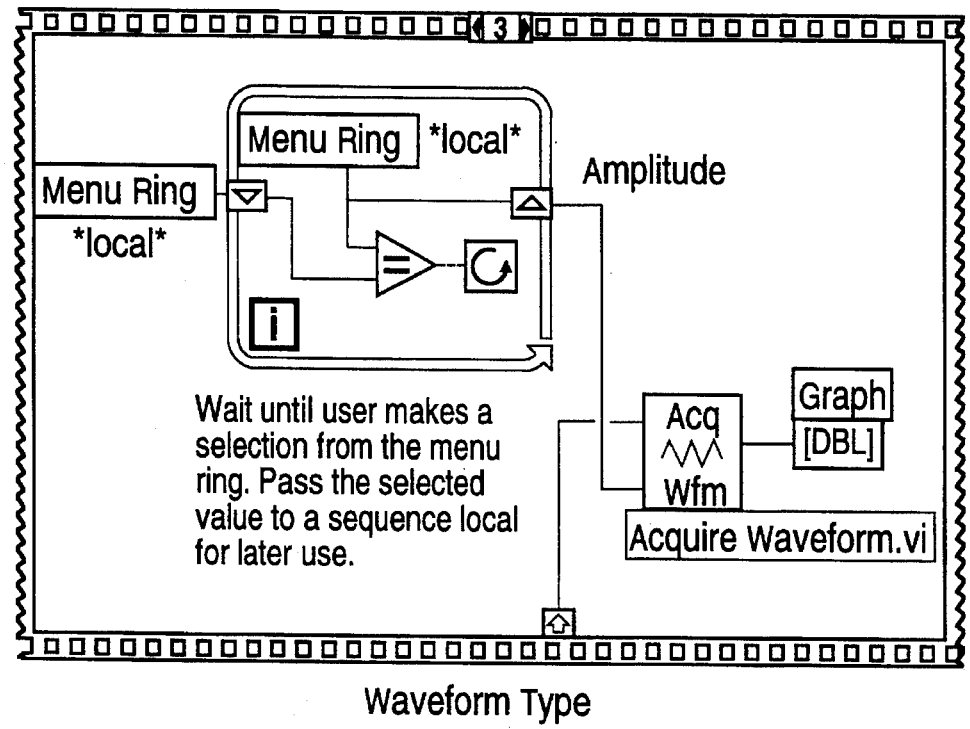

Referring now to FIGS. 153A–B, a VI that demonstrates the use of menu ring controls in an ATE application is shown. The block diagram illustrated in FIG. 154 includes an outer while loop which in turn comprises a case structure, which in turn comprises a sequence structure having frames in 0 through 3. The true case of the case structure is illustrated in FIG. 154. The false case being illustrated in FIG. 154A. Likewise, frame 0 of the sequence structure is illustrated in FIG. 154, whereas frames 1, 2, and 3 of the sequence structure are illustrated in FIG. 154B, C, and D, respectively.

When the VI is run, the Menu Ring control is initially disabled. The Menu Ring Control is enabled after the user clicks on the Generate Waveform button. The Menu Ring control provides the user with different options to select the type of waveform and its amplitude.

Analog/Digital Example

Referring now to FIGS. 155A–B and 156, front panels and a block diagram of a VI that selects analog or digital outputs for the front panel depending on operations in the block diagram is shown. The front panel in FIG. 155A includes an analog readout as well as a mode control, a low battery control, a division setup control and a stop button. The front panel in FIG. 155B includes a digital readout as well as a mode control, a low battery control, division setup and stop button. Referring now to FIG. 156, the block diagram includes a case or conditional structure having digital and analog frames. A mode function is provided to the input of a selector whose true false inputs are connected to the digital and analog controls, respectively. As shown, the digital frame includes readouts for voltage current, resistance, and voltage A/C rms, whereas the analog frame includes only outputs for voltage current and resistance. The block diagram also includes a while loop shown between the digital and analog frames, which reads the value of the respective mode and provides the output to the readout controls.

The above examples illustrate some of the possible attributes available. The following is a summary of the attributes for the various controls.

Base Attributes

A base set of attributes is available for all controls. These attributes include the visibility of a control, whether it is disabled, and key focus. It is noted that these attributes can be read as well as set. For example, a control can be made invisible, and then may be checked to see if it is currently invisible.

| | |
|---|---|
| Visible | Visible when True: hidden when False. |
| Disabled | 0     Control is enabled. |
| | 1     Control is disabled. |
| | 2     Control is grayed out. |
| Key Focus | When True, the control is the currently selected key focus. Key focus is generally changed by tabbing through fields. The Key Focus Attribute allows the user to focus on a particular control for keyboard data entry without requiring the user to use the mouse to select this control. |

Attributes for Rotary, Slide, and Fill Controls

In addition to the base and numeric attributes, rotary, slide, and fill controls have the following attributes:

| | |
|---|---|
| Active Slider | Which slider/needle is active? |
| Slider Colors | Active slider/needle colors |
| FG Color | Foreground Color |
| BG Color | Background Color |
| Fill Style | Fill Style (0–4) - No fill, fill to min, fill to max, fill to value below, fill to value above |
| Fill Color | Fill color for active slider |
| Scale Info | Scale Information |
| Style | Scale style (0–8) - as shown in pop-up menu from top, left to bottom, right |
| Format & Precision | Cluster of the format and precision attributes. |
| Format | The format for a numeric can be one of the following five values. |
| | 0 - Decimal |
| | 1 - Scientific |
| | 2 - Engineering |
| | 3 - Binary |
| | 4 - Octal |
| | 5 - Hexadecimal |
| Precision | Precision is the number of digits displayed after the decimal point. |
| Range | Range values |
| Minimum | Minimum range value |
| Maximum | Maximum range value |
| Increment | Increment between markers |
| Mapping | Mapping Mode (0–1) - Linear or Logarithmic |
| Editable | Allow editing of scale values? |

Attributes for Rings

These attributes are in addition to base and numeric attributes

| | |
|---|---|
| Strings | Items in Ring String |

Attributes for the Ramp

| | |
|---|---|
| Array Visible | Is color array visible? |
| Ramp Visible | Is ramp visible? |
| DigDisp Visible | Is digital display visible? |
| Scale Info | Color scale information |
| Interpolate Color | Interpolate between array colors? |
| Low Color | For values less than the first array |
| High Color | For values greater than last array. |
| Color Array | Color Array elements. |
| Style | Scale style (0–8) - as shown in pop-up menu from top, left to bottom, right |
| Format & Precision | Cluster of the format and precision attributes. |
| Format | The format for a numeric can be one of the following five values.<br>0 - Decimal<br>1 - Scientific<br>2 - Engineering<br>3 - Binary<br>4 - Octal<br>5 - Hexadecimal |
| Precision | Precision is the number of digits displayed after the decimal point. |
| Range | Range values |
| Minimum | Minimum range value |
| Maximum | Maximum range value |
| Increment | Increment between markers |
| Mapping | Mapping Mode (0–1) - Linear or Logarithmic |
| Editable | Allow editing of scale values? |

Attributes for Booleans

In addition to the base attributes, the Boolean text strings that are displayed inside of the Boolean can be set, as well as the colors of each of the states. The strings are an array of four elements, with the first element for the false string and the second element for the true string. The other two strings only apply to Booleans that have a mechanical action, such as Switch when Released or Latch when Released. These behaviors are typically used in dialog boxes, where a button does not change state unless the mouse is released with the cursor inside the button; as the button is pressed, it highlights in temporary transition states, false to true and from true to false (the third and fourth states). As with the strings, the colors are an array of four elements.

If an array of only two strings is passed to the text strings attribute node, the first string is copied to the third string and the second string to the fourth string. If an array of one string is passed to the node, that string is copied to all four strings.

For example, assume a Boolean is set to a mechanical action of a Switch when released, and a string array of run, stop, stop?, and run? is passed. In the FALSE state, the Boolean has a string of run.

If the button is pressed, the button highlights and the string changes to run?. If the mouse is released with the cursor in the button, the button changes to TRUE, and displays the word stop; if the mouse is release outside of the button, then the button returns to FALSE and displays the word run. Pressing on the button while it is TRUE will display the string stop?.

| | |
|---|---|
| Strings (4) | Strings for False, True, True Tracking, and False Tracking states. |
| Colors (4) | Foreground and background colors for False, True, True Tracking, and False Tracking states. |

Attributes for Strings

In addition to the base attributes, the scroll position for a string (the line number displayed at the top of the string control, with 0 representing the first line) and the selection range (measured in characters, with 0 representing the first character of the string) can also be set. The backslash codes and the scrollbar may also be enabled/disabled.

| | |
|---|---|
| Scroll Position | Scroll to line # # from top of screen. |
| Selection | Text selection. |
| Selection Start | Beginning character position |
| Selection End | Ending character position. |
| Codes | Are backslash codes \n, \t, etc. enabled? |
| Scrollbar | Is vertical scrollbar enabled? |

Attributes for Paths

In addition to the base attributes, the scrollbar can be enabled/disabled.

| | |
|---|---|
| Selection | Text Selection |
| Selection Start | Beginning character position |
| Selection End | Ending character position |

Attributes for Arrays

In addition to the base attributes, arrays have attributes for the visibility of the index display, the current values of the index, and the selection range for the array (used in copy and paste).

| | |
|---|---|
| Index Visible | Is the array index visible? |
| Index Values | Element in top left corner of array |
| Selection Start [ ] | Beginning element in array selection |
| Selection Size [ ] | Number of elements in array selection |

Attributes for Clusters

The cluster has only the base attributes.

Attributes for Tables

In addition to the base attributes, Tables have attributes for the control of scroll bar visibility, row and column header visibility, selection color, edit position, index values, setting the data selection range, changing row and column headers, reading from and writing to specific cells, and setting cell foreground and background color.

| | |
|---|---|
| Index Visible | Are the table indexes visible? |
| vScroll Visible | Is the vertical scroll bar visible? |
| hScroll Visible | Is the horizontal scroll bar visible? |
| Row Headers Vis | Are the row headers visible? |
| Col Headers Vis | Are the column headers visible? |
| Selection Color | Color used to draw the data selection |
| Edit Position | Set the row/column of the current text entry location |
| Index Values | Set the index value of the top/left visible cell |
| Selection Start | Set start of data selection range |
| | Row number |
| | Column number |
| Selection Size | Number of cells in data selection |
| | Row |
| | Column |
| Row Headers [ ] | Array of strings |
| | Header string |
| Column Headers [ ] | Array of strings |
| | Header string |
| Cell Selection | Cell from which to read/write specific attributes |
| | Row |
| | Column |
| Cell FG Color | Foreground color for cells |
| Cell BG Color | Background color for cells |

Attributes for the Waveform Chart

In addition to the base attributes, the Waveform Chart has attributes for reading and setting the visibility of the legend, palette, scroll bar and numeric displays. It also has attributes for the colors of the chart paper (background) and grid, the X and Y scale information, the update modes of strip, sweep, and scope.

Attributes can also be set for each of the plots. Attributes for plots are applied to the active plot. The active plot is selected by setting the active plot attribute to the number of a plot, with 0 representing the first plot. After a plot is selected, attributes can be read or set for that plot, including the plot's color, interpolation, point style and line style.

| | |
|---|---|
| Legend Visible | Is the chart legend visible? |
| Palette Visible | Is the chart palette visible? |
| Scroll Bar Visible | Is the chart scroll bar visible? |
| Display(s) Visible | Are the chart digital display(s) visible? |
| Transpose Array | Transpose data before plotting? |
| Paper Colors | Colors for plotting surface |
| FG Color | Foreground color for plotting surface |
| BG Color | Background color for plotting surface |
| Grid Colors | Grid Colors |
| X Color | Color for X grid |
| Y Color | Color for Y grid |
| X Scale Info | X scale information |
| X Scale Fit | Fit X scale to data (0–2) - Never, Once, Always |
| X Style | X scale style (0–8) - as shown in pop-up menu from top, left to bottom, right |
| X Format & Precision | |
| X Format | X Format (0–5) - Decimal Scientific, Engineering, Binary, Octal, Hex |
| X Precision | X Precision - digits after decimal point |
| X Range | X scale range values |
| X Minimum | X scale minimum range value |
| X Maximum | X scale maximum range value |
| X Increment | Increment between X markers |
| X Mapping Mode | X Mapping Mode (0–1) - Linear or logarithmic |
| X Editable | Allow editing of X scale values? |
| Y Scale Info | Y scale information |
| Y Scale Fit | Fit Y scale to data (0–2) - Never, Once, Always |
| Y Style | Y scale style (0–8) - as shown in pop-up menu from top, left to bottom, right |
| Y Format & Precision | |
| Y Format | Y Format (0–5) - Decimal Scientific, Engineering, Binary, Octal, Hex |
| Y Precision | Y Precision - digits after decimal point |
| Y Range | Y scale range values |
| Y Minimum | Y scale minimum range value |
| Y Maximum | Y scale maximum range value |
| Y Increment | Increment between Y markers |
| Y Mapping Mode | Y Mapping Mode (0–1) - Linear or logarithmic |
| Y Editable | Allow editing of Y scale values? |
| Active Plot | Which plot is active |
| Plot Name | Name of active plot |
| Plot Attributes | Attributes of active plot |
| Plot Color | Color of active plot |
| Plot Interpolation | Interpolation for active plot (0–2) - None, Stepwise, Linear |
| Point Style | Point style for active plot (0–2) - as shown in pop-up menu from top, left to bottom, right |
| Line Style | Line style for active plot (0–4) - as shown in pop-up menu from top to bottom |
| Update Mode | Update mode for chart (0–2) - Scroll, Scope, Sweep |

Attributes for the Waveform Graph

The attributes for the waveform graph are similar to the waveform chart, with the addition of control of Smooth Update.

| | |
|---|---|
| Legend Visible | Is the chart legend visible? |
| Palette Visible | Is the chart palette visible? |
| Transpose Array | Transpose data before plotting? |
| Smooth Update | Produce smooth (double buffered) updates |
| Paper Colrs | Colors for plotting surface |
| FG Color | Foreground color for plotting surface |
| BG Color | Background color for plotting surface |
| Grid Colors | Grid Colors |
| X Color | Color for X grid |
| Y Color | Color for Y grid |
| X Scale Info | X scale information |
| X Scale Fit | Fit X scale to data (0–2) - Never, Once, Always |
| X Style | X scale style (0–8) - as shown in pop-up menu from top, left to bottom, right |
| X Format & Precision | |
| X Format | X Format (0–5) - Decimal Scientific, Engineering, Binary, Octal, Hex |
| X Precision | X Precision - digits after decimal point |
| X Range | X scale range values |
| X Minimum | X scale minimum range value |
| X Maximum | X scale maximum range value |
| X Increment | Increment between X markers |
| X Mapping Mode | X Mapping Mode (0–1) - Linear or logarithmic |
| X Editable | Allow editing of X scale values? |
| Y Scale Info | Y scale information |
| Y Scale Fit | Fit Y scale to data (0–2) - Never, Once, Always |
| Y Style | Y scale style (0–8) - as shown in pop-up menu from top, left to bottom, right |
| Y Format & Precision | |
| Y Format | Y Format (0–5) - Decimal Scientific, Engineering, Binary, Octal, Hex |
| Y Precision | Y Precision - digits after decimal point |
| Y Range | Y scale range values |

| | |
|---|---|
| Y Minimum | Y scale minimum range value |
| Y Maximum | Y scale maximum range value |
| Y Increment | Increment between Y markers |
| Y Mapping Mode | Y Mapping Mode (0–1) - Linear or logarithmic |
| Y Editable | Allow editing of Y scale values? |
| Active Plot | Which plot is active |
| Plot Name | Name of active plot |
| Plot Attributes | Attributes of active plot |
| Plot Color | Color of active plot |
| Plot Interpolation | Interpolation for active plot (0–2) - None, Stepwise, Linear |
| Point Style | Point style for active plot (0–2) - as shown in pop-up menu from top, left to bottom, right |
| Line Style | Line style for active plot (0–4) - as shown in pop-up menu from top to bottom |

Attributes for the Intensity Chart

In addition to the base attributes, the Intensity Chart attributes are a superset of the standard chart and the color ramp.

| | |
|---|---|
| Ramp Visible | Is the ramp visible? |
| Array Visible | Is the color array visible? |
| Palette Visible | Is the chart palette visible? |
| Scroll Bar Visible | Is the chart scroll bar visible? |
| Transpose Array | Transpose data before plotting? |
| Paper Colors | Colors for plotting surface |
| FG Color | Foreground color for plotting surface |
| BG Color | Background color for plotting surface |
| Grid Colors | Grid Colors |
| X Color | Color for X grid |
| Y Color | Color for Y grid |
| X Scale Info | X scale information |
| X Scale Fit | Fit X scale to data (0–2) - Never, Once, Always |
| X Style | X scale style (0–8) - as shown in pop-up menu from top, left to bottom, right |
| X Format & Precision | |
| X Format | X Format (0–5) - Decimal Scientific, Engineering, Binary, Octal, Hex |
| X Precision | X Precision - digits after decimal point |
| X Range | X scale range values |
| X Minimum | X scale minimum range value |
| X Maximum | X scale maximum range value |
| X Increment | Increment between X markers |
| X Mapping Mode | X Mapping Mode (0–1) - Linear or logarithmic |
| X Editable | Allow editing of X scale values? |
| Y Scale Info | Y scale information |
| Y Scale Fit | Fit Y scale to data (0–2) - Never, Once, Always |
| Y Style | Y scale style (0–8) - as shown in pop-up menu from top, left to bottom, right |
| Y Format & Precision | |
| Y Format | Y Format (0–5) - Decimal Scientific, Engineering, Binary, Octal, Hex |
| Y Precision | Y Precision - digits after decimal point |
| Y Range | Y scale range values |
| Y Minimum | Y scale minimum range value |
| Y Maximum | Y scale maximum range value |
| Y Increment | Increment between Y markers |
| Y Mapping Mode | Y Mapping Mode (0–1) - Linear or logarithmic |
| Y Editable | Allow editing of Y scale values? |
| Z Scale Info | Color (Z) Scale Information |
| Interpolate Color | Interpolate between array colors? |
| Low Color | Color for values less then first array element? |
| High Color | Color for values greater than last array element? |
| Color Array | Color Array |
| | Value/Color pair |
| | Value |
| Z Scale Fit | Fit Z scale to data (0–2) - Never, Once, Always |
| Z Style | Z scale style (0–8) - as shown in pop-up menu from top, left to bottom, right |
| Z Format & Precision | |
| Z Format | Z Format (0–5) - Decimal Scientific, Engineering, Binary, Octal, Hex |
| Z Precision | Z Precision - digits after decimal point |
| Z Range | Z scale range values |
| Z Minimum | Z scale minimum range value |
| Z Maximum | Z scale maximum range value |
| Z Increment | Increment between Z markers |
| Z Mapping Mode | Z Mapping Mode (0–1) - Linear or logarithmic |
| Z Editable | Allow editing of Z scale values? |
| Ignore Array | Use colormap instead of array elements |
| Color Table | Colormap - 256 colors |
| Update Mode | Update mode for chart (0–2) - Scroll, Scope, Sweep |
| History Data | Array of numbers (read only) |

Attributes for the Intensity Graph

| | |
|---|---|
| Ramp Visible | Is the ramp visible? |
| Array Visible | Is the color array visible? |
| Palette Visible | Is the chart palette visible? |
| Smooth Update | Produce smooth (double buffered) updates |
| Paper Colors | Colors for plotting surface |
| FG Color | Foreground color for plotting surface |
| BG Color | Background color for plotting surface |
| Grid Colors | Grid Colors |
| X Color | Color for X grid |
| Y Color | Color for Y grid |
| X Scale Info | X scale information |
| X Scale Fit | Fit X scale to data (0–2) - Never, Once, Always |
| X Style | X scale style (0–8) - as shown in pop-up menu from top, left to bottom, right |
| X Format & Precision | |
| X Format | X Format (0–5) - Decimal Scientific, Engineering, Binary, Octal, Hex |
| X Precision | X Precision - digits after decimal point |
| X Range | X scale range values |
| X Minimum | X scale minimum range value |
| X Maximum | X scale maximum range value |
| X Increment | Increment between X markers |
| X Mapping Mode | X Mapping Mode (0–1) - Linear or logarithmic |
| X Editable | Allow editing of X scale values? |
| Y Scale Info | Y scale information |
| Y Scale Fit | Fit Y scale to data (0–2) - Never, Once, Always |
| Y Style | Y scale style (0–8) - as shown in pop-up menu from top, left to bottom, right |
| Y Format & Precision | |
| Y Format | Y Format (0–5) - Decimal Scientific, Engineering, Binary, Octal, Hex |
| Y Precision | Y Precision - digits after decimal point |
| Y Range | Y scale range values |
| Y Minimum | Y scale minimum range value |
| Y Maximum | Y scale maximum range value |
| Y Increment | Increment between Y markers |
| Y Mapping Mode | Y Mapping Mode (0–1) - Linear or logarithmic |
| Y Editable | Allow editing of Y scale values? |
| Z Scale Info | Color (Z) Scale Information |
| Interpolate Color | Interpolate between array colors? |
| Low Color | Color for values less then first array |

-continued

| | |
|---|---|
| | element? |
| High Color | Color for values greater than last array element? |
| Color Array | Color Array<br>Value/Color pair<br>Value |
| Z Scale Fit | Fit Z scale to data (0–2) - Never, Once, Always |
| Z Style | Z scale style (0–8) - as shown in pop-up menu from top, left to bottom, right |
| Z Format & Precision | |
| Z Format | Z Format (0–5) - Decimal Scientific, Engineering, Binary, Octal, Hex |
| Z Precision | Z Precision - digits after decimal point |
| Z Range | Z scale range values |
| Z Minimum | Z scale minimum range value |
| Z Maximum | Z scale maximum range value |
| Z Increment | Increment between Z markers |
| Z Mapping Mode | Z Mapping Mode (0–1) - Linear or logarithmic |
| Z Editable | Allow editing of Z scale values? |
| Ignore Array | Use colormap instead of array elements |
| Color Table | Colormap - 256 colors |
| Update Mode | Update mode for chart (0–2) - Scroll, Scope, Sweep |

Attributes for Graph Cursors

| | |
|---|---|
| Active Cursor | Which cursor is active? |
| Cursor Attributes | Attributes for active cursor |
| Cursor Name | Name of active cursor |
| Cursor Color | Color of active cursor |
| Cursor Cross Hair | Cross hair style for active cursor (0–8) - as shown in pop-up menu from top, left to bottom, right |
| Cursor Point Style | Point style for active cursor (0–16) - as shown in pop-up menu from top, left to bottom, right |
| Cursor Name Visible | Is the active cursor's name showing? |
| Cursor Locked | Is the active cursor locked to a plot? |
| Cursor Plot | Plot with which the active cursor is associated (for Intensity Graph Cursor, this is "Cursor Row" - Data row to which the active cursor is associated) |
| Cursor Index | Index of point to which the active cursor is locked (for Intensity Graph Cursor, this is "Cursor Column" - Data column to which the active cursor is associated) |
| Cursor Position | Position of active cursor |
| Cursor X | Horizontal position of cursor |
| Cursor Y | Vertical position of cursor |

Attributes for Pictures

| | |
|---|---|
| Erase First | Erase (0–20) - Never, Once, Always |
| Dimensions | Drawable surface dimensions (read only)<br>Width in pixels<br>Height in pixels |

Conclusion

In summary, attribute nodes are employed to programmatically manipulate front panel controls and indicators. These front panel objects possess a set of characteristics, depending on the control or indicator type, that the VI can modify. Therefore, attribute nodes are powerful tools for expanding user interface capabilities. Some common attributes include strings for a ring control, colors, visibility, and graph scales and cursors.

Attribute nodes are created from the pop-up menu of a control or indicator (or a control or indicator terminal). Each attribute node can read and set multiple attributes for a given control. In addition, the user can create multiple attribute nodes for a single front panel object, so the user can configure attributes from multiple locations in a block diagram. The Help Window is a useful tool for gaining information about individual attributes from a node.

Attribute nodes are especially helpful in a few key areas of VI development. Attribute nodes greatly expand graph functionality. Features such as zooming and trace point selection can be implemented with the cursor and graph scale attributes. Also, attribute nodes enhance LabVIEW®ATE systems significantly. Using attributes such as programmable string displays for rings, programmable labels for buttons, and programmable control access, the user can customize the user interface to present different test options.

We claim:

1. A computer implemented method for programmatically affecting an attribute of a control in a data flow program in a computer system including a video screen, means for creating a graphical data flow diagram, and means for creating a panel associated with said data flow diagram for displaying data input to and output from said data flow diagram, the method comprising the computer implemented steps of:

displaying on the screen a first panel;

displaying on the screen a first control which displays data, wherein said first control is comprised in said first panel;

displaying on the screen a first function icon that references a function icon control means for controlling a first function;

displaying on the screen an attribute node icon associated with said first control, wherein the attribute node icon references an attribute control means for programmatically affecting an attribute of said first control;

assembling on the screen a data flow diagram including the first function icon and the attribute node icon, wherein the first function icon is connected to the attribute node icon and wherein the function icon control means provides data to the attribute control means during execution of the data flow diagram, wherein said first panel is associated with said data flow diagram and wherein said first control in said first panel displays input or output data from said data flow diagram;

executing the data flow diagram;

the function icon control means writing a value to the attribute control means to affect said attribute of said first control during said step of executing; and changing said attribute of said first control after said step of the function icon control means writing said value to the attribute control means to affect said attribute of said first control.

2. The method of claim 1, further comprising:

displaying on the screen a first terminal icon that references said first control prior to said step of assembling;

wherein said step of assembling comprises assembling on the screen the data flow diagram including the first terminal icon, the first function icon and the attribute node icon.

3. The method of claim 1, wherein said first control includes a plurality of attributes and wherein said attribute control means programmatically affects said plurality of attributes of said first control;

wherein said step of the function icon control means writing a value comprises the function icon control means writing values to said attribute control means to affect said plurality of attributes of said first control during said step of executing.

4. The method of claim 3, wherein said attribute node icon lists said plurality of attributes of said first control, wherein said plurality of attributes are listed sequentially;

wherein said step of the function icon control means writing values comprises the function icon control means writing values to said attribute control means sequentially according to said sequential listing of attributes in said attribute node icon to affect said plurality of attributes of said first control during said step of executing.

5. The method of claim 1, further comprising:

displaying on the screen a first terminal icon that references said first control prior to said step of assembling;

displaying on the screen a second control in said first panel;

displaying on the screen a second terminal icon that references said second control prior to said step of assembling;

wherein said first control displays data input to the data flow diagram and said second control displays data output from the data flow diagram;

wherein said step of assembling comprises assembling on the screen the data flow diagram including the first terminal icon and the second terminal icon and the first function icon and the attribute node icon, wherein the data flow diagram displays a first procedure for producing a value for the second terminal icon from a value provided by the first terminal icon.

6. The method of claim 1, further comprising:

displaying on the screen a first terminal icon that references said first control prior to said step of assembling;

displaying on the screen a second control in said first panel;

displaying on the screen a second terminal icon that references said second control prior to said step of assembling;

wherein said second control displays data input to the data flow diagram and said first control displays data output from the data flow diagram;

wherein said step of assembling comprises assembling on the screen the data flow diagram including the first terminal icon and the second terminal icon and the first function icon and the attribute node icon, wherein the data flow diagram displays a first procedure for producing a value for the first terminal icon from a value provided by the second terminal icon.

7. The method of claim 1, wherein said attribute comprises an element of the appearance of said first control.

8. The method of claim 1, wherein said attribute comprises one or more of the group consisting of: size, color, range, scale, visibility, disabled, and key focus.

9. The method of claim 1, wherein said first control comprises one of the group consisting of: digital numeric control, color numeric control, rotary control, slide control, fill control, ring control, color ramp, table, waveform chart, waveform graph, XY graph, intensity chart, and intensity graph.

10. The method of claim 1, wherein said control comprises a waveform graph, wherein said attribute comprises one or more of the group consisting of: active cursor, cursor name, cursor color, cursor grid style, cursor point style, cursor locked, cursor plot, cursor index, cursor location, cursor X location, cursor Y location, cursor list, and smooth update.

11. The method of claim 1, wherein said control comprises a waveform graph having a cursor, wherein said attribute comprises an attribute of said cursor.

12. A computer implemented method for programmatically accessing an attribute of a control in a data flow program in a computer system including a video screen, means for creating a graphical data flow diagram, and means for creating a panel associated with said data flow diagram for displaying data input to and output from said data flow diagram, the method comprising the computer implemented steps of:

displaying on the screen a first panel;

displaying on the screen a first control which displays data, wherein said first control is comprised in said first panel;

displaying on the screen a first function icon that references a function icon control means for controlling a first function;

displaying on the screen an attribute node icon associated with said first control, wherein the attribute node icon references an attribute control means for programmatically accessing an attribute of said first control;

assembling on the screen a data flow diagram including the first function icon and the attribute node icon, wherein the attribute node icon is connected to the first function icon and wherein the attribute control means provides data to the function icon control means during execution of the data flow diagram, wherein said first panel is associated with said data flow diagram and wherein said first control in said first panel displays input or output data from said data flow diagram;

executing the data flow diagram;

receiving input from a user during said step of executing to change said attribute of said first control;

the attribute control means reading said attribute of said first control and generating a value indicative thereof during said step of executing;

the attribute control means providing said value to said function icon control means during said step of executing; and the function icon control means computing a value using said value received from the attribute control means during said step of executing.

13. The method of claim 12, further comprising:

displaying on the screen a first terminal icon that references said first control prior to said step of assembling;

wherein said step of assembling comprises assembling on the screen the data flow diagram including the first terminal icon, the first function icon, and the attribute node icon.

14. The method of claim 12, wherein said first control includes a plurality of attributes and wherein said attribute control means programmatically accesses said plurality of attributes of said first control;

wherein said step of the attribute control means providing said value comprises the attribute control means providing a plurality of values to said function icon control means during said step of executing.

15. The method of claim 14, wherein said attribute node icon lists said plurality of attributes of said first control, wherein said plurality of attributes are listed sequentially;

wherein said step of the attribute control means providing said plurality of values comprises the attribute control means providing said plurality of values sequentially according to said sequential listing of attributes in said attribute node icon during said step of executing.

16. The method of claim 12, further comprising:

displaying on the screen a first terminal icon that references said first control prior to said step of assembling;

displaying on the screen a second control in said first panel;

displaying on the screen a second terminal icon that references said second control prior to said step of assembling;

wherein said first control displays data input to the data flow diagram and said second control displays data output from the data flow diagram;

wherein said step of assembling comprises assembling on the screen the data flow diagram including the first terminal icon and the second terminal icon and the first function icon and the attribute node icon, wherein the data flow diagram displays a first procedure for producing a value for the second terminal icon from a value provided by the first terminal icon.

17. The method of claim 12, further comprising:

displaying on the screen a first terminal icon that references said first control prior to said step of assembling;

displaying on the screen a second control in said first panel;

displaying on the screen a second terminal icon that references said second control prior to said step of assembling;

wherein said second control displays data input to the data flow diagram and said first control displays data output from the data flow diagram;

wherein said step of assembling comprises assembling on the screen the data flow diagram including the first terminal icon and the second terminal icon and the first function icon and the attribute node icon, wherein the data flow diagram displays a first procedure for producing a value for the first terminal icon from a value provided by the second terminal icon.

18. The method of claim 12, wherein said step of the attribute control means providing said value comprises the attribute control means providing said value to said function icon control means to enable said function icon control means to determine said attribute of said first control during said step of executing.

19. The method of claim 12, wherein said attribute comprises an element of the appearance of said first control.

20. The method of claim 12, wherein said attribute comprises one or more of the group consisting of: size, color, range, scale, visibility, disabled, and key focus.

21. The method of claim 12, wherein said first control comprises one of the group consisting of: digital numeric control, color numeric control, rotary control, slide control, fill control, ring control, color ramp, table, waveform chart, waveform graph, XY graph, intensity chart, and intensity graph.

22. The method of claim 12, wherein said control comprises a waveform graph, wherein said attribute comprises one or more of the group of: active cursor, cursor name, cursor color, cursor grid style, cursor point style, cursor locked, cursor plot, cursor index, cursor location, cursor X location, cursor Y location, cursor list, and smooth update.

23. The method of claim 12, wherein said control comprises a waveform graph having a cursor, wherein said attribute comprises an attribute of said cursor.

24. A computer implemented method for programmatically accessing an attribute of a control in a data flow program in a computer system including a video screen, means for creating a graphical data flow diagram, and means for creating a panel associated with said data flow diagram for displaying data input to and output from said data flow diagram, the method comprising the computer implemented steps of:

displaying on the screen a first panel;

displaying on the screen a first control which displays data, wherein said first control is comprised in said first panel;

displaying on the screen a first function icon that references a first function icon control means for controlling a first function;

displaying on the screen a second function icon that references a second function icon control means for controlling a second function;

displaying on the screen an attribute node icon associated with said first control, wherein the attribute node icon references an attribute control means for programmatically accessing an attribute of said first control;

assembling on the screen a data flow diagram including the first function icon, the second function icon, and the attribute node icon, wherein the first function icon is connected to the attribute node icon and wherein the attribute node icon is connected to the second function icon, wherein said first panel is associated with said data flow diagram and wherein said first control in said first panel displays input or output data from said data flow diagram;

executing the data flow diagram;

the first function icon control means writing a value to the attribute control means to affect said attribute of said first control during said step of executing; and the second function icon control means reading a value from the attribute control means to access said attribute of said first control during said step of executing.

25. The method of claim 24, further comprising:

displaying on the screen a first terminal icon that references said first control prior to said step of assembling;

wherein said step of assembling comprises assembling on the screen the data flow diagram including the first terminal icon, the first function icon and the attribute node icon.

26. The method of claim 24, further comprising:

displaying on the screen a first terminal icon that references said first control prior to said step of assembling;

displaying on the screen a second control in said first panel;

displaying on the screen a second terminal icon that references said second control prior to said step of assembling;

wherein said first control displays data input to the data flow diagram and said second control displays data output from the data flow diagram;

wherein said step of assembling comprises assembling on the screen the data flow diagram including the first terminal icon and the second terminal icon, the first function icon, the second function icon and the attribute node icon, wherein the data flow diagram displays a first procedure for producing a value for the second terminal icon from a value provided by the first terminal icon.

27. The method of claim 24, further comprising:

displaying on the screen a first terminal icon that references said first control prior to said step of assembling;

displaying on the screen a second control in said first panel;

displaying on the screen a second terminal icon that references said second control prior to said step of assembling;

wherein said second control displays data input to the data flow diagram and said first control displays data output from the data flow diagram;

wherein said step of assembling comprises assembling on the screen the data flow diagram including the first terminal icon and the second terminal icon and the first function icon and the second function icon and the attribute node icon, wherein the data flow diagram displays a first procedure for producing a value for the first terminal icon from a value provided by the second terminal icon.

28. The method of claim 24, wherein said attribute comprises an element of the appearance of said first control.

29. The method of claim 24, wherein said attribute comprises one or more of the group consisting of: size, color, range, scale, visibility, disabled, and key focus.

30. The method of claim 24, wherein said first control comprises one of the group consisting of: digital numeric control, color numeric control, rotary control, slide control, fill control, ring control, color ramp, table, waveform chart, waveform graph, XY graph, intensity chart, and intensity graph.

31. The method of claim 24, wherein said control comprises a waveform graph, wherein said attribute comprises one or more of the group consisting of: active cursor, cursor name, cursor color, cursor grid style, cursor point style, cursor locked, cursor plot, cursor index, cursor location, cursor X location, cursor Y location, cursor list, and smooth update.

32. The method of claim 24, wherein said control comprises a waveform graph having a cursor, wherein said attribute comprises an attribute of said cursor.

33. A computer implemented method for programming a computer system including a video screen, means for creating a graphical data flow diagram, and means for creating a panel associated with said data flow diagram for displaying data input to and output from said data flow diagram, the method comprising the computer implemented steps of:

displaying on the screen a first panel;

displaying on the screen a first control in said first panel, wherein said first control displays data;

displaying on the screen a second control in said first panel, wherein said second control displays data;

displaying on the screen a first terminal icon that references said first control;

displaying on the screen a second terminal icon that references said second control;

displaying on the screen a first function icon that references a function icon control means for controlling a first function;

displaying on the screen an attribute node icon associated with said first control that references an attribute control means for programmatically affecting an attribute of said first control;

displaying on the screen a connector pane icon having a plurality of terminals for linking said first and second terminal icons, wherein said connector pane icon has associated connector control means for linking controls;

assigning said first control to a first terminal of said connector pane icon;

assigning said second control to a second terminal of said connector pane icon;

assembling on the screen a data flow diagram including the first terminal icon and the second terminal icon and the first function icon and the attribute node icon, wherein said first and second controls display data in said data flow diagram;

executing the data flow diagram;

propagating control data from said first control to said second control in a first data structure during said step of executing; and propagating attribute data between said attribute control means and said second control using a second data structure.

* * * * *